United States Patent
Kikuchi et al.

(10) Patent No.: US 8,247,323 B2
(45) Date of Patent: Aug. 21, 2012

(54) SEMICONDUCTOR DEVICE

(75) Inventors: Hideaki Kikuchi, Kawasaki (JP); Kouichi Nagai, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 18 days.

(21) Appl. No.: 12/761,002

(22) Filed: Apr. 15, 2010

(65) Prior Publication Data

US 2010/0197046 A1 Aug. 5, 2010

Related U.S. Application Data

(62) Division of application No. 11/401,902, filed on Apr. 12, 2006, now abandoned.

(30) Foreign Application Priority Data

Oct. 7, 2005 (JP) .................................. 2005-295453

(51) Int. Cl.
*H01L 21/4763* (2006.01)

(52) U.S. Cl. ................ 438/639; 257/E21.575; 257/757; 257/758; 257/774; 438/622; 438/629; 438/637

(58) Field of Classification Search ........... 257/E21.008, 257/E21.575, 767, 773–775, 758, 757, 768; 438/3, 118, 396, 584, 622, 629, 637, 639, 438/640, 667, 668, 672, 675, 700, 701, 713, 438/978

See application file for complete search history.

(56) References Cited

U.S. PATENT DOCUMENTS

| | | | |
|---|---|---|---|
| 5,475,248 A | 12/1995 | Takenaka | |
| 5,504,038 A * | 4/1996 | Chien et al. | 438/647 |
| 5,541,124 A * | 7/1996 | Miwa et al. | 438/366 |
| 5,976,976 A | 11/1999 | Doan et al. | |
| 5,985,749 A * | 11/1999 | Lin et al. | 438/623 |
| 6,071,810 A | 6/2000 | Wada et al. | |
| 6,245,672 B1 | 6/2001 | Hong et al. | |
| 6,284,649 B1 | 9/2001 | Miyamoto | |
| 6,313,497 B1 | 11/2001 | Iwasa | |
| 6,344,411 B1 | 2/2002 | Yamada et al. | |
| 6,384,440 B1 | 5/2002 | Mori et al. | |

(Continued)

FOREIGN PATENT DOCUMENTS

EP 1006582 A2 6/2000

(Continued)

OTHER PUBLICATIONS

Japanese Office Action dated Mar. 9, 2010, issued in corresponding Japanese Patent Application No, 2005-295453.

(Continued)

*Primary Examiner* — Chris Chu
(74) *Attorney, Agent, or Firm* — Westerman, Hattori, Daniels & Adrian, LLP

(57) ABSTRACT

A silicide film is formed between a ferroelectric capacitor structure, which is formed by sandwiching a ferroelectric film between a lower electrode and an upper electrode, and a conductive plug (the conductive material constituting the plug is tungsten (W) for example). Here, an example is shown in which a base film of the conductive plug is the silicide film.

8 Claims, 94 Drawing Sheets

U.S. PATENT DOCUMENTS

| | | | |
|---|---|---|---|
| 6,420,262 | B1 | 7/2002 | Farrar |
| 6,485,988 | B2 | 11/2002 | Ma et al. |
| 6,492,222 | B1 | 12/2002 | Xing |
| 6,776,622 | B2 | 8/2004 | Yang et al. |
| 6,858,904 | B2 * | 2/2005 | Derraa et al. ............ 257/384 |
| 7,557,446 | B2 * | 7/2009 | Ito et al. ............ 257/751 |
| 2004/0004289 | A1 | 1/2004 | Ueno |
| 2004/0135185 | A1 | 7/2004 | Yabuki |
| 2005/0020066 | A1 * | 1/2005 | Choi et al. ............ 438/683 |
| 2005/0023701 | A1 | 2/2005 | Kajita et al. |

FOREIGN PATENT DOCUMENTS

| | | |
|---|---|---|
| JP | 2001-111001 A | 4/2001 |
| JP | 2001-135798 A | 5/2001 |
| JP | 2001-230382 A | 8/2001 |
| JP | 2003-110095 A | 4/2003 |
| JP | 2004-303995 A | 10/2004 |
| KR | 20000047773 | 7/2000 |
| KR | 20020016337 A | 3/2002 |

OTHER PUBLICATIONS

Office Action dated Feb. 21, 2007 issued in corresponding Korean Application No. 10-200600018716.

* cited by examiner

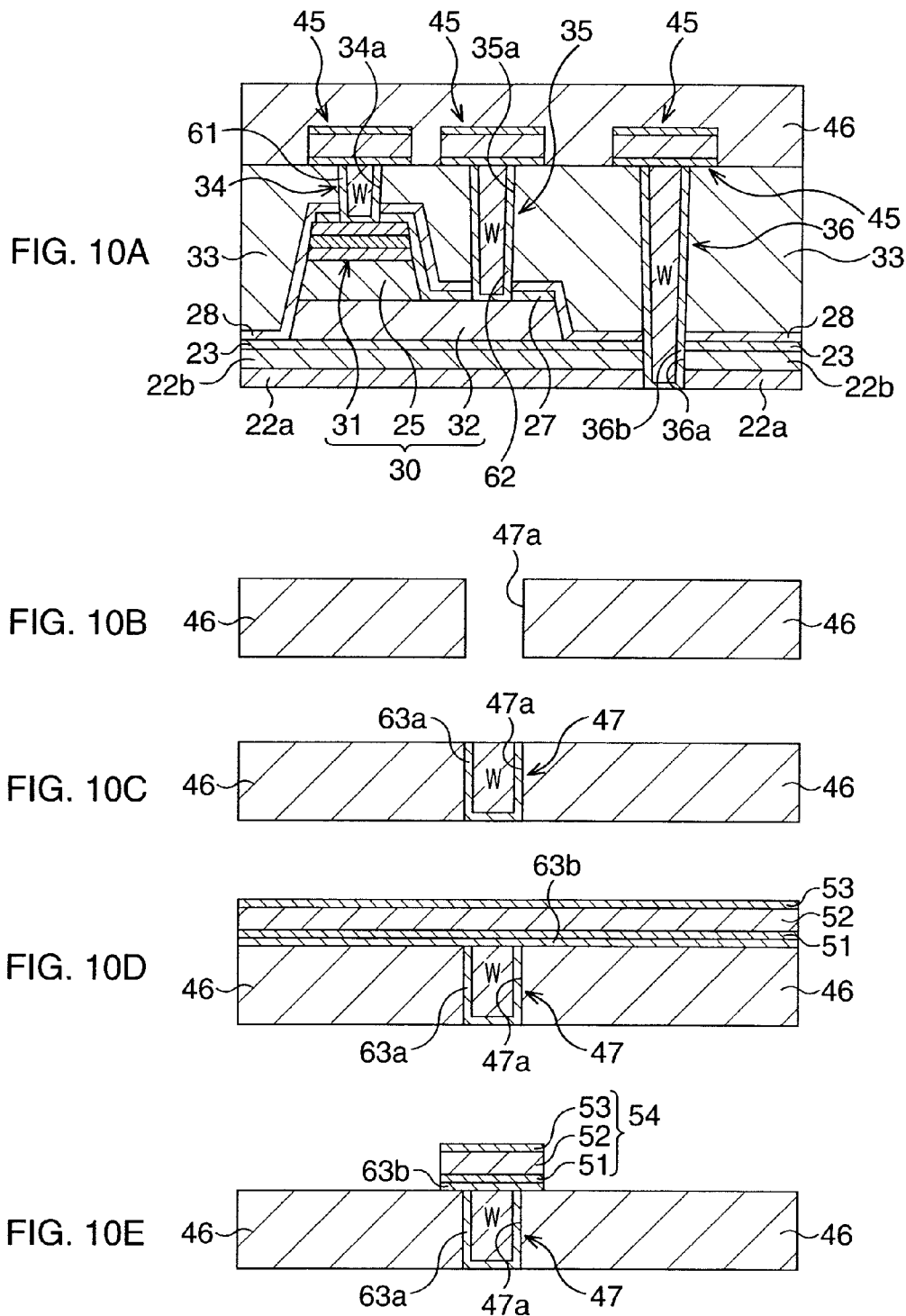

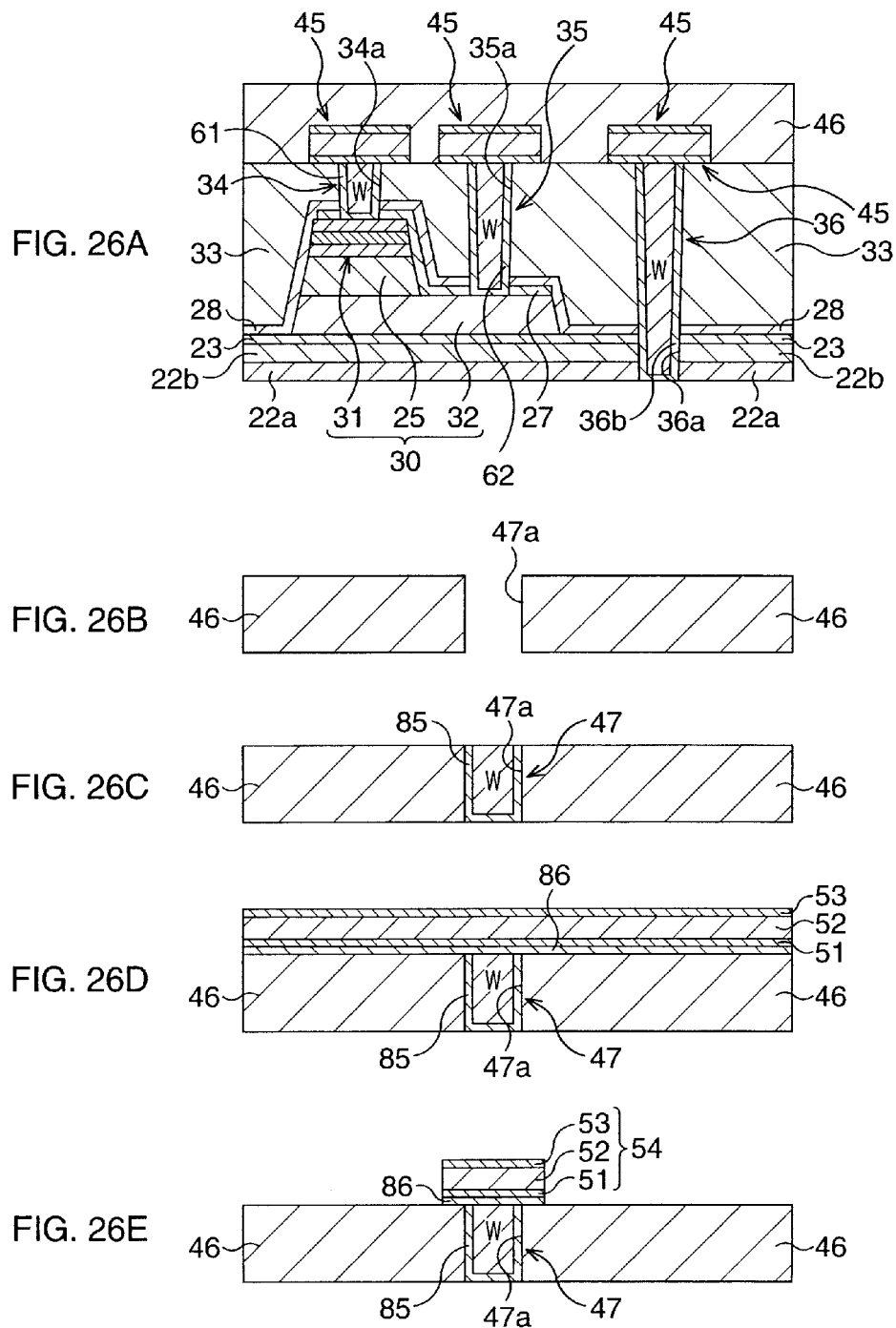

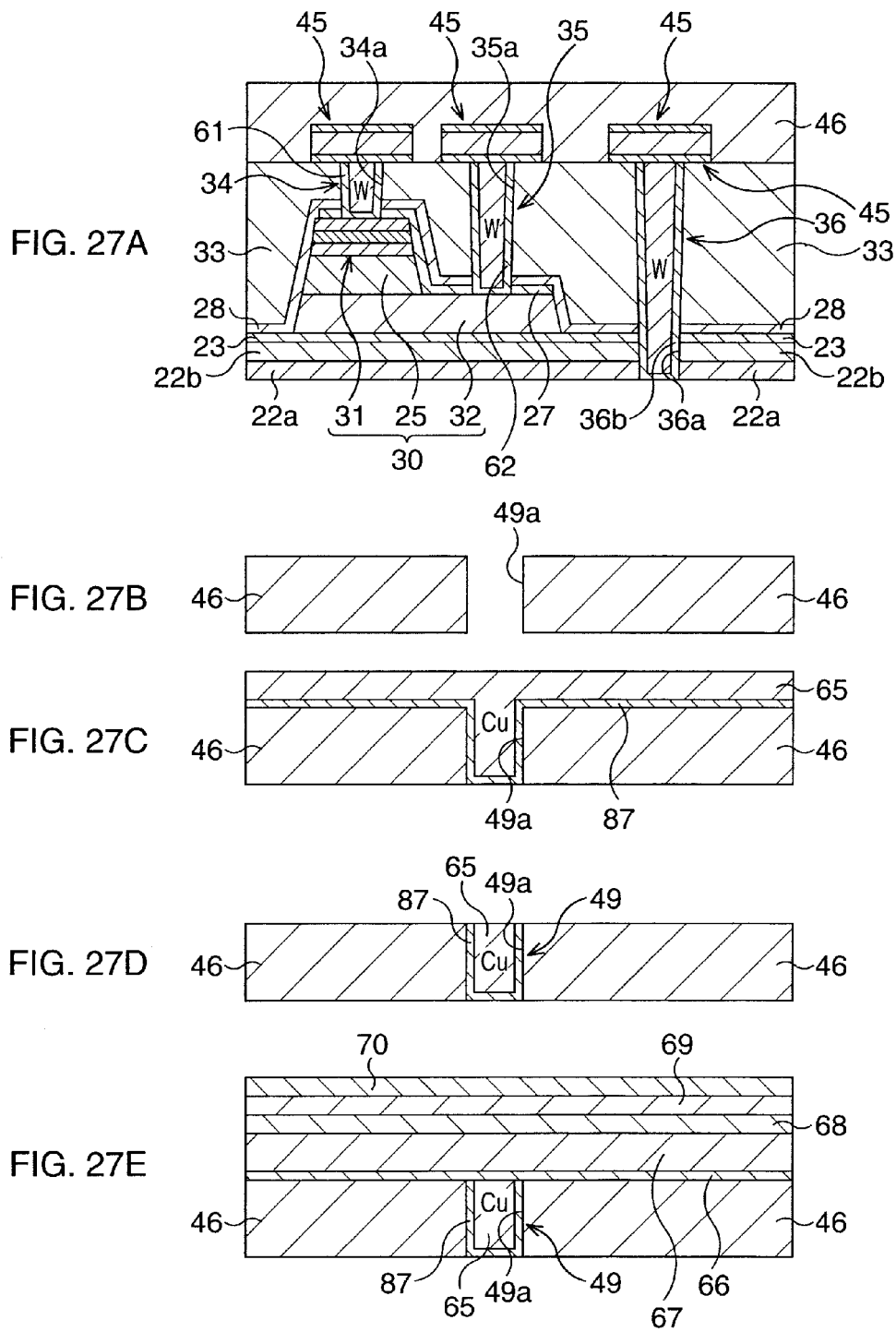

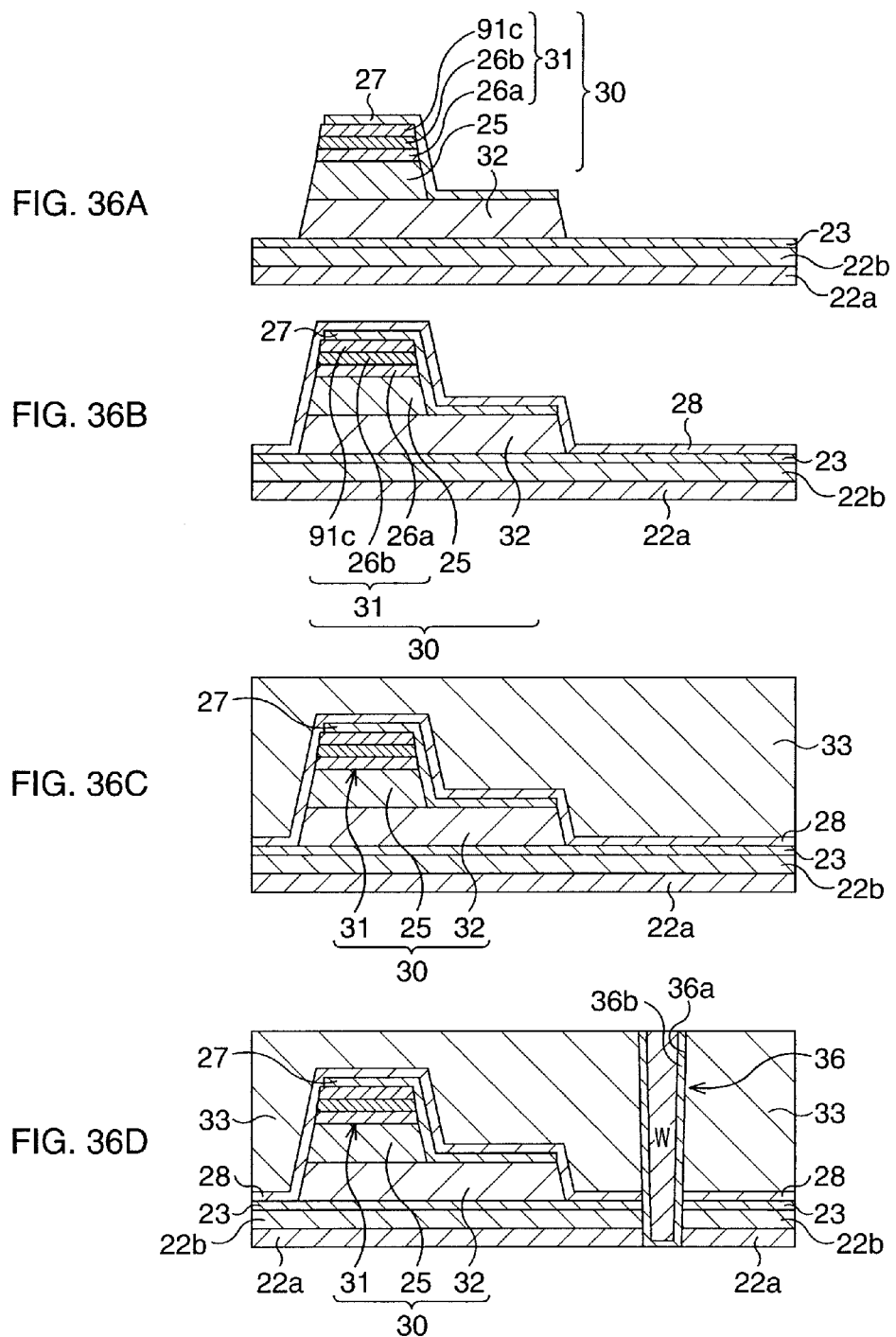

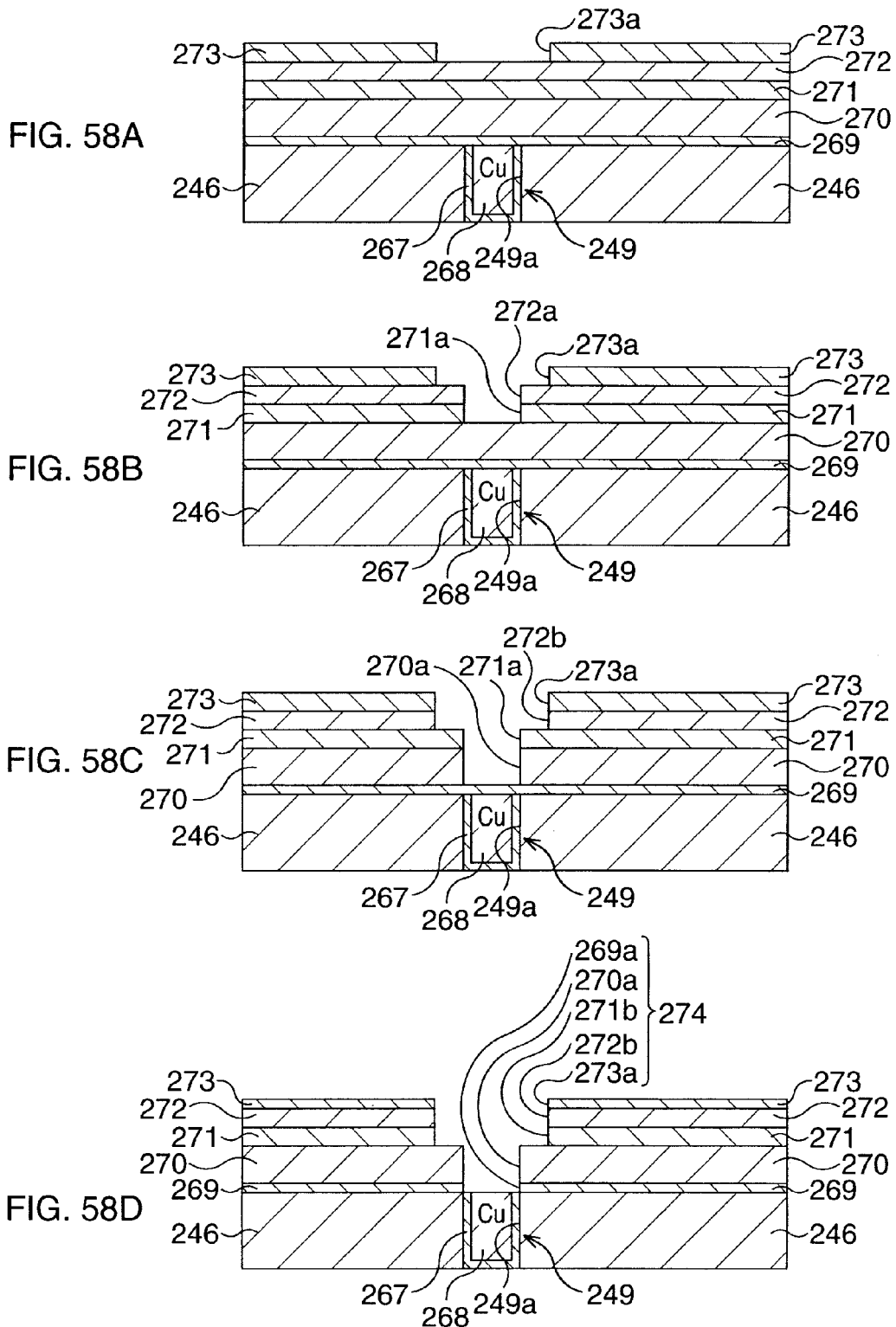

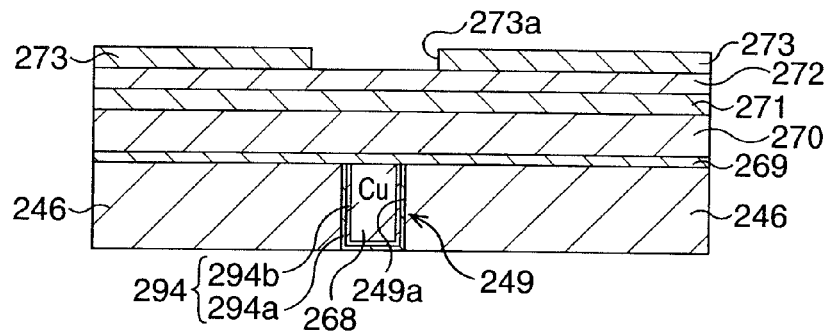
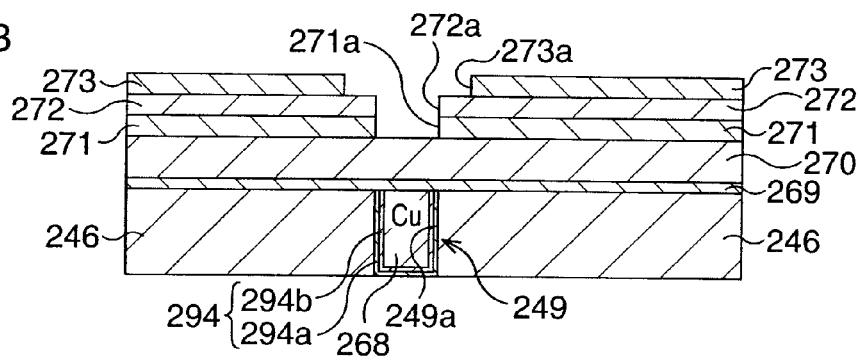
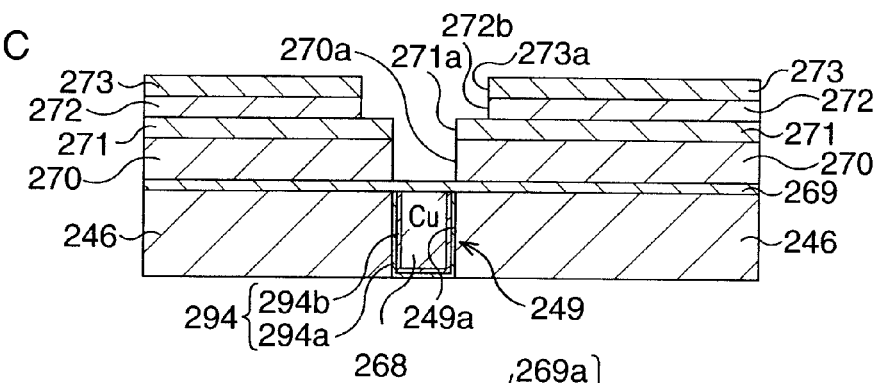
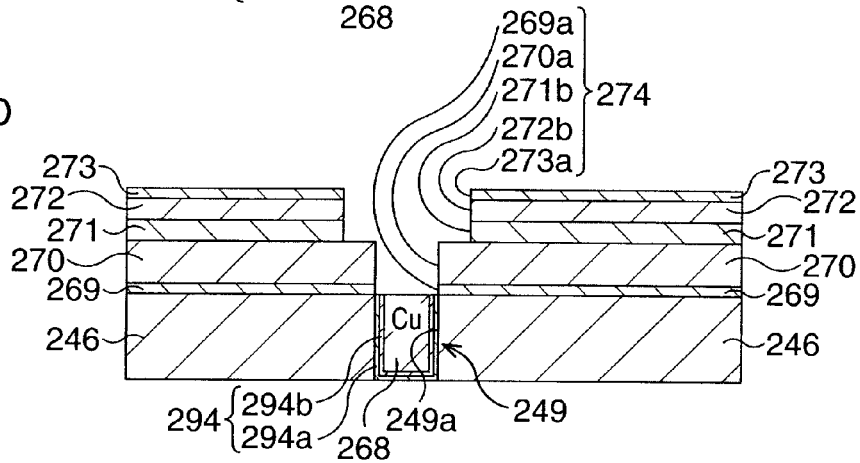

SEMICONDUCTOR DEVICE

CROSS-REFERENCE TO RELATED APPLICATIONS

Incorporated-by-Reference to Related Applications

This application is a divisional application of U.S. Ser. No. 11/401,902, filed Apr. 12, 2006, and is based upon and claims the benefit of priority from the prior Japanese Patent Application No. 2005-295453, filed on Oct. 7, 2005, the entire contents of which are incorporated herein by reference.

BACKGROUND OF THE INVENTION

1. Field of the Invention

The present invention relates to a semiconductor device using a conductive plug for connection to a conductive structure, and in particular, it is mainly directed to a semiconductor device having a ferroelectric capacitor structure formed by sandwiching a ferroelectric film between a lower electrode and an upper electrode.

2. Description of the Related Art

In recent years, development of ferroelectric memories (FeRAMs: Ferroelectric Random Access Memories) is in progress, which retain information in a ferroelectric capacitor structure utilizing polarization inversion of a ferroelectric. The ferroelectric memories are non-volatile memories which do not lose information retained therein even when the power supply is cut off, and attracting attention particularly because they promise realization of high degree of integration, high speed operation, high durability, and low power consumption.

Ferroelectric capacitors have characteristics which deteriorate easily by hydrogen gas and moisture from the outside. Further, their characteristics easily deteriorate also by etching processing or the like. Accordingly, recovery of capacitor characteristics by means of high-temperature annealing is essential. Then, as materials for an upper electrode and a lower electrode constituting a ferroelectric capacitor structure, noble metals and noble metal oxides which endure the high-temperature annealing are widely used.

[Patent document 1] Japanese Patent Application Laid-open No. 2001-230382

[Patent document 2] Japanese Patent Application Laid-open No. 2003-110095

[Patent document 3] Japanese Patent Application Laid-open No. 2004-303995

In FeRAMs, noble metals such as platinum (Pt) and layered films of a noble metal oxide and a noble metal are widely used for the upper electrode of the ferroelectric capacitor structure. However, noble metals such as Pt have catalytic activity, which operates to activate oxygen existing in a conductive oxide film constituting the upper electrode and an insulating film in which the ferroelectric capacitor structure is embedded or oxygen entering from the outside. On the ferroelectric capacitor structure, a conductive plug constituted of a material such as tungsten (W) is formed via a conductive base film (glue film) of TiN/Ti or the like, where activated oxygen as described above oxidizes the glue film and the conductive plug. As a result, contact resistance increases and causes a problem such that a sufficient voltage will not be applied to the ferroelectric capacitor structure. Activated oxygen generated by catalytic activity of a noble metal has an ability to oxidize the glue film and the conductive plug even at room temperature.

Also, even when no noble metal layer of Pt or the like, in other words, no catalyst exists in the upper electrode, oxygen is activated by high-temperature recovery annealing, which is performed on the ferroelectric film while growing W by a CVD method when forming the conductive plug or after a via hole is formed. This activated oxygen oxidizes the glue film and the conductive plug.

SUMMARY OF THE INVENTION

The present invention is made in view of the above-described problems, and an object thereof is to provide a highly reliable semiconductor device and a method of manufacturing the same by inhibiting oxidation of a conductive plug to stabilize contact resistance.

A semiconductor device according to the present invention includes a semiconductor substrate, a conductive structure formed above the semiconductor substrate, conductive plugs electrically connected to the conductive structure, and base films having conductivity and each constituted of a silicide material, the base films covering from bottom faces to side faces of the conductive plugs respectively and being sandwiched between the conductive structure and the conductive plugs at portions of the bottom faces.

A semiconductor device according to the present invention includes a semiconductor substrate, a conductive structure formed above the semiconductor substrate, conductive plugs electrically connected to the conductive structure, and conductive layers each containing a conductive material having conductivity even when oxidized, the conductive layers formed between the conductive structure and the conductive plugs.

A semiconductor device according to the present invention includes a semiconductor substrate, a conductive structure formed above the semiconductor substrate and having a noble metal layer in an upper layer part thereof, and conductive plugs electrically connected to the conductive structure, in which the noble metal layer includes a catalyst poisoning material which inhibits catalytic activity of the noble metal.

A method of manufacturing a semiconductor device according to the present invention includes the steps of forming a conductive structure above a semiconductor substrate, forming an insulating film which covers the conductive structure, forming in the insulating film openings which expose part of a surface of the conductive structure, forming base films each constituted of a silicide material so as to cover inner wall surfaces of the openings respectively, and forming conductive plugs by filling up the openings with a conductive material via the base films.

A method of manufacturing a semiconductor device according to the present invention includes the steps of forming a conductive structure above a semiconductor substrate, forming a conductive layer containing a conductive material having conductivity even when oxidized above the conductive structure, forming an insulating film so as to cover the conductive structure and the conductive layer, forming in the insulating film openings which expose part of a surface of the conductive structure, and forming conductive plugs by filling up the openings with a conductive material.

A method of manufacturing a semiconductor device according to the present invention includes the steps of forming a conductive structure having a noble metal layer in an upper layer part thereof above a semiconductor substrate, forming an insulating film so as to cover the conductive structure, forming in the insulating film openings which expose part of a surface of the conductive structure, and forming conductive plugs by filling up the openings with a conductive material, in which, to the noble metal layer, a catalyst poisoning material which inhibits catalytic activity of the noble metal is added.

BRIEF DESCRIPTION OF THE DRAWINGS

FIG. 10A to FIG. 10E are schematic cross-sectional views showing a structure of an FeRAM according to modification example 3 of the first embodiment together with a manufacturing method thereof (main steps) in the order of steps;

FIG. 26A to FIG. 26E are schematic cross-sectional views showing a structure of an FeRAM according to modification example 10 of the first embodiment together with a manufacturing method thereof (main steps) in the order of steps;

FIG. 27A to FIG. 27E are schematic cross-sectional views showing a structure of an FeRAM according to modification example 11 of the first embodiment together with a manufacturing method thereof (main steps) in the order of steps;

FIG. 36A to FIG. 36D are schematic cross-sectional views showing the structure of the FeRAM according to the modification example 13 of the first embodiment together with the manufacturing method thereof (main steps) in the order of steps, continuing from FIG. 35D;

FIG. 58A to FIG. 58D are schematic cross-sectional views showing the structure of the FeRAM according to the modification example 7 of the second embodiment together with the manufacturing method thereof (main steps) in the order of steps, continuing from FIG. 57E;

FIG. 91A to FIG. 91D are schematic cross-sectional views showing the structure of the FeRAM according to the modification example 18 of the second embodiment together with the manufacturing method thereof (main steps) in the order of steps, continuing from FIG. 90E;

DETAILED DESCRIPTION OF THE PREFERRED EMBODIMENTS

Basic Gist of the Present Invention

The inventor of the present invention has devised an idea of providing a conductor impervious to oxygen between a ferroelectric capacitor structure and a conductive plug when forming the conductive plug which connects the ferroelectric capacitor structure and an upper wire of an FeRAM, in order to inhibit oxidation of the conductive plug. The present invention proposes the following structures which embody the conductor impervious to oxygen. In each of FIG. 1A to FIG. 1C, for simplicity of understanding, only a ferroelectric capacitor structure, a wire and a conductive plug connecting the both are shown, and descriptions of an insulating film and so on which bury them are omitted.

In basic structure (1), a silicide film that is a conductive film which does not easily allow permeation of oxygen is formed as a base film of the conductive plug.

Figure 1A:
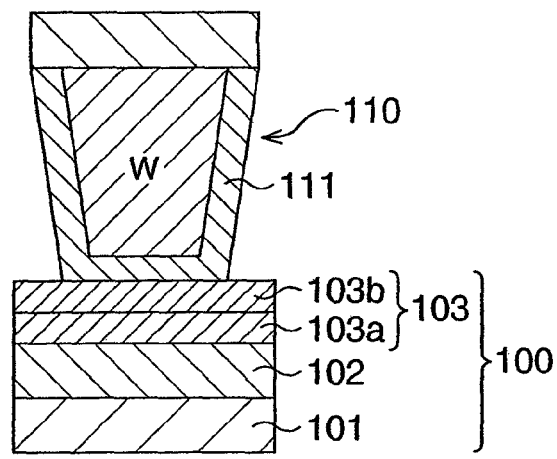
FIG. 1A to FIG. 1C are schematic cross-sectional views for explaining the basic gist of the present invention.

Particularly, as shown in FIG. 1A, a silicide film 111 is formed between a ferroelectric capacitor structure 100, which is formed by sandwiching a ferroelectric film 102 between a lower electrode 101 and an upper electrode 103, and a conductive plug 110 (a conductive material forming the plug is tungsten (W) for example). Here, an example is shown in which a base film of the conductive plug 110 is the silicide film 111 (having a film thickness of approximately 50 nm for example). The upper electrode 103 is formed by layering an $IrO_x$ film 103a (typically, x=2) which is a conductive oxide and a Pt film 103b which is a noble metal, and has a structure in which the Pt film 103b and the conductive plug 110 are separated by the silicide film 111. This silicide film 111 inhibits entrance into the conductive plug 110 of oxygen activated due to the $IrO_x$ film 103a, oxygen activated due to the Pt film 103b, and the like, thereby preventing oxidation of the conductive plug 110.

As the silicide film 111, for example, at least one type selected from Ti silicide, Co silicide, Mo silicide, Nb silicide, Ta silicide, W silicide, and V silicide is preferred.

In basic structure (2), a conductive layer constituted of a metal having conductivity even when oxidized is formed between the ferroelectric capacitor structure and the conductive plug.

Figure 1B:
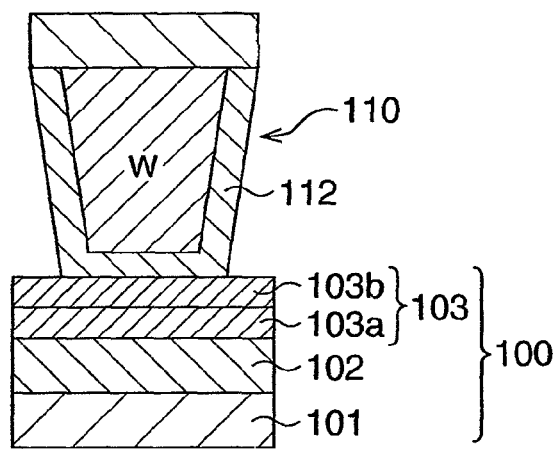

Particularly, as shown in FIG. 1B, a conductive layer 112 constituted of a conductive material (metal for example) having conductivity even when oxidized is formed between a ferroelectric capacitor structure 100, which is formed by sandwiching a ferroelectric film 102 between a lower electrode 101 and an upper electrode 103, and a conductive plug 110. Here, an example is shown in which a base film of the conductive plug 110 is the conductive layer 112 (having a film thickness of approximately 50 nm for example). The upper electrode 103 is formed by layering an $IrO_x$ film 103a (typically, x=2) which is a conductive oxide and a Pt film 103b which is a noble metal, and has a structure in which the Pt film 103b and the conductive plug 110 are separated by the conductive layer 112. This conductive layer 112 absorbs oxygen, so to speak due to oxidation of itself, but it does not impair the electrical connection function of the conductive plug 110 because it maintains conductivity even when oxidized. This conductive layer 112 inhibits entrance into the conductive plug 110 of oxygen activated due to the $IrO_x$ film 103a, oxygen activated due to the Pt film 103b, and the like, thereby preventing oxidation of the conductive plug 110.

As the conductive layer 112, for example, one containing at least one type selected from Ag, Ni, Cu, Zn, In, Sn, Ir, Ru, Rh, Pd, and Os is preferred.

In basic structure (3), when forming a noble metal layer as an upper layer part of a lower electrode, a catalyst poisoning material which inhibits catalytic activity of the noble metal is mixed in the noble metal layer.

Figure 1C:
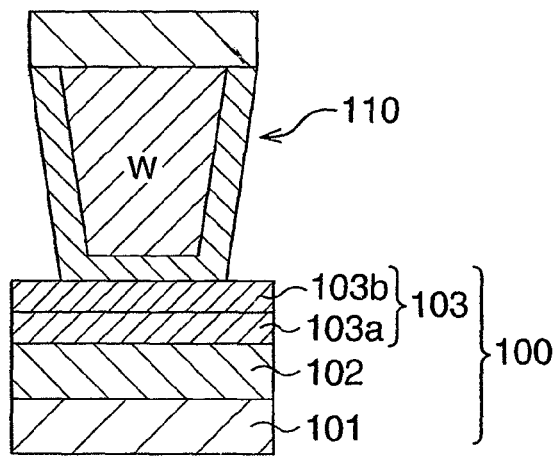

Particularly, as shown in FIG. 1C, in a ferroelectric capacitor structure 100 formed by sandwiching a ferroelectric film 102 by a lower electrode 101 and an upper electrode 103, when the upper electrode 103 is formed by layering an $IrO_x$ film 103a (typically, x=2) which is a conductive oxide and a Pt film 103b which is a noble metal, a catalyst poisoning material which inhibits catalytic activity of Pt is mixed in the Pt film 103b. This structure inhibits catalytic activity of oxygen in the Pt film 103b, thereby allowing the Pt film 103b to exhibit an oxidation preventing function, which is an original function thereof, without being disturbed by its own catalytic activity. This Pt film 103b inhibits entrance into the conductive plug 110 of oxygen activated due to the $IrO_x$ film 103a and inhibits activation of oxygen in the Pt film 103b, thereby preventing oxidation of the conductive plug 110 (here, a base film thereof is TiN for example).

As the catalyst poisoning material to be mixed in the Pt film 103b, for example, one containing at least one type selected from CO, chlorine compound, sulfur compound, phosphorous compound, and silicon compound is preferred.

In this point, the patent documents 1, 2 disclose structures using TiSiN for a base film of a W plug connected to the upper electrode. Here, TiSiN is provided to prevent diffusion of metal into an insulating film of the W plug, and although their compositions are similar, their functions are utterly different from those of the present invention, so that the both are different inventions.

Further, in the patent document 3, in order to prevent oxidation of a W plug, there is disclosed a structure such that TiAlN is formed on the W plug to make a so-called local interconnection. However, in order to use TiAlN as an oxidation preventing film for the W plug, it is essential to perform plasma processing, which poses a problem of complicating manufacturing steps.

In addition to the respective basic structure (1) to basic structure (3), in order to further inhibit entrance of hydrogen (and water) into the conductive plug 110, it is preferable that a conductive protection film (not shown; for example a nitride-based material (TiAlN or the like)) which inhibits permeation of hydrogen is formed above the silicide film 111 or below the silicide film 111 in the basic structure (1), above or below the conductive layer 112 in the basic structure (2), or above the Pt film 103b in the basic structure (3). This structure realizes inhibition of entrance of oxygen as well as inhibition of entrance of hydrogen into the conductive plug 110, and therefore it is possible to solve as far as possible a concerned matter of entrance of oxygen and hydrogen into the conductive plug, which is regarded as a problem for semiconductor memories having a capacitor structure, especially the ferroelectric capacitor structure, without unnecessarily complicating a structure as well as unnecessarily increasing manufacturing steps.

Here, in the basic structure (1), the above-described base film (corresponding to the silicide film 111) can be formed as one of the following two-layer structures:
1) a nitride-based material (TiAlN or the like) with a film thickness of approximately 50 nm/a silicide with a film thickness of approximately 20 nm; and
2) a silicide with a film thickness of approximately 50 nm/Ti with a film thickness of approximately 20 nm.

Also, in the basic structure (1), the above-described base film (corresponding to the silicide film 111) can be formed as the following three-layer structure:
a nitride-based material (TiAlN or the like) with a film thickness of approximately 50 nm/a silicide with a film thickness of approximately 10 nm to 20 nm/Ti with a film thickness of approximately 10 nm to 20 nm.

In the basic structure (2), the above-described base film (corresponding to the conductive layer 112) can be formed as one of the following two-layer structures:
1) a nitride-based material (TiAlN or the like) with a film thickness of approximately 50 nm/a conductive material having conductivity even when oxidized with a film thickness of approximately 20 nm; and
2) a conductive material having conductivity even when oxidized with a film thickness of approximately 50 nm/Ti with a film thickness of approximately 20 nm.

Also, in the basic structure (2), the above-described base film (corresponding to the conductive layer 112) can be formed as the following three-layer structure:
a nitride-based material (TiAlN or the like) with a film thickness of approximately 50 nm/a conductive material having conductivity even when oxidized with a film thickness of approximately 10 nm to 20 nm/Ti with a film thickness of approximately 10 nm to 20 nm.

A structure having the basic structures (1) and (2) together is also preferable. In this case, the above-described base film (corresponding to the silicide film 111 or the conductive layer 112) can be formed as one of the following two-layer structures:
1) a silicide with a film thickness of approximately 50 nm/a conductive material having conductivity even when oxidized with a film thickness of approximately 20 nm; and
2) a conductive material having conductivity even when oxidized with a film thickness of approximately 50 nm/a silicide with a film thickness of approximately 20 nm.

Also, in the structure having the basic structures (1) and (2) together, the above-described base film (corresponding to the silicide film 111 or the conductive layer 112) can be formed as one of the following three-layer structures:
1) a silicide with a film thickness of approximately 50 nm/a conductive material having conductivity even when oxidized with a film thickness of approximately 10 nm to 20 nm/Ti with a film thickness of approximately 10 nm to 20 nm;
2) a conductive material having conductivity even when oxidized with a film thickness of approximately 50 nm/a silicide with a film thickness of approximately 10 nm to 20 nm/Ti with a film thickness of approximately 10 nm to 20 nm;
3) a nitride-based material (TiAlN or the like) with a film thickness of approximately 50 nm/a conductive material having conductivity even when oxidized with a film thickness of approximately 10 nm to 20 nm/a silicide with a film thickness of approximately 10 nm to 20 nm; and
4) a nitride-based material (TiAlN or the like) with a film thickness of approximately 50 nm/a silicide with a film thickness of approximately 10 nm to 20 nm/a conductive material having conductivity even when oxidized with a film thickness of approximately 10 nm to 20 nm.

Also, in the structure having the basic structures (1) and (2) together, the above-described base film (corresponding to the silicide film 111 or the conductive layer 112) can be formed as one of the following four-layer structures:
1) a nitride-based material (TiAlN or the like) with a film thickness of approximately 50 nm/a conductive material having conductivity even when oxidized with a film thickness of approximately 10 nm to 20 nm/a silicide with a film thickness of approximately 10 nm to 20 nm/Ti with a film thickness of approximately 10 nm to 20 nm; and
2) a nitride-based material (TiAlN or the like) with a film thickness of approximately 50 nm/a silicide with a film thickness of approximately 10 nm to 20 nm/a conductive material having conductivity even when oxidized with a film thickness of approximately 10 nm to 20 nm/Ti with a film thickness of approximately 10 nm to 20 nm.

Note that in the above-described structure (1) to structure (3), a so-called planar type FeRAM is exemplified, in which conduction of the lower electrode and the upper electrode of the ferroelectric capacitor structure is provided on an upper side of the ferroelectric capacitor structure, but the present invention is not limited to this. For example, it is applicable to a so-called stack-type ferroelectric capacitor structure in which conduction of the lower electrode is provided on a lower side of the ferroelectric capacitor structure and conduction of the upper electrode is provided on an upper side of the ferroelectric capacitor structure.

Also, in the above-described structure (1) to structure (3), with the conductive structure of interest being the ferroelectric capacitor structure, mainly the prevention of oxidation of the conductive plug formed above the ferroelectric capacitor structure is described, but the present invention is not limited to this. For example, it is also preferable that the conductive structure of interest is wiring, and the structure (1) to structure (3) are applied to a conductive plug which connects the wires formed on an upper side of the ferroelectric capacitor structure with each other. For example, in an FeRAM, when respective wires at an upper layer are connected by a conductive plug, there is a problem that the conductive plug easily oxidizes due to generation of oxygen from the ferroelectric capacitor structure existing at a lower layer, but when these structures are adopted, oxidation of this conductive plug can be prevented similarly as described above.

SPECIFIC EMBODIMENTS TO WHICH THE PRESENT INVENTION IS APPLIED

Hereinafter, specific embodiments to which the present invention is applied will be described in detail with reference to the drawings. In the following embodiments, the cases of applying the present invention to an FeRAM will be exemplified, but it is also applicable to a semiconductor memory in which a general dielectric film is used for the capacitor structure.

First Embodiment

In this embodiment, a so-called planar type FeRAM will be exemplified, in which conduction of a lower electrode and an upper electrode of a ferroelectric capacitor structure is provided on an upper side of the ferroelectric capacitor structure. Note that for convenience of explanation, the structure of the FeRAM will be described together with a manufacturing method thereof.

FIG. 2A to FIG. 6B are schematic cross-sectional views showing a structure of an FeRAM according to the first embodiment together with a manufacturing method thereof in the order of steps.

Figure 2A:
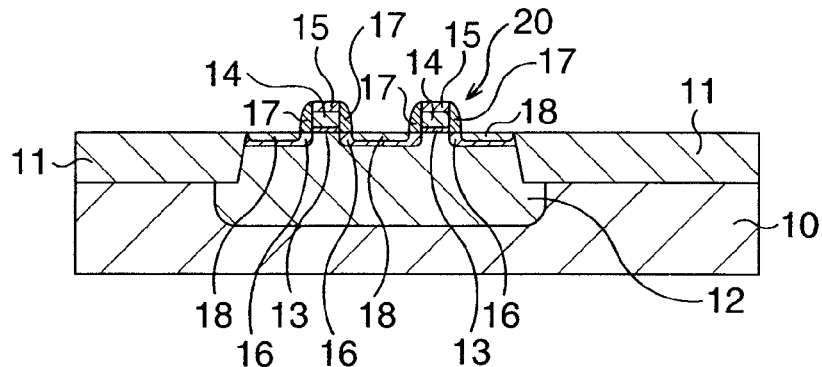
FIG. 2A to FIG. 2D are schematic cross-sectional views showing a structure of an FeRAM according to a first embodiment of the present invention together with a manufacturing method thereof in the order of steps.

First, as shown in FIG. 2A, a MOS transistor 20 which functions as a selection transistor is formed on a silicon semiconductor substrate 10.

Particularly, an element isolation structure 11 is formed on a surface layer of the silicon semiconductor substrate 10 by an STI (Shallow Trench Isolation) method for example to thereby define an element active region.

Next, an impurity, here B, is ion-implanted into the element active region under conditions of a dose amount of $3.0 \times 10^{13}/cm^2$ and acceleration energy of 300 keV for example, thereby forming a well 12.

Next, a thin gate insulating film 13 with a film thickness of approximately 3.0 nm is formed by thermal oxidation or the like on the element active region, and on the gate insulating film 13, a polycrystalline silicon film with a film thickness of approximately 180 nm and a silicon nitride film for example with a film thickness of approximately 29 nm are deposited by a CVD method. The silicon nitride film, the polycrystalline silicon film, and the gate insulating film 13 are processed in electrode forms by lithography and subsequent dry etching, thereby pattern-forming gate electrodes 14 on the gate insulating film 13. At this time, simultaneously, cap films 15 each constituted of a silicon nitride film are pattern-formed on the gate electrodes 14.

Next, using the cap films 15 as a mask, an impurity, here As, is ion-implanted into the element active region under conditions of a dose amount of $5.0 \times 10^{14}/cm^2$ and acceleration energy of 10 keV for example, thereby forming a so-called LDD region 16.

Next, a silicon oxide film for example is deposited on the entire surface thereof by a CVD method, and so-called etching back is performed on this silicon oxide film to leave the silicon oxide film only on side faces of the gate electrodes 14 and the cap films 15, thereby forming side wall insulating films 17.

Next, using the cap films 15 and the side wall insulating films 17 as a mask, an impurity, here P, is ion-implanted into the element active region under conditions for providing a higher impurity concentration than that in the LDD region 16, for example a dose amount of $5.0 \times 10^{14}/cm^2$ and acceleration energy of 13 keV, thereby forming a source/drain region 18 overlapping with the LDD region 16. Thus the MOS transistor 20 is completed.

Figure 2B:
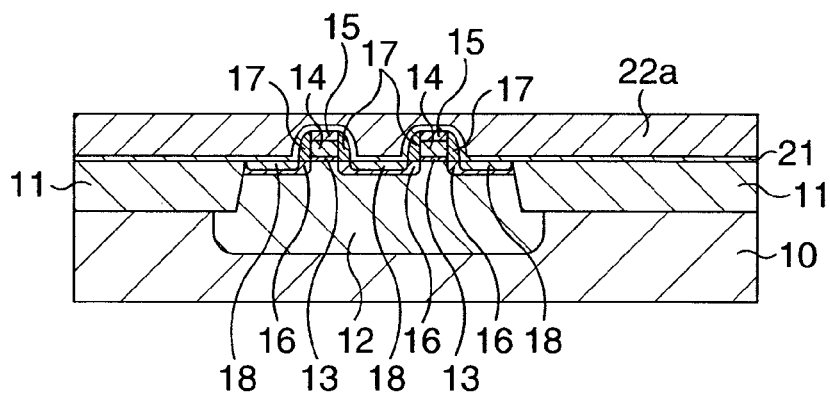

Subsequently, as shown in FIG. 2B, a protection film 21 and an interlayer insulating film 22a of the MOS transistor 20 are formed sequentially.

Particularly, the protection film 21 and the interlayer insulating film 22a are formed sequentially so as to cover the MOS transistor 20. Here, as the protection film 21, a silicon oxide film is used as a material and deposited with a film thickness of approximately 20 nm by a CVD method. As the interlayer insulating film 22a, a layered structure is formed such that, for example, a plasma SiO film (with a film thickness of approximately 20 nm), a plasma SiN film (with a film thickness of approximately 80 nm) and a plasma TEOS film (with a film thickness of approximately 1000 nm) are formed sequentially, and after layering them, polishing is performed by CMP until the film thickness becomes approximately 700 nm.

Figure 2C:
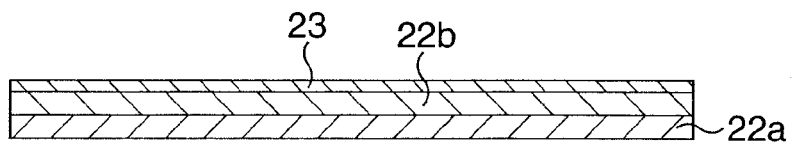

Subsequently, as shown in FIG. 2C, an interlayer insulating film 22b and a protection film 23 are formed sequentially. Note that in FIG. 2C and respective subsequent drawings, for convenience of illustration, only the structure of the interlayer insulating film 22a and above is shown, and the silicon semiconductor substrate 10, the MOS transistor 20, and so on are omitted therefrom.

Particularly, first, a silicon oxide film is deposited with a film thickness of approximately 100 nm on the interlayer insulating film 22a by a plasma CVD method using TEOS for example, thereby forming the interlayer insulating film 22b. Thereafter, the interlayer insulating film 22b is annealed. Conditions of this annealing are such that it is performed for 20 minutes to 45 minutes at 650° C. for example while supplying an $N^2$ gas at a flow rate of 20 liter/minute.

Next, on the interlayer insulating film 22b, the protection film 23 for preventing entrance of hydrogen and water into a ferroelectric film, which will be described later, of the ferroelectric capacitor structure is formed. As the protection film 23, alumina ($Al_2O_3$) is used as a material and deposited with a film thickness of approximately 20 nm to 50 nm by a sputtering method. Thereafter, the protection film 23 is annealed. Conditions of this annealing are such that it is performed for 30 seconds to 120 seconds at 650° C. for example while supplying an $O_2$ gas at a flow rate of 2 liter/minute.

Figure 2D:
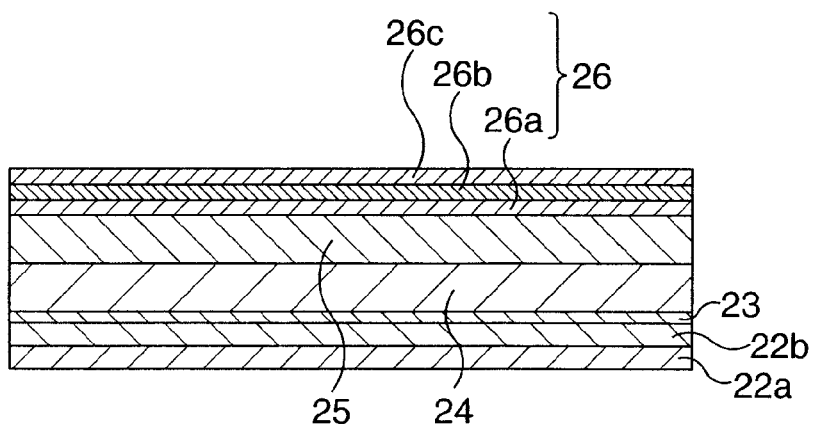

Subsequently, as shown in FIG. 2D, a lower electrode layer 24, a ferroelectric film 25 and an upper electrode layer 26 are formed sequentially.

Particularly, first, a Pt film is deposited with a film thickness of approximately 150 nm to 200 nm for example by a sputtering method, thereby forming the lower electrode layer 24.

Next, on the lower electrode layer 24, the ferroelectric film 25 constituted of PZT for example, which is a ferroelectric, is deposited with a film thickness of approximately 100 nm to 300 nm by an RF sputtering method. Then, the ferroelectric film 25 is annealed to crystallize the ferroelectric film 25. Conditions of this annealing are such that it is performed for 60 seconds to 120 seconds at 550° C. to 650° C. for example while supplying Ar/$O_2$ gases at flow rates of 1.98 liter/minute of Ar and 0.025 liter/minute of $O_2$.

Next, the upper electrode layer 26 is formed by deposition on the ferroelectric film 25.

As the upper electrode layer 26, first, an $IrO_2$ film 26a for example which is a conductive oxide is formed with a film thickness of approximately 30 nm to 70 nm by a reactive sputtering method. Thereafter, the $IrO_2$ film 26a is annealed. Conditions of this annealing are such that it is performed for 10 seconds to 60 seconds at 650° C. to 850° C. for example while supplying $Ar/O_2$ gases at flow rates of 2.0 liter/minute of Ar and 0.02 liter/minute of $O_2$. Next, on the $IrO_2$ film 26a, an $IrO_2$ film 26b is formed with a film thickness of approximately 150 nm to 300 nm by a reactive sputtering method. Then, on the $IrO_2$ film 26b, a noble metal film, here a Pt film 26c, which functions as a cap film for the $IrO_2$ film 26b is formed with a film thickness of approximately 100 nm by a sputtering method. The $IrO_2$ films 26a, 26b and the Pt film 26c constitute the upper electrode layer 26. Note that for the upper electrode layer 26, instead of the $IrO_2$ films 26a, 26b, a conductive oxide of Ir, Ru, $RuO_2$, $SrRuO_3$ or the like or a layered structure of them may be adopted. Further, it is also possible to omit formation of the Pt film 26c.

Figure 3A:
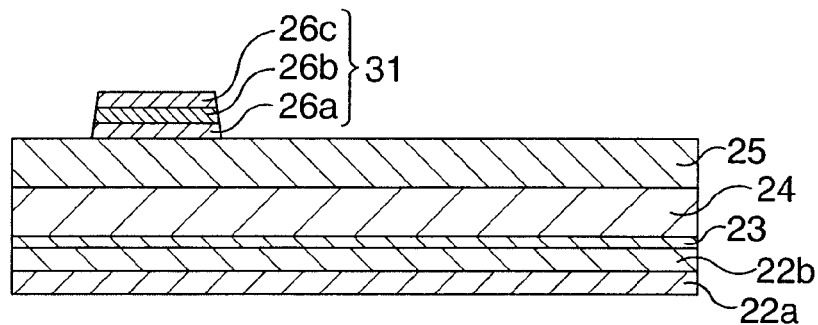
FIG. 3A to FIG. 3D are schematic cross-sectional views showing the structure of the FeRAM according to the first embodiment together with the manufacturing method thereof in the order of steps, continuing from FIG. 2D.

Subsequently, as shown in FIG. 3A, an upper electrode 31 is pattern-formed.

Particularly, the upper electrode layer 26 is processed in a form of a plurality of electrodes by lithography and subsequent dry etching, thereby pattern-forming the upper electrode 31.

Figure 3B:
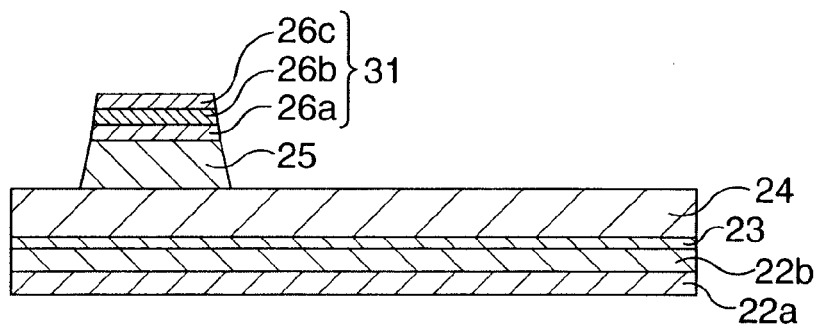

Subsequently, as shown in FIG. 3B, the ferroelectric film 25 is processed.

Particularly, the ferroelectric film 25 is processed by lithography and subsequent dry etching so as to match with the upper electrode 31. After this patterning of the ferroelectric film 25, the ferroelectric film 25 is annealed to recover the function of the ferroelectric film 25.

Figure 3C:
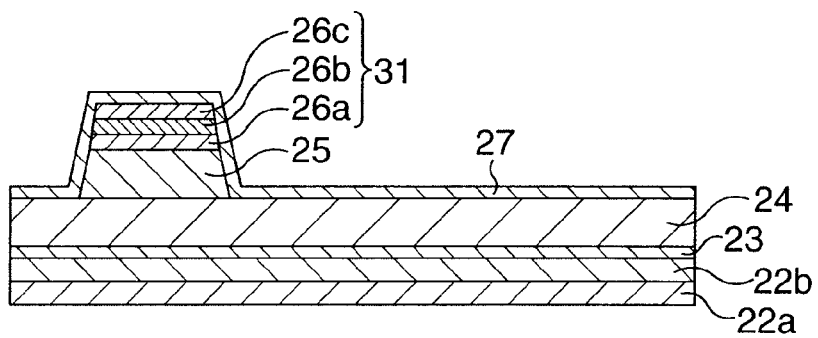

Subsequently, as shown in FIG. 3C, a protection film 27 for preventing entrance of hydrogen and water into the ferroelectric film 25 is formed.

Particularly, on the lower electrode layer 24, alumina ($Al_2O_3$) is used as a material and deposited by a sputtering method with a film thickness of approximately 50 nm so as to cover the ferroelectric film 25 and the upper electrode 31, thereby forming the protection film 27. Thereafter, the protection film 27 is annealed.

Figure 3D:
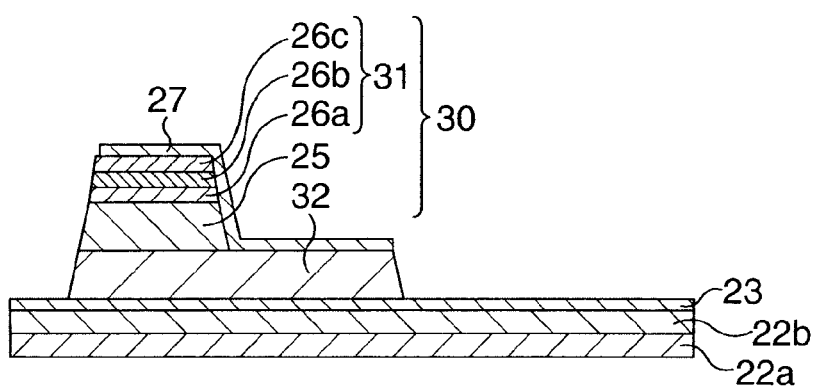

Subsequently, as shown in FIG. 3D, the protection film 27 is processed together with the lower electrode layer 24 to thereby complete the ferroelectric capacitor structure 30.

Particularly, the protection film 27 and the lower electrode layer 24 are processed by lithography and subsequent dry etching so that they match with the processed ferroelectric film 25 and the lower electrode layer 24 remains larger in size than the ferroelectric film 25, thereby pattern-forming a lower electrode 32. Thus the ferroelectric capacitor structure 30 is completed, in which the ferroelectric film 25 and the upper electrode 31 are layered sequentially on the lower electrode 32, and the lower electrode 32 and the upper electrode 31 are capacitively coupled via the ferroelectric film 25. At this time, simultaneously, the protection film 27 remains so as to cover the top face of the upper electrode 31, side faces of the upper electrode 31 and ferroelectric film 25, and the top face of the lower electrode layer 24. Thereafter, the protection film 27 is annealed.

Figure 4A:
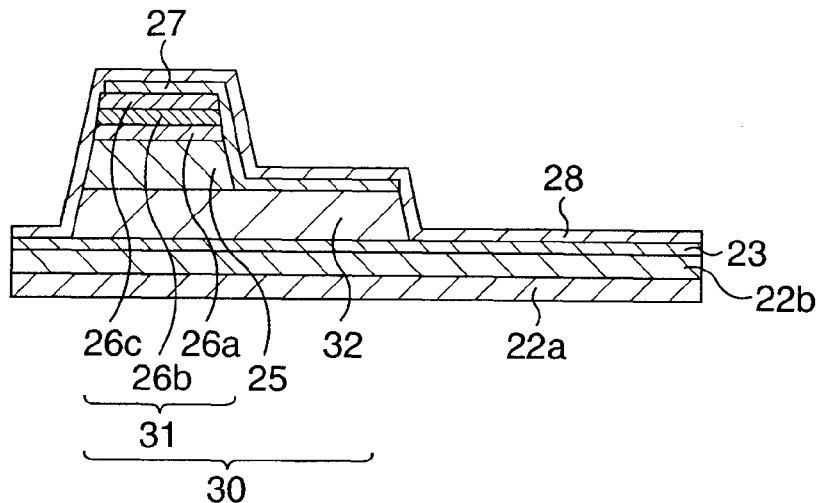
FIG. 4A to FIG. 4C are schematic cross-sectional views showing the structure of the FeRAM according to the first embodiment together with the manufacturing method thereof in the order of steps, continuing from FIG. 3D.

Subsequently, as shown in FIG. 4A, a protection film 28 is formed.

Particularly, alumina ($Al_2O_3$) is used as a material and deposited by a sputtering method with a film thickness of approximately 20 nm to 50 nm so as to cover the entire face of the ferroelectric capacitor structure 30, thereby forming the protection film 28. Thereafter, the protection film 28 is annealed.

Figure 4B:
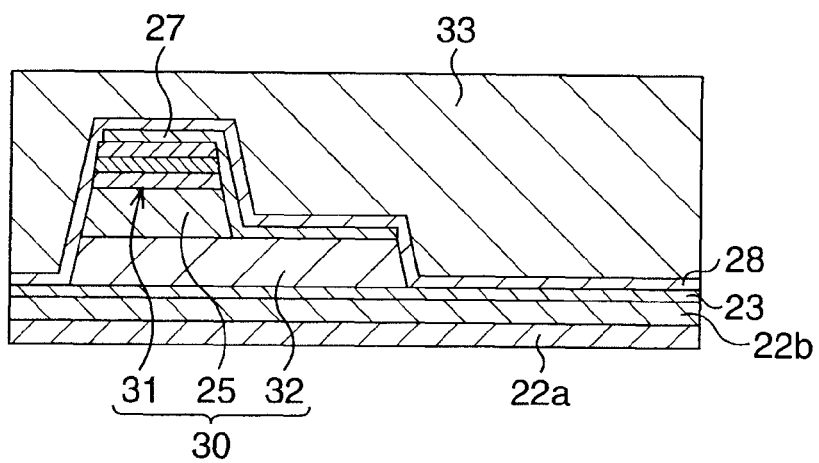

Subsequently, as shown in FIG. 4B, an interlayer insulating film 33 is formed.

Particularly, the interlayer insulating film 33 is formed so as to cover the ferroelectric capacitor structure 30 via the protection films 27, 28. Here, the interlayer insulating film 33 is formed such that a silicon oxide film is deposited with a film thickness of approximately 1500 nm to 2500 nm by a plasma CVD method using TEOS for example, and thereafter it is polished by CMP until the film thickness becomes approximately 1000 nm for example. After the CMP, for the purpose of dehydrating the interlayer insulating film 33, plasma annealing of $N_2O$ for example is performed.

Figure 4C:
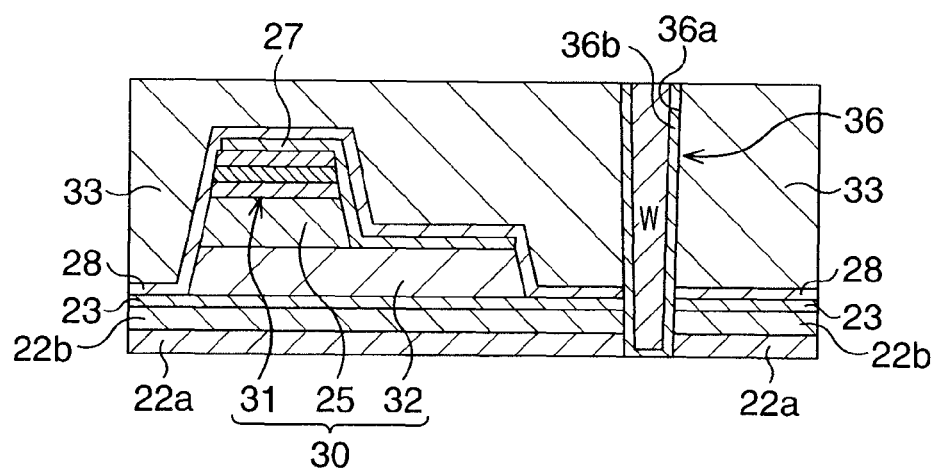

Subsequently, as shown in FIG. 4C, a plug 36 connected to the source/drain region 18 of the transistor structure 20 is formed.

Particularly, first, with the source/drain region 18 being an etching stopper, the interlayer insulating film 33, the protection films 28, 27, the interlayer insulating films 22b, 22a, and the protection film 21 are processed by lithography and subsequent dry etching until part of a surface of the source/drain region 18 exposes, thereby forming a via hole 36a with a diameter of approximately 0.3 μm for example.

Next, a Ti film and a TiN film for example are deposited sequentially with a film thickness of approximately 20 nm and a film thickness of approximately 50 nm respectively by a sputtering method so as to cover a wall surface of the via hole 36a, thereby forming a base film (glue film) 36b. Then, a W film for example is formed by a CVD method so as to fill up the via hole 36a via the glue film 36b. Thereafter, with the interlayer insulating film 33 being a stopper, the W film and the glue film 36b are polished by CMP, thereby forming the plug 36 in which the via hole 36a is filled up with W via the glue film 36b. After the CMP, plasma annealing of $N_2O$ for example is performed.

Figure 5A:
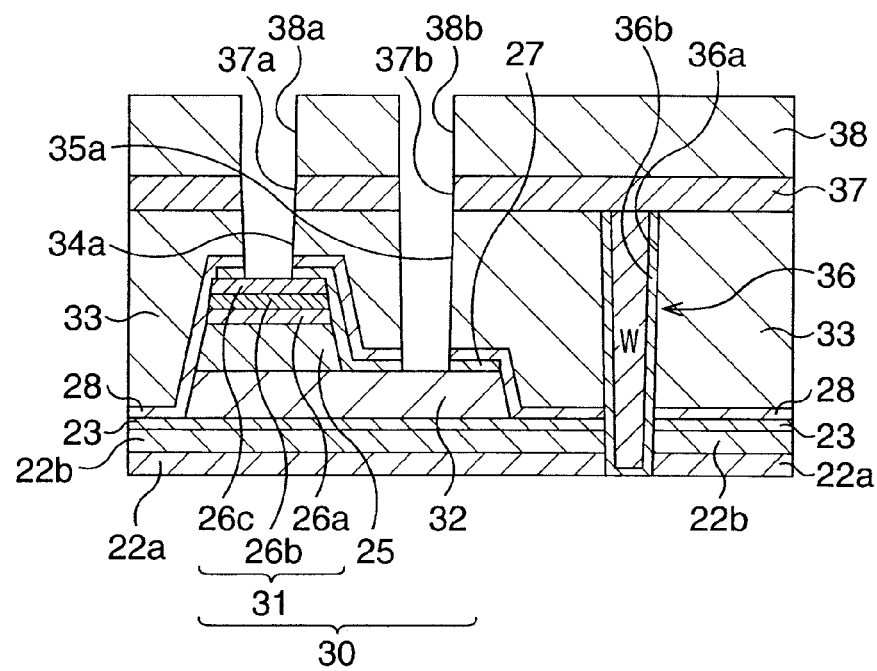
FIG. 5A to FIG. 5C are schematic cross-sectional views showing the structure of the FeRAM according to the first embodiment together with the manufacturing method thereof in the order of steps, continuing from FIG. 4C.

Subsequently, as shown in FIG. 5A, after a hard mask 37 and a resist mask 38 are formed, via holes 34a, 35a to the ferroelectric capacitor structure 30 are formed.

Particularly, first, a silicon nitride film is deposited by a CVD method with a film thickness of approximately 100 nm on the interlayer insulating film 33, thereby forming the hard mask 37. Next, a resist is applied on the hard mask 37, and the resist is processed by lithography to thereby form the resist mask 38 having openings 38a, 38b.

Next, using the resist mask 38, the hard mask 37 is dry-etched to form openings 37a, 37b at positions on the hard mask 37 which match with the openings 38a, 38b respectively.

Then, using mainly the hard mask 37, with the upper electrode 31 and the lower electrode 32 being etching stoppers respectively, the interlayer insulating film 33 and the protection films 28, 27 are dry-etched. In this dry etching, a process performed on the interlayer insulating film 33 and the protection films 28, 27 until part of a surface of the upper electrode 31 is exposed and a process performed on the interlayer insulating film 33 and the protection films 28, 27 until part of a surface of the lower electrode 32 is exposed are carried out simultaneously, so that the via holes 34a, 35a with a diameter of approximately 0.5 μm for example are formed simultaneously at the respective positions.

Figure 5B:
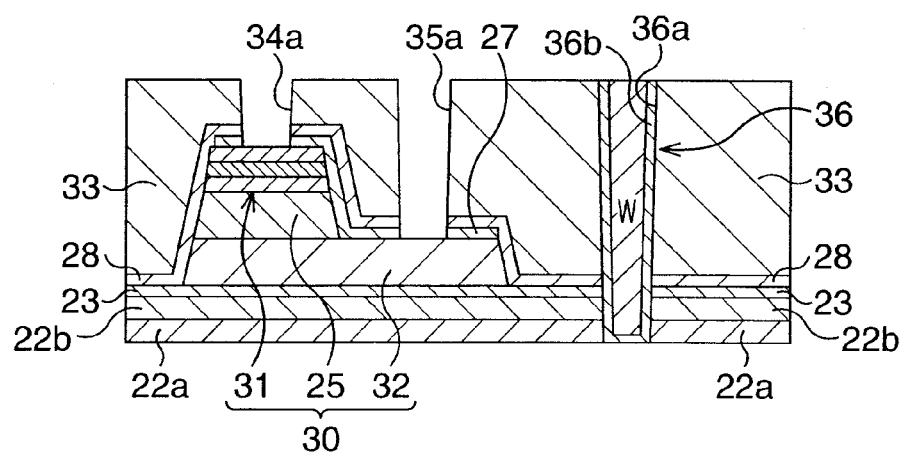

Subsequently, as shown in FIG. 5B, the resist mask 38 and the hard mask 37 are removed.

Particularly, first, the remained resist mask 38 is removed by ashing or the like. Thereafter, annealing is performed for recovering the ferroelectric capacitor structure 30 from damages received in steps after the ferroelectric capacitor structure 30 is formed. Then, by overall anisotropic etching, so called etch back, the hard mask 37 is removed.

Figure 5C:
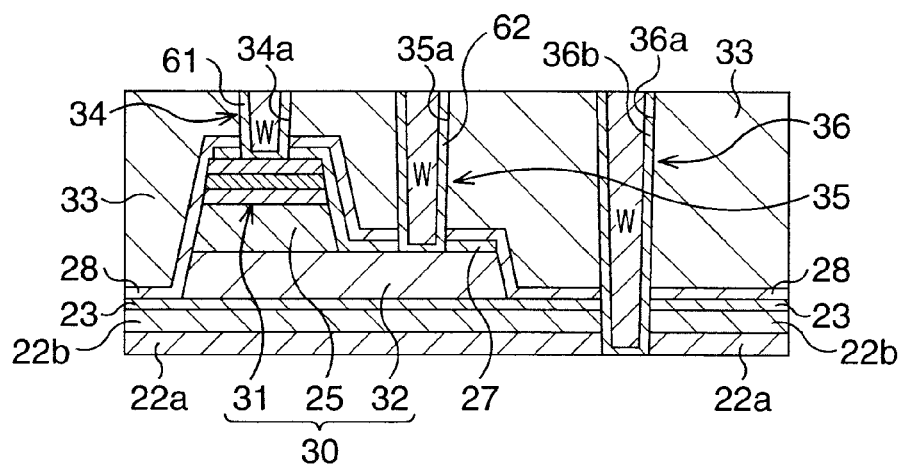

Subsequently, as shown in FIG. 5C, the plugs 34, 35 connected to the ferroelectric capacitor structure 30 are formed.

In this embodiment, in order to inhibit oxidation of the plugs 34, 35 due to oxygen generated from the upper electrode 31 (particularly, oxygen activated by the Pt film 26c), as conductors impervious to oxygen silicide films are formed as base films of the plugs 34, 35. Specifically, silicide films, for example Ti silicide (TiSi) films, are deposited with a film thickness of approximately 50 nm so as to cover respective wall surfaces of the via holes 34a, 35a, thereby forming base films (glue films) 61, 62. As the silicide films, at least one type selected from Ti silicide, Co silicide, No silicide, Nb silicide, Ta silicide, W silicide, and V silicide is used.

Here, when forming the silicide films, the silicide films are grown at a low temperature of 350° C. or lower by a sputtering method or a CVD method. A low temperature of this degree does not deteriorate the ferroelectric film 25 of the ferroelectric capacitor structure 30. When the present invention is applied to a semiconductor memory having a general capacitor structure which is not the ferroelectric capacitor structure, it is not necessary to form the silicide films particularly at a low temperature, so that the silicide films may be formed by annealing at approximately 700° C. for example.

Then, for example W films are formed by a CVD method so as to fill up the via holes 34a, 35a via the glue films 61, 62 respectively. Thereafter, with the interlayer insulating film 33 being a stopper, the W films and the glue films 61, 62 are polished by CMP, thereby forming the plugs 34, 35 in which the via holes 34a, 35a are filled up with W via the glue films 61, 62 respectively. After the CMP, plasma annealing of $N_2O$ for example is performed.

In this example, the W filling up the via holes 34a, 35a are covered from bottom faces to side faces by the glue films 61, 62 which are the silicide films impervious to oxygen, and the W and the upper electrode 31 are separated by the glue films 61, 62. Therefore, entrance into the plugs 34, 35 of oxygen activated due to the $IrO_2$ films 26a, 26b constituting the upper electrode 31, oxygen activated due to the Pt film 26c, and the like is inhibited, thereby preventing oxidation of the plugs 34, 35.

Note that in this embodiment, the case of applying the silicide film to the glue films of the plugs 34, 35 connected to the ferroelectric capacitor structure 30 is exemplified, but similarly the silicide film and a conductive protection film which inhibits permeation of hydrogen may be applied to the glue film of the plug 36 connected to the MOS transistor 20.

Figure 6A:
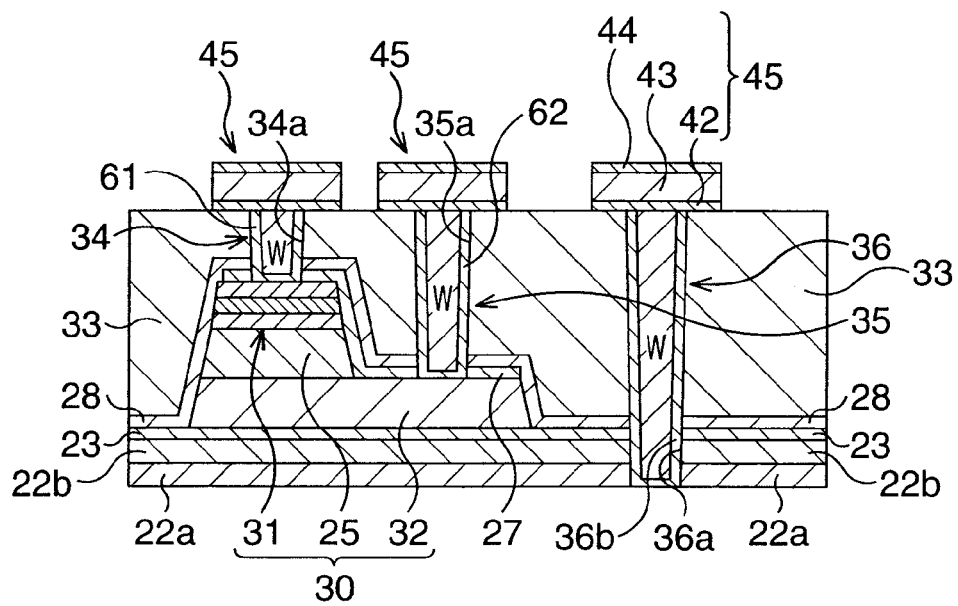
FIG. 6A and FIG. 6B are schematic cross-sectional views showing the structure of the FeRAM according to the first embodiment together with the manufacturing method thereof in the order of steps, continuing from FIG. 5C.

Subsequently, as shown in FIG. 6A, first wires 45 connected respectively to the plugs 34, 35, 36 are formed.

Particularly, first, a barrier metal film 42, a wiring film 43 and a barrier metal film 44 are deposited by a sputtering method or the like on the entire surface of the interlayer insulating film 33. As the barrier metal film 42, a TiN film for example is formed with a film thickness of approximately 150 nm by a sputtering method. As the wiring film 43, an Al alloy film (here an Al—Cu film) for example is formed with a film thickness of approximately 350 nm. As the barrier metal film 44, a TiN film for example is formed with a film thickness of approximately 150 nm by a sputtering method. Here, the structure of the wiring film 43 is the same as that of a logic part other than the FeRAM of the same rules, so that there is no problem in processing of wires or reliability thereof.

Next, as a reflection preventing film, for example an SiON film (not-shown) is formed, and thereafter the reflection preventing film, the barrier metal film 44, the wiring film 43 and the barrier metal film 42 are processed in a wiring form by lithography and subsequent dry etching, thereby patternforming the respective first wires 45 connected respectively to the plugs 34, 35, 36. Note that instead of forming the Al alloy film as the wiring film 43, a Cu film (or a Cu alloy film) may be formed using a so-called damascene method or the like to thereby form Cu wires as the first wires 45.

Figure 6B:
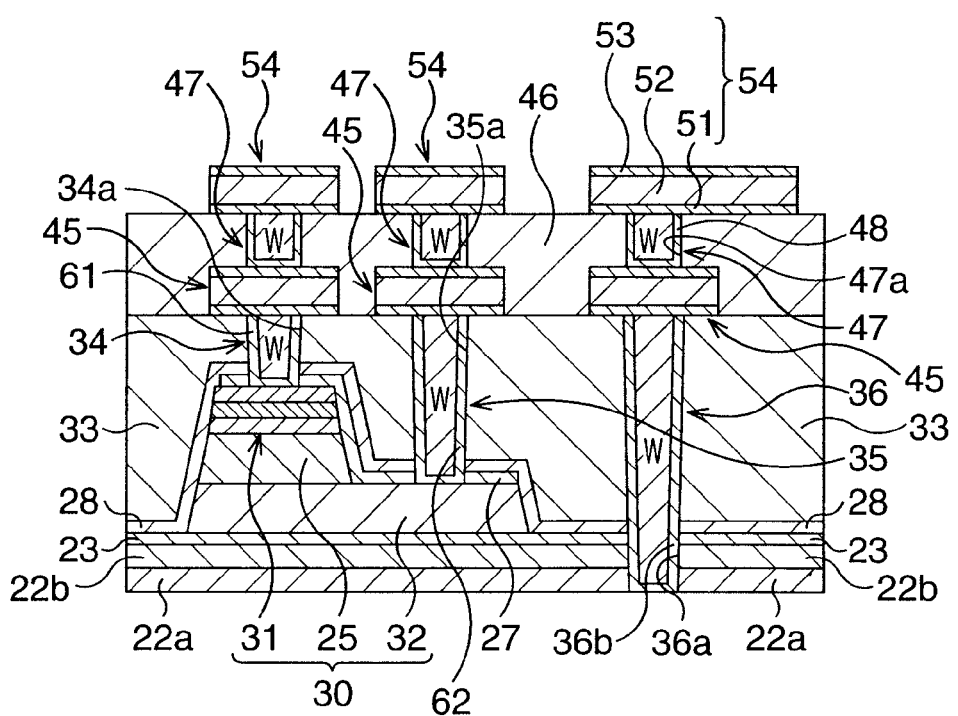

Subsequently, as shown in FIG. 6B, second wires 54 connected to the first wires 45 are formed.

Particularly, first, an interlayer insulating film 46 is formed so as to cover the first wires 45. As the interlayer insulating film 46, a silicon oxide film is formed with a film thickness of approximately 700 nm, and a plasma TEOS film is formed so that a total film thickness thereof is approximately 1100 nm. Thereafter, the surface thereof is polished by CMP to make the film thickness approximately 750 nm.

Next, plugs 47 connected to the first wires 45 are formed.

Until part of surfaces of the first wires 45 expose, the interlayer insulating film 46 is processed by lithography and subsequent dry etching, thereby forming via holes 47a with a diameter of approximately 0.25 μm for example. Next, base films (glue films) 48 are formed so as to cover wall surfaces of the via holes 47a, and thereafter W films are formed so as to fill up the via holes 47a via the glue films 48 by a CVD method. Then, with the interlayer insulating film 46 being a stopper, the W films and the glue films 48 for example are polished, thereby forming the plugs 47 in which the via holes 47a are filled up with W via the glue films 48.

Next, the second wires 54 connected respectively to the plugs 47 are formed.

First, a barrier metal film 51, a wiring film 52 and a barrier metal film 53 are deposited on the entire surface by a sputtering method or the like. As the barrier metal film 51, a TiN film for example is formed with a film thickness of approximately 150 nm by a sputtering method. As the wiring film 52, an Al alloy film (here an Al—Cu film) for example is formed with a film thickness of approximately 350 nm. As the barrier metal film 53, a TiN film for example is formed with a film thickness of approximately 150 nm by a sputtering method. Here, the structure of the wiring film 52 is the same as that of a logic part other than the FeRAM of the same rules, so that there is no problem in processing of wires or reliability thereof.

Next, as a reflection preventing film, for example an SiON film (not-shown) is formed, and thereafter the reflection preventing film, the barrier metal film 53, the wiring film 52 and the barrier metal film 51 are processed in a wiring form by lithography and subsequent dry etching, thereby patternforming the respective second wires 54. Note that instead of forming the Al alloy film as the wiring film 52, a Cu film (or a Cu alloy film) may be formed using a so-called damascene method or the like to thereby form Cu wires as the second wires 54.

Thereafter, steps of forming an interlayer insulating film and a further upper layer wire, and so on are performed, thereby completing the planar type FeRAM according to this embodiment.

As described above, according to this embodiment, oxidation of the plugs 34, 35 connected to the ferroelectric capacitor structure 30 is inhibited, so that a highly reliable planar type FeRAM having stabilized contact resistance can be realized.

MODIFICATION EXAMPLES

Here, modification examples of the first embodiment will be described. Note that components and the like corresponding to those in the first embodiment are designated the same numerals.

Modification Example 1

In this example, similarly to the first embodiment, a structure of a planar type FeRAM and a manufacturing method thereof will be disclosed, but this example is different in that the glue films of the conductive plugs connected to the ferroelectric capacitor structure 30 are formed as a layered structure of a silicide film and a conductive protection film preventing entrance of hydrogen.

Figure 7A:
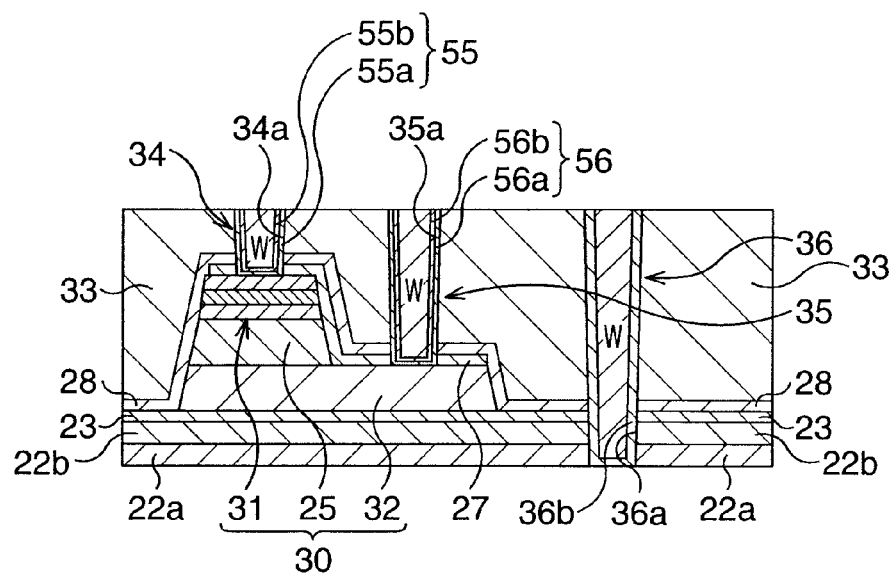
FIG. 7A and FIG. 7B are schematic cross-sectional views showing a structure of an FeRAM according to modification example 1 of the first embodiment together with a manufacturing method thereof (main steps) in the order of steps.
Figure 7B:
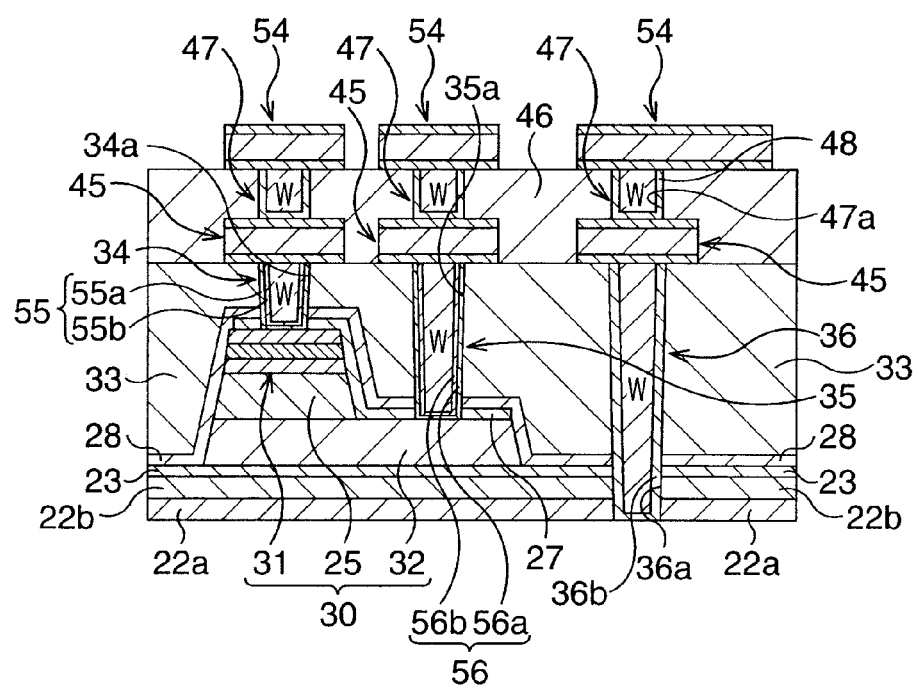

FIG. 7A and FIG. 7B are schematic cross-sectional views showing a structure of an FeRAM according to modification example 1 of the first embodiment together with a manufacturing method thereof (main steps) in the order of steps.

First, similarly to the first embodiment, the respective steps of FIG. 2A to FIG. 5B are performed.

Subsequently, as shown in FIG. 7A, plugs 34, 35 connected to the ferroelectric capacitor structure 30 are formed.

In this example, in order to inhibit oxidation of the plugs 34, 35 due to oxygen generated from the upper electrode 31 (particularly, oxygen activated by the Pt film 26c) and to prevent entrance of hydrogen into the plugs 34, 35, as a conductor impervious to oxygen the base films of the plugs 34, 35 are each formed with a silicide film and a film which inhibits entrance of hydrogen. Specifically, silicide films 55a, 56a, for example Ti silicide (TiSi) films (with a film thickness of approximately 20 nm) and conductive protection films which inhibit permeation of hydrogen, for example TiN films 55b, 56b (with a film thickness of approximately 50 nm) are deposited sequentially so as to cover respective wall surfaces of the via holes 34a, 35a, thereby forming base films (glue films) 55, 56 of layered structure.

Here, when forming the silicide films 55a, 56a, the silicide films are grown at a low temperature of 350° C. or lower by a sputtering method or a CVD method. A low temperature of this degree does not deteriorate the ferroelectric film 25 of the ferroelectric capacitor structure 30. When the present invention is applied to a semiconductor memory having a general capacitor structure which is not the ferroelectric capacitor structure, it is not necessary to form the silicide films particularly at a low temperature, so that the silicide films may be formed by annealing at approximately 700° C. for example.

As the silicide films 55a, 56a, at least one type selected from Ti silicide, Co silicide, No silicide, Nb silicide, Ta silicide, W silicide, and V silicide is used. Further, as the conductive protection films which inhibit permeation of hydrogen, at least one type selected from TiN, TiSiN, TaN, CrN, HfN, ZrN, TiAlN, TaAlN, CrAlN, and HfAlN is used.

Then, for example W films are formed by a CVD method so as to fill up the via holes 34a, 35a via the glue films 55, 56 respectively. Thereafter, with the interlayer insulating film 33 being a stopper, the W films and the glue films 55, 56 are polished by CMP, thereby forming the plugs 34, 35 in which the via holes 34a, 35a are filled up with W via the glue films 55, 56 respectively. After the CMP, plasma annealing of $N_2O$ for example is performed.

In this example, the W filling up the via holes 34a, 35a are covered from bottom faces to side faces by the glue films 55, 56 formed as the layered structure of the silicide film impervious to oxygen and the conductive protection film which inhibits permeation of hydrogen, and the W and the upper electrode 31 are separated by the glue films 55, 56. Therefore, entrance into the plugs 34, 35 of oxygen activated due to the $IrO_2$ films 26a, 26b constituting the upper electrode 31, oxygen activated due to the Pt film 26c, and the like is inhibited, thereby preventing oxidation of the plugs 34, 35 as well as preventing entrance of hydrogen into the plugs 34, 35.

Then, similarly to the first embodiment, the respective steps of FIG. 6A and FIG. 6B are performed to obtain the structure shown in FIG. 7B.

Thereafter, steps of forming an interlayer insulating film and a further upper layer wire, and so on are performed, thereby completing the planar type FeRAM according to this example.

Note that in this example, the case of applying the layered films of the silicide film and the conductive protection film which inhibits permeation of hydrogen to the glue films of the plugs 34, 35 connected to the ferroelectric capacitor structure 30 is exemplified, but similarly the layered films may be applied to the glue film of the plug 36 connected to the MOS transistor 20.

Figure 8:
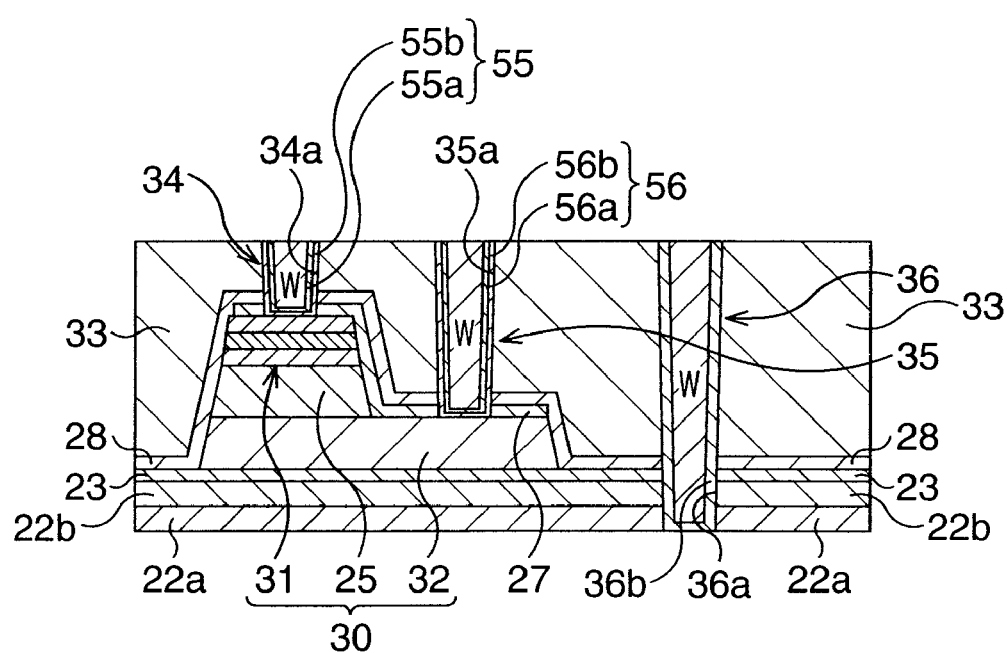
FIG. 8 is a schematic cross-sectional view showing a structure of an FeRAM according to another example of the modification example 1 of the first embodiment.

Further, in this example, the glue films 55, 56 are formed as the layered structure of the silicide films 55a, 56a and the TiN films 55b, 56b, but as shown in FIG. 8 (corresponding to FIG. 7A), the layered state of respective films may be inverted, thereby forming the glue films 55, 56 as layered structures of the TiN films 55b, 56b and the silicide films 55a, 56a, respectively.

As described above, according to this example, oxidation of the plugs 34, 35 connected to the ferroelectric capacitor structure 30 is inhibited, and also entrance of hydrogen into the plugs 34, 35 is inhibited, so that a highly reliable planar type FeRAM with stabilized contact resistance can be realized.

Modification Example 2

In this example, similarly to the first embodiment, a structure of a planar type FeRAM and a manufacturing method thereof will be disclosed, but this example is different in that a silicide film is applied to the glue films of the conductive plugs connecting the wires located at an upper layer of the ferroelectric capacitor structure 30.

FIG. 9A to FIG. 9E are schematic cross-sectional views showing a structure of an FeRAM according to modification example 2 of the first embodiment together with a manufacturing method thereof (main steps) in the order of steps.

First, similarly to the first embodiment, the respective steps of FIG. 2A to FIG. 6A are performed.

Figure 9A:
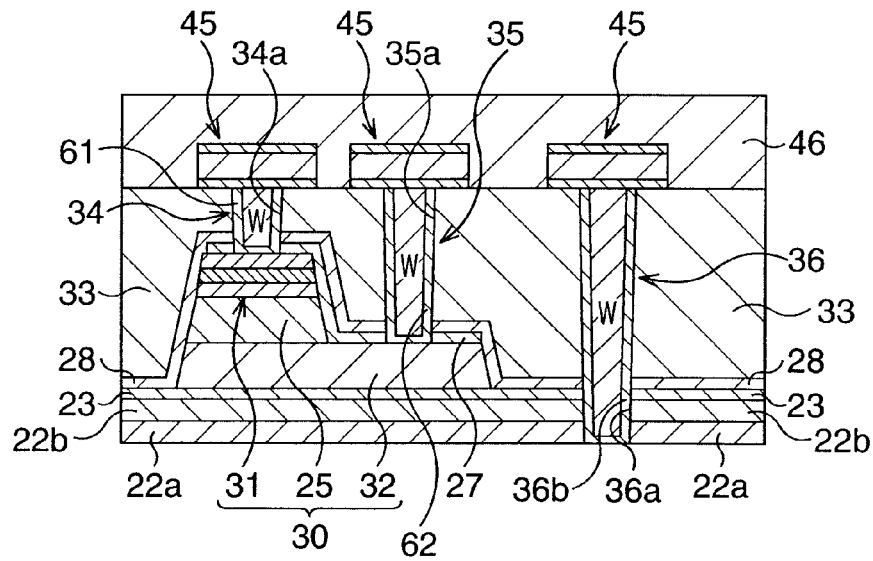
FIG. 9A to FIG. 9E are schematic cross-sectional views showing a structure of an FeRAM according to modification example 2 of the first embodiment together with a manufacturing method thereof (main steps) in the order of steps.

Subsequently, as shown in FIG. 9A, an interlayer insulating film 46 is formed so as to cover the first wires 45.

Particularly, a silicon oxide film is formed with a film thickness of approximately 700 nm so as to cover the first wires 45, and a plasma TEOS film is formed thereon so that a total film thickness thereof is approximately 1100 nm. Thereafter, the surface thereof is polished by CMP to make the film thickness approximately 750 nm, thereby forming the interlayer insulating film 46. After the CMP, plasma annealing of $N_2O$ for example is performed.

Figure 9B:
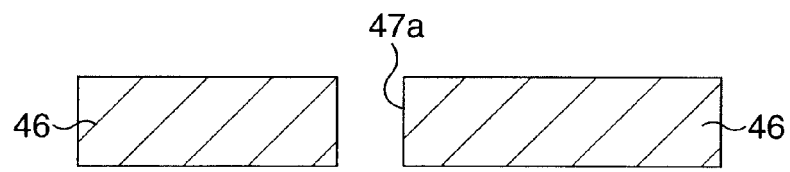

Subsequently, as shown in FIG. 9B, via holes 47a which expose surfaces of the first wires 45 are formed. Note that in FIG. 9B and respective subsequent drawings, for convenience of illustration, only the structure of the interlayer insulating film 46 and above is shown, and the ferroelectric capacitor structure 30, the first wires 45, and so on are omitted therefrom. Here, a plug 47 which is connected to one of the respective first wires 45 connected to the plugs 34, 35, 36 (for example the first wire 45 connected to the plug 35) is shown representatively.

Particularly, until part of a surface of the first wire 45 exposes, the interlayer insulating film 46 is processed by lithography and subsequent dry etching, thereby forming a via hole 47a with a diameter of approximately 0.25 μm for example.

Figure 9C:
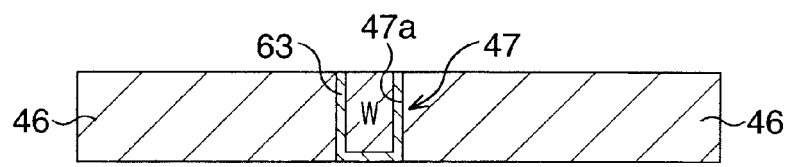

Subsequently, as shown in FIG. 9C, the plug 47 connected to the first wire 45 is formed.

Particularly, in order to inhibit oxidation of the plug 47 due to oxygen generated from the ferroelectric capacitor structure 30 (particularly, oxygen activated by the Pt film 26c), as a conductor impervious to oxygen a base film of the plug 47 is formed with a silicide film. Specifically, a silicide film, for example a Ti silicide (TiSi) film is formed with a film thickness of approximately 20 nm to 50 nm on the interlayer insulating film 46 so as to cover an inner wall surface of the via hole 47a, thereby forming a base film (glue film) 63. As the silicide film, at least one type selected from Ti silicide, Co silicide, Mo silicide, Nb silicide, Ta silicide, W silicide, and V silicide is used.

Here, when forming the silicide film, the silicide film is grown at a low temperature of 350° C. or lower by a sputtering method or a CVD method. A low temperature of this degree does not deteriorate the ferroelectric film 25 of the ferroelectric capacitor structure 30. When the present invention is applied to a semiconductor memory having a general capacitor structure which is not the ferroelectric capacitor structure, it is not necessary to form the silicide film particularly at a low temperature, so that the silicide film may be formed by annealing at approximately 700° C. for example.

Then, a W film for example is formed by a CVD method so as to fill up the via hole 47a via the glue film 63. Thereafter, with the interlayer insulating film 46 being a stopper, the W film and the glue film 63 are polished by CMP, thereby forming the plug 47 in which the via hole 47a is filled up with W via the glue film 63.

In this example, the W filling up the via hole 47a is covered from a bottom face to a side face by the glue film 63 which is the silicide film impervious to oxygen, and the W and the ferroelectric capacitor structure 30 existing at a lower layer thereof are separated by the glue film 63. Therefore, entrance into the plug 47 of oxygen activated due to the IrO₂ films 26a, 26b constituting the upper electrode 31, oxygen activated due to the Pt film 26c, and the like is inhibited, thereby preventing oxidation of the plug 47.

Note that in this example, the case of applying the silicide film to the glue films of the plugs 34, connected to the ferroelectric capacitor structure 30, and also applying the silicide film to the glue film of the plug 47 connected to the first wire 45 is exemplified, but when attaching much weight to the achievement of preventing oxidation of the plug 47 in particular, the silicide film may be applied only to the glue film of the plug 47 connected to the first wire 45.

Figure 9D:
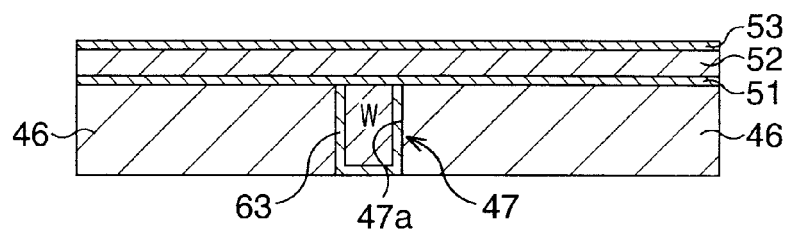

Subsequently, as shown in FIG. 9D, a barrier metal film 51, a wiring film 52 and a barrier metal film 53 are deposited on the entire surface by a sputtering method or the like.

Particularly, as the barrier metal film 51, a TiN film for example is formed with a film thickness of approximately 150 nm by a sputtering method. As the wiring film 52, an Al alloy film (here an Al—Cu film) for example is formed with a film thickness of approximately 350 nm. As the barrier metal film 53, a TiN film for example is formed with a film thickness of approximately 150 nm by a sputtering method. Here, the structure of the wiring film 52 is the same as that of a logic part other than the FeRAM of the same rules, so that there is no problem in processing of wires or reliability thereof.

Figure 9E:
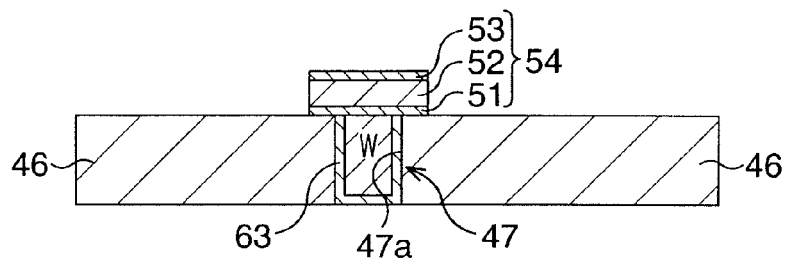

Subsequently, as shown in FIG. 9E, a second wire 54 connected to the plug 47 is formed.

Particularly, as a reflection preventing film, for example an SiON film or a reflection preventing film (not-shown) is formed, and thereafter the reflection preventing film, the barrier metal film 53, the wiring film 52 and the barrier metal film 51 are processed in a wiring form by lithography and subsequent dry etching, thereby pattern-forming the second wire 54.

Thereafter, steps of forming an interlayer insulating film and a further upper layer wire, and so on are performed, thereby completing the planar type FeRAM according to this example. Here, when forming further upper layer wires, a silicide film as described above is applied to a glue film of a plug (a plug constituted of W) connecting the upper layer wires, similarly to the plug 47.

As described above, according to this example, oxidation of the plugs 34, 35 connected to the ferroelectric capacitor structure 30 as well as the plugs 47 connected to the first wires 45 is inhibited, so that a highly reliable planar type FeRAM with stabilized contact resistance can be realized.

Modification Example 3

In this example, similarly to the first embodiment, a structure of a planar type FeRAM and a manufacturing method thereof will be disclosed, but this example is different in that a silicide film is applied to the glue films of the conductive plugs connecting the wires located at an upper layer of the ferroelectric capacitor structure 30.

FIG. 10A to FIG. 10E are schematic cross-sectional views showing a structure of an FeRAM according to modification example 3 of the first embodiment together with a manufacturing method thereof (main steps) in the order of steps.

First, similarly to the first embodiment, the respective steps of FIG. 2A to FIG. 6A are performed.

Subsequently, as shown in FIG. 10A, an interlayer insulating film 46 is formed so as to cover the first wires 45.

Particularly, a silicon oxide film is formed with a film thickness of approximately 700 nm so as to cover the first wires 45, and a plasma TEOS film is formed thereon so that a total film thickness thereof is approximately 1100 nm. Thereafter, the surface thereof is polished by CMP to make the film thickness approximately 750 nm, thereby forming the interlayer insulating film 46. After the CMP, plasma annealing of N₂O for example is performed.

Subsequently, as shown in FIG. 10B, via holes 47a which expose surfaces of the first wires 45 are formed. Note that in FIG. 10B and respective subsequent drawings, for convenience of illustration, only the structure of the interlayer insulating film 46 and above is shown, and the ferroelectric capacitor structure 30, the first wires 45, and so on are omitted therefrom. Here, a plug 47 which is connected to one of the respective first wires 45 connected to the plugs 34, 35, 36 (for example the first wire 45 connected to the plug 35) and so on are shown representatively.

Particularly, until part of a surface of the first wire 45 exposes, the interlayer insulating film 46 is processed by lithography and subsequent dry etching, thereby forming a via hole 47a with a diameter of approximately 0.25 μm for example.

Subsequently, as shown in FIG. 10C, the plug 47 connected to the first wire 45 is formed.

Particularly, in order to inhibit oxidation of the plug 47 due to oxygen generated from the ferroelectric capacitor structure 30 (particularly, oxygen activated by the Pt film 26c), as a conductor impervious to oxygen a base film of the plug 47 is formed with a silicide film. Specifically, a silicide film, for example a Ti silicide (TiSi) film is formed with a film thickness of approximately 20 nm to 50 nm on the interlayer insulating film 46 so as to cover an inner wall surface of the via hole 47a, thereby forming a base film (glue film) 63a. As the silicide film, at least one type selected from Ti silicide, Co silicide, Mo silicide, Nb silicide, Ta silicide, W silicide, and V silicide is used.

Here, when forming the silicide film, the silicide film is grown at a low temperature of 350° C. or lower by a sputtering method or a CVD method. A low temperature of this degree does not deteriorate the ferroelectric film 25 of the ferroelectric capacitor structure 30. When the present invention is applied to a semiconductor memory having a general capacitor structure which is not the ferroelectric capacitor structure, it is not necessary to form the silicide film particularly at a low temperature, so that the silicide film may be formed by annealing at approximately 700° C. for example.

Then, a W film for example is formed by a CVD method so as to fill up the via hole 47a via the glue film 63a. Thereafter, with the interlayer insulating film 46 being a stopper, the W film and the glue film 63a are polished by CMP, thereby forming the plug 47 in which the via hole 47a is filled up with W via the glue film 63a.

Subsequently, as shown in FIG. 10D, a silicide film 63b, a barrier metal film 51, a wiring film 52 and a barrier metal film 53 are deposited on the entire surface by a sputtering method or the like.

Particularly, the silicide film 63b is formed using, similarly to the glue film 63a, a Ti silicide with a film thickness of approximately 200 nm. As the silicide film 63b, at least one type selected from Ti silicide, Co silicide, No silicide, Nb silicide, Ta silicide, W silicide, and V silicide is used.

Here, similarly to the glue film 63a, when forming the silicide film 63b, the silicide film is grown at a low temperature of 350° C. or lower by a sputtering method or a CVD method. A low temperature of this degree does not deteriorate the ferroelectric film 25 of the ferroelectric capacitor structure 30. When the present invention is applied to a semiconductor memory having a general capacitor structure which is not the ferroelectric capacitor structure, it is not necessary to form the silicide film particularly at a low temperature, so that the silicide film may be formed by annealing at approximately 700° C. for example.

As the barrier metal film 51, a TiN film for example is formed with a film thickness of approximately 150 nm by a sputtering method. As the wiring film 52, an Al alloy film (here an Al—Cu film) for example is formed with a film thickness of approximately 350 nm. As the barrier metal film 53, a TiN film for example is formed with a film thickness of approximately 150 nm by a sputtering method. Here, the structure of the wiring film 52 is the same as that of a logic part other than the FeRAM of the same rules, so that there is no problem in processing of wires or reliability thereof.

Subsequently, as shown in FIG. 10E, a second wire 54 connected to the plug 47 is formed.

Particularly, as a reflection preventing film, for example an SiON film or a reflection preventing film (not-shown) is formed, and thereafter the reflection preventing film, the barrier metal film 53, the wiring film 52, the barrier metal film 51 and the silicide film 63b are processed in a wiring form by lithography and subsequent dry etching, thereby pattern-forming the second wire 54.

Thereafter, steps of forming an interlayer insulating film and a further upper layer wire, and so on are performed, thereby completing the planar type FeRAM according to this example. Here, when forming further upper layer wires, a silicide film as described above is applied to a glue film of a plug (a plug constituted of W) connecting the upper layer wires, similarly to the plug 47.

In this example, the W filling up the via hole 47a is covered from a bottom face to a side face by the glue film 63a which is the silicide film impervious to oxygen, and an upper face of the W filling up the via hole 47a is covered by the silicide film 63b. The W is in a state of being substantially completely isolated from the ferroelectric capacitor structure 30 existing at a lower layer thereof by the glue film 63a and the silicide film 63b. Accordingly, entrance into the plug 47 of oxygen activated due to the $IrO_2$ films 26a, 26b constituting the upper electrode 31, oxygen activated due to the Pt film 26c, and the like is inhibited as much as possible, thereby preventing oxidation of the plug 47.

Note that in this example, the case of applying the silicide film to the glue films of the plugs 34, connected to the ferroelectric capacitor structure 30, and also applying the silicide film to the glue film of the plug 47 connected to the first wire 45 and the upper face of the plug 47 is exemplified, but when attaching much weight to the achievement of preventing oxidation of the plug 47 in particular, the silicide film may be applied only to the glue film of the plug 47 connected to the first wire 45 and the upper face of the plug 47.

As described above, according to this example, oxidation of the plugs 34, 35 connected to the ferroelectric capacitor structure 30 as well as the plugs 47 connected to the first wires 45 is inhibited, so that a highly reliable planar type FeRAM with stabilized contact resistance can be realized.

Modification Example 4

In this example, similarly to the first embodiment, a structure of a planar type FeRAM and a manufacturing method thereof will be disclosed, but this example is different in that part of wires located at an upper layer of the ferroelectric capacitor structure 30 are formed by a so-called damascene method, and a silicide film is applied to the glue films of the wires and the conductive plugs.

FIG. 11A to FIG. 13B are schematic cross-sectional views showing a structure of an FeRAM according to modification example 4 of the first embodiment together with a manufacturing method thereof (main steps) in the order of steps.

First, similarly to the first embodiment, the respective steps of FIG. 2A to FIG. 6A are performed.

Figure 11A:
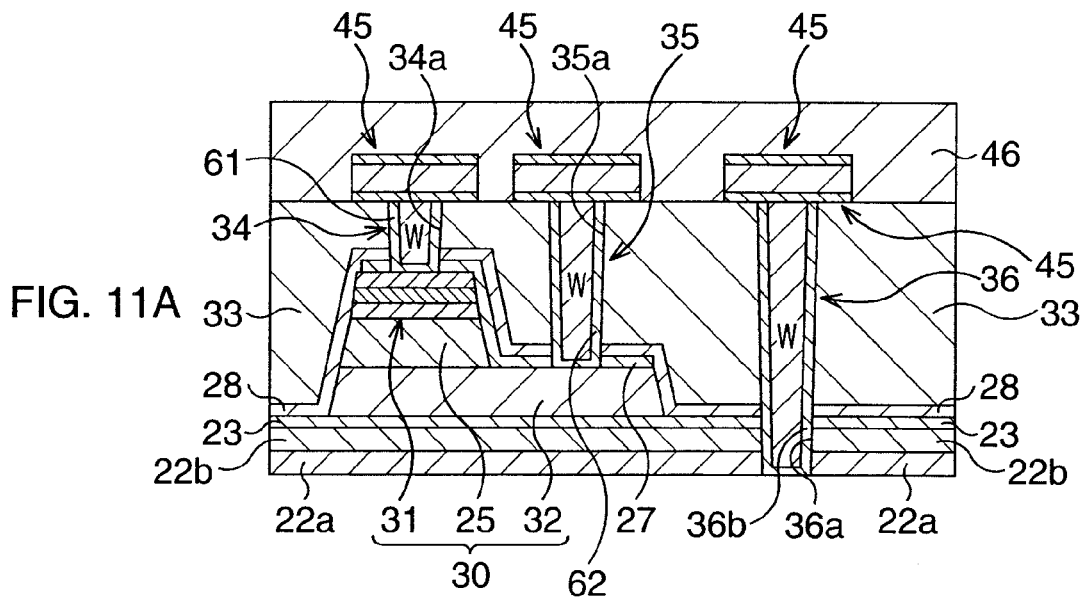
FIG. 11A to FIG. 11E are schematic cross-sectional views showing a structure of an FeRAM according to modification example 4 of the first embodiment together with a manufacturing method thereof (main steps) in the order of steps.

Subsequently, as shown in FIG. 11A, an interlayer insulating film 46 is formed so as to cover the first wires 45.

Particularly, a silicon oxide film is formed with a film thickness of approximately 700 nm so as to cover the first wires 45, and a plasma TEOS film is formed thereon so that a total film thickness thereof is approximately 1100 nm. Thereafter, the surface thereof is polished by CMP to make the film thickness approximately 750 nm, thereby forming the interlayer insulating film 46. After the CMP, plasma annealing of $N_2O$ for example is performed.

Figure 11B:
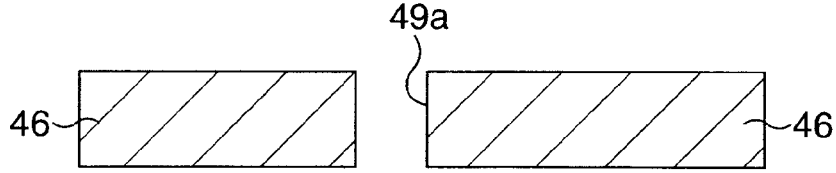

Subsequently, as shown in FIG. 11B, via holes 49a which expose surfaces of the first wires 45 are formed. Note that in FIG. 11B and respective subsequent drawings, for convenience of illustration, only the structure of the interlayer insulating film 46 and above is shown, and the ferroelectric capacitor structure 30, the first wires 45, and so on are omitted therefrom. Here, a plug 49 which is connected to one of the respective first wires 45 connected to the plugs 34, 35, 36 (for example the first wire 45 connected to the plug 35) and so on are shown representatively.

Particularly, until part of a surface of the first wire 45 exposes, the interlayer insulating film 46 is processed by lithography and subsequent dry etching, thereby forming a via hole 49a with a diameter of approximately 0.25 μm for example.

Figure 11C:
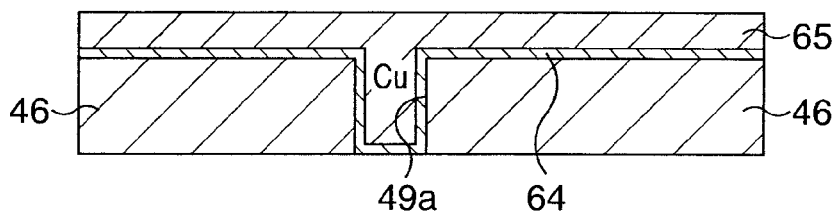

Subsequently, as shown in FIG. 11C, a base film 64 constituted of a silicide film is formed and Cu plating is performed.

Particularly, as a conductor impervious to oxygen, a base film is formed with a silicide film. Specifically, a silicide film, for example a Ti silicide (TiSi) film is formed with a film thickness of approximately 10 nm to 20 nm on the interlayer insulating film 46 so as to cover an inner wall surface of the via hole 49a, thereby forming the base film (glue film) 64. As the silicide film, at least one type selected from Ti silicide, Co silicide, Mo silicide, Nb silicide, Ta silicide, W silicide, and V silicide is used.

Here, when forming the silicide film, the silicide film is grown at a low temperature of 350° C. or lower by a sputtering method or a CVD method. A low temperature of this degree does not deteriorate the ferroelectric film 25 of the ferroelectric capacitor structure 30. When the present invention is applied to a semiconductor memory having a general capacitor structure which is not the ferroelectric capacitor structure, it is not necessary to form the silicide film particularly at a low temperature, so that the silicide film may be formed by annealing at approximately 700° C. for example.

Then, after a seed film (not-shown) of Cu is formed, a Cu (or an alloy thereof) film 65 is deposited on the glue film 64 by a plating method so as to fill up the via hole 49a via the glue film 64.

Figure 11D:
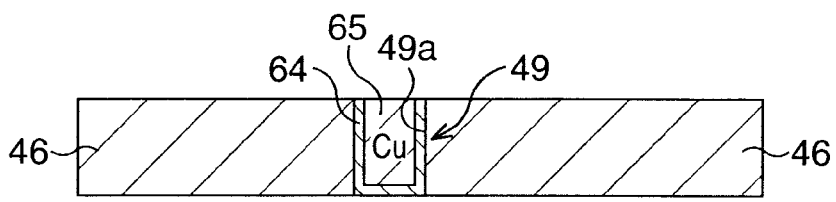

Subsequently, as shown in FIG. 11D, the plug 49 is formed.

Particularly, with the interlayer insulating film 46 being a stopper, the Cu film 65 and the glue film 64 are polished by CMP, thereby forming the plug 49 in which the via hole 49a is filled up with Cu via the glue film 64.

Figure 11E:
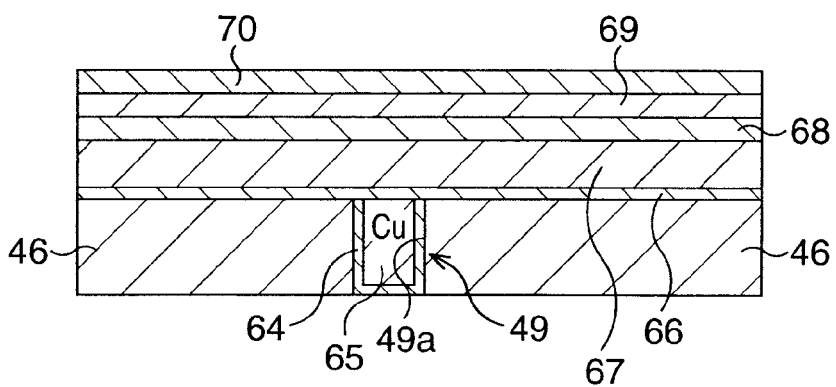

Subsequently, as shown in FIG. 11E, a silicon nitride film 66, an interlayer insulating film 67, an SOG film 68, an interlayer insulating film 69 and a silicon nitride film 70 are layered sequentially on the interlayer insulating film 46 so as to cover the plug 49.

Particularly, the silicon nitride film 66 is formed with a film thickness of approximately 50 nm to 100 nm by a CVD method for example. The interlayer insulating film 67 is formed with a film thickness of approximately 200 nm to 400 nm by a CVD method for example. The SOG film 68 is formed with a film thickness of approximately 100 nm to 200 nm by spin coating SOG. The interlayer insulating film 69 is formed with a film thickness of approximately 100 nm by a CVD method for example. The silicon nitride film 70 is formed with a film thickness of approximately 100 nm by a CVD method for example.

Figure 12A:
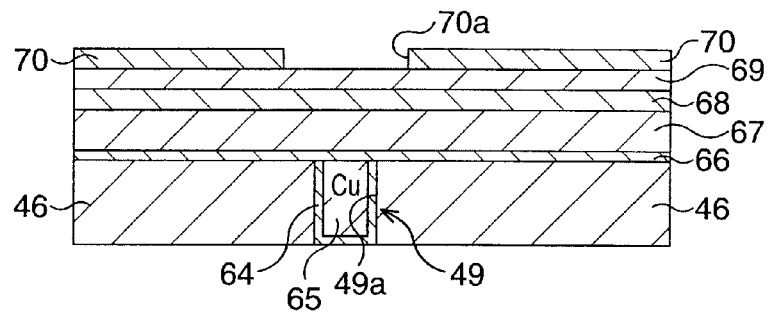
FIG. 12A to FIG. 12D are schematic cross-sectional views showing the structure of the FeRAM according to the modification example 4 of the first embodiment together with the manufacturing method thereof (main steps) in the order of steps, continuing from FIG. 11E.

Subsequently, as shown in FIG. 12A, the silicon nitride film 70 is processed.

Particularly, the silicon nitride film 70 is patterned by lithography and dry etching, thereby forming an opening 70a in a wiring form in the silicon nitride film 70.

Figure 12B:
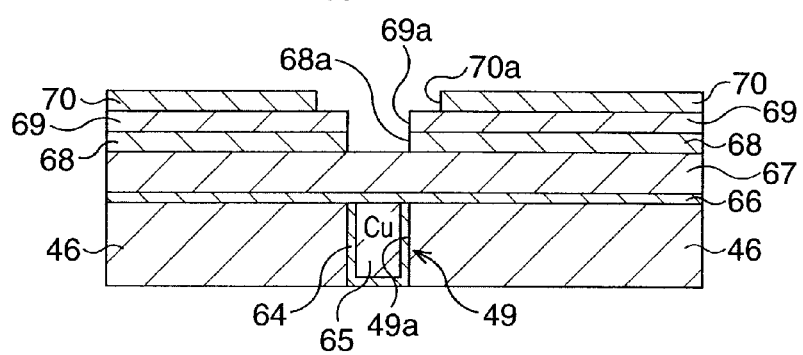

Subsequently, as shown in FIG. 12B, the interlayer insulating film 69 and the SOG film 68 are processed.

Particularly, the interlayer insulating film 69 and the SOG film 68 are patterned by lithography and dry etching, thereby forming openings 69a, 68a in a hole form at positions on the interlayer insulating film 69 and the SOG film 68 located above the plug 49 and matching with the opening 70a.

Figure 12C:
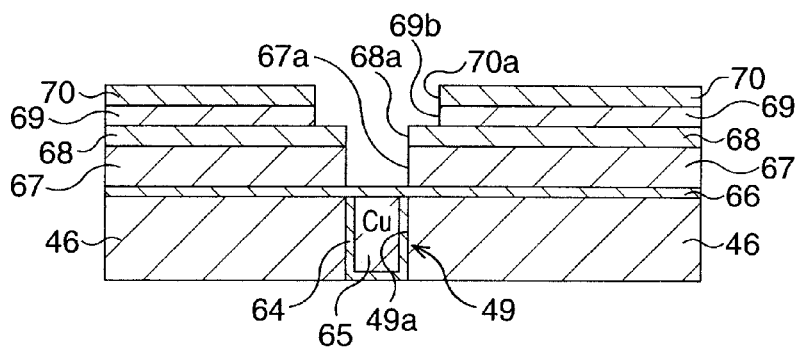

Subsequently, as shown in FIG. 12C, the interlayer insulating film 69 and the interlayer insulating film 67 are processed.

Particularly, using the silicon nitride film 70 as a hard mask, the interlayer insulating film 69 is patterned in a wiring form corresponding to the opening 70a by lithography and dry etching, thereby forming an opening 69b extending the opening 69a. At this time, simultaneously, the interlayer insulating film 69 and the SOG film 68 function as a mask, and the interlayer insulating film 67 is patterned in a hole form corresponding to the opening 68a, thereby forming an opening 67a.

Figure 12D:
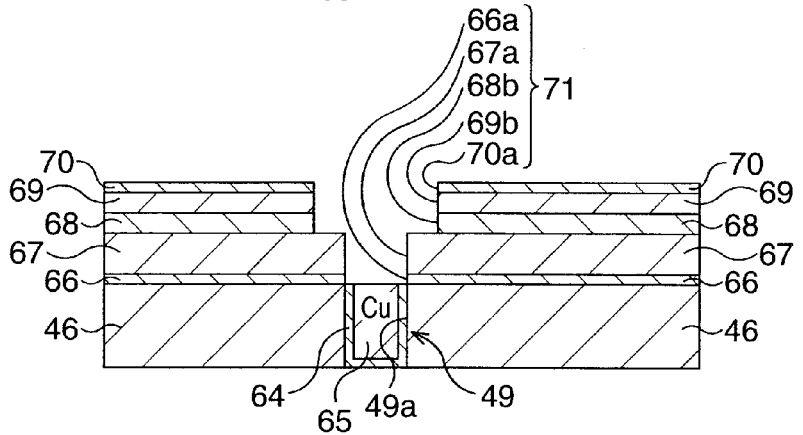

Subsequently, as shown in FIG. 12D, a wiring trench 71 is completed.

Particularly, using the silicon nitride film 70 as a hard mask, the silicon nitride film 66 is patterned by lithography and dry etching until a surface of the plug 47 exposes. At this time, an opening 68b in a wiring form extending the opening 68a corresponding to the openings 70a, 69b, is formed in the SOG film 68, and an opening 66a in a hole form corresponding to the opening 67a is formed in the silicon nitride film 66. Here, also the silicon nitride film 70 becomes thin by the film thickness of the silicon nitride film 66 by etching. At this time, the openings 66a, 67a formed in the silicon nitride film 66 and the interlayer insulating film 67 and the openings 68b, 69b, 70a formed in the SOG film 68, the interlayer insulating film 69 and the silicon nitride film 70 become integral, thereby completing the wiring trench 71.

Figure 13A:
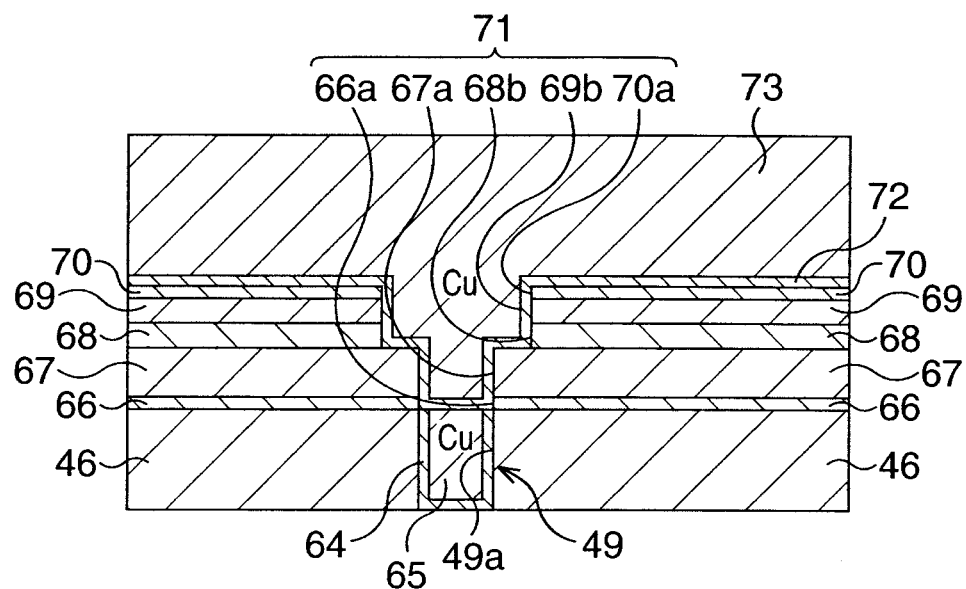
FIG. 13A and FIG. 13B are schematic cross-sectional views showing the structure of the FeRAM according to the modification example 4 of the first embodiment together with the manufacturing method thereof (main steps) in the order of steps, continuing from FIG. 12D.

Subsequently, as shown in FIG. 13A, a base film 72 constituted of a silicide film is formed and Cu plating is performed.

Particularly, as a conductor impervious to oxygen, a base film is formed with a silicide film. Specifically, a silicide film, for example a Ti silicide (TiSi) film is formed with a film thickness of approximately 10 nm to 20 nm on the silicon nitride film 70 so as to cover an inner wall surface of the wiring trench 71, thereby forming the base film (glue film) 72. As the silicide film, at least one type selected from Ti silicide, Co silicide, Mo silicide, Nb silicide, Ta silicide, W silicide, and V silicide is used.

Here, when forming the silicide film, the silicide film is grown at a low temperature of 350° C. or lower by a sputtering method or a CVD method. A low temperature of this degree does not deteriorate the ferroelectric film 25 of the ferroelectric capacitor structure 30. When the present invention is applied to a semiconductor memory having a general capacitor structure which is not the ferroelectric capacitor structure, it is not necessary to form the silicide film particularly at a low temperature, so that the silicide film may be formed by annealing at approximately 700° C. for example.

Then, after a seed film (not-shown, having a film thickness of approximately 130 nm) of Cu is formed, a Cu film 73 is deposited on the glue film 72 by a plating method so as to fill up the wiring trench 71 via the glue film 72.

Figure 13B:
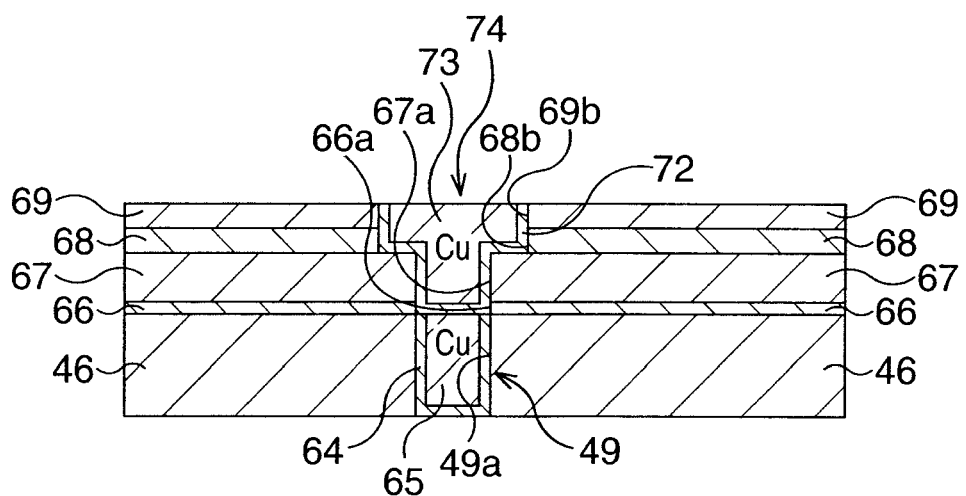

Subsequently, as shown in FIG. 13B, a wiring structure 74 is formed.

Particularly, with the interlayer insulating film 69 being a stopper, the Cu film 73, the glue film 72 and the silicon nitride film 70 are polished by CMP, and the wiring trench 71 is filled up with Cu (or an alloy thereof) via the glue film 72, thereby forming the wiring structure 74 electrically connected to the first wire 45 via the plug 49. Here, in the wiring structure 74, a part where spaces of the openings 66a, 67a are filled up with Cu via the glue film 72 corresponds to a conductive plug part and a part where spaces of the openings 68b, 69b are filled up with Cu via the glue film 72 corresponds to a wire part, and thus the conductive plug part and the wire part are formed integrally.

Thereafter, steps of forming an interlayer insulating film and a further upper layer wire by a damascene method, and so on are performed, thereby completing the planar type FeRAM according to this example. Here, when the further upper layer wire is formed, the silicide film as described above is applied to a glue film thereof, similarly to the wiring structure 74.

In this example, the Cu filling up the via hole 49a is covered from a bottom face to a side face by the glue film 64 which is the silicide film impervious to oxygen, and the Cu filling up the wiring trench 71 is covered from a bottom face to a side face by the glue film 72 which is the silicide film. These Cu are in a state of being isolated from the ferroelectric capacitor structure 30 existing at a lower layer thereof by the glue films 64, 72. Accordingly, entrance into the plug 49 and the wiring structure 74 of oxygen activated due to the $IrO_2$ films 26a, 26b constituting the upper electrode 31, oxygen activated due to the Pt film 26c, and the like is inhibited as much as possible, thereby preventing oxidation of the plug 49 and the wiring structure 74.

Note that in this example, the case of applying the silicide film to the glue films of the plugs 34, 35 connected to the ferroelectric capacitor structure 30, and also applying the silicide film to the glue films of the plug 49 connected to the first wire 45 and the wiring structure 74 is exemplified, but when attaching much weight to the achievement of preventing oxidation of the plug 47 and the wiring structure 74 in particular, the silicide film may be applied only to the glue films of the plug 47 and the wiring structure 74.

As described above, according to this example, oxidation of the plugs 34, 35 connected to the ferroelectric capacitor structure 30 as well as the plugs 49 connected to the first wires 45 and the wiring structure 74 is inhibited, so that a highly reliable planar type FeRAM with stabilized contact resistance can be realized.

Modification Example 5

In this example, in the structure of the modification example 4, the glue films are formed as a layered structure of a silicide film and a conductive protection film which inhibits permeation of hydrogen.

FIG. 14A to FIG. 16B are schematic cross-sectional views showing a structure of an FeRAM according to modification example 5 of the first embodiment together with a manufacturing method thereof (main steps) in the order of steps.

First, similarly to the first embodiment, the respective steps of FIG. 2A to FIG. 6A are performed.

Figure 14A:
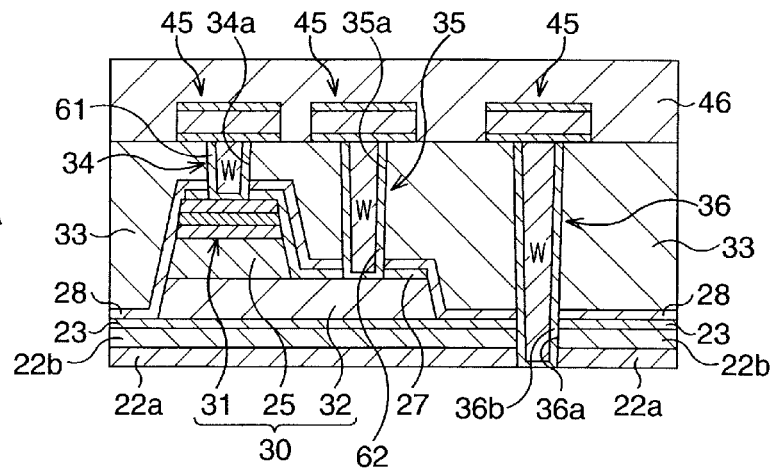
FIG. 14A to FIG. 14E are schematic cross-sectional views showing a structure of an FeRAM according to modification example 5 of the first embodiment together with a manufacturing method thereof (main steps) in the order of steps.

Subsequently, as shown in FIG. 14A, an interlayer insulating film 46 is formed so as to cover the first wires 45.

Particularly, a silicon oxide film is formed with a film thickness of approximately 700 nm so as to cover the first wires 45, and a plasma TEOS film is formed thereon so that a total film thickness thereof is approximately 1100 nm. Thereafter, the surface thereof is polished by CMP to make the film thickness approximately 750 nm, thereby forming the interlayer insulating film 46. After the CMP, plasma annealing of $N_2O$ for example is performed.

Figure 14B:
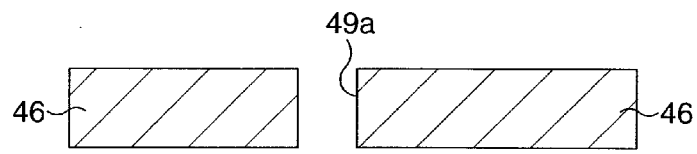

Subsequently, as shown in FIG. 14B, via holes 49a which expose surfaces of the first wires 45 are formed. Note that in FIG. 14B and respective subsequent drawings, for convenience of illustration, only the structure of the interlayer insulating film 46 and above is shown, and the ferroelectric capacitor structure 30, the first wires 45, and so on are omitted therefrom. Here, a plug 49 which is connected to one of the respective first wires 45 connected to the plugs 34, 35, 36 (for example the first wire 45 connected to the plug 35) and so on are shown representatively.

Particularly, until part of a surface of the first wire 45 exposes, the interlayer insulating film 46 is processed by lithography and subsequent dry etching, thereby forming a via hole 49a with a diameter of approximately 0.25 μm for example.

Figure 14C:
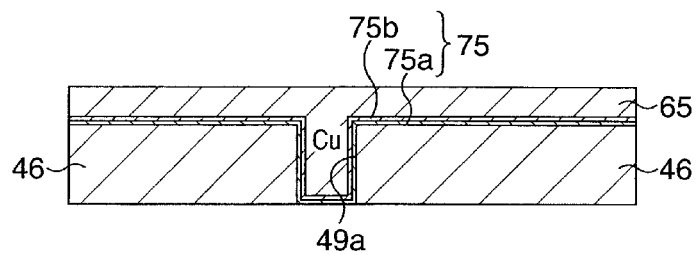

Subsequently, as shown in FIG. 14C, a base film 75 which is the layered structure of a silicide film and a conductive protection film which inhibits permeation of hydrogen is formed and Cu plating is performed.

Particularly, the silicide film which is a conductor impervious to oxygen and the conductive protection film which prevents entrance of hydrogen are layered to form the base film. Specifically, a silicide film 75a, for example a Ti silicide (TiSi) film (with a film thickness of approximately 20 nm) and a conductive protection film which inhibits permeation of hydrogen, for example a TiAlN film 75b (with a film thickness of approximately 50 nm) are deposited sequentially on the interlayer insulating film 46 so as to cover an inner wall surface of the via hole 49a, thereby forming the base film (glue film) 75 of layered structure. As the silicide film 75a, at least one type selected from Ti silicide, Co silicide, Mo silicide, Nb silicide, Ta silicide, W silicide, and V silicide is used. Further, as the conductive protection film which inhibits permeation of hydrogen, at least one type selected from TiN, TiSiN, TaN, CrN, HfN, ZrN, TiAlN, TaAlN, CrAlN, and HfAlN is used.

Here, when forming the silicide film 75a, the silicide film is grown at a low temperature of 350° C. or lower by a sputtering method or a CVD method. A low temperature of this degree does not deteriorate the ferroelectric film 25 of the ferroelectric capacitor structure 30. When the present invention is applied to a semiconductor memory having a general capacitor structure which is not the ferroelectric capacitor structure, it is not necessary to form the silicide film particularly at a low temperature, so that the silicide film may be formed by annealing at approximately 700° C. for example.

Then, after a seed film (not-shown) of Cu is formed, a Cu (or an alloy thereof) film 65 is deposited on the glue film 75 by a plating method so as to fill up the via hole 49a via the glue film 75.

Figure 14D:
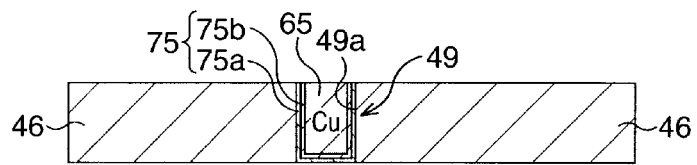

Subsequently, as shown in FIG. 14D, the plug 49 is formed.

Particularly, with the interlayer insulating film 46 being a stopper, the Cu film 65 and the glue film 75 are polished by CMP, thereby forming the plug 49 in which the via hole 49a is filled up with Cu via the glue film 75.

Figure 14E:
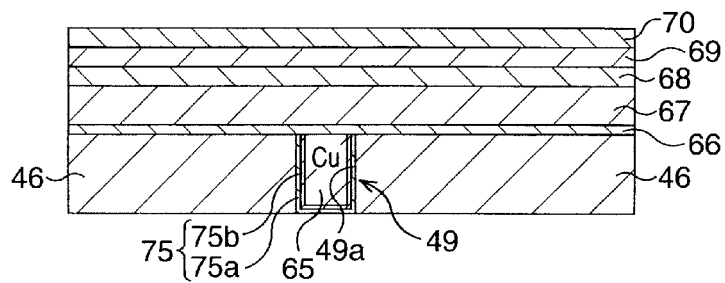

Subsequently, as shown in FIG. 14E, a silicon nitride film 66, an interlayer insulating film 67, an SOG film 68, an interlayer insulating film 69 and a silicon nitride film 70 are layered sequentially on the interlayer insulating film 46 so as to cover the plug 49.

Particularly, the silicon nitride film 66 is formed with a film thickness of approximately 50 nm to 100 nm by a CVD method for example. The interlayer insulating film 67 is formed with a film thickness of approximately 200 nm to 400 nm by a CVD method for example. The SOG film 68 is formed with a film thickness of approximately 100 nm to 200 nm by spin coating SOG. The interlayer insulating film 69 is formed with a film thickness of approximately 100 nm by a CVD method for example. The silicon nitride film 70 is formed with a film thickness of approximately 100 nm by a CVD method for example.

Figure 15A:
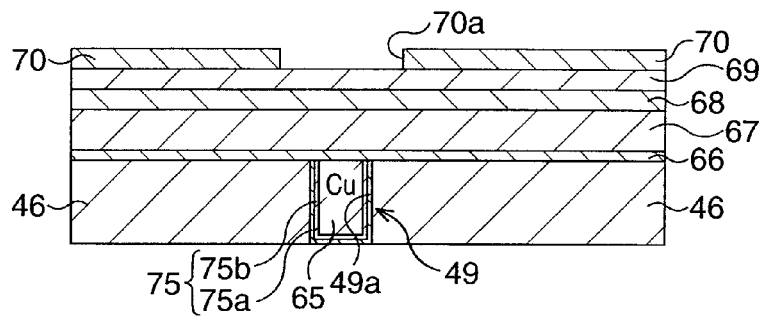
FIG. 15A to FIG. 15D are schematic cross-sectional views showing the structure of the FeRAM according to the modification example 5 of the first embodiment together with the manufacturing method thereof (main steps) in the order of steps, continuing from FIG. 14E.

Subsequently, as shown in FIG. 15A, the silicon nitride film 70 is processed.

Particularly, the silicon nitride film 70 is patterned by lithography and dry etching, thereby forming an opening 70a in a wiring form in the silicon nitride film 70.

Figure 15B:
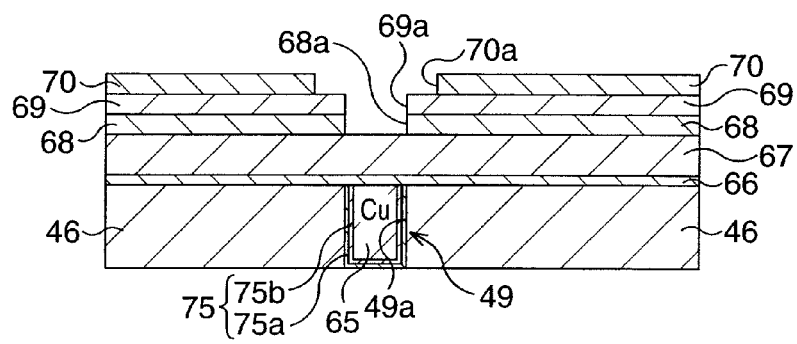

Subsequently, as shown in FIG. 15B, the interlayer insulating film 69 and the SOG film 68 are processed.

Particularly, the interlayer insulating film 69 and the SOG film 68 are patterned by lithography and dry etching, thereby forming openings 69a, 68a in a hole form at positions on the interlayer insulating film 69 and the SOG film 68 located above the plug 49 and matching with the opening 70a.

Figure 15C:
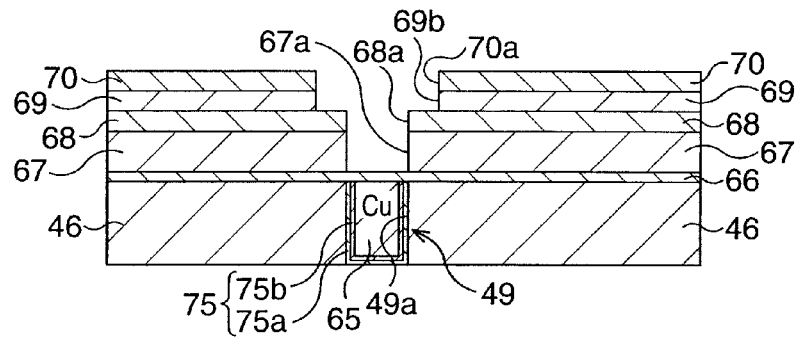

Subsequently, as shown in FIG. 15C, the interlayer insulating film 69 and the interlayer insulating film 67 are processed.

Particularly, using the silicon nitride film 70 as a hard mask, the interlayer insulating film 69 is patterned in a wiring form corresponding to the opening 70a by lithography and dry etching, thereby forming an opening 69b extending the opening 69a. At this time, simultaneously, the interlayer insulating film 69 and the SOG film 68 function as a mask, and the interlayer insulating film 67 is patterned in a hole form corresponding to the opening 68a, thereby forming an opening 67a.

Figure 15D:
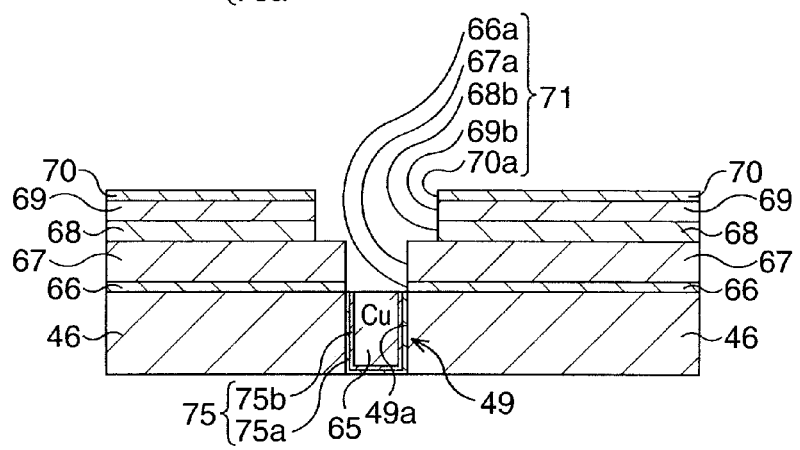

Subsequently, as shown in FIG. 15D, a wiring trench 71 is completed.

Particularly, using the silicon nitride film 70 as a hard mask, the silicon nitride film 66 is patterned by lithography and dry etching until a surface of the plug 47 exposes. At this time, an opening 68b in a wiring form extending the opening 68a corresponding to the openings 70a, 69b, is formed in the SOG film 68, and an opening 66a in a hole form corresponding to the opening 67a is formed in the silicon nitride film 66. Here, also the silicon nitride film 70 becomes thin by the film thickness of the silicon nitride film 66 by etching. At this time, the openings 66a, 67a formed in the silicon nitride film 66 and the interlayer insulating film 67 and the openings 68b, 69b, 70a formed in the SOG film 68, the interlayer insulating film 69 and the silicon nitride film 70 become integral, thereby completing the wiring trench 71.

Figure 16A:
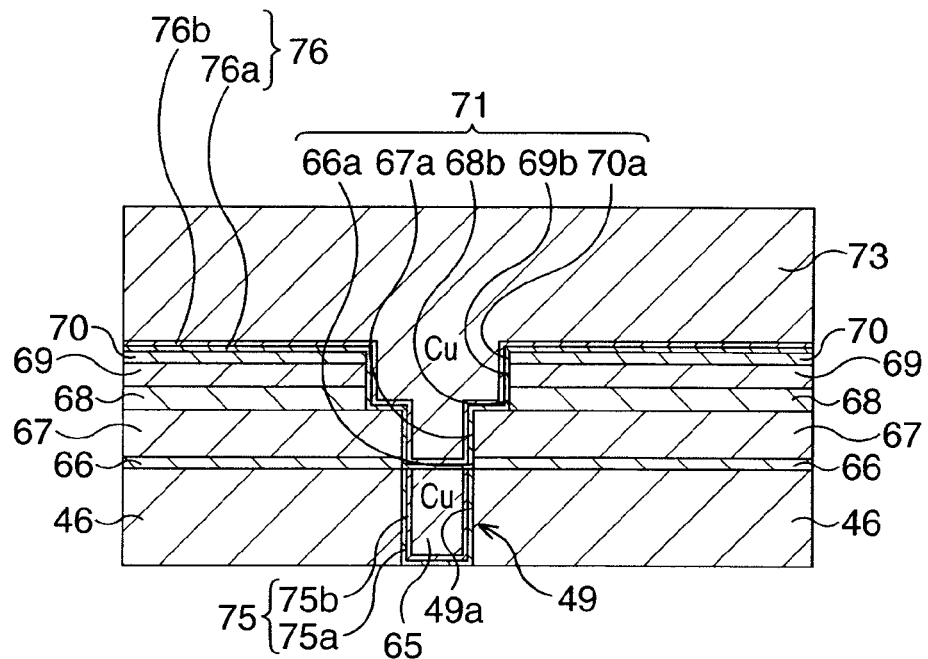
FIG. 16A and FIG. 16B are schematic cross-sectional views showing the structure of the FeRAM according to the modification example 5 of the first embodiment together with the manufacturing method thereof (main steps) in the order of steps, continuing from FIG. 15D.

Subsequently, as shown in FIG. 16A, a base film 76 is formed and Cu plating is performed.

Particularly, a silicide film which is a conductor impervious to oxygen and a conductive protection film which prevents entrance of hydrogen are layered to form the base film. Specifically, a silicide film 76a, for example a Ti silicide (TiSi) film (with a film thickness of approximately 20 nm) and a conductive protection film which inhibits permeation of hydrogen, for example a TiAlN film 76b (with a film thickness of approximately 50 nm) are deposited sequentially on the silicon nitride film 70 so as to cover an inner wall surface of the wiring trench 71, thereby forming the base film (glue film) 76 of layered structure. As the silicide film 76a, at least one type selected from Ti silicide, Co silicide, No silicide, Nb silicide, Ta silicide, W silicide, and V silicide is used. Further, as the conductive protection film which inhibits permeation of hydrogen, at least one type selected from TiN, TiSiN, TaN, CrN, HfN, ZrN, TiAlN, TaAlN, CrAlN, and HfAlN is used.

Here, when forming the silicide film 76a, the silicide film is grown at a low temperature of 350° C. or lower by a sputtering method or a CVD method. A low temperature of this degree does not deteriorate the ferroelectric film 25 of the ferroelectric capacitor structure 30. When the present invention is applied to a semiconductor memory having a general capacitor structure which is not the ferroelectric capacitor structure, it is not necessary to form the silicide film particularly at a low temperature, so that the silicide film may be formed by annealing at approximately 700° C. for example.

Then, after a seed film (not-shown, having a film thickness of approximately 130 nm) of Cu is formed, a Cu film 73 is deposited on the glue film 76 by a plating method so as to fill up the wiring trench 71 via the glue film 76.

Figure 16B:
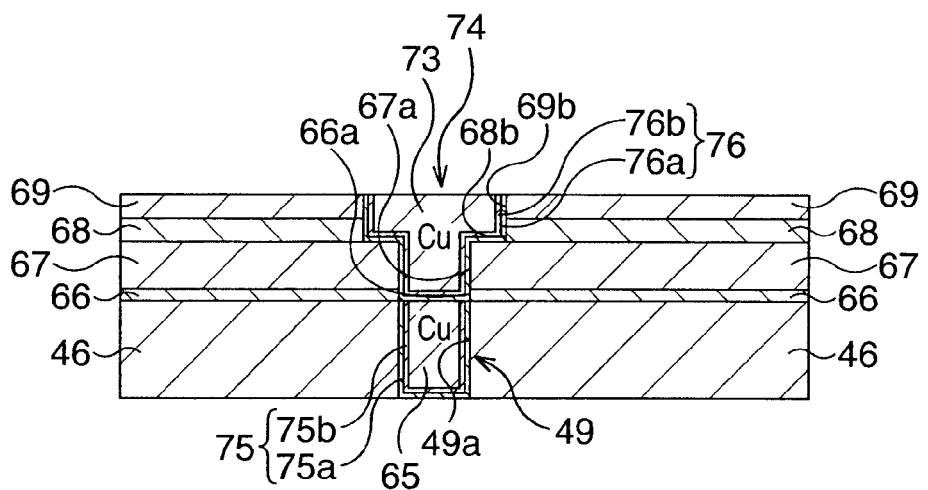

Subsequently, as shown in FIG. 16B, a wiring structure 74 is formed.

Particularly, with the interlayer insulating film 69 being a stopper, the Cu film 73, the glue film 76 and the silicon nitride film 70 are polished by CMP, and the wiring trench 71 is filled up with Cu (or an alloy thereof) via the glue film 76, thereby forming the wiring structure 74 electrically connected to the first wire 45 via the plug 49. Here, in the wiring structure 74, a part where spaces of the openings 66a, 67a are filled up with Cu via the glue film 76 corresponds to a conductive plug part and a part where spaces of the openings 68b, 69b are filled up with Cu via the glue film 76 corresponds to a wire part, and thus the conductive plug part and the wire part are formed integrally.

Thereafter, steps of forming an interlayer insulating film and a further upper layer wire by a damascene method, and so on are performed, thereby completing the planar type FeRAM according to this example. Here, when the further upper layer wire is formed, the layered films of the silicide film and the conductive protection film which inhibits permeation of hydrogen as described above are applied to a glue film thereof, similarly to the wiring structure 74.

In this example, the Cu filling up the via hole 49a is covered from a bottom face to a side face by the glue film 75 formed as the layered structure of the silicide film impervious to oxygen and the conductive protection film having a function of inhibiting permeation of hydrogen, and the Cu filling up the wiring trench 71 is covered from a bottom face to a side face by the glue film 76 formed as the layered structure of the silicide film and the conductive protection film having a function of inhibiting permeation of hydrogen. These Cu are in a state of being isolated from the ferroelectric capacitor structure 30 existing at a lower layer thereof by the glue films 75, 76. Accordingly, entrance into the plug 49 and the wiring structure 74 of oxygen activated due to the $IrO_2$ films 26a, 26b constituting the upper electrode 31, oxygen activated due to the Pt film 26c, and the like is inhibited as much as possible, thereby preventing oxidation of the plug 49 and the wiring structure 74 and also preventing entrance of hydrogen into the plug 49 and the wiring structure 74.

Note that in this example, the case of applying the silicide film to the glue films of the plugs 34, connected to the ferroelectric capacitor structure 30, and also applying the layered films of the silicide film and the conductive protection film which inhibits permeation of hydrogen to the glue films of the plug 49 connected to the first wire 45 and the wiring structure 74 is exemplified, but when attaching much weight to the achievement of preventing oxidation of the plug 47 and the wiring structure 74 in particular, the silicide film may be applied only to the glue films of the plug 47 and the wiring structure 74.

Figure 17:
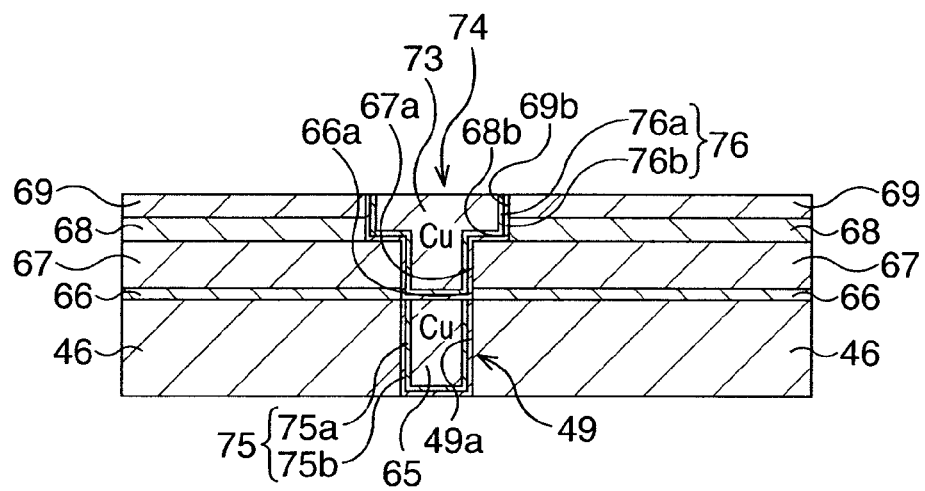
FIG. 17 is a schematic cross-sectional view showing a structure of an FeRAM according to another example of the modification example 5 of the first embodiment.

Further, in this example, the glue film 75 is formed as the layered structure of the silicide film 75a and the TiAlN film 75b and the glue film 76 is formed as the layered structure of the Ti silicide film 76a and the TiAlN film 76b, but as shown in FIG. 17 (corresponding to FIG. 16B), the layered state of respective films may be inverted, thereby forming the glue film 75 as a layered structure of the TiAlN film 75b and the Ti silicide film 75a and the glue film 76 as a layered structure of the TiAlN film 76b and the Ti silicide film 76a.

Figure 18:
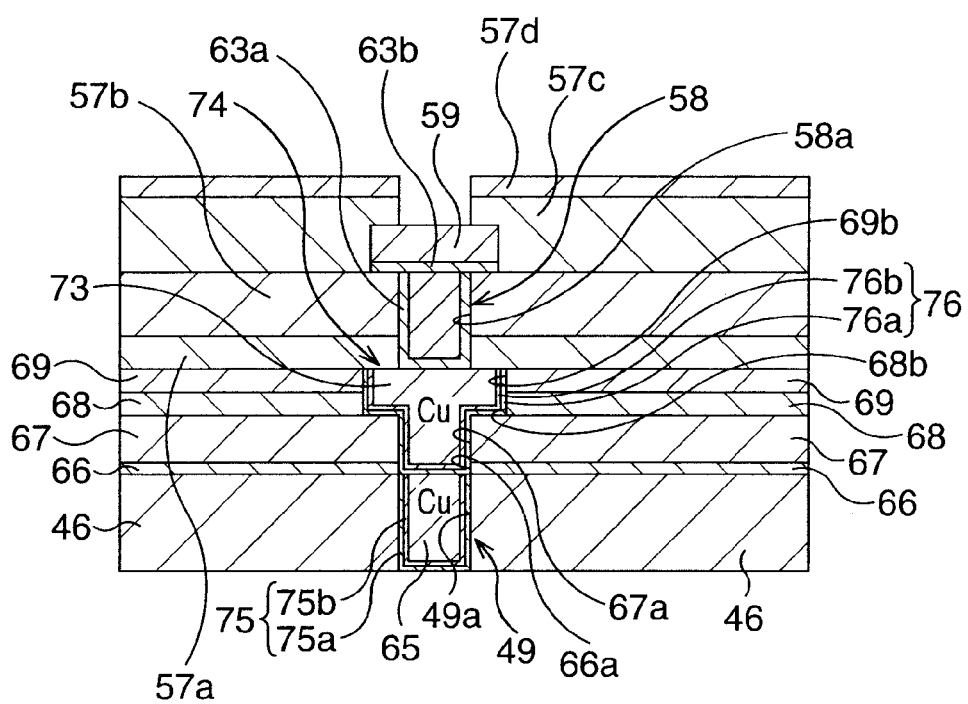
FIG. 18 is a schematic cross-sectional view showing a structure of an FeRAM according to another example of the modification example 5 of the first embodiment.

Further, as shown in FIG. 18, after forming the wiring structure 74 in which the wiring trench 71 is filled up with Cu via the glue film 76 as in this example, the modification example 3 may be applied. Specifically, W is filled via a glue film 63a in a via hole 58a formed in interlayer insulating films 57a, 57b, thereby forming a plug 58. In this plug 58, the W filling up the via hole 58a is covered from a bottom face to a side face by the glue film 63a which is a silicide film impervious to oxygen, and a top face of the W filling up the via hole 58a is covered by a silicide film 63b. On the silicide film 63b, a pad electrode 59 constituted of an Al alloy film (here an Al—Cu film) for example is formed, and interlayer insulating films 57c, 57d are formed so as to cover the pad electrode 59. In the interlayer insulating films 57c, 57d, an opening which exposes part of a surface of the pad electrode 59 is formed. As the interlayer insulating films 57a to 57c, a silicon oxide film such as NSG is used, and as the interlayer insulating film 57d, a silicon nitride film or the like, which is more rigid than the silicon oxide film, is used.

As described above, according to this example, oxidation of the plugs 34, 35 connected to the ferroelectric capacitor structure 30 as well as the plugs 49 connected to the first wires 45 and the wiring structure 74 is inhibited, and moreover, entrance of hydrogen into at least the plugs 49 connected to the first wires 45 and the wiring structure 74 is inhibited, so that a highly reliable planar type FeRAM with stabilized contact resistance can be realized.

Modification Example 6

In this example, similarly to the first embodiment, a structure of a planar type FeRAM and a manufacturing method thereof will be disclosed, but this example is different in that the conductors impervious to oxygen provided between the ferroelectric capacitor structure 30 and the conductive plugs 34, 35 are different.

Figure 19A:
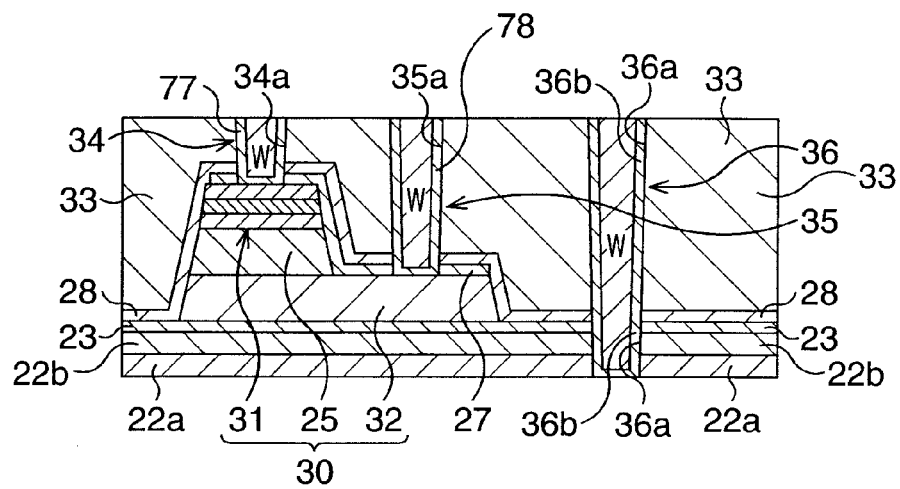
FIG. 19A and FIG. 19B are schematic cross-sectional views showing a structure of an FeRAM according to modification example 6 of the first embodiment together with a manufacturing method thereof (main steps) in the order of steps.
Figure 19B:
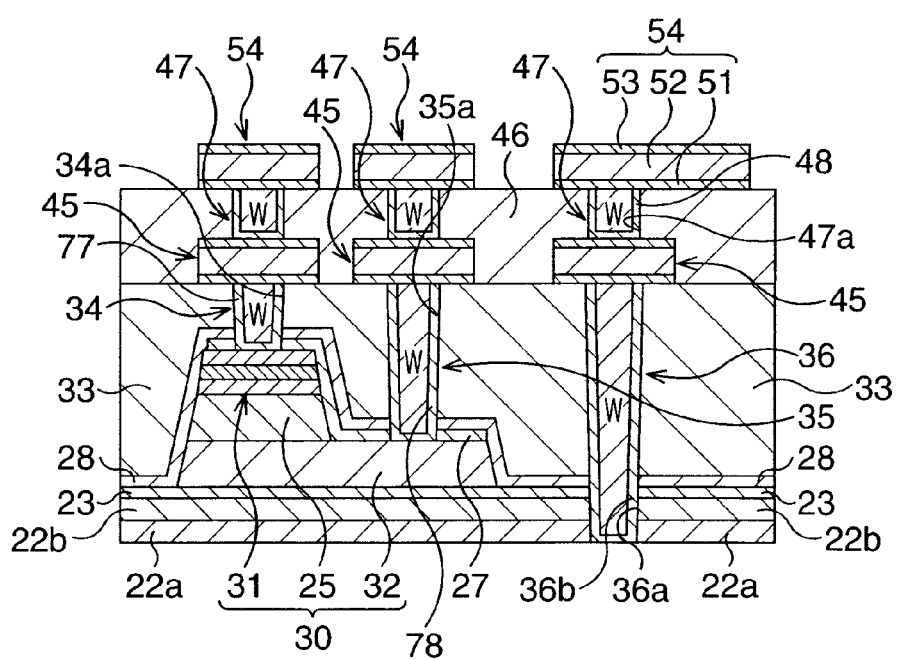

FIG. 19A and FIG. 19B are schematic cross-sectional views showing a structure of an FeRAM according to modification example 6 of the first embodiment together with a manufacturing method thereof (main steps) in the order of steps.

First, similarly to the first embodiment, the respective steps of FIG. 2A to FIG. 5B are performed.

Subsequently, as shown in FIG. 19A, plugs 34, 35 connected to the ferroelectric capacitor structure 30 are formed.

In this example, in order to inhibit oxidation of the plugs 34, 35 due to oxygen generated from the upper electrode 31 (particularly, oxygen activated by the Pt film 26c), the base films of the plugs 34, 35 are each formed with a metal film which is a conductor impervious to oxygen (capable of absorbing oxygen) and has conductivity even when oxidized. Specifically, metals having conductivity even when oxidized, for example Ir films are deposited with a film thickness of approximately 50 nm so as to cover respective wall surfaces of the via holes 34a, 35a, thereby forming base films (glue films) 77, 78. As the metal having conductivity even when oxidized, one containing at least one type selected from Ag, Ni, Cu, Zn, In, Sn, Ir, Ru, Rh, Pd, and Os is used. When two or more types are selected, they may be used in an alloy state.

Then, for example W films are formed by a CVD method so as to fill up the via holes 34a, 35a via the glue films 77, 78 respectively. Thereafter, with the interlayer insulating film 33 being a stopper, the W films and the glue films 77, 78 are polished by CMP, thereby forming the plugs 34, 35 in which the via holes 34a, 35a are filled up with W via the glue films 77, 78 respectively. After the CMP, plasma annealing of $N_2O$ for example is performed.

In this example, the W filling up the via holes 34a, 35a are covered from bottom faces to side faces by the glue films 77, 78 constituted of the Ir film which is a metal having conductivity even when oxidized, and the W and the upper electrode 31 are separated by the glue films 77, 78. The glue films 77, 78 absorb oxygen, so to speak due to oxidation of themselves, but they do not impair the electrical connection function of the plugs 34, 35 because they maintain conductivity even when oxidized. By these glue films 77, 78, entrance into the plugs 34, 35 of oxygen activated due to the $IrO_2$ films 26a, 26b constituting the upper electrode 31, oxygen activated due to the Pt film 26c, and the like is inhibited.

Note that in this example, the case of applying the metal film having conductivity even when oxidized to the glue films of the plugs 34, 35 connected to the ferroelectric capacitor structure 30 is exemplified, but similarly the metal film having conductivity even when oxidized may be applied to the glue film of the plug 36 connected to the MOS transistor 20.

Then, the respective steps of FIG. 6A and FIG. 6B are performed to obtain the structure shown in FIG. 19B.

Thereafter, steps of forming an interlayer insulating film and a further upper layer wire, and so on are performed, thereby completing the planar type FeRAM according to this example.

As described above, according to this example, oxidation of the plugs 34, 35 connected to the ferroelectric capacitor structure 30 is inhibited, so that a highly reliable planar type FeRAM with stabilized contact resistance can be realized.

Modification Example 7

In this example, similarly to the first embodiment, a structure of a planar type FeRAM and a manufacturing method thereof will be disclosed, but this example is different in that the conductors impervious to oxygen provided between the ferroelectric capacitor structure 30 and the conductive plugs 34, 35 are different.

Figure 20A:
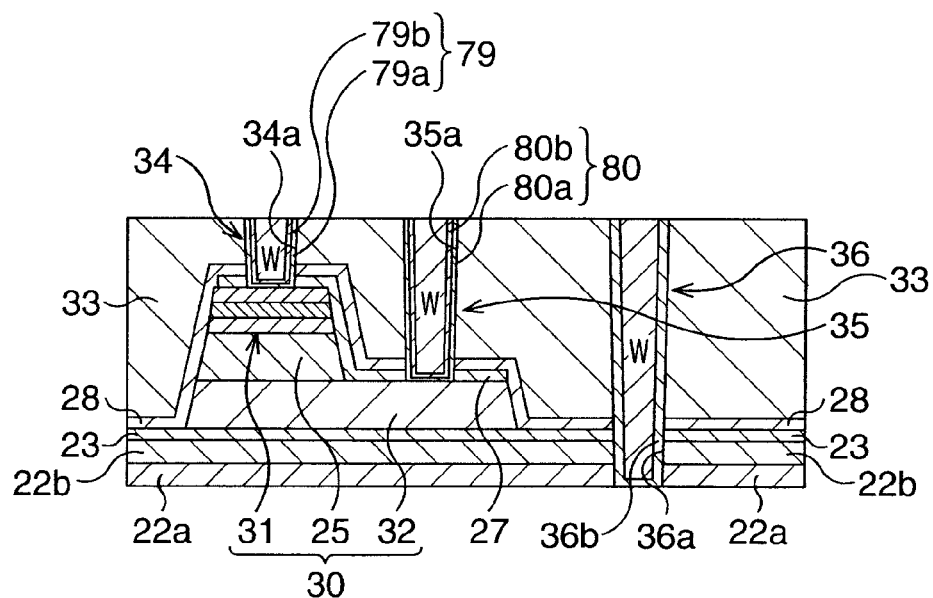
FIG. 20A and FIG. 20B are schematic cross-sectional views showing a structure of an FeRAM according to modification example 7 of the first embodiment together with a manufacturing method thereof (main steps) in the order of steps.
Figure 20B:
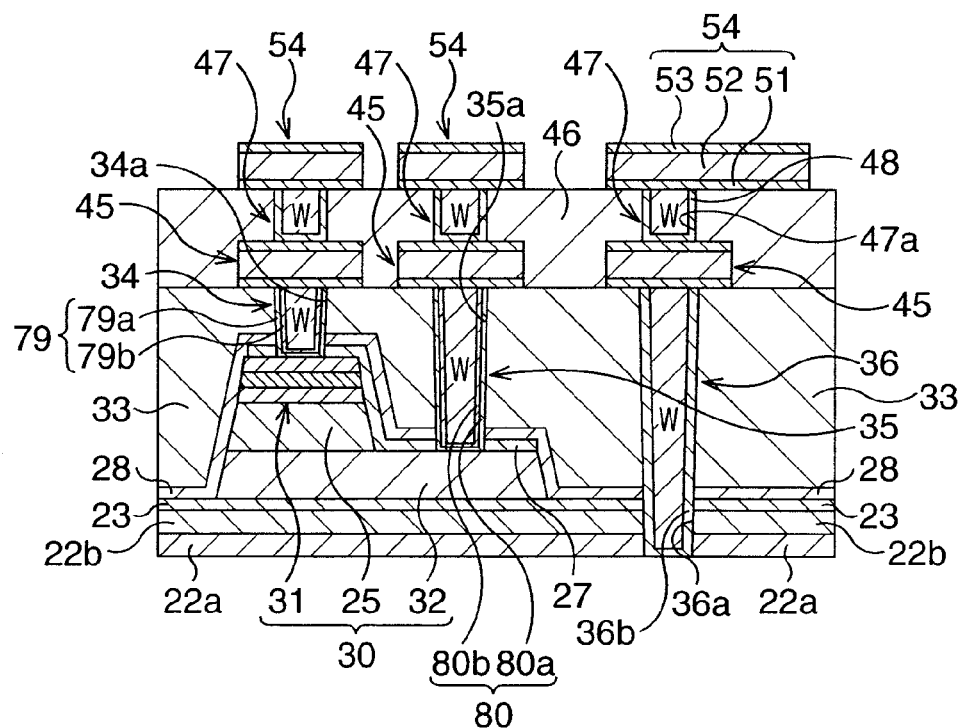

FIG. 20A and FIG. 20B are schematic cross-sectional views showing a structure of an FeRAM according to modification example 7 of the first embodiment together with a manufacturing method thereof (main steps) in the order of steps.

First, similarly to the first embodiment, the respective steps of FIG. 2A to FIG. 5B are performed.

Subsequently, as shown in FIG. 20A, plugs 34, 35 connected to the ferroelectric capacitor structure 30 are formed.

In this example, in order to inhibit oxidation of the plugs 34, 35 due to oxygen generated from the upper electrode 31 (particularly, oxygen activated by the Pt film 26c) and to prevent entrance of hydrogen into the plugs 34, 35, the base films of the plugs 34, are each formed as a two-layer structure of a metal film which is a conductor impervious to oxygen (capable of absorbing oxygen) and has conductivity even when oxidized and a conductive protection film which inhibits permeation of hydrogen. Specifically, conductive layers 79a, 80a having conductivity even when oxidized, for example Ir films (with a film thickness of approximately 20 nm) and conductive protection films which inhibit permeation of hydrogen, for example TiN films 79b, 80b (with a film thickness of approximately 50 nm) are deposited sequentially so as to cover respective wall faces of the via holes 34a, 35a, thereby forming base films (glue films) 79, 80 of two-layer structure.

Note that as the conductive layer 79a having conductivity even when oxidized, one containing at least one type selected from Ag, Ni, Cu, Zn, In, Sn, Ir, Ru, Rh, Pd, and Os is used. When two or more types are selected, they may be used in an alloy state. Also, as the conductive protection film which inhibits permeation of hydrogen, at least one type selected from TiN, TiSiN, TaN, CrN, HfN, ZrN, TaAlN, CrAlN, and HfAlN is used.

Then, for example W films are formed by a CVD method so as to fill up the via holes 34a, 35a via the glue films 79, 80 respectively. Thereafter, with the interlayer insulating film 33 being a stopper, the W films and the glue films 79, 80 are polished by CMP, thereby forming the plugs 34, 35 in which the via holes 34a, 35a are filled up with W via the glue films 79, 80 respectively. After the CMP, plasma annealing of $N_2O$ for example is performed.

In this example, the W filling up the via holes 34a, 35a are covered from bottom faces to side faces by the glue films 79, 80 formed by layering the conductive layers 79a, 80a which are metals having conductivity even when oxidized and the TiN films 79b, 80b having a hydrogen blocking function, and the W and the upper electrode 31 are separated by the glue films 79, 80. The conductive layers 79a, 80a absorb oxygen, so to speak due to oxidation of themselves, but they do not impair the electrical connection function of the plugs 34, 35 because they maintain conductivity even when oxidized. By these conductive layers 79a, 80a and the TiN films 79b, 80b, entrance into the plugs 34, 35 of oxygen activated due to the $IrO_2$ films 26a, 26b, oxygen activated due to the Pt film 26c, and the like is inhibited, thereby preventing oxidation of the plugs 34, 35, and also preventing entrance of hydrogen into the plugs 34, 35.

Note that in this example, the case of applying the metal film having conductivity even when oxidized and the conductive protection film which inhibits permeation of hydrogen to the glue films of the plugs 34, 35 connected to the ferroelectric capacitor structure 30 is exemplified, but similarly the metal film having conductivity even when oxidized and the conductive protection film which inhibits permeation of hydrogen may be applied to the glue film of the plug 36 connected to the MOS transistor 20.

Then, the respective steps of FIG. 6A and FIG. 6B are performed to obtain the structure shown in FIG. 20B.

Thereafter, steps of forming an interlayer insulating film and a further upper layer wire, and so on are performed, thereby completing the planar type FeRAM according to this example.

Figure 21:
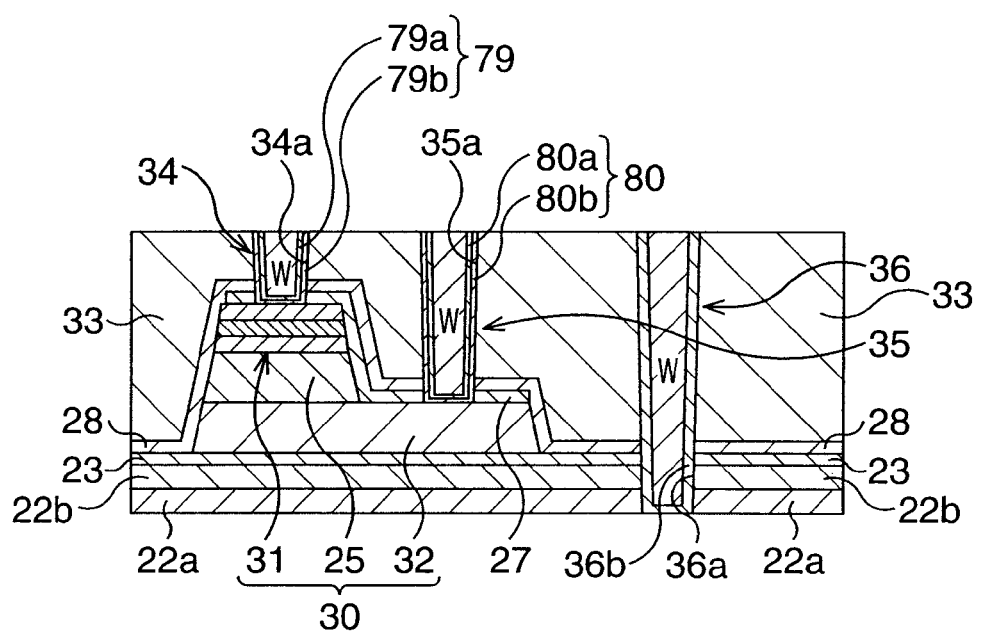
FIG. 21 is a schematic cross-sectional view showing a structure of an FeRAM according to another example of the modification example 7 of the first embodiment.

Note that in this example, the glue films 79, 80 are formed as the layered structure of the Ir films 79a, 80a and the TiN films 79b, 80b, but as shown in FIG. 21 (corresponding to FIG. 20A), the layered state of respective films may be inverted, thereby forming the glue films 79, 80 as a layered structure of the TiN films 79b, 80b and the Ir films 79a, 80a.

As described above, according to this example, oxidation of the plugs 34, 35 connected to the ferroelectric capacitor structure 30 is inhibited, and also entrance of hydrogen into the plugs 34, 35 is inhibited, so that a highly reliable planar type FeRAM with stabilized contact resistance can be realized.

Modification Example 8

In this example, similarly to the first embodiment, a structure of a planar type FeRAM and a manufacturing method thereof will be disclosed, but this example is different in that a metal layer having conductivity even when oxidized is formed on the ferroelectric capacitor structure 30.

FIG. 22A to FIG. 24D are schematic cross-sectional views showing a structure of an FeRAM according to modification example 8 of the first embodiment together with a manufacturing method thereof (main steps) in the order of steps.

First, similarly to the first embodiment, the respective steps of FIG. 2A to FIG. 2C are performed.

Figure 22A:
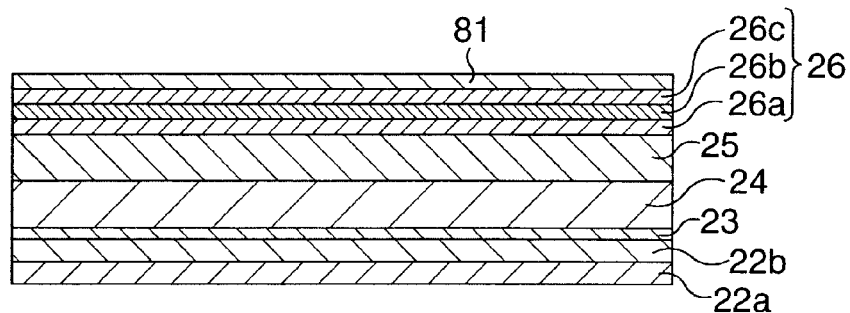
FIG. 22A to FIG. 22D are schematic cross-sectional views showing a structure of an FeRAM according to modification example 8 of the first embodiment together with a manufacturing method thereof (main steps) in the order of steps.

Subsequently, as shown in FIG. 22A, a lower electrode layer 24, a ferroelectric film 25, an upper electrode layer 26, and a conductive layer 81 constituted of a metal having conductivity even when oxidized are formed sequentially.

Particularly, first, a Pt film is deposited with a film thickness of approximately 150 nm to 200 nm for example by a sputtering method, thereby forming the lower electrode layer 24.

Next, on the lower electrode layer 24, the ferroelectric film 25 constituted of PZT for example, which is a ferroelectric, is deposited with a film thickness of approximately 100 nm to 300 nm by an RF sputtering method. Then, the ferroelectric film 25 is annealed to crystallize this ferroelectric film 25. Conditions of this annealing are such that it is performed for 60 seconds to 120 seconds at 550° C. to 650° C. for example while supplying $Ar/O_2$ gases at flow rates of 1.98 liter/minute of Ar and 0.025 liter/minute of $O_2$.

Next, the upper electrode layer 26 is formed by deposition on the ferroelectric film 25.

As the upper electrode layer 26, first, an $IrO_2$ film 26a for example which is a conductive oxide is formed with a film thickness of approximately 30 nm to 70 nm by a reactive sputtering method. Thereafter, the $IrO_2$ film 26a is annealed. Conditions of this annealing are such that it is performed for 10 seconds to 60 seconds at 650° C. to 850° C. for example while supplying $Ar/O_2$ gases at flow rates of 2.0 liter/minute of Ar and 0.02 liter/minute of $O_2$. Next, on the $IrO_2$ film 26a, an $IrO_2$ film 26b is formed with a film thickness of approximately 150 nm to 300 nm by a reactive sputtering method.

Next, on the $IrO_2$ film 26b, a noble metal film, here a Pt film 26c, which functions as a cap film for the $IrO_2$ film 26b is formed with a film thickness of approximately 100 nm by a sputtering method. From the $IrO_2$ films 26a, 26b and the Pt film 26c, the upper electrode layer 26 is constituted. Note that for the upper electrode layer 26, instead of the $IrO_2$ films 26a, 26b, conductive oxides of Ir, Ru, $RuO_2$, $SrRuO_3$, or the like or a layered structure of them may be adopted. Further, it is also possible to omit formation of the Pt film 26c.

Then, on the Pt film 26c, as a conductor impervious to oxygen, the conductive layer 81 constituted of a metal having conductivity even when oxidized, here Ir, is formed with a film thickness of approximately 200 nm by a sputtering method or the like. As the conductive layer 81, one containing at least one type selected from Ag, Ni, Cu, Zn, In, Sn, Ir, Ru, Rh, Pd, and Os is used. When two or more types are selected, they may be used in an alloy state.

Figure 22B:
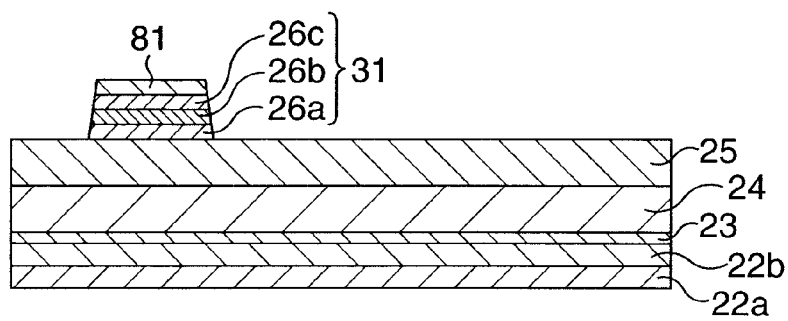

Subsequently, as shown in FIG. 22B, an upper electrode 31 whose upper surface is covered by the conductive layer 81 is pattern-formed.

Particularly, the conductive layer 81 and the upper electrode layer 26 are processed in a form of a plurality of electrodes by lithography and subsequent dry etching, thereby pattern-forming the upper electrode 31 in a state that the upper surface is covered by the conductive layer 81.

Figure 22C:
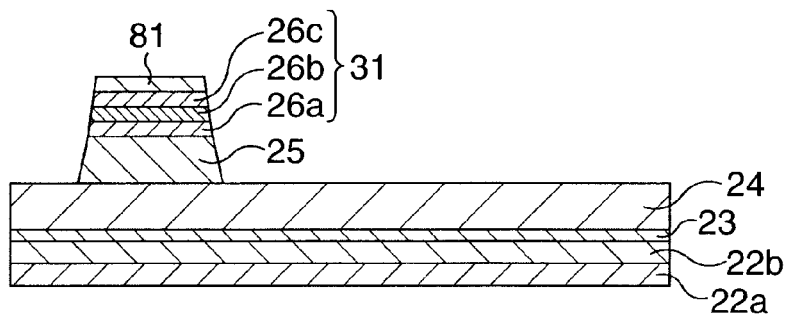

Subsequently, as shown in FIG. 22C, the ferroelectric film 25 is processed.

Particularly, a ferroelectric film 25 is processed by lithography and subsequent dry etching so as to match with the upper electrode 31. After this patterning of the ferroelectric film 25, the ferroelectric film 25 is annealed to recover the function of the ferroelectric film 25.

Figure 22D:
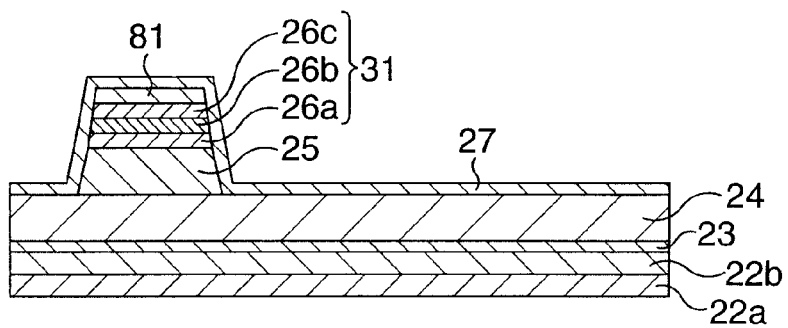

Subsequently, as shown in FIG. 22D, a protection film 27 for preventing entrance of hydrogen and water into the ferroelectric film 25 is formed.

Particularly, on the lower electrode layer 24, alumina ($Al_2O_3$) is used as a material and deposited by a sputtering method with a film thickness of approximately 50 nm so as to cover the ferroelectric film 25 and the upper electrode 31, thereby forming the protection film 27. Thereafter, the protection film 27 is annealed.

Figure 23A:
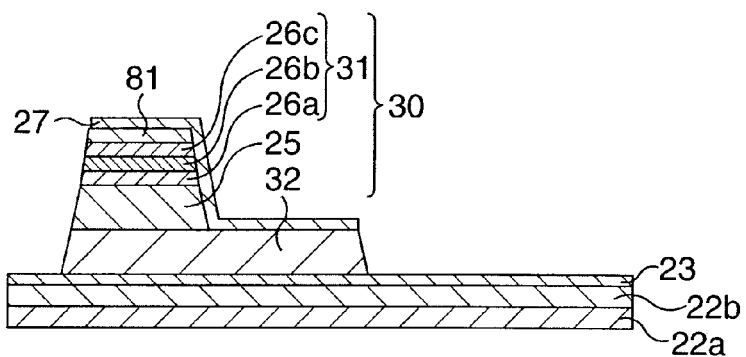
FIG. 23A to FIG. 23D are schematic cross-sectional views showing the structure of the FeRAM according to the modification example 8 of the first embodiment together with the manufacturing method thereof (main steps) in the order of steps, continuing from FIG. 22D.

Subsequently, as shown in FIG. 23A, the protection film 27 is processed together with the lower electrode layer 24 to thereby complete the ferroelectric capacitor structure 30.

The protection film 27 and the lower electrode layer 24 are processed by lithography and subsequent dry etching so that they match with the processed ferroelectric film 25 and the lower electrode layer 24 remains larger in size than the ferroelectric film 25, thereby pattern-forming a lower electrode 32. Thus the ferroelectric capacitor structure 30 is completed, in which the ferroelectric film 25 and the upper electrode 31 whose upper surface is covered by the conductive layer 81 are layered sequentially on the lower electrode 32, and the lower electrode 32 and the upper electrode 31 are capacitively coupled via the ferroelectric film 25. At this time, simultaneously, the protection film 27 remains so as to cover the top face of the conductive layer 81, side faces of the upper electrode 31, the upper electrode 31 and ferroelectric film 25, and the top face of the lower electrode layer 24. Thereafter, the protection film 27 is annealed.

Figure 23B:
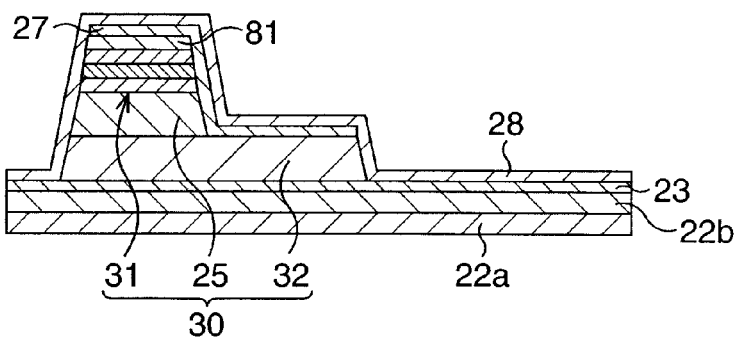

Subsequently, as shown in FIG. 23B, a protection film 28 is formed.

Particularly, alumina ($Al_2O_3$) is used as a material and deposited by a sputtering method with a film thickness of approximately 20 nm to 50 nm so as to cover the entire face of the ferroelectric capacitor structure 30 and the conductive layer 81, thereby forming the protection film 28. Thereafter, the protection film 28 is annealed.

Figure 23C:
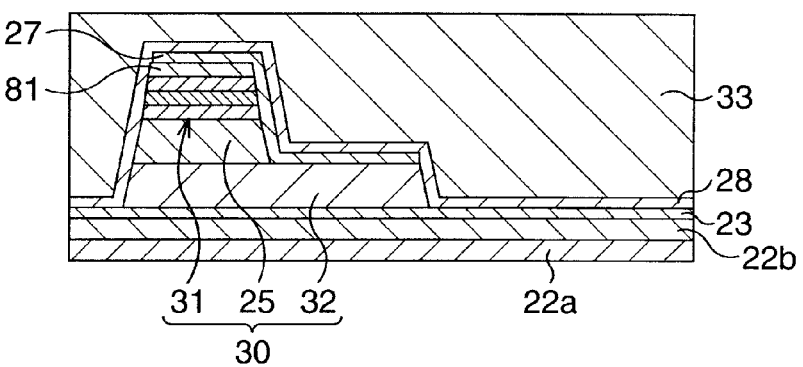

Subsequently, as shown in FIG. 23C, an interlayer insulating film 33 is formed.

Particularly, the interlayer insulating film 33 is formed so as to cover the ferroelectric capacitor structure 30 and the conductive layer 81 via the protection films 27, 28. Here, the interlayer insulating film 33 is formed such that a silicon oxide film is deposited with a film thickness of approximately 1500 nm to 2500 nm by a plasma CVD method using TEOS for example, and thereafter it is polished by CMP until the film thickness becomes approximately 1000 nm for example. After the CMP, for the purpose of dehydrating the interlayer insulating film 33, plasma annealing of $N_2O$ for example is performed.

Figure 23D:
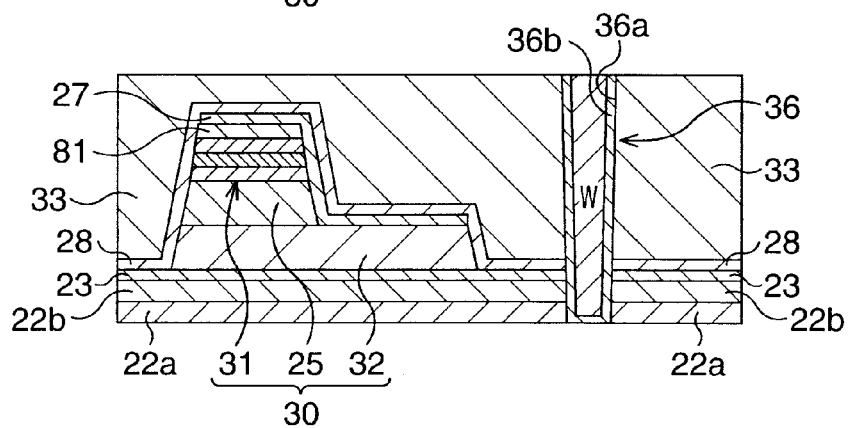

Subsequently, as shown in FIG. 23D, a plug 36 connected to the source/drain region 18 of the transistor structure 20 is formed.

Particularly, first, with the source/drain region 18 being an etching stopper, the interlayer insulating film 33, the protection films 28, 27, the interlayer insulating films 22b, 22a, and the protection film 21 are processed by lithography and subsequent dry etching until part of a surface of the source/drain region 18 exposes, thereby forming a via hole 36a with a diameter of approximately 0.3 μm for example.

Next, a Ti film and a TiN film for example are deposited sequentially with a film thickness of approximately 20 nm and a film thickness of approximately 50 nm respectively by a sputtering method so as to cover a wall surface of the via hole 36a, thereby forming a base film (glue film) 36b. Then, a W film for example is formed by a CVD method so as to fill up the via hole 36a via the glue film 36b. Thereafter, with the interlayer insulating film 33 being a stopper, the W film and the glue film 36b are polished by CMP, thereby forming the plug 36 in which the via hole 36a is filled up with W via the glue film 36b. After the CMP, plasma annealing of $N_2O$ for example is performed.

Figure 24A:
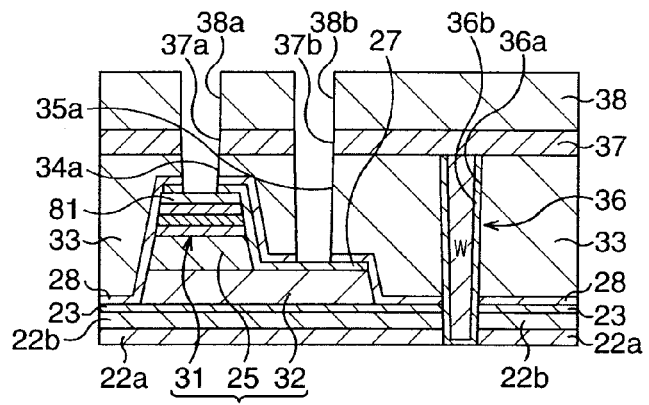
FIG. 24A to FIG. 24D are schematic cross-sectional views showing the structure of the FeRAM according to the modification example 8 of the first embodiment together with the manufacturing method thereof (main steps) in the order of steps, continuing from FIG. 23D.

Subsequently, as shown in FIG. 24A, after a hard mask 37 and a resist mask 38 are formed, via holes 34a, 35a to the ferroelectric capacitor structure 30 are formed.

Particularly, first, a silicon nitride film is deposited by a CVD method with a film thickness of approximately 100 nm on the interlayer insulating film 33, thereby forming the hard mask 37. Next, a resist is applied on the hard mask 37, and the resist is processed by lithography to thereby form the resist mask 38 having openings 38a, 38b.

Next, using the resist mask 38, the hard mask 37 is dry-etched to form openings 37a, 37b at positions on the hard mask 37 which match with the openings 38a, 38b respectively.

Then, using mainly the hard mask 37, with the conductive layer 81 on the upper electrode 31 and the lower electrode 32 being etching stoppers respectively, the interlayer insulating film 33 and the protection films 28, 27 are dry-etched. In this dry etching, a process performed on the interlayer insulating film 33 and the protection films 28, 27 until part of a surface of the conductive layer 81 is exposed and a process performed on the interlayer insulating film 33 and the protection films 28, 27 until part of a surface of the lower electrode 32 is exposed are carried out simultaneously, so that the via holes 34a, 35a with a diameter of approximately 0.5 μm for example are formed simultaneously at the respective positions.

Figure 24B:
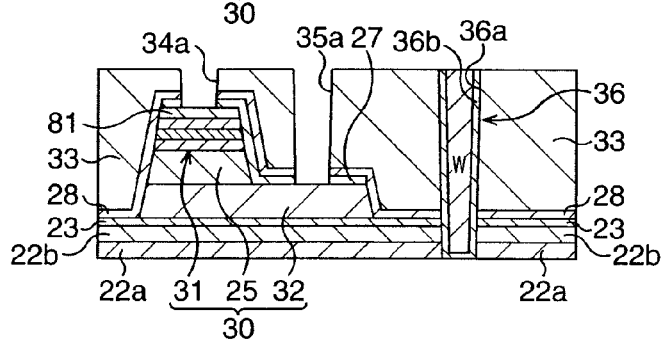

Subsequently, as shown in FIG. 24B, the resist mask 38 and the hard mask 37 are removed.

Particularly, first, the remained resist mask 38 is removed by ashing or the like. Thereafter, annealing is performed for recovering the ferroelectric capacitor structure 30 from damages received in steps after the ferroelectric capacitor structure 30 is formed. Then, by overall anisotropic etching, so called etch back, the hard mask 37 is removed.

Figure 24C:
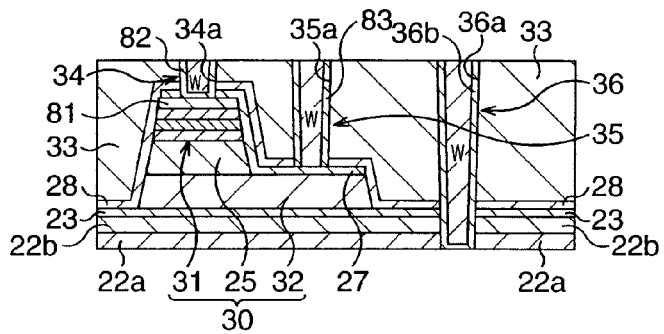

Subsequently, as shown in FIG. 24C, the plugs 34, connected to the ferroelectric capacitor structure 30 are formed.

Particularly, for example TiN films are deposited with a film thickness of approximately 50 nm so as to cover respective wall surfaces of the via holes 34a, 35a by a sputtering method, thereby forming base films (glue films) 82, 83. Then, for example W films are formed by a CVD method so as to fill up the via holes 34a, 35a via the glue film 82, 83. Thereafter, with the interlayer insulating film 33 being a stopper, the W films and the glue films 82, 83 are polished by CMP, thereby forming the plugs 34, 35 in which the via holes 34a, 35a are filled up with W via the glue films 82, 83. After the CMP, plasma annealing of $N_2O$ for example is performed. The TiN film constituting the glue films 82, 83 have a function of inhibiting permeation of hydrogen, and thus entrance of hydrogen into the plugs 34, 35 is inhibited. Here, as materials for the glue films 82, 83 which have a function of inhibiting permeation of hydrogen, at least one type selected from TiN, TiSiN, TaN, CrN, HfN, ZrN, TiAlN, TaAlN, CrAlN, and HfAlN is used.

In this example, the W filling up the via holes 34a, 35a and the upper electrode 31 are separated by the conductive layer 81. The conductive layer 81 absorbs oxygen, so to speak due to oxidation of itself, but it does not impair the electrical connection function of the plugs 34, 35 because it maintains conductivity even when oxidized. By this glue film 81, entrance into the plugs 34, 35 of oxygen activated due to the $IrO_2$ films 26a, 26b constituting the upper electrode 31, oxygen activated due to the Pt film 26c, and the like is inhibited, thereby preventing oxidation of the plugs 34, 35.

Note that in this example, the case of providing the conductive layer constituted of a metal having conductivity even when oxidized at the connection parts to the plugs 34, 35 of the ferroelectric capacitor structure 30 is exemplified, but similarly the conductive layer of a metal having conductivity even when oxidized, such as the conductive layer 81 constituted of Ir, may be formed at a connection part (on the source/drain 18) of the plug 36 to the MOS transistor 20.

Figure 24D:
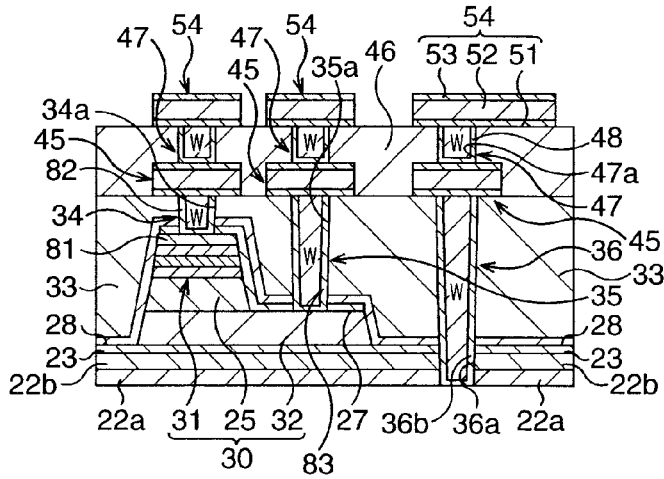

Then, the respective steps of FIG. 6A and FIG. 6B are performed to obtain the structure shown in FIG. 24D.

Thereafter, steps of forming an interlayer insulating film and a further upper layer wire, and so on are performed, thereby completing the planar type FeRAM according to this example.

As described above, according to this example, oxidation of the plugs 34, 35 connected to the ferroelectric capacitor structure 30 is inhibited, so that a highly reliable planar type FeRAM with stabilized contact resistance can be realized.

Modification Example 9

In this example, similarly to the first embodiment, a structure of a planar type FeRAM and a manufacturing method thereof will be disclosed, but this example is different in that a metal film having conductivity even when oxidized is applied to the glue films of the conductive plugs connecting the wires located at an upper layer of the ferroelectric capacitor structure 30.

FIG. 25A to FIG. 25E are schematic cross-sectional views showing a structure of an FeRAM according to modification example 9 of the first embodiment together with a manufacturing method thereof (main steps) in the order of steps.

First, similarly to the first embodiment, the respective steps of FIG. 2A to FIG. 6A are performed.

Figure 25A:
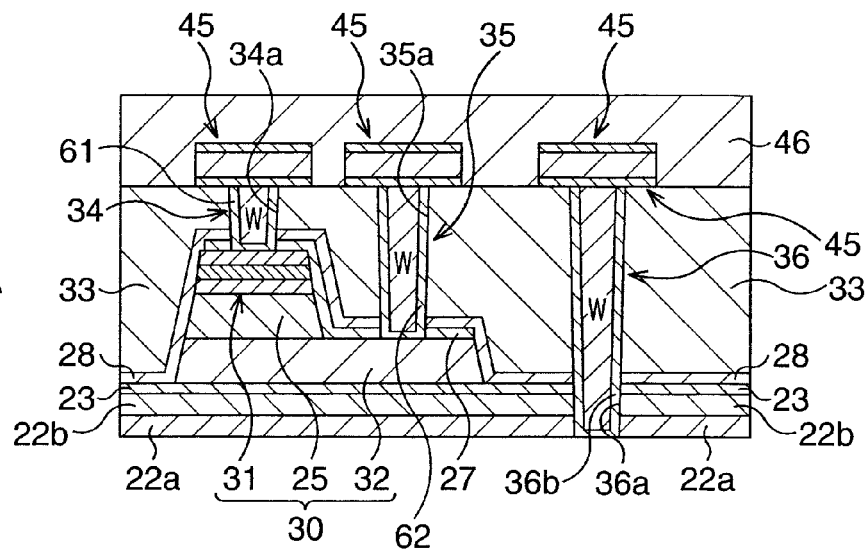
FIG. 25A to FIG. 25E are schematic cross-sectional views showing a structure of an FeRAM according to modification example 9 of the first embodiment together with a manufacturing method thereof (main steps) in the order of steps.

Subsequently, as shown in FIG. 25A, an interlayer insulating film 46 is formed so as to cover the first wires 45.

Particularly, a silicon oxide film is formed with a film thickness of approximately 700 nm so as to cover the first wires 45, and a plasma TEOS film is formed thereon so that a total film thickness thereof is approximately 1100 nm. Thereafter, the surface thereof is polished by CMP to make the film thickness approximately 750 nm, thereby forming the interlayer insulating film 46. After the CMP, plasma annealing of $N_2O$ for example is performed.

Figure 25B:
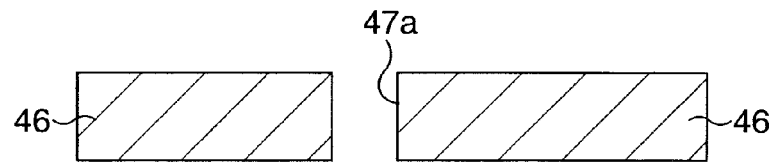

Subsequently, as shown in FIG. 25B, via holes 47a which expose surfaces of the first wires 45 are formed. Note that in FIG. 25B and respective subsequent drawings, for convenience of illustration, only the structure of the interlayer insulating film 46 and above is shown, and the ferroelectric capacitor structure 30, the first wires 45, and so on are omitted therefrom. Here, a plug 47 which is connected to one of the respective first wires 45 connected to the plugs 34, 35, 36 (for example the first wire 45 connected to the plug 35) is shown representatively.

Particularly, until part of a surface of the first wire 45 exposes, the interlayer insulating film 46 is processed by lithography and subsequent dry etching, thereby forming a via hole 47a with a diameter of approximately 0.25 μm for example.

Figure 25C:
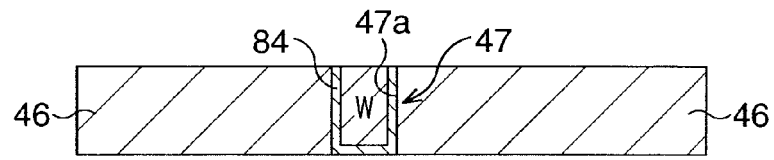

Subsequently, as shown in FIG. 25C, the plug 47 connected to the first wire 45 is formed.

Particularly, in order to inhibit oxidation of the plug 47 due to oxygen generated from the ferroelectric capacitor structure 30 (particularly, oxygen activated by the Pt film 26c), the base film of the plug 47 is formed with a metal film which is a conductor impervious to oxygen (capable of absorbing oxygen) and has conductivity even when oxidized. Specifically, a metal having conductivity even when oxidized, for example an Ir film is deposited with a film thickness of approximately 50 nm on the interlayer insulating film 46 so as to cover an inner wall surface of the via hole 47a, thereby forming a base film (glue film) 84. As the metal having conductivity even when oxidized, one containing at least one type selected from Ag, Ni, Cu, Zn, In, Sn, Ir, Ru, Rh, Pd, and Os is used. When two or more types are selected, they may be used in an alloy state.

Then, a W film for example is formed by a CVD method so as to fill up the via hole 47a via the glue film 84. Thereafter, with the interlayer insulating film 46 being a stopper, the W film and the glue film 84 are polished by CMP, thereby forming the plug 47 in which the via hole 47a is filled up with W via the glue film 84.

In this example, the W filling up the via hole 47a is covered from a bottom face to a side face by the glue film 84 which is the metal film having conductivity even when oxidized, and the W and the ferroelectric capacitor structure 30 existing at a lower layer thereof are separated by the glue film 84. The glue film 84 absorbs oxygen, so to speak due to oxidation of itself, but it does not impair the electrical connection function of the plug 47 because it maintains conductivity even when oxidized. By this glue film 84, entrance into the plug 47 of oxygen activated due to the $IrO_2$ films 26a, 26b constituting the upper electrode 31, oxygen activated due to the Pt film 26c, and the like is inhibited, thereby preventing oxidation of the plug 47.

Figure 25D:
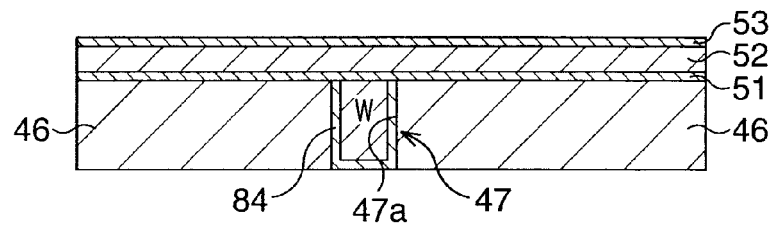

Subsequently, as shown in FIG. 25D, a barrier metal film 51, a wiring film 52 and a barrier metal film 53 are deposited on the entire surface by a sputtering method or the like.

Particularly, as the barrier metal film 51, a TiN film for example is formed with a film thickness of approximately 150 nm by a sputtering method. As the wiring film 52, an Al alloy film (here an Al—Cu film) for example is formed with a film thickness of approximately 350 nm. As the barrier metal film 53, a TiN film for example is formed with a film thickness of approximately 150 nm by a sputtering method. Here, the structure of the wiring film 52 is the same as that of a logic part other than the FeRAM of the same rules, so that there is no problem in processing of wires or reliability thereof.

Figure 25E:
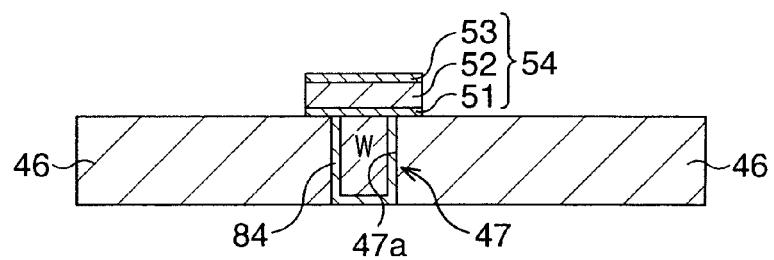

Subsequently, as shown in FIG. 25E, a second wire 54 connected to the plug 47 is formed.

Particularly, as a reflection preventing film, for example an SiON film or a reflection preventing film (not-shown) is formed, and thereafter the reflection preventing film, the barrier metal film 53, the wiring film 52 and the barrier metal film 51 are processed in a wiring form by lithography and subsequent dry etching, thereby pattern-forming the second wire 54.

Thereafter, steps of forming an interlayer insulating film and a further upper layer wire, and so on are performed, thereby completing the planar type FeRAM according to this example. Here, when forming further upper layer wires, a silicide film as described above is applied to a glue film of a plug (a plug constituted of W) connecting the upper layer wires, similarly to the plug 47.

Note that in this example, the case of applying the silicide film to the glue films of the plugs 34, connected to the ferroelectric capacitor structure 30, and applying the metal film having conductivity even when oxidized to the glue film of the plug 47 connected to the first wire 45 is exemplified, but it is also preferable to apply the metal film having conductivity to the glue films of the plugs 34, 35 connected to the ferroelectric capacitor structure 30. Also, when attaching much weight to the achievement of preventing oxidation of the plug 47 in particular, the metal film having conductivity even when oxidized may be applied only to the glue film of the plug 47 connected to the first wire 45.

As described above, according to this example, oxidation of the plugs 34, 35 connected to the ferroelectric capacitor structure 30 as well as the plugs 47 connected to the first wires 45 is inhibited, so that a highly reliable planar type FeRAM with stabilized contact resistance can be realized.

Modification Example 10

In this example, similarly to the first embodiment, a structure of a planar type FeRAM and a manufacturing method thereof will be disclosed, but this example is different in that a metal film having conductivity even when oxidized is applied to the glue films of the conductive plugs connecting the wires located at an upper layer of the ferroelectric capacitor structure 30.

FIG. 26A to FIG. 26E are schematic cross-sectional views showing a structure of an FeRAM according to modification example 10 of the first embodiment together with a manufacturing method thereof (main steps) in the order of steps.

First, similarly to the first embodiment, the respective steps of FIG. 2A to FIG. 6A are performed.

Subsequently, as shown in FIG. 26A, an interlayer insulating film 46 is formed so as to cover the first wires 45.

Particularly, a silicon oxide film is formed with a film thickness of approximately 700 nm so as to cover the first wires 45, and a plasma TEOS film is formed thereon so that a total film thickness thereof is approximately 1100 nm. Thereafter, the surface thereof is polished by CMP to make the film thickness approximately 750 nm, thereby forming the interlayer insulating film 46. After the CMP, plasma annealing of N$_2$O for example is performed.

Subsequently, as shown in FIG. 26B, via holes 47a which expose surfaces of the first wires 45 are formed. Note that in FIG. 26B and respective subsequent drawings, for convenience of illustration, only the structure of the interlayer insulating film 46 and above is shown, and the ferroelectric capacitor structure 30, the first wires 45, and so on are omitted therefrom. Here, a plug 47 which is connected to one of the respective first wires 45 connected to the plugs 34, 35, 36 (for example the first wire 45 connected to the plug 35) is shown representatively.

Particularly, until part of a surface of the first wire 45 exposes, the interlayer insulating film 46 is processed by lithography and subsequent dry etching, thereby forming a via hole 47a with a diameter of approximately 0.25 μm for example.

Subsequently, as shown in FIG. 26C, the plug 47 connected to the first wire 45 is formed.

Particularly, in order to inhibit oxidation of the plug 47 due to oxygen generated from the ferroelectric capacitor structure 30 (particularly, oxygen activated by the Pt film 26c), as a conductor impervious to oxygen the base film of the plug 47 is formed with a metal film having conductivity even when oxidized. Specifically, a metal film having conductivity even when oxidized, for example an Ir film is formed with a film thickness of approximately 50 nm on the interlayer insulating film 46 so as to cover an inner wall surface of the via hole 47a, thereby forming a base film (glue film) 85. As the metal having conductivity even when oxidized, one containing at least one type selected from Ag, Ni, Cu, Zn, In, Sn, Ir, Ru, Rh, Pd, and Os is used. When two or more types are selected, they may be used in an alloy state.

Then, a W film for example is formed by a CVD method so as to fill up the via hole 47a via the glue film 85. Thereafter, with the interlayer insulating film 46 being a stopper, the W film and the glue film 85 are polished by CMP, thereby forming the plug 47 in which the via hole 47a is filled up with W via the glue film 85.

Subsequently, as shown in FIG. 26D, a conductive layer 86, a barrier metal film 51, a wiring film 52 and a barrier metal film 53 are deposited on the entire surface by a sputtering method or the like.

Particularly, similarly to the glue film 85, the conductive layer 86 is formed using a metal having conductivity even when oxidized, for example Ir with a film thickness of approximately 200 nm. As the conductive layer 86, one containing at least one type selected from Ag, Ni, Cu, Zn, In, Sn, Ir, Ru, Rh, Pd, and Os is used. When two or more types are selected, they may be used in an alloy state.

As the barrier metal film 51, a TiN film for example is formed with a film thickness of approximately 150 nm by a sputtering method. As the wiring film 52, an Al alloy film (here an Al—Cu film) for example is formed with a film thickness of approximately 350 nm. As the barrier metal film 53, a TiN film for example is formed with a film thickness of approximately 150 nm by a sputtering method. Here, the structure of the wiring film 52 is the same as that of a logic part other than the FeRAM of the same rules, so that there is no problem in processing of wires or reliability thereof.

Subsequently, as shown in FIG. 26E, a second wire 54 connected to the plug 47 is formed.

Particularly, as a reflection preventing film, for example an SiON film or a reflection preventing film (not-shown) is formed, and thereafter the reflection preventing film, the barrier metal film 53, the wiring film 52, the barrier metal film 51 and the conductive layer 86 are processed in a wiring form by lithography and subsequent dry etching, thereby pattern-forming the second wire 54.

Thereafter, steps of forming an interlayer insulating film and a further upper layer wire, and so on are performed, thereby completing the planar type FeRAM according to this example. Here, when forming further upper layer wires, a silicide film as described above is applied to a glue film of a plug (a plug constituted of W) connecting the upper layer wires, similarly to the plug 47.

In this example, the W filling up the via hole 47a is covered from a bottom face to a side face by the glue film 85 which is the metal film having conductivity even when oxidized, and an upper face of the W filling up the via hole 47a is covered by the conductive layer 86 which is the metal film having conductivity. The W is in a state of being substantially completely isolated from the ferroelectric capacitor structure 30 existing at a lower layer thereof by the glue film 85 and the conductive layer 86. The glue film 85 and the conductive layer 86 absorb oxygen, so to speak due to oxidation of themselves, but they do not impair the electrical connection function of the plug 47 because they maintain conductivity even when oxidized. By these glue film 85 and the conductive layer 86, entrance into the plug 47 of oxygen activated due to the IrO$_2$ films 26a, 26b constituting the upper electrode 31, oxygen activated due to the Pt film 26c, and the like is inhibited as much as possible, thereby preventing oxidation of the plug 47.

Note that in this example, the case of applying the silicide film to the glue films of the plugs 34, connected to the ferroelectric capacitor structure 30, and applying the metal film having conductivity even when oxidized to the glue film of the plug 47 connected to the first wire 45 and the upper face of the plug 47 is exemplified, but it is also preferable to apply the metal film having conductivity to the glue films of the plugs 34, 35 connected to the ferroelectric capacitor structure 30. Also, when attaching much weight to the achievement of preventing oxidation of the plug 47 in particular, the metal film having conductivity even when oxidized may be applied only to the glue film of the plug 47 connected to the first wire 45 and the upper face of the plug 47.

As described above, according to this example, oxidation of the plugs 34, 35 connected to the ferroelectric capacitor structure 30 as well as the plugs 47 connected to the first wires 45 is inhibited, so that a highly reliable planar type FeRAM with stabilized contact resistance can be realized.

Modification Example 11

In this example, similarly to the first embodiment, a structure of a planar type FeRAM and a manufacturing method thereof will be disclosed, but this example is different in that part of wires located at an upper layer of the ferroelectric capacitor structure 30 are formed by a so-called damascene method, and a silicide film is applied to the glue films of the wires and the conductive plugs.

FIG. 27A to FIG. 29B are schematic cross-sectional views showing a structure of an FeRAM according to modification example 11 of the first embodiment together with a manufacturing method thereof (main steps) in the order of steps.

First, similarly to the first embodiment, the respective steps of FIG. 2A to FIG. 6A are performed.

Subsequently, as shown in FIG. 27A, an interlayer insulating film 46 is formed so as to cover the first wires 45.

Particularly, a silicon oxide film is formed with a film thickness of approximately 700 nm so as to cover the first wires 45, and a plasma TEOS film is formed thereon so that a total film thickness thereof is approximately 1100 nm. Thereafter, the surface thereof is polished by CMP to make the film thickness approximately 750 nm, thereby forming the interlayer insulating film 46. After the CMP, plasma annealing of $N_2O$ for example is performed.

Subsequently, as shown in FIG. 27B, via holes 49a which expose surfaces of the first wires 45 are formed. Note that in FIG. 27B and respective subsequent drawings, for convenience of illustration, only the structure of the interlayer insulating film 46 and above is shown, and the ferroelectric capacitor structure 30, the first wires 45, and so on are omitted therefrom. Here, a plug 49 which is connected to one of the respective first wires 45 connected to the plugs 34, 35, 36 (for example the first wire 45 connected to the plug 35) is shown representatively.

Particularly, until part of a surface of the first wire 45 exposes, the interlayer insulating film 46 is processed by lithography and subsequent dry etching, thereby forming a via hole 49a with a diameter of approximately 0.25 μm for example.

Subsequently, as shown in FIG. 27C, a base film 87 constituted of a metal having conductivity even when oxidized is formed and Cu plating is performed.

Particularly, a metal film having conductivity even when oxidized, for example an Ir film is deposited with a film thickness of approximately 50 nm on the interlayer insulating film 46 so as to cover an inner wall surface of the via hole 49a, thereby forming the base film (glue film) 87. As the base film 87, one containing at least one type selected from Ag, Ni, Cu, Zn, In, Sn, Ir, Ru, Rh, Pd, and Os is used. When two or more types are selected, they may be used in an alloy state.

Then, after a seed film (not-shown) of Cu is formed, a Cu (or an alloy thereof) film 65 is deposited on the glue film 87 by a plating method so as to fill up the via hole 49a via the glue film 87.

Subsequently, as shown in FIG. 27D, the plug 49 is formed.

Particularly, with the interlayer insulating film 46 being a stopper, the Cu film 65 and the glue film 87 are polished by CMP, thereby forming the plug 49 in which the via hole 49a is filled up with Cu via the glue film 87.

Subsequently, as shown in FIG. 27E, a silicon nitride film 66, an interlayer insulating film 67, an SOG film 68, an interlayer insulating film 69 and a silicon nitride film 70 are layered sequentially on the interlayer insulating film 46 so as to cover the plug 49.

Particularly, the silicon nitride film 66 is formed with a film thickness of approximately 50 nm to 100 nm by a CVD method for example. The interlayer insulating film 67 is formed with a film thickness of approximately 200 nm to 400 nm by a CVD method for example. The SOG film 68 is formed with a film thickness of approximately 100 nm to 200 nm by spin coating SOG. The interlayer insulating film 69 is formed with a film thickness of approximately 100 nm by a CVD method for example. The silicon nitride film 70 is formed with a film thickness of approximately 100 nm by a CVD method for example.

Figure 28A:
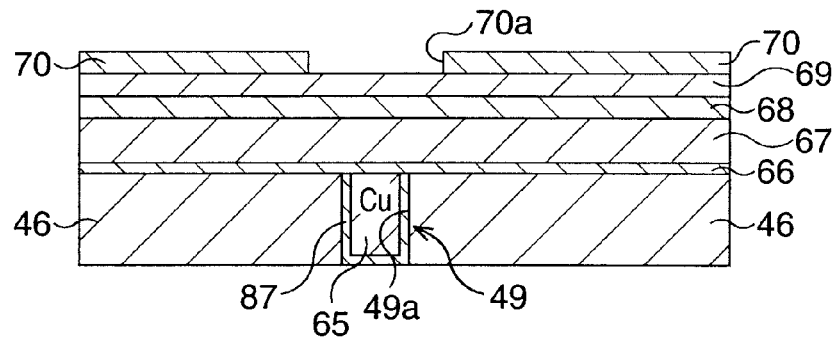
FIG. 28A to FIG. 28D are schematic cross-sectional views showing the structure of the FeRAM according to the modification example 11 of the first embodiment together with the manufacturing method thereof (main steps) in the order of steps, continuing from FIG. 27E.

Subsequently, as shown in FIG. 28A, the silicon nitride film 70 is processed.

Particularly, the silicon nitride film 70 is patterned by lithography and dry etching, thereby forming an opening 70a in a wiring form in the silicon nitride film 70.

Figure 28B:
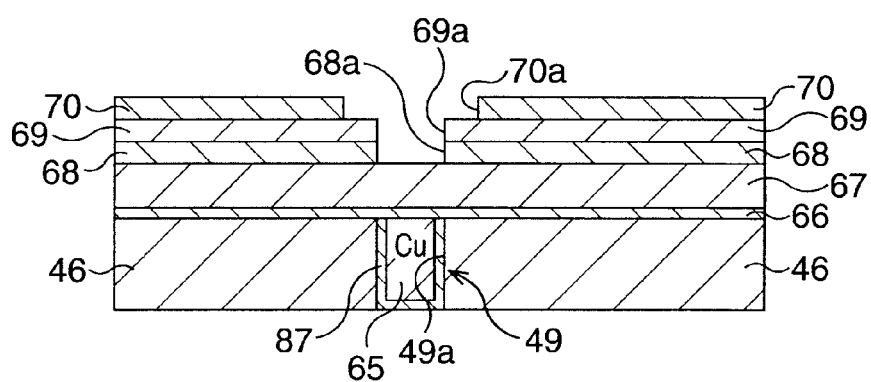

Subsequently, as shown in FIG. 28B, the interlayer insulating film 69 and the SOG film 68 are processed.

Particularly, the interlayer insulating film 69 and the SOG film 68 are patterned by lithography and dry etching, thereby forming openings 69a, 68a in a hole form at positions on the interlayer insulating film 69 and the SOG film 68 located above the plug 49 and matching with the opening 70a.

Figure 28C:
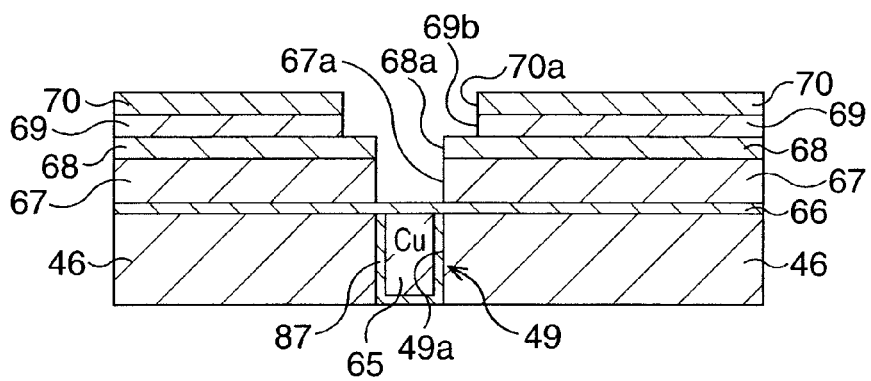

Subsequently, as shown in FIG. 28C, the interlayer insulating film 69 and the interlayer insulating film 67 are processed.

Particularly, using the silicon nitride film 70 as a hard mask, the interlayer insulating film 69 is patterned in a wiring form corresponding to the opening 70a by lithography and dry etching, thereby forming an opening 69b extending the opening 69a. At this time, simultaneously, the interlayer insulating film 69 and the SOG film 68 function as a mask, and the interlayer insulating film 67 is patterned in a hole form corresponding to the opening 68a, thereby forming an opening 67a.

Figure 28D:
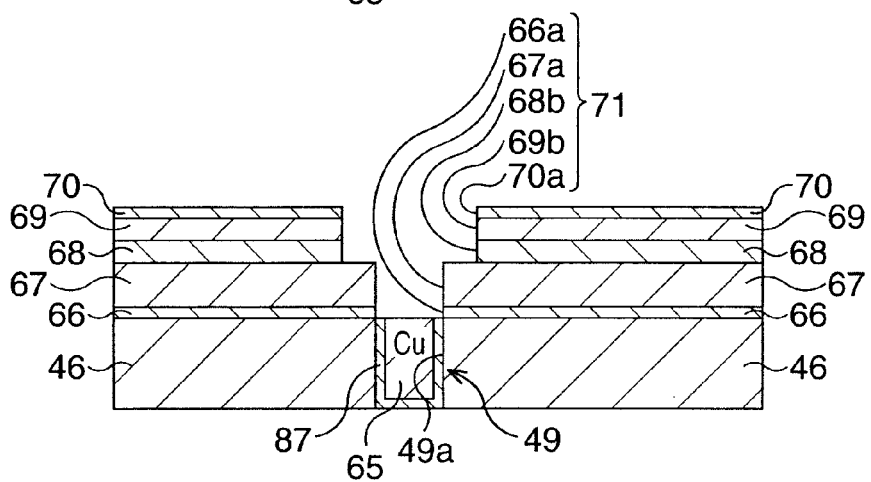

Subsequently, as shown in FIG. 28D, a wiring trench 71 is completed.

Particularly, using the silicon nitride film 70 as a hard mask, the silicon nitride film 66 is patterned by lithography and dry etching until a surface of the plug 47 exposes. At this time, an opening 68b in a wiring form extending the opening 68a corresponding to the openings 70a, 69b, is formed in the SOG film 68, and an opening 66a in a hole form corresponding to the opening 67a is formed in the silicon nitride film 66. Here, also the silicon nitride film 70 becomes thin by the film thickness of the silicon nitride film 66 by etching. At this time, the openings 66a, 67a formed in the silicon nitride film 66 and the interlayer insulating film 67 and the openings 68b, 69b, 70a formed in the SOG film 68, the interlayer insulating film 69 and the silicon nitride film 70 become integral, thereby completing the wiring trench 71.

Figure 29A:
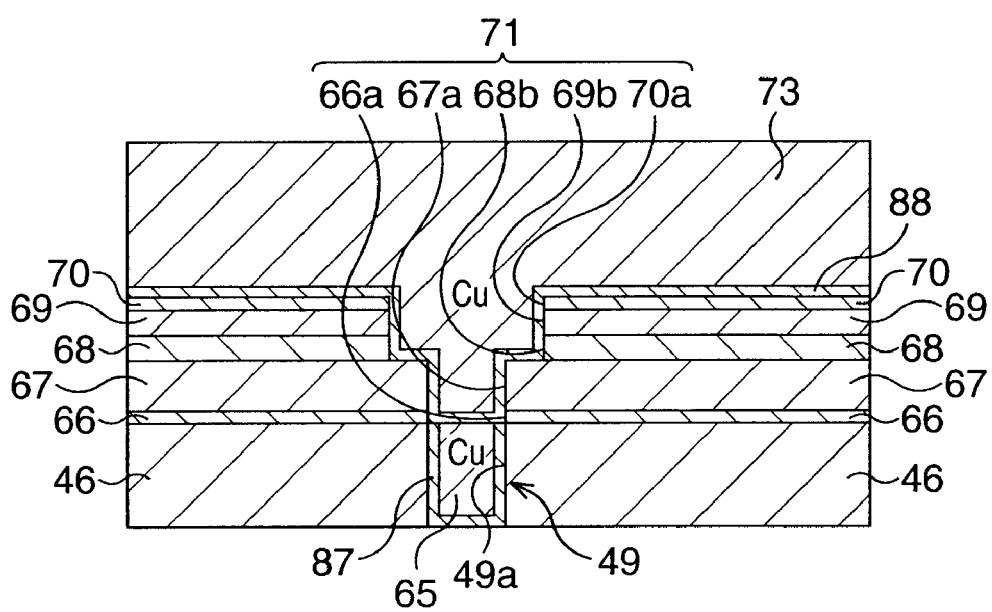
FIG. 29A and FIG. 29B are schematic cross-sectional views showing the structure of the FeRAM according to the modification example 11 of the first embodiment together with the manufacturing method thereof (main steps) in the order of steps, continuing from FIG. 28D.

Subsequently, as shown in FIG. 29A, a base film 88 constituted of a metal having conductivity even when oxidized is formed and Cu plating is performed.

Particularly, a metal film having conductivity, for example an Ir film, is formed with a film thickness of approximately 50 nm on the silicon nitride film 70 so as to cover an inner wall surface of the wiring trench 71, thereby forming the base film (glue film) 88. As the glue film 88, one containing at least one type selected from Ag, Ni, Cu, Zn, In, Sn, Ir, Ru, Rh, Pd, and Os is used. When two or more types are selected, they may be used in an alloy state.

Then, after a seed film (not-shown, having a film thickness of approximately 130 nm) of Cu is formed, a Cu film 73 is deposited on the glue film 88 by a plating method so as to fill up the wiring trench 71 via the glue film 88.

Figure 29B:
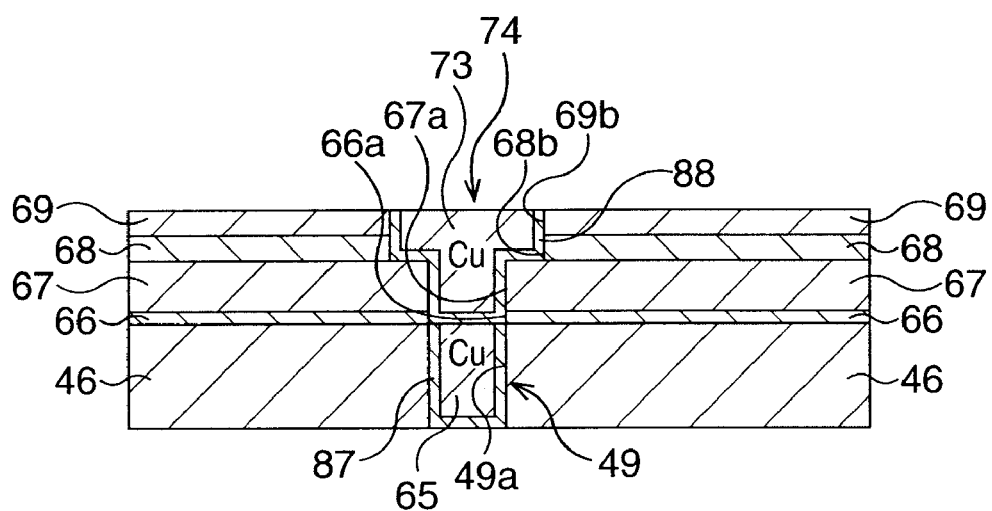

Subsequently, as shown in FIG. 29B, a wiring structure 74 is formed.

Particularly, with the interlayer insulating film 69 being a stopper, the Cu film 73, the glue film 88 and the silicon nitride film 70 are polished by CMP, and the wiring trench 71 is filled up with Cu (or an alloy thereof) via the glue film 88, thereby forming the wiring structure 74 electrically connected to the first wire 45 via the plug 49. Here, in the wiring structure 74, a part where spaces of the openings 66a, 67a are filled up with Cu via the glue film 88 corresponds to a conductive plug part and a part where spaces of the openings 68b, 69b are filled up with Cu via the glue film 88 corresponds to a wire part, and thus the conductive plug part and the wire part are formed integrally.

Thereafter, steps of forming an interlayer insulating film and a further upper layer wire by a damascene method, and so on are performed, thereby completing the planar type FeRAM according to this example. Here, when the further upper layer wire is formed, the silicide film as described above is applied to a glue film thereof, similarly to the wiring structure 74.

In this example, the Cu filling up the via hole 49a is covered from a bottom face to a side face by the glue film 87 which is the metal film having conductivity even when oxidized, and the Cu filling up the wiring trench 71 is covered from a bottom face to a side face by the glue film 88 which is the metal film having conductivity even when oxidized. These Cu are in a state of being isolated from the ferroelectric capacitor structure 30 existing at a lower layer thereof by the glue films 87, 88. The glue films 87, 88 absorb oxygen, so to speak due to oxidation of themselves, but they do not impair the electrical connection function of the wiring structure 74 because they maintain conductivity even when oxidized. By these glue films 87, 88, entrance into the plug 49 and the wiring structure 74 of oxygen activated due to the $IrO_2$ films 26a, 26b constituting the upper electrode 31, oxygen activated due to the Pt film 26c, and the like is inhibited as much as possible, thereby preventing oxidation of the plug 49 and the wiring structure 74.

Note that in this example, the case of applying the metal film having conductivity even when oxidized to the glue films of the plugs 34, 35 connected to the ferroelectric capacitor structure 30, and also applying the metal film to the glue films of the plug 49 connected to the first wire 45 and the wiring structure 74 is exemplified, but when attaching much weight to the achievement of preventing oxidation of the plug 47 and the wiring structure 74 in particular, the metal film having conductivity even when oxidized may be applied only to the glue films of the plug 47 and the wiring structure 74.

As described above, according to this example, oxidation of the plugs 34, 35 connected to the ferroelectric capacitor structure 30 as well as the plugs 49 connected to the first wires 45 and the wiring structure 74 is inhibited, so that a highly reliable planar type FeRAM with stabilized contact resistance can be realized.

Modification Example 12

In this example, in the structure of the modification example 11, the glue films are formed as a layered structure of a metal film having conductivity even when oxidized and a conductive protection film which inhibits permeation of hydrogen.

FIG. 30A to FIG. 32B are schematic cross-sectional views showing a structure of an FeRAM according to modification example 12 of the first embodiment together with a manufacturing method thereof (main steps) in the order of steps.

First, similarly to the first embodiment, the respective steps of FIG. 2A to FIG. 6A are performed.

Figure 30A:
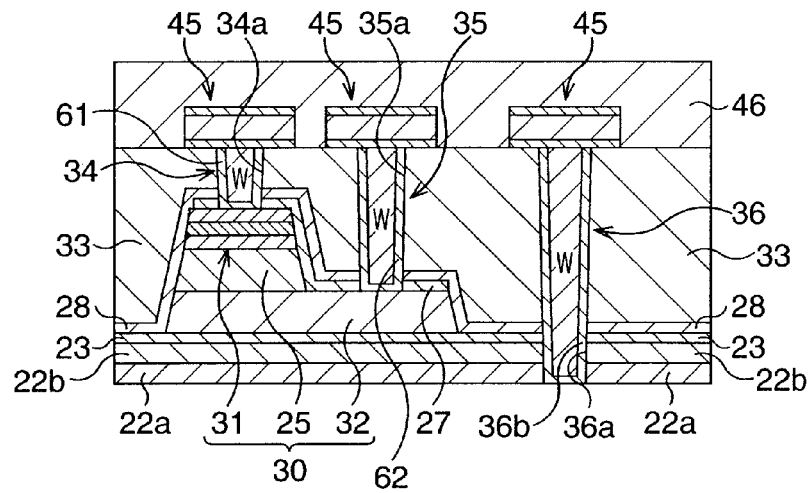
FIG. 30A to FIG. 30E are schematic cross-sectional views showing a structure of an FeRAM according to modification example 12 of the first embodiment together with a manufacturing method thereof (main steps) in the order of steps.

Subsequently, as shown in FIG. 30A, an interlayer insulating film 46 is formed so as to cover the first wires 45.

Particularly, a silicon oxide film is formed with a film thickness of approximately 700 nm so as to cover the first wires 45, and a plasma TEOS film is formed thereon so that a total film thickness thereof is approximately 1100 nm. Thereafter, the surface thereof is polished by CMP to make the film thickness approximately 750 nm, thereby forming the interlayer insulating film 46. After the CMP, plasma annealing of $N_2O$ for example is performed.

Figure 30B:
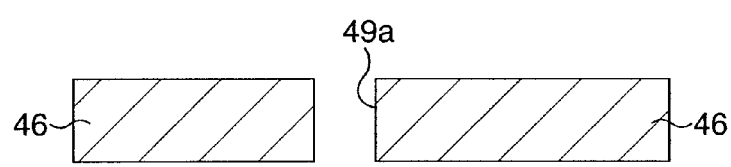

Subsequently, as shown in FIG. 30B, via holes 49a which expose surfaces of the first wires 45 are formed. Note that in FIG. 30B and respective subsequent drawings, for convenience of illustration, only the structure of the interlayer insulating film 46 and above is shown, and the ferroelectric capacitor structure 30, the first wires 45, and so on are omitted therefrom. Here, a plug 49 which is connected to one of the respective first wires 45 connected to the plugs 34, 35, 36 (for example the first wire 45 connected to the plug 35) and so on are shown representatively.

Particularly, until part of a surface of the first wire 45 exposes, the interlayer insulating film 46 is processed by lithography and subsequent dry etching, thereby forming a via hole 49a with a diameter of approximately 0.25 μm for example.

Figure 30C:
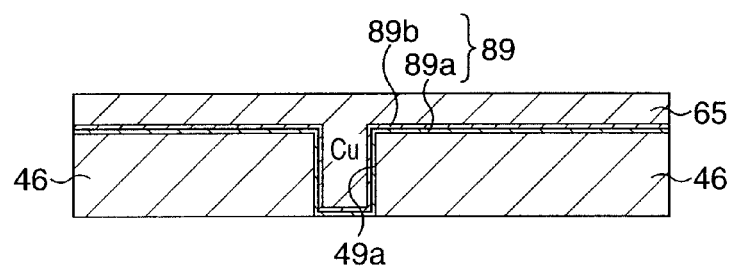

Subsequently, as shown in FIG. 30C, a base film 89 constituted of a metal having conductivity even when oxidized is formed and Cu plating is performed.

Particularly, a metal film which is a conductor impervious to oxygen and has conductivity even when oxidized and a conductive protection film which prevents entrance of hydrogen are layered to form the base film. Specifically, a conductive layer 89a having conductivity even when oxidized, for example a Ir film (with a film thickness of approximately 20 nm) and a conductive protection film which inhibits permeation of hydrogen, for example a TiAlN film 89b (with a film thickness of approximately 50 nm) are deposited sequentially on the interlayer insulating film 46 so as to cover an inner wall surface of the via hole 49a, thereby forming the base film (glue film) 89 of layered structure. As the conductive layer 89a having conductivity even when oxidized, one containing at least one type selected from Ag, Ni, Cu, Zn, In, Sn, Ir, Ru, Rh, Pd, and Os is used. When two or more types are selected, they may be used in an alloy state. Further, as the conductive protection film which inhibits permeation of hydrogen, at least one type selected from TiN, TiSiN, TaN, CrN, HfN, ZrN, TiAlN, TaAlN, CrAlN, and HfAlN is used.

Then, after a seed film (not-shown) of Cu is formed, a Cu (or an alloy thereof) film 65 is deposited on the glue film 89 by a plating method so as to fill up the via hole 49a via the glue film 89.

Figure 30D:
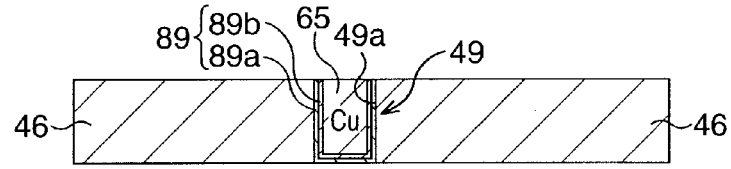

Subsequently, as shown in FIG. 30D, the plug 49 is formed.

Particularly, with the interlayer insulating film 46 being a stopper, the Cu film 65 and the glue film 89 are polished by CMP, thereby forming the plug 49 in which the via hole 49a is filled up with Cu via the glue film 89.

Figure 30E:
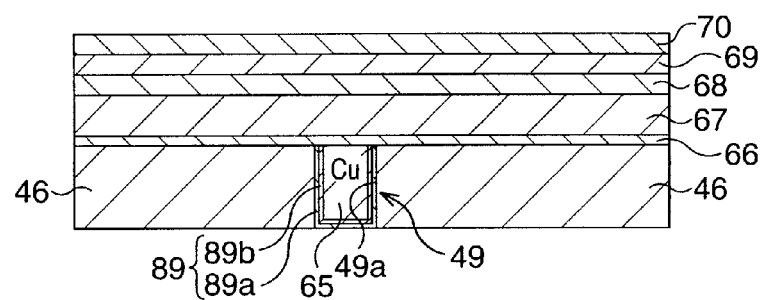

Subsequently, as shown in FIG. 30E, a silicon nitride film 66, an interlayer insulating film 67, an SOG film 68, an interlayer insulating film 69 and a silicon nitride film 70 are layered sequentially on the interlayer insulating film 46 so as to cover the plug 49.

Particularly, the silicon nitride film 66 is formed with a film thickness of approximately 50 nm to 100 nm by a CVD method for example. The interlayer insulating film 67 is formed with a film thickness of approximately 200 nm to 400 nm by a CVD method for example. The SOG film 68 is formed with a film thickness of approximately 100 nm to 200 nm by spin coating SOG. The interlayer insulating film 69 is formed with a film thickness of approximately 100 nm by a CVD method for example. The silicon nitride film 70 is formed with a film thickness of approximately 100 nm by a CVD method for example.

Figure 31A:
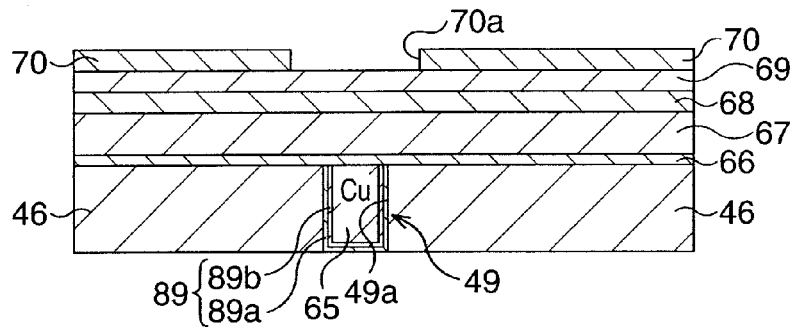
FIG. 31A to FIG. 31D are schematic cross-sectional views showing the structure of the FeRAM according to the modification example 12 of the first embodiment together with the manufacturing method thereof (main steps) in the order of steps, continuing from FIG. 30E.

Subsequently, as shown in FIG. 31A, the silicon nitride film 70 is processed.

Particularly, the silicon nitride film 70 is patterned by lithography and dry etching, thereby forming an opening 70a in a wiring form in the silicon nitride film 70.

Figure 31B:
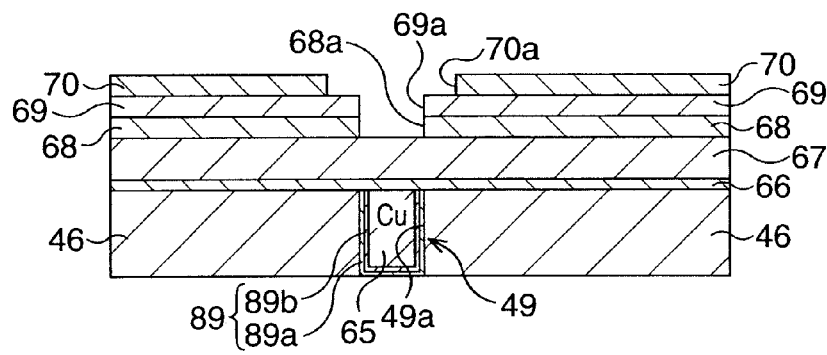

Subsequently, as shown in FIG. 31B, the interlayer insulating film 69 and the SOG film 68 are processed.

Particularly, the interlayer insulating film 69 and the SOG film 68 are patterned by lithography and dry etching, thereby forming openings 69a, 68a in a hole form at positions on the interlayer insulating film 69 and the SOG film 68 located above the plug 49 and matching with the opening 70a.

Figure 31C:
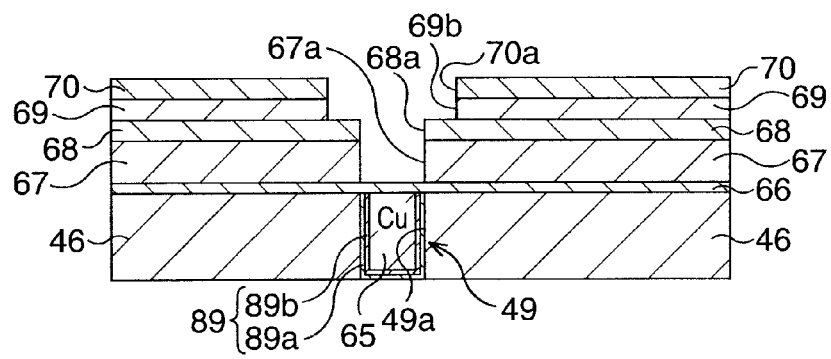

Subsequently, as shown in FIG. 31C, the interlayer insulating film 69 and the interlayer insulating film 67 are processed.

Particularly, using the silicon nitride film 70 as a hard mask, the interlayer insulating film 69 is patterned in a wiring form corresponding to the opening 70a by lithography and dry etching, thereby forming an opening 69b extending the opening 69a. At this time, simultaneously, the interlayer insulating film 69 and the SOG film 68 function as a mask, and the interlayer insulating film 67 is patterned in a hole form corresponding to the opening 68a, thereby forming an opening 67a.

Figure 31D:
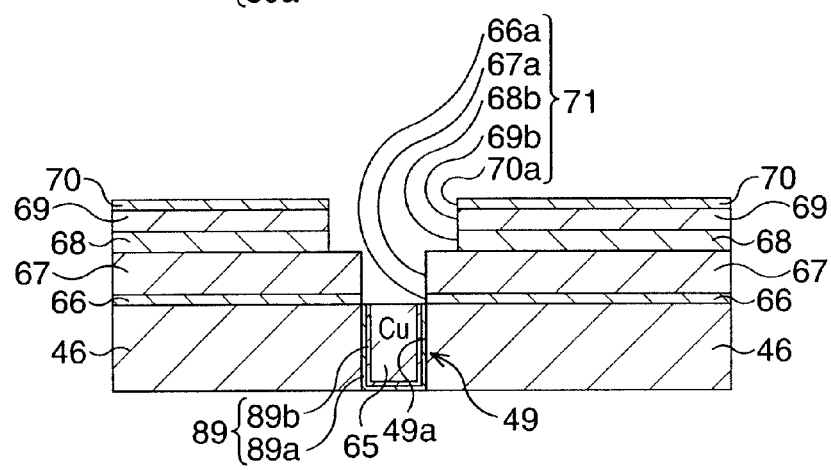

Subsequently, as shown in FIG. 31D, a wiring trench 71 is completed.

Particularly, using the silicon nitride film 70 as a hard mask, the silicon nitride film 66 is patterned by lithography and dry etching until a surface of the plug 47 exposes. At this time, an opening 68b in a wiring form extending the opening 68a corresponding to the openings 70a, 69b, is formed in the SOG film 68, and an opening 66a in a hole form corresponding to the opening 67a is formed in the silicon nitride film 66. Here, also the silicon nitride film 70 becomes thin by the film thickness of the silicon nitride film 66 by etching. At this time, the openings 66a, 67a formed in the silicon nitride film 66 and the interlayer insulating film 67 and the openings 68b, 69b, 70a formed in the SOG film 68, the interlayer insulating film 69 and the silicon nitride film 70 become integral, thereby completing the wiring trench 71.

Figure 32A:
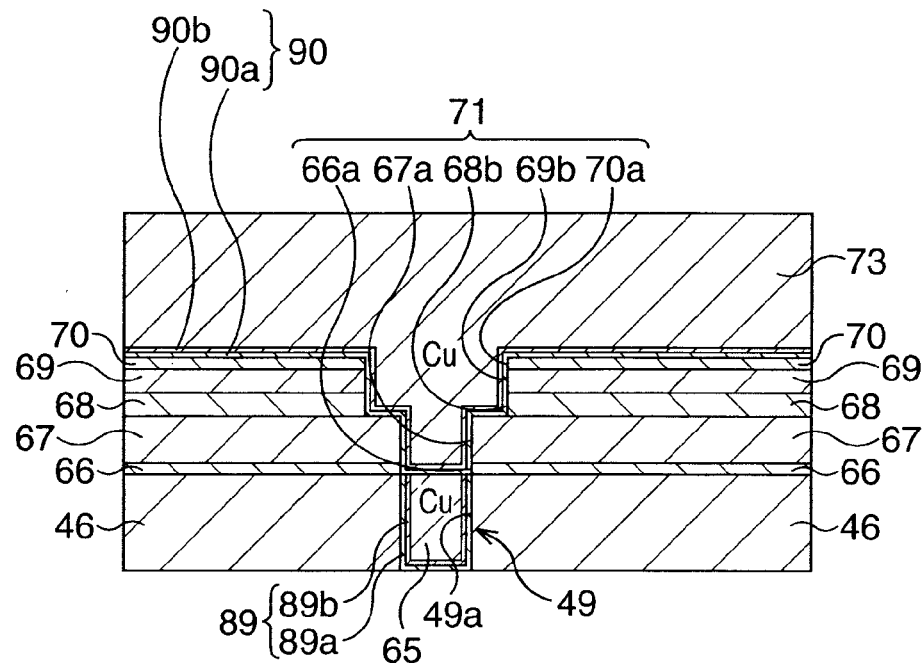
FIG. 32A and FIG. 32B are schematic cross-sectional views showing the structure of the FeRAM according to the modification example 12 of the first embodiment together with the manufacturing method thereof (main steps) in the order of steps, continuing from FIG. 31D.

Subsequently, as shown in FIG. 32A, a base film 90 is formed and Cu plating is performed.

Particularly, a metal film which is a conductor impervious to oxygen and has conductivity even when oxidized and a conductive protection film which prevents entrance of hydrogen are layered to form the base film. Specifically, a conductive layer 90a having conductivity even when oxidized, for example an Ir film (with a film thickness of approximately 20 nm) and a conductive protection film which inhibits permeation of hydrogen, for example a TiAlN film 90b (with a film thickness of approximately 50 nm) are deposited sequentially on the silicon nitride film 70 so as to cover an inner wall surface of the wiring trench 71, thereby forming the base film (glue film) 90 of layered structure. As the conductive layer 90a having conductivity even when oxidized, one containing at least one type selected from Ag, Ni, Cu, Zn, In, Sn, Ir, Ru, Rh, Pd, and Os is used. When two or more types are selected, they may be used in an alloy state. Further, as the conductive protection film which inhibits permeation of hydrogen, at least one type selected from TiN, TiSiN, TaN, CrN, HfN, ZrN, TiAlN, TaAlN, CrAlN, and HfAlN is used.

Then, after a seed film (not-shown, having a film thickness of approximately 130 nm) of Cu is formed, a Cu film 73 is deposited on the glue film 90 by a plating method so as to fill up the wiring trench 71 via the glue film 90.

Figure 32B:
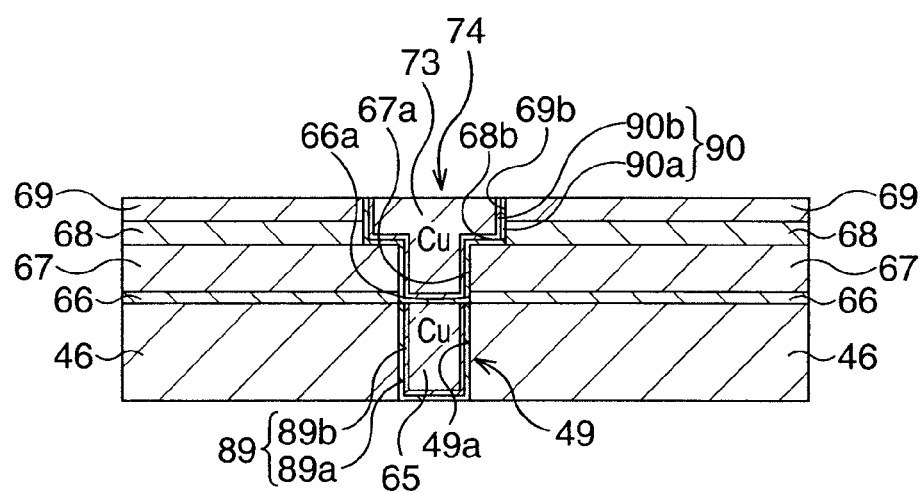

Subsequently, as shown in FIG. 32B, a wiring structure 74 is formed.

Specifically, with the interlayer insulating film 69 being a stopper, the Cu film 73, the glue film 90 and the silicon nitride film 70 are polished by CMP, and the wiring trench 71 is filled up with Cu (or an alloy thereof) via the glue film 90, thereby forming the wiring structure 74 electrically connected to the first wire 45 via the plug 49. Here, in the wiring structure 74, a part where spaces of the openings 66a, 67a are filled up with Cu via the glue film 90 corresponds to a conductive plug part and a part where spaces of the openings 68b, 69b are filled up with Cu via the glue film 90 corresponds to a wire part, and thus the conductive plug part and the wire part are formed integrally.

Thereafter, steps of forming an interlayer insulating film and a further upper layer wire by a damascene method, and so on are performed, thereby completing the planar type FeRAM according to this example. Here, when the further upper layer wire is formed, the layered films of the metal film having conductivity even when oxidized and the conductive protection film which inhibits permeation of hydrogen as described above are applied to a glue film thereof, similarly to the wiring structure 74.

In this example, the Cu filling up the via hole 49a is covered from a bottom face to a side face by the glue film 89 formed as the layered structure of the metal film impervious to oxygen and having conductivity even when oxidized and the conductive protection film having a function of inhibiting permeation of hydrogen, and the Cu filling up the wiring trench 71 is covered from a bottom face to a side face by the glue film 90 formed as the layered structure of the metal film having conductivity even when oxidized and the conductive protection film having a function of inhibiting permeation of hydrogen. These Cu are in a state of being isolated from the ferroelectric capacitor structure 30 existing at a lower layer thereof by the glue films 89, 90. The glue films 89, 90 absorb oxygen, so to speak due to oxidation of themselves, but they do not impair the electrical connection function of the plug 49 and the wiring structure 74 because they maintain conductivity even when oxidized. By these glue films 89, 90, entrance into the plug 49 and the wiring structure 74 of oxygen activated due to the $IrO_2$ films 26a, 26b constituting the upper electrode 31, oxygen activated due to the Pt film 26c, and the like is inhibited as much as possible, thereby preventing oxidation of the plug 49 and the wiring structure 74 and also preventing entrance of hydrogen into the plug 49 and the wiring structure 74.

Note that in this example, the case of applying the silicide film to the glue films of the plugs 34, 35 connected to the ferroelectric capacitor structure 30, and applying the layered films of the metal film having conductivity even when oxidized and the conductive protection film which inhibits permeation of hydrogen to the glue films of the plug 49 connected to the first wire 45 and the wiring structure 74 is exemplified, but it is also preferable to apply the metal film having conductivity and the conductive protection film which inhibits permeation of hydrogen to the glue films of the plugs 34, 35 connected to the ferroelectric capacitor structure 30.

Further, when attaching much weight to the achievement of preventing oxidation of the plug 49 and the wiring structure 74 and entrance of hydrogen thereto in particular, the above-described layered films may be applied only to the glue films of the plug 49 connected to the first wire 45 and the wiring structure 74.

Figure 33:
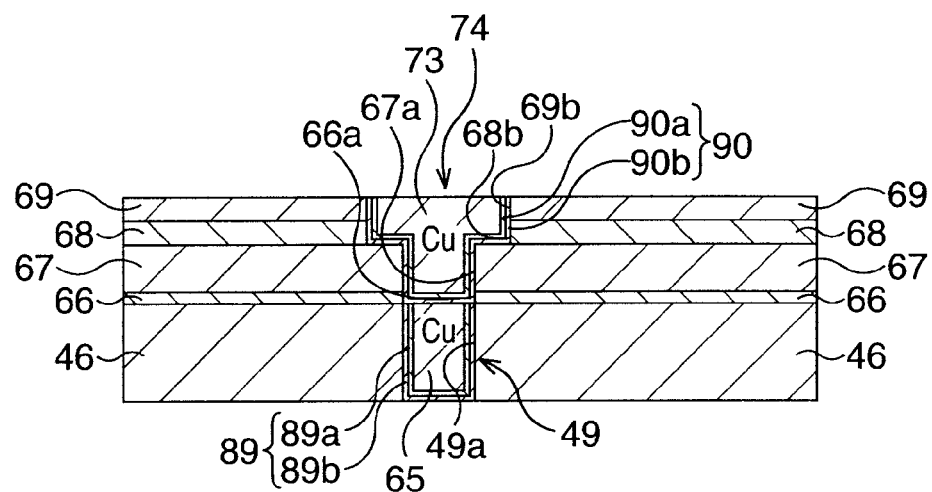
FIG. 33 is a schematic cross-sectional view showing a structure of an FeRAM according to another example of the modification example 12 of the first embodiment.

Further, in this example, the glue film 89 is formed as the layered structure of the conductive layer 89a and the TiAlN film 89b and the glue film 90 is formed as the layered structure of the conductive layer 90a and the TiAlN film 90b, but as shown in FIG. 33 (corresponding to FIG. 32B), the layered state of respective films may be inverted, thereby forming the glue film 89 as a layered structure of the TiAlN film 89b and the conductive layer 89a and the glue film 90 as a layered structure of the TiAlN film 90b and the conductive layer 90a.

Figure 34:
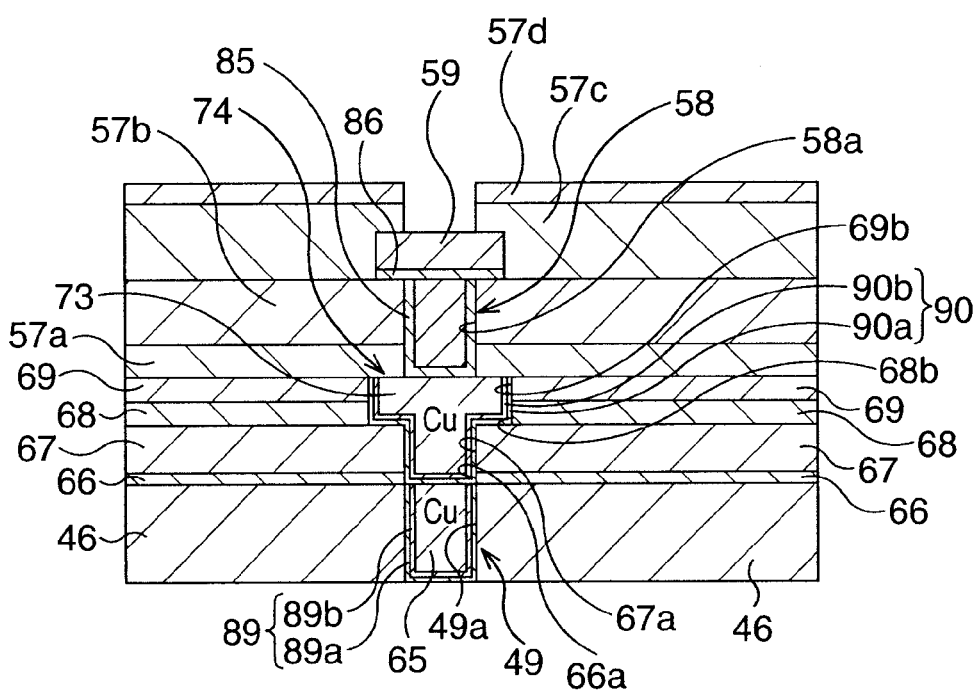
FIG. 34 is a schematic cross-sectional view showing a structure of an FeRAM according to another example of the modification example 12 of the first embodiment.

Further, as shown in FIG. 34, after forming the wiring structure 74 in which the wiring trench 71 is filled up with Cu via the glue film 90 as in this example, the modification example 10 may be applied. Specifically, W filling up a via hole 58a formed in interlayer insulating films 57a, 57b is covered from a bottom face to a side face by a glue film 85 which is a metal film impervious to oxygen and has conductivity even when oxidized, and a top face of the W filling up the via hole 58a is covered by a conductive layer 86 which is a metal film having conductivity even when oxidized. On the conductive layer 86, a pad electrode 59 constituted of an Al alloy film (here an Al—Cu film) for example is formed, and interlayer insulating films 57c, 57d are formed so as to cover the pad electrode 59. In the interlayer insulating films 57c, 57d, an opening which exposes part of a surface of the pad electrode 59 is formed. As the interlayer insulating films 57a to 57c, a silicon oxide film such as NSG is used, and as the interlayer insulating film 57d, a silicon nitride film or the like, which is more rigid than the silicon oxide film, is used.

As described above, according to this example, oxidation of the plugs 34, 35 connected to the ferroelectric capacitor structure 30 as well as the plugs 49 connected to the first wires 45 and the wiring structure 74 is inhibited, and moreover, entrance of hydrogen into at least the plugs 49 connected to the first wires 45 and the wiring structure 74 is inhibited, so that a highly reliable planar type FeRAM with stabilized contact resistance can be realized.

Modification Example 13

In this example, similarly to the first embodiment, a structure of a planar type FeRAM and a manufacturing method thereof will be disclosed, but this example is different in that the conductors impervious to oxygen provided between the ferroelectric capacitor structure 30 and the conductive plugs 34, 35 are different.

FIG. 35A to FIG. 37D are schematic cross-sectional views showing a structure of an FeRAM according to modification example 13 of the first embodiment together with a manufacturing method thereof (main steps) in the order of steps.

First, similarly to the first embodiment, the respective steps of FIG. 2A to FIG. 2C are performed.

Figure 35A:
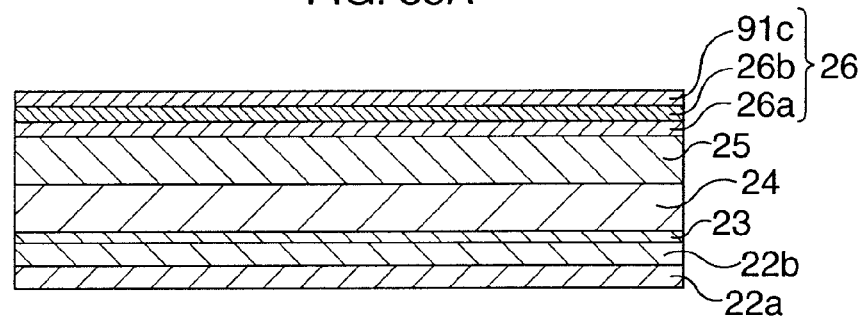
FIG. 35A to FIG. 35D are schematic cross-sectional views showing a structure of an FeRAM according to modification example 13 of the first embodiment together with a manufacturing method thereof (main steps) in the order of steps.

Subsequently, as shown in FIG. 35A, a lower electrode layer 24, a ferroelectric film 25 and an upper electrode layer 26 are formed sequentially.

Particularly, first, a Pt film is deposited with a film thickness of approximately 150 nm to 200 nm for example by a sputtering method, thereby forming the lower electrode layer 24.

Next, on the lower electrode layer 24, the ferroelectric film 25 constituted of PZT for example, which is a ferroelectric, is deposited with a film thickness of approximately 100 nm to 300 nm by an RF sputtering method. Then, the ferroelectric film 25 is annealed to crystallize the ferroelectric film 25. Conditions of this annealing are such that it is performed for 60 seconds to 120 seconds at 550° C. to 650° C. for example while supplying Ar/O$_2$ gases at flow rates of 1.98 liter/minute of Ar and 0.025 liter/minute of O$_2$.

Next, the upper electrode layer 26 is formed by deposition on the ferroelectric film 25.

As the upper electrode layer 26, first, an IrO$_2$ film 26a for example which is a conductive oxide is formed with a film thickness of approximately 30 nm to 70 nm by a reactive sputtering method. Thereafter, the IrO$_2$ film 26a is annealed. Conditions of this annealing are such that it is performed for 10 seconds to 60 seconds at 650° C. to 850° C. for example while supplying Ar/O$_2$ gases at flow rates of 2.0 liter/minute of Ar and 0.02 liter/minute of O$_2$. Next, on the IrO$_2$ film 26a, an IrO$_2$ film 26b is formed with a film thickness of approximately 150 nm to 300 nm by a reactive sputtering method. Here, instead of the IrO$_2$ films 26a, 26b, conductive oxides of Ir, Ru, RuO$_2$, SrRuO$_3$, or the like or a layered structure of them may be adopted.

Next, a Pt film 91 which functions as a cap film for the IrO$_2$ film 26b is formed on the IrO$_2$ film 26b.

Pt is a noble metal which has catalytic activity, and in this example, a Pt film 91 including a catalyst poisoning material which inhibits the catalytic activity of Pt is formed. As the catalyst poisoning material, a material containing at least one type selected from CO, chlorine compound, sulfur compound, phosphorous compound, and silicon compound is used. Specifically, the following techniques (1) to (3) are proposed. In this embodiment, at least one of the techniques (1) to (3) (for example the technique (1)) is selected and performed.

(1) By a PVD (Physical Vapor Deposition) method, a growing gas to which a catalyst poisoning material, for example CO is added is used to form the Pt film 91 with a film thickness of approximately 100 nm.

(2) By a PVD method, a Pt target to which a catalyst poisoning material, for example CO is added is used to form the Pt film 91 with a film thickness of approximately 100 nm.

(3) After forming a Pt film with a film thickness of approximately 100 nm by a PVD method, the Pt film is contacted with a gas to which a catalyst poisoning material, for example CO is added so that the catalyst poisoning material is included in the Pt film, thereby forming the Pt film 91.

By forming the Pt film 91 as described above, the upper electrode layer 26 is formed with the IrO$_2$ films 26a, 26b, and the Pt film 91.

Figure 35B:
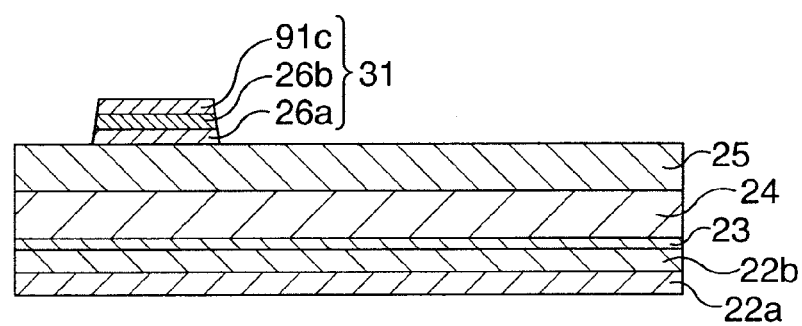

Subsequently, as shown in FIG. 35B, an upper electrode 31 is pattern-formed.

Particularly, the upper electrode layer 26 is processed in a form of a plurality of electrodes by lithography and subsequent dry etching, thereby pattern-forming the upper electrode 31.

Here, when forming the Pt film 91 including the catalyst poisoning material, instead of performing one of the techniques (1) to (3), a technique (4) as follows may be carried out.

In this technique (4), after the Pt film is patterned as in FIG. 35B (after the upper electrode 31 is pattern formed), in a state that the Pt film is exposed, the Pt film is contacted with a gas to which a catalyst poisoning material, for example CO, is added so that the catalyst poisoning material is included in the Pt film, thereby forming the Pt film 91. By performing this technique (4), a larger effect of inhibiting the catalytic activity of Pt can be obtained rather than performing the technique (3).

Figure 35C:
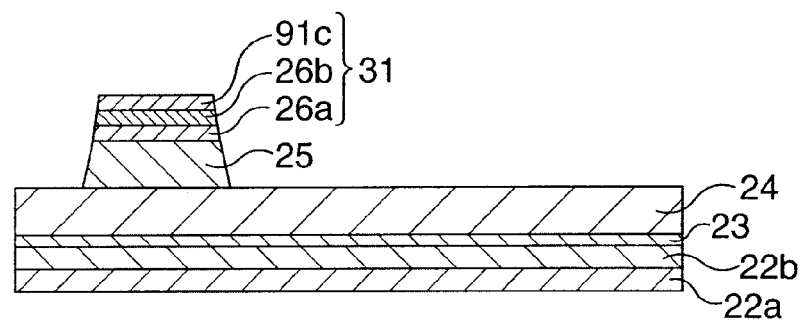

Subsequently, as shown in FIG. 35C, the ferroelectric film 25 is processed.

Particularly, the ferroelectric film 25 is processed by lithography and subsequent dry etching so as to match with the upper electrode 31. After this patterning of the ferroelectric film 25, the ferroelectric film 25 is annealed to recover the function of the ferroelectric film 25.

Figure 35D:
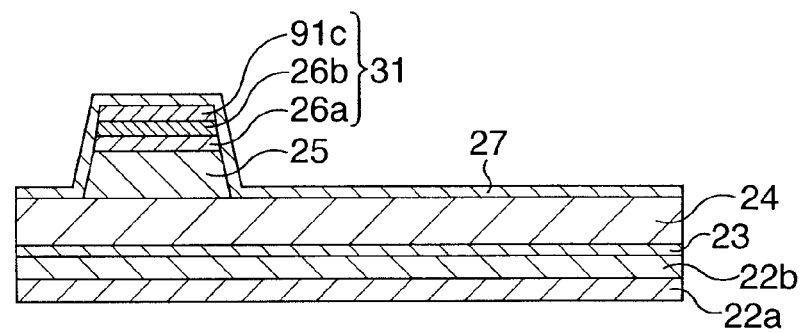

Subsequently, as shown in FIG. 35D, a protection film 27 for preventing entrance of hydrogen and water into the ferroelectric film 25 is formed.

Particularly, on the lower electrode layer 24, alumina ($Al_2O_3$) is used as a material and deposited by a sputtering method with a film thickness of approximately 50 nm so as to cover the ferroelectric film 25 and the upper electrode 31, thereby forming the protection film 27. Thereafter, the protection film 27 is annealed.

Subsequently, as shown in FIG. 36A, the protection film 27 is processed together with the lower electrode layer 24 to thereby complete the ferroelectric capacitor structure 30.

The protection film 27 and the lower electrode layer 24 are processed by lithography and subsequent dry etching so that they match with the processed ferroelectric film 25 and the lower electrode layer 24 remains larger in size than the ferroelectric film 25, thereby pattern-forming a lower electrode 32. Thus the ferroelectric capacitor structure 30 is completed, in which the ferroelectric film 25 and the upper electrode 31 are layered sequentially on the lower electrode 32, and the lower electrode 32 and the upper electrode 31 are capacitively coupled via the ferroelectric film 25. At this time, simultaneously, the protection film 27 remains so as to cover the top face of the upper electrode 31, side faces of the upper electrode 31 and ferroelectric film 25, and the top face of the lower electrode layer 24. Thereafter, the protection film 27 is annealed.

Subsequently, as shown in FIG. 36B, a protection film 28 is formed.

Particularly, alumina ($Al_2O_3$) is used as a material and deposited by a sputtering method with a film thickness of approximately 20 nm to 50 nm so as to cover the entire face of the ferroelectric capacitor structure 30, thereby forming the protection film 28. Thereafter, the protection film 28 is annealed.

Subsequently, as shown in FIG. 36C, an interlayer insulating film 33 is formed.

Particularly, the interlayer insulating film 33 is formed so as to cover the ferroelectric capacitor structure 30 via the protection films 27, 28. Here, the interlayer insulating film 33 is formed such that a silicon oxide film is deposited with a film thickness of approximately 1500 nm to 2500 nm by a plasma CVD method using TEOS for example, and thereafter it is polished by CMP until the film thickness becomes approximately 1000 nm for example. After the CMP, for the purpose of dehydrating the interlayer insulating film 33, plasma annealing of $N_2O$ for example is performed.

Subsequently, as shown in FIG. 36D, a plug 36 connected to the source/drain region 18 of the transistor structure 20 is formed.

Particularly, first, with the source/drain region 18 being an etching stopper, the interlayer insulating film 33, the protection films 28, 27, the interlayer insulating films 22b, 22a, and the protection film 21 are processed by lithography and subsequent dry etching until part of a surface of the source/drain region 18 exposes, thereby forming a via hole 36a with a diameter of approximately 0.3 μm for example.

Next, a Ti film for example and a TiN film are deposited sequentially with a film thickness of approximately 20 nm and a film thickness of approximately 50 nm respectively by a sputtering method so as to cover a wall surface of the via hole 36a, thereby forming a base film (glue film) 36b. Then, a W film for example is formed by a CVD method so as to fill up the via hole 36a via the glue film 36b. Thereafter, with the interlayer insulating film 33 being a stopper, the W film and the glue film 36b are polished by CMP, thereby forming the plug 36 in which the via hole 36a is filled up with W via the glue film 36b. After the CMP, plasma annealing of $N_2O$ for example is performed.

Figure 37A:
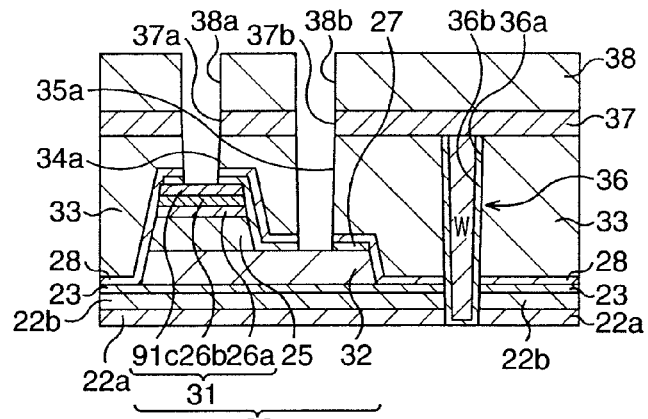
FIG. 37A to FIG. 37D are schematic cross-sectional views showing the structure of the FeRAM according to the modification example 13 of the first embodiment together with the manufacturing method thereof (main steps) in the order of steps, continuing from FIG. 36D.

Subsequently, as shown in FIG. 37A, after a hard mask 37 and a resist mask 38 are formed, via holes 34a, 35a to the ferroelectric capacitor structure 30 are formed.

Particularly, first, a silicon nitride film is deposited by a CVD method with a film thickness of approximately 100 nm on the interlayer insulating film 33, thereby forming the hard mask 37. Next, a resist is applied on the hard mask 37, and the resist is processed by lithography to thereby form the resist mask 38 having openings 38a, 38b.

Next, using the resist mask 38, the hard mask 37 is dry-etched to form openings 37a, 37b at positions on the hard mask 37 which match with the openings 38a, 38b respectively.

Then, using mainly the hard mask 37, with the upper electrode 31 and the lower electrode 32 being etching stoppers respectively, the interlayer insulating film 33 and the protection films 28, 27 are dry-etched. In this dry etching, a process performed on the interlayer insulating film 33 and the protection films 28, 27 until part of a surface of the Pt film 91 is exposed and a process performed on the interlayer insulating film 33 and the protection films 28, 27 until part of a surface of the lower electrode 32 is exposed are carried out simultaneously, so that the via holes 34a, 35a with a diameter of approximately 0.5 μm for example are formed simultaneously at the respective positions.

Figure 37B:
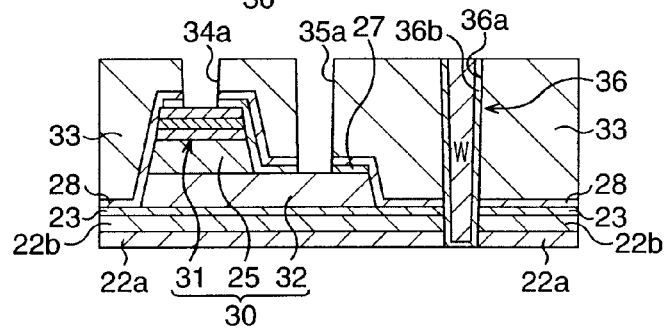

Subsequently, as shown in FIG. 37B, the resist mask 38 and the hard mask 37 are removed.

Particularly, first, the remained resist mask 38 is removed by ashing or the like. Thereafter, annealing is performed for recovering the ferroelectric capacitor structure 30 from damages received in steps after the ferroelectric capacitor structure 30 is formed. Then, by overall anisotropic etching, so called etch back, the hard mask 37 is removed.

Figure 37C:
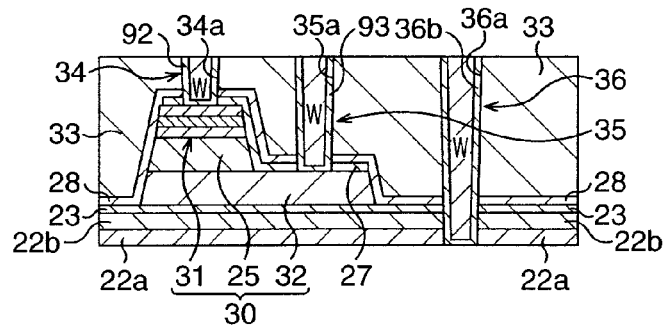

Subsequently, as shown in FIG. 37C, the plugs 34, connected to the ferroelectric capacitor structure 30 are formed.

Particularly, for example TiN films are deposited with a film thickness of approximately 20 nm so as to cover respective wall surfaces of the via holes 34a, 35a by a sputtering method, thereby forming base films (glue films) 92, 93. Then, for example W films are formed by a CVD method so as to fill up the via holes 34a, 35a via the glue films 92, 93. Thereafter, with the interlayer insulating film 33 being a stopper, the W films and the glue films 92, 93 are polished by CMP, thereby forming the plugs 34, 35 in which the via holes 34a, 35a are filled up with W via the glue films 92, 93. After the CMP, plasma annealing of $N_2O$ for example is performed. Here, the TiN film constituting the glue films 92, 93 has a function of inhibiting permeation of hydrogen, so that entrance of hydrogen into the plugs 34, 35 is inhibited. Here, for the glue films 82, 83, at least one type selected from TiN, TiSiN, TaN, CrN, HfN, ZrN, TiAlN, TaAlN, CrAlN, HfAlN is used.

In this example, the Pt film 91 is formed including the catalyst poisoning material inside, and the W filling up the via holes 34a, 35a and the $IrO_2$ films 26a, 26b are separated by the Pt film 91. In the Pt film 91, catalytic activity of oxygen in Pt is inhibited, so that Pt film 91 can exhibit an oxidation preventing function, which is an original function thereof, without being disturbed by its own catalytic activity. By this Pt film 91, entrance of oxygen activated due to the IrO$_2$ films 26a, 26b into the plugs 34, 35 is inhibited, and also activation of oxygen in the Pt film 91 is inhibited, thereby preventing oxidation of the plugs 34, 35.

Figure 37D:
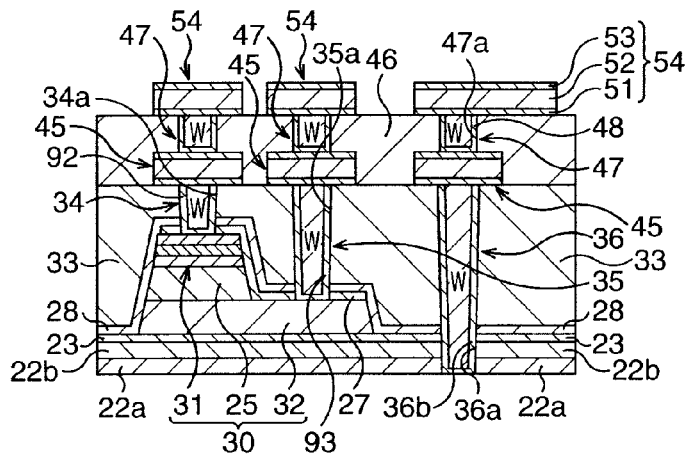

Then, the respective steps of FIG. 6A and FIG. 6B are performed to obtain the structure shown in FIG. 37D.

Thereafter, steps of forming an interlayer insulating film and a further upper layer wire, and so on are performed, thereby completing the planar type FeRAM according to this example.

As described above, according to this example, oxidation of the plugs 34, 35 connected to the ferroelectric capacitor structure 30 is inhibited, so that a highly reliable planar type FeRAM with stabilized contact resistance can be realized.

Note that this example can be applied to the first embodiment and the modification examples 1 to 12. Specifically, in such cases, in each of the first embodiment and the modification examples 1 to 12, the Pt film 26c, which is a component of the upper electrode film 26, is formed as a structure including the catalyst poisoning material inside. By this structure, a highly reliable planar type FeRAM with more securely stabilized contact resistance can be realized.

Second Embodiment

In this embodiment, a so-called stack type FeRAM will be exemplified, in which conduction of the lower electrode of a ferroelectric capacitor structure is provided on a lower side of the ferroelectric capacitor structure and conduction of the upper electrode thereof is provided on an upper side of the ferroelectric capacitor structure. Note that for convenience of explanation, the structure of the FeRAM will be described together with a manufacturing method thereof.

FIG. 38A to FIG. 42B are schematic cross-sectional views showing a structure of an FeRAM according to the second embodiment together with a manufacturing method thereof in the order of steps.

Figure 38A:
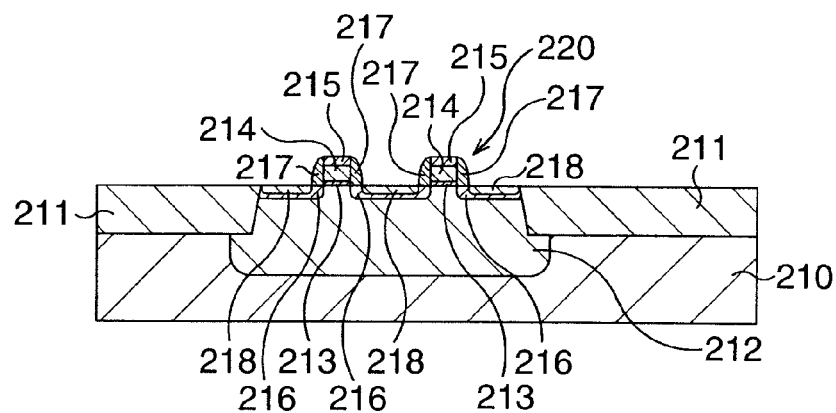
FIG. 38A to FIG. 38D are schematic cross-sectional views showing a structure of an FeRAM according to a second embodiment of the present invention together with a manufacturing method thereof in the order of steps.

First, as shown in FIG. 38A, a MOS transistor 220 which functions as a selection transistor is formed on a silicon semiconductor substrate 210.

Particularly, an element isolation structure 211 is formed on a surface layer of the silicon semiconductor substrate 210 by an STI (Shallow Trench Isolation) method for example to thereby define an element active region.

Next, an impurity, here B, is ion-implanted into the element active region under conditions of a dose amount of $3.0 \times 10^{13}/cm^2$ and acceleration energy of 300 keV for example, thereby forming a well 212.

Next, a thin gate insulating film 213 with a film thickness of approximately 3.0 nm is formed by thermal oxidation or the like on the element active region, and on the gate insulating film 213, a polycrystalline silicon film with a film thickness of approximately 180 nm and a silicon nitride film for example with a film thickness of approximately 29 nm are deposited by a CVD method. The silicon nitride film, the polycrystalline silicon film, and the gate insulating film 213 are processed in electrode forms by lithography and subsequent dry etching, thereby pattern-forming gate electrodes 214 on the gate insulating film 213. At this time, simultaneously, cap films 215 each constituted of a silicon nitride film are pattern-formed on the gate electrodes 214.

Next, using the cap films 215 as a mask, an impurity, here As, is ion-implanted into the element active region under conditions of a dose amount of $5.0 \times 10^{14}/cm^2$ and acceleration energy of 10 keV for example, thereby forming a so-called LDD region 216.

Next, a silicon oxide film for example is deposited on the entire surface thereof by a CVD method, and so-called etching back is performed on this silicon oxide film to leave the silicon oxide film only on side faces of the gate electrodes 214 and the cap films 215, thereby forming side wall insulating films 217.

Next, using the cap films 215 and the side wall insulating films 217 as a mask, an impurity, here P, is ion-implanted into the element active region under conditions for providing a higher impurity concentration than that in the LDD region 216, for example a dose amount of $5.0 \times 10^{19}/cm^2$ and acceleration energy of 13 keV, thereby forming a source/drain region 218 overlapping with the LDD region 216. Thus the MOS transistor 220 is completed.

Figure 38B:
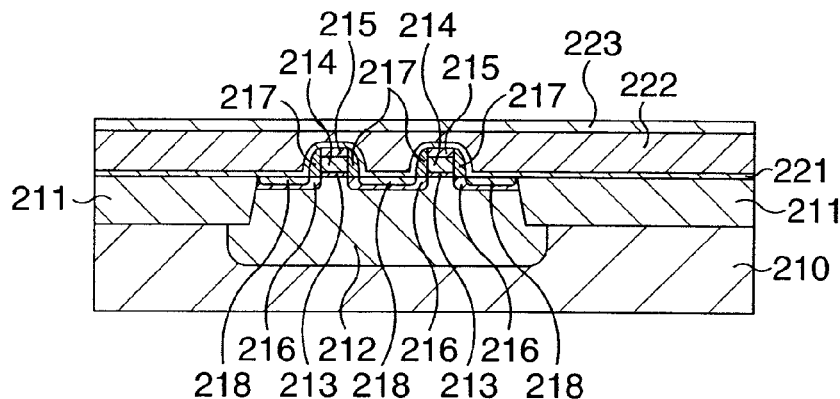

Subsequently, as shown in FIG. 38B, a protection film 221, an interlayer insulating film 222, and an upper insulating film 223 of the MOS transistor 220 are formed sequentially.

Particularly, the protection film 221, the interlayer insulating film 222, and the upper insulating film 223 are formed sequentially so as to cover the MOS transistor 220. Here, as the protection film 221, a silicon oxide film is used as a material and deposited with a film thickness of approximately 20 nm by a CVD method. As the interlayer insulating film 222, a layered structure is formed such that, for example, a plasma SiO film (with a film thickness of approximately 20 nm), a plasma SiN film (with a film thickness of approximately 80 nm) and a plasma TEOS film (with a film thickness of approximately 1000 nm) are formed sequentially, and after layering them, polishing is performed by CMP until the film thickness becomes approximately 700 nm. As the upper insulating film 223, a silicon nitride film is used as a material and deposited with a film thickness of approximately 100 nm by a CVD method.

Figure 38C:
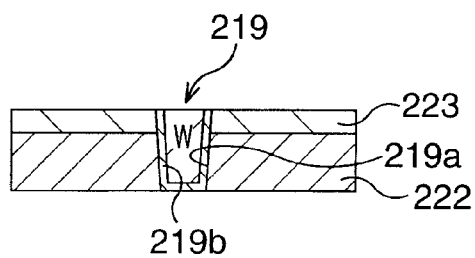

Subsequently, as shown in FIG. 38C, a plug 219 connected to the source/drain region 218 of the transistor structure 220 is formed. Note that in FIG. 38C and respective subsequent drawings, for convenience of illustration, only the structure of the interlayer insulating film 222 and above is shown, and the silicon semiconductor substrate 210, the MOS transistor 220, and so on are omitted therefrom.

Particularly, first, with the source/drain region 218 being an etching stopper, the upper insulating film 223, the interlayer insulating film 222, and the protection film 221 are processed by lithography and subsequent dry etching until part of a surface of the source/drain region 218 exposes, thereby forming a via hole 219a with a diameter of approximately 0.3 μm for example.

Next, a Ti film for example and a TiN film are deposited sequentially with a film thickness of approximately 20 nm and a film thickness of approximately 50 nm respectively by a sputtering method so as to cover a wall surface of the via hole 219a, thereby forming a base film (glue film) 219b. Then, a W film for example is formed by a CVD method so as to fill up the via hole 219a via the glue film 219b. Thereafter, with the upper insulating film 223 being a stopper, the W film and the glue film 219b are polished by CMP, thereby forming the plug 219 in which the via hole 219a is filled up with W via the glue film 219b. After the CMP, plasma annealing of N$_2$O for example is performed.

Figure 38D:
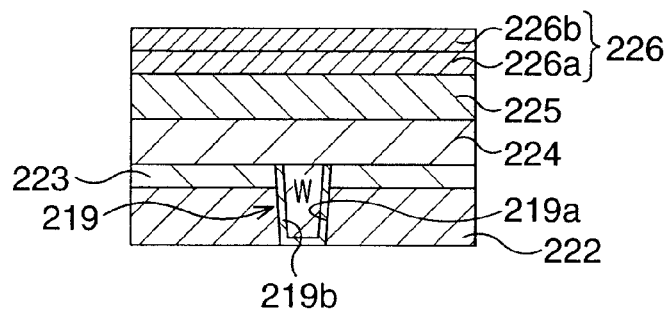

Subsequently, as shown in FIG. 38D, a lower electrode layer 224, a ferroelectric film 225 and an upper electrode layer 226 are formed sequentially.

Particularly, first, a Pt film is deposited with a film thickness of approximately 150 nm to 200 nm for example by a sputtering method, thereby forming the lower electrode layer 224.

Next, on the lower electrode layer 224, the ferroelectric film 225 constituted of PZT for example, which is a ferroelectric, is deposited with a film thickness of approximately 100 nm to 300 nm by an RF sputtering method. Then, the ferroelectric film 225 is annealed to crystallize the ferroelectric film 225. Conditions of this annealing are such that it is performed for 60 seconds to 120 seconds at 550° C. to 650° C. for example while supplying Ar/$O_2$ gases at flow rates of 1.98 liter/minute of Ar and 0.025 liter/minute of $O_2$.

Next, the upper electrode layer 226 is formed by deposition on the ferroelectric film 225.

As the upper electrode layer 226, first, an $IrO_2$ film 226a for example which is a conductive oxide is formed with a film thickness of approximately 200 nm by a reactive sputtering method. Thereafter, the $IrO_2$ film 226a is annealed. Conditions of this annealing are such that it is performed for 10 seconds to 60 seconds at 650° C. to 850° C. for example while supplying Ar/$O_2$ gases at flow rates of 2.0 liter/minute of Ar and 0.02 liter/minute of $O_2$. Then, on the $IrO_2$ film 226a, a noble metal film, here a Pt film 226b, which functions as a cap film for the $IrO_2$ film 226a is formed with a film thickness of approximately 100 nm by a sputtering method. The $IrO_2$ film 226a and the Pt film 226b constitute the upper electrode layer 226. Note that for the upper electrode layer 226, instead of the $IrO_2$ film 226a, a conductive oxide of Ir, Ru, $RuO_2$, $SrRuO_3$ or the like or a layered structure of them may be adopted. Further, it is also possible to omit formation of the Pt film 226b.

Figure 39A:
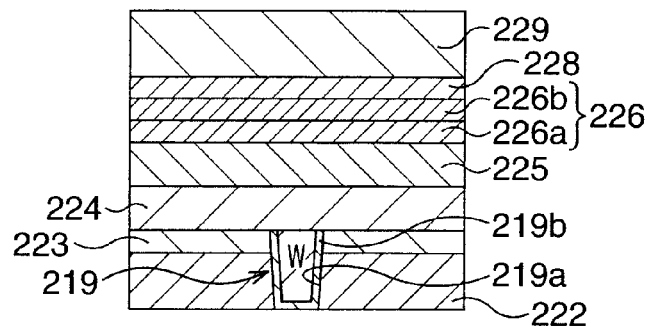
FIG. 39A to FIG. 39D are schematic cross-sectional views showing the structure of the FeRAM according to the second embodiment of the present invention together with the manufacturing method thereof in the order of steps, continuing from FIG. 38D.

Subsequently, as shown in FIG. 39A, a TiN film 228 and a silicon oxide film 229 are formed.

Particularly, the TiN film 228 is formed by deposition with a film thickness of approximately 200 nm on the upper electrode layer 226 by a sputtering method or the like. The silicon oxide film 229 is formed by deposition with a film thickness of approximately 1000 nm on the TiN film 228 by a CVD method using TEOS for example. Here, instead of the TEOS film, an HDP film may be formed. Note that it is also preferable to further form a silicon nitride film on the silicon oxide film 229.

Figure 39B:
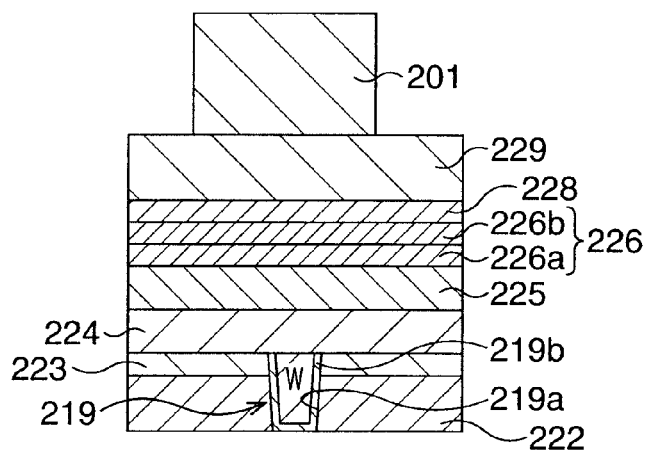

Subsequently, as shown in FIG. 39B, a resist mask 201 is formed.

Particularly, a resist is applied on the silicon oxide film 229, and this resist is processed in an electrode form by lithography, thereby forming the resist mask 201.

Figure 39C:
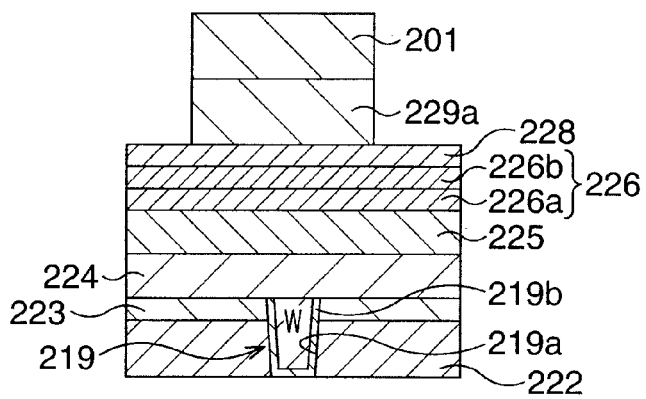

Subsequently, as shown in FIG. 39C, the silicon oxide film 229 is processed.

Particularly, with the resist mask 201 being a mask, the silicon oxide film 229 is dry-etched. At this time, the silicon oxide film 229 is patterned corresponding to the electrode form of the resist mask 201, thereby forming a hard mask 229a. Also, the resist mask 201 is etched and its thickness is reduced.

Figure 39D:
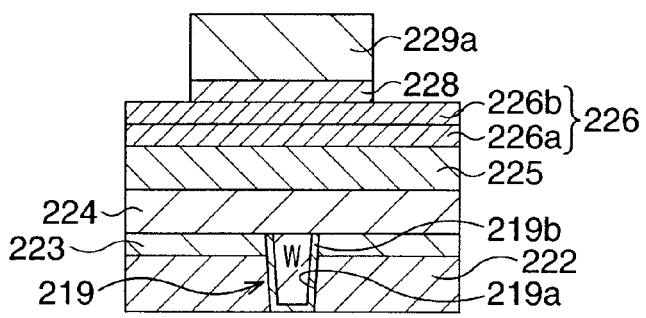

Subsequently, as shown in FIG. 39D, the TiN film 228 is processed.

Particularly, with the resist mask 201 and the hard mask 229a being a mask, the TiN film 228 is dry etched. At this time, the TiN film 228 is patterned corresponding to the electrode form of the hard mask 229a. Also, the resist mask 201 itself is etched and becomes thin during the etching. Thereafter, the resist mask 201 is removed by ashing or the like. Note that here a silicide film 227 may also be patterned together with the TiN film 228 corresponding to the electrode form of the hard mask 229a.

Figure 40A:
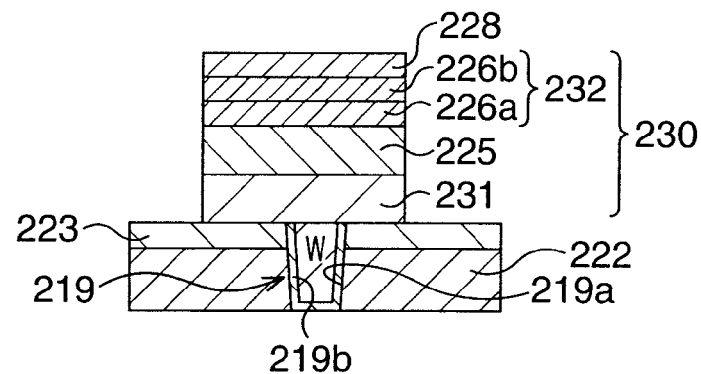
FIG. 40A to FIG. 40C are schematic cross-sectional views showing the structure of the FeRAM according to the second embodiment of the present invention together with the manufacturing method thereof in the order of steps, continuing from FIG. 39D.

Subsequently, as shown in FIG. 40A, the upper electrode layer 226, the ferroelectric film 225, and the lower electrode layer 224 are processed.

Particularly, with the hard mask 229a and the TiN film 228 being a mask and the upper insulating film 223 being an etching stopper, the upper electrode layer 226, the ferroelectric film 225, and the lower electrode layer 224 are dry-etched. At this time, the upper electrode layer 226, the ferroelectric film 225, and the lower electrode layer 224 are patterned corresponding to the electrode form of the TiN film 228. Also, the hard mask 229a itself is etched and becomes thin during the etching. Thereafter, the hard mask 229a is removed by dry etching (etching back) on its entire surface.

Figure 40B:
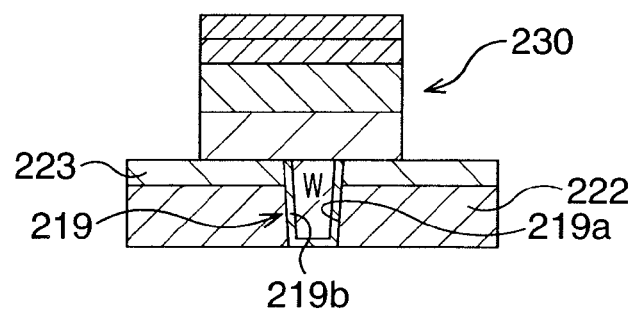

Subsequently, as shown in FIG. 40B, the ferroelectric capacitor structure 230 is completed.

Particularly, the TiN film 228 used as a mask is removed by wet etching. At this time, the ferroelectric capacitor structure 230 is completed, in which the ferroelectric film 225 and an upper electrode 232 are layered sequentially on a lower electrode 231, and the lower electrode 231 and the upper electrode 232 are capacitively coupled via the ferroelectric film 225. In this ferroelectric capacitor structure 230, the lower electrode 231 is connected to the plug 219, and the source/drain 218 and the lower electrode 231 are electrically connected via the plug 219.

Figure 40C:
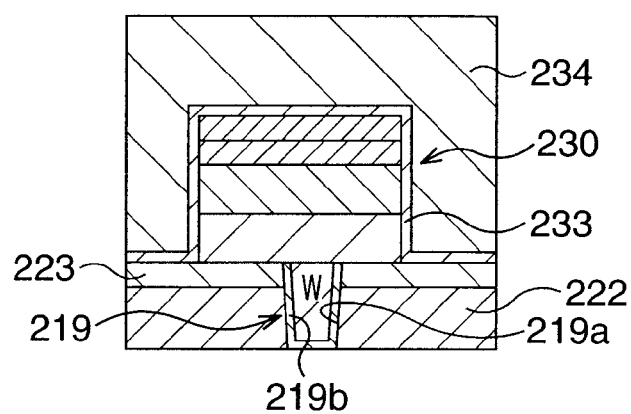

Subsequently, as shown in FIG. 40C, a protection film 233 and an interlayer insulating film 234 are formed.

Particularly, first, alumina ($Al_2O_3$) is used as a material and deposited by a sputtering method with a film thickness of approximately 20 nm to 50 nm so as to cover the entire face of the ferroelectric capacitor structure 230, thereby forming the protection film 233. Thereafter, the protection film 233 is annealed.

Next, the interlayer insulating film 234 is formed so as to cover the ferroelectric capacitor structure 230 via the protection film 233. Here, the interlayer insulating film 234 is formed such that a silicon oxide film is deposited with a film thickness of approximately 1500 nm to 2500 nm by a plasma CVD method using TEOS for example, and thereafter it is polished by CMP until the film thickness becomes approximately 1000 nm for example. After the CMP, for the purpose of dehydrating the interlayer insulating film 234, plasma annealing of $N_2O$ for example is performed.

Figure 41A:
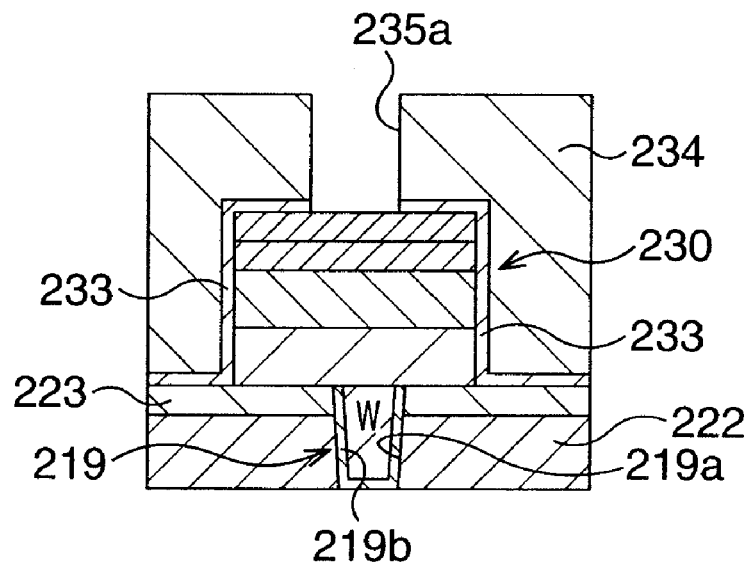
FIG. 41A and FIG. 41B are schematic cross-sectional views showing the structure of the FeRAM according to the second embodiment of the present invention together with the manufacturing method thereof in the order of steps, continuing from FIG. 40C.

Subsequently, as shown in FIG. 41A, a via hole 235a to the upper electrode 232 of the ferroelectric capacitor structure 230 is formed.

Particularly, the interlayer insulating film 234 and the protection film 233 are patterned by lithography and subsequent dry etching, thereby forming the via hole 235a which exposes part of a surface of the upper electrode 232.

Figure 41B:
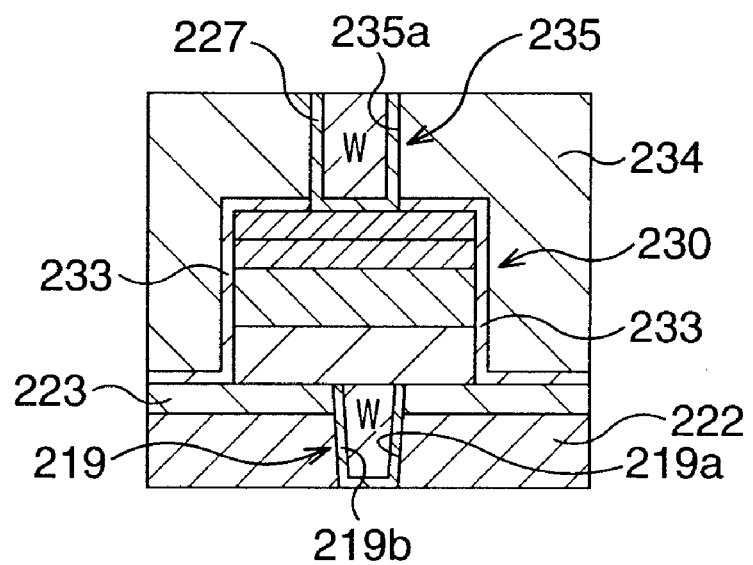

Subsequently, as shown in FIG. 41B, a plug 235 connected to the upper electrode 232 of the ferroelectric capacitor structure 230 is formed.

In this embodiment, in order to inhibit oxidation of the plug 235 due to oxygen generated from the upper electrode 232 (particularly, oxygen activated by the Pt film 226b), as a conductor impervious to oxygen a silicide film is formed as a base film of the plug 235. Specifically, a silicide film, for example a Ti silicide (TiSi) film is deposited with a film thickness of approximately 50 nm so as to cover a wall surface of the via hole 235a, thereby forming a base film (glue film) 227. As the silicide film, at least one type selected from Ti silicide, Co silicide, Mo silicide, Nb silicide, Ta silicide, W silicide, and V silicide is used.

Thereafter, with the interlayer insulating film 234 being a stopper, the W film and the glue film 227 are polished by CMP, thereby forming the plug 235 in which the via hole 235a is filled up with W via the glue film 227. After the CMP, plasma annealing of $N_2O$ for example is performed.

Here, when forming the silicide film, the silicide film is grown at a low temperature of 350° C. or lower by a sputtering method or a CVD method. A low temperature of this degree does not deteriorate the ferroelectric film 225 of the ferroelectric capacitor structure 230. When the present invention is applied to a semiconductor memory having a general capacitor structure which is not the ferroelectric capacitor structure, it is not necessary to form the silicide film particularly at a low temperature, so that the silicide film may be formed by annealing at approximately 700° C. for example.

In this embodiment, the W filling up the via hole 235a is separated from the upper electrode 232 by the glue film 227 constituted of the silicide film, so that entrance into the plug 235 of oxygen activated due to the $IrO_2$ film 226a constituting the upper electrode 232, oxygen activated due to the Pt film 226b, and the like is inhibited, thereby preventing oxidation of the plug 235.

Figure 42A:
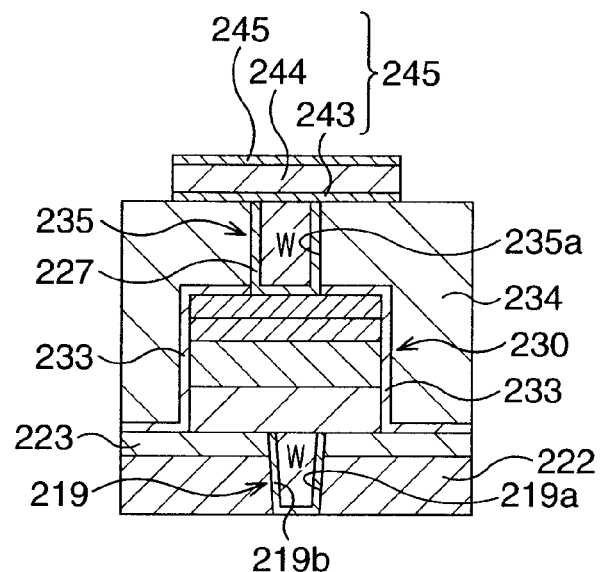
FIG. 42A and FIG. 42B are schematic cross-sectional views showing the structure of the FeRAM according to the second embodiment of the present invention together with the manufacturing method thereof in the order of steps, continuing from FIG. 41B.

Subsequently, as shown in FIG. 42A, a first wire 245 connected to the plug 235 is formed.

Particularly, first, a barrier metal film 242, a wiring film 243 and a barrier metal film 244 are deposited by a sputtering method or the like on the entire surface of the interlayer insulating film 234. As the barrier metal film 242, a TiN film for example is formed with a film thickness of approximately 150 nm by a sputtering method. As the wiring film 243, an Al alloy film (here an Al—Cu film) for example is formed with a film thickness of approximately 350 nm. As the barrier metal film 244, a TiN film for example is formed with a film thickness of approximately 150 nm by a sputtering method. Here, the structure of the wiring film 243 is the same as that of a logic part other than the FeRAM of the same rules, so that there is no problem in processing of wires or reliability thereof.

Next, as a reflection preventing film, for example an SiON film or a reflection preventing film (not-shown) is formed, and thereafter the reflection preventing film, the barrier metal film 244, the wiring film 243 and the barrier metal film 242 are processed in a wiring form by lithography and subsequent dry etching, thereby pattern-forming the first wire 245 connected to the plug 235. Note that instead of forming the Al alloy film as the wiring film 243, a Cu film (or a Cu alloy film) may be formed using a so-called damascene method or the like to thereby form a Cu wire as the first wire 245.

Figure 42B:
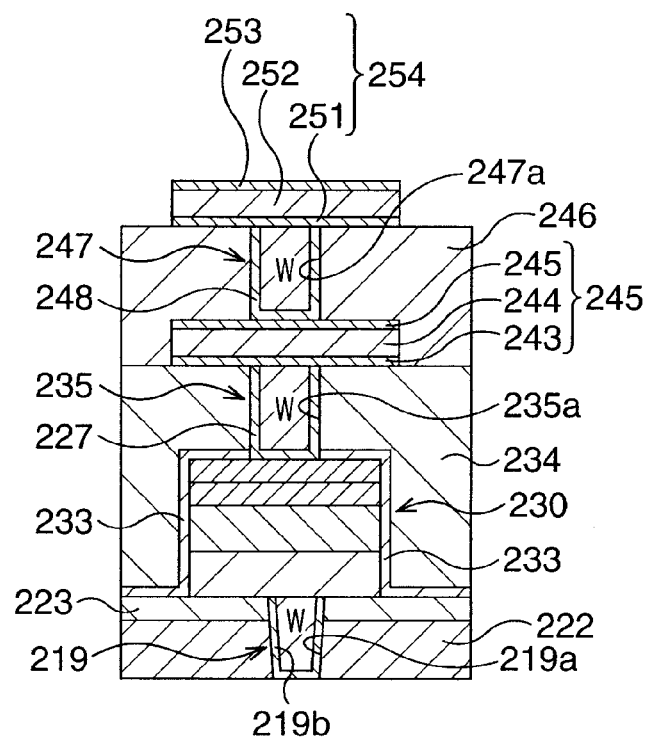

Subsequently, as shown in FIG. 42B, a second wire 254 connected to the first wire 245 is formed.

Particularly, first, an interlayer insulating film 246 is formed so as to cover the first wire 245. As the interlayer insulating film 246, a silicon oxide film is formed with a film thickness of approximately 700 nm, and a plasma TEOS film is formed so that a total film thickness thereof is approximately 1100 nm. Thereafter, the surface thereof is polished by CMP to make the film thickness approximately 750 nm.

Next, the plug 247 connected to the first wire 245 is formed.

Until part of a surface of the first wire 245 exposes, the interlayer insulating film 246 is processed by lithography and subsequent dry etching, thereby forming a via hole 247a with a diameter of approximately 0.25 μm for example. Next, a base film (glue film) 248 is formed so as to cover a wall surface of the via hole 247a, and thereafter a W film is formed so as to fill up the via hole 247a via the glue film 248 by a CVD method. Then, with the interlayer insulating film 246 being a stopper, the W film and the glue film 248 for example are polished, thereby forming the plug 247 in which the via hole 247a is filled up with W via the glue film 248.

Next, the second wire 254 connected to the plug 247 is formed.

First, a barrier metal film 251, a wiring film 252 and a barrier metal film 253 are deposited on the entire surface by a sputtering method or the like. As the barrier metal film 251, a TiN film for example is formed with a film thickness of approximately 150 nm by a sputtering method. As the wiring film 252, an Al alloy film (here an Al—Cu film) for example is formed with a film thickness of approximately 350 nm. As the barrier metal film 253, a TiN film for example is formed with a film thickness of approximately 150 nm by a sputtering method. Here, the structure of the wiring film 252 is the same as that of a logic part other than the FeRAM of the same rules, so that there is no problem in processing of wires or reliability thereof.

Next, as a reflection preventing film, for example an SiON film or a reflection preventing film (not-shown) is formed, and thereafter the reflection preventing film, the barrier metal film 253, the wiring film 252 and the barrier metal film 251 are processed in a wiring form by lithography and subsequent dry etching, thereby pattern-forming the second wire 254. Note that instead of forming the Al alloy film as the wiring film 252, a Cu film (or Cu alloy film) may be formed using a so-called damascene method or the like to thereby form a Cu wire as the second wire 254.

Thereafter, steps of forming an interlayer insulating film and a further upper layer wire, and so on are performed, thereby completing the stack type FeRAM according to this embodiment.

As described above, according to this embodiment, oxidation of the plug 235 connected to the ferroelectric capacitor structure 230 is inhibited, so that a highly reliable stack type FeRAM with stabilized contact resistance can be realized.

MODIFICATION EXAMPLES

Here, modification examples of the second embodiment will be described. Note that components and the like corresponding to those in the second embodiment are designated the same numerals.

Modification Example 1

In this example, similarly to the second embodiment, a structure of a stack type FeRAM and a manufacturing method thereof will be disclosed, but this example is different in that the glue films of the conductive plugs connected to the ferroelectric capacitor structure 230 are formed as a layered structure of a silicide film and a conductive protection film preventing entrance of hydrogen.

Figure 43A:
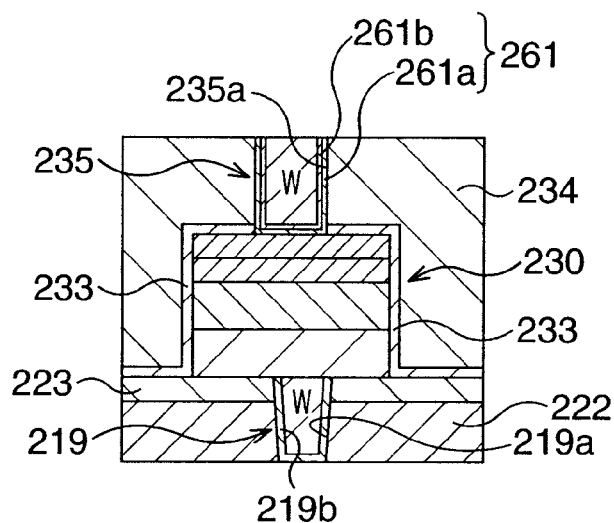
FIG. 43A and FIG. 43B are schematic cross-sectional views showing a structure of an FeRAM according to modification example 1 of the second embodiment together with a manufacturing method thereof (main steps) in the order of steps.
Figure 43B:
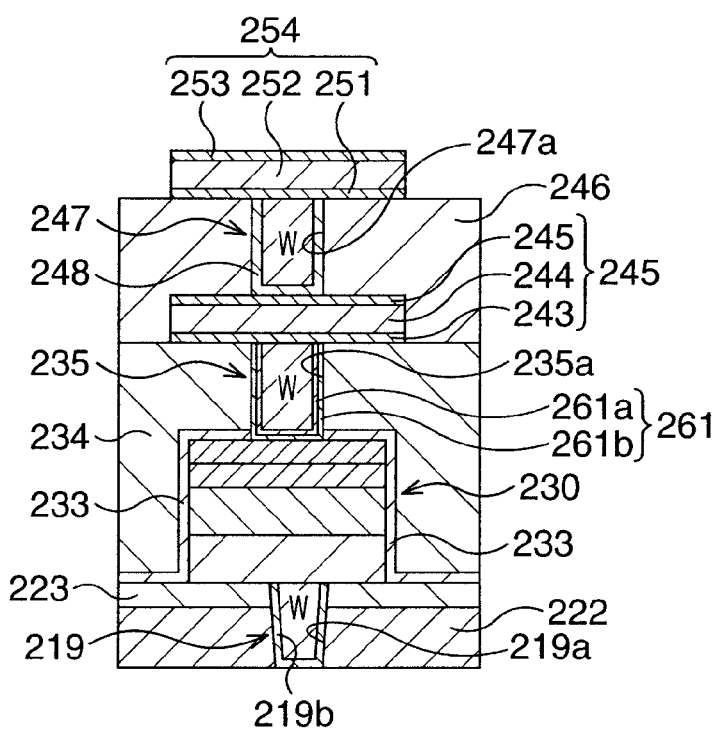

FIG. 43A and FIG. 43B are schematic cross-sectional views showing a structure of an FeRAM according to modification example 1 of the second embodiment together with a manufacturing method thereof (main steps) in the order of steps.

First, similarly to the second embodiment, the respective steps of FIG. 38A to FIG. 41A are performed.

Subsequently, as shown in FIG. 43A, a plug 235 connected to the upper electrode 232 of the ferroelectric capacitor structure 230 is formed.

In this example, in order to inhibit oxidation of the plug 235 due to oxygen generated from the upper electrode 232 (particularly, oxygen activated by the Pt film 226b) and to prevent entrance of hydrogen into the plug 235, as a conductor impervious to oxygen the base film of the plug 235 is formed with a silicide film and a film which inhibits entrance of hydrogen. Specifically, a silicide film 261a, for example a Ti silicide (TiSi) film (with a film thickness of approximately 20 nm) and a conductive protection film which inhibits permeation of hydrogen, for example a TiN film 261b (with a film thickness of approximately 50 nm) are deposited sequentially so as to cover a wall surface of the via hole 235a, thereby forming a base film (glue film) 261 of layered structure.

Here, when forming the silicide film 261a, the silicide film is grown at a low temperature of 350° C. or lower by a sputtering method or a CVD method. A low temperature of this degree does not deteriorate the ferroelectric film 225 of the ferroelectric capacitor structure 230. When the present invention is applied to a semiconductor memory having a general capacitor structure which is not the ferroelectric capacitor structure, it is not necessary to form the silicide film particularly at a low temperature, so that the silicide film may be formed by annealing at approximately 700° C. for example.

As the silicide film 261a, at least one type selected from Ti silicide, Co silicide, Mo silicide, Nb silicide, Ta silicide, W silicide, and V silicide is used. Further, as the conductive protection film which inhibits permeation of hydrogen, at least one type selected from TiN, TiSiN, TaN, CrN, HfN, ZrN, TiAlN, TaAlN, CrAlN, and HfAlN is used.

Then, a W film for example is formed by a CVD method so as to fill up the via hole 235a via the glue film 261. Thereafter, with the interlayer insulating film 234 being a stopper, the W film and the glue film 261 are polished by CMP, thereby forming the plug 235 in which the via hole 235a is filled up with W via the glue film 261. After the CMP, plasma annealing of $N_2O$ for example is performed.

In this example, the W filling up the via hole 235a is covered from a bottom face to a side face by the glue film 261 formed as the layered structure of the silicide film impervious to oxygen and the conductive protection film which inhibits permeation of hydrogen, and the W and the upper electrode 232 are separated by the glue film 261. Therefore, entrance into the plug 235 of oxygen activated due to the $IrO_2$ film 226a constituting the upper electrode 232, oxygen activated due to the Pt film 226b, and the like is inhibited, thereby preventing oxidation of the plug 235 as well as preventing entrance of hydrogen into the plug 235.

Then, similarly to the second embodiment, the respective steps of FIG. 42A and FIG. 42B are performed to obtain the structure shown in FIG. 43B.

Thereafter, steps of forming an interlayer insulating film and a further upper layer wire, and so on are performed, thereby completing the stack type FeRAM according to this example.

Figure 44:
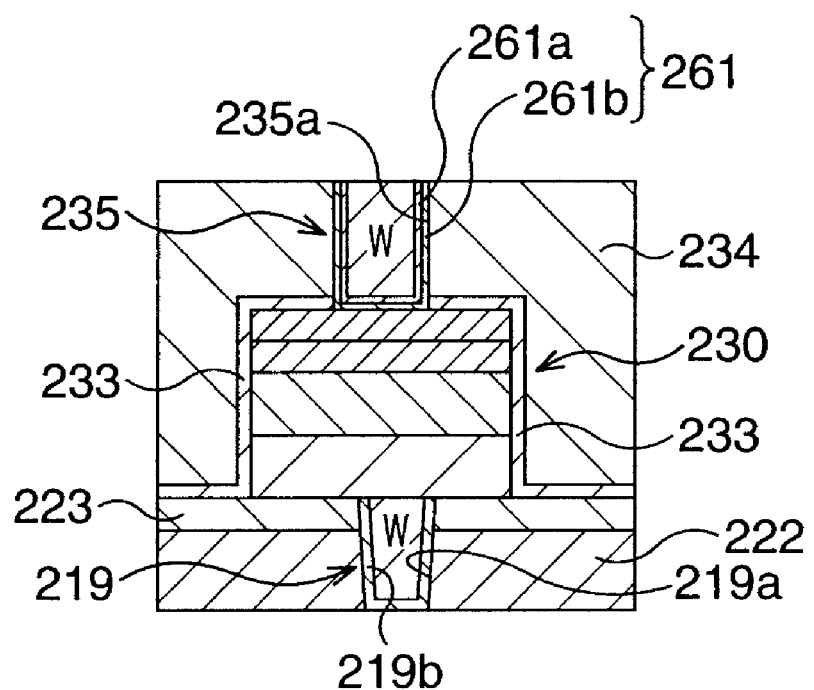
FIG. 44 is a schematic cross-sectional view showing a structure of an FeRAM according to another example of the modification example 1 of the second embodiment.

Further, in this example, the glue film 261 is formed as the layered structure of the silicide film 261a and the TiN film 261b, but as shown in FIG. 44 (corresponding to FIG. 43A), the layered state of respective films may be inverted, thereby forming the glue film 261 as a layered structure of the TiN film 261b and the silicide film 261a.

As described above, according to this example, oxidation of the plug 235 connected to the ferroelectric capacitor structure 230 is inhibited, and also entrance of hydrogen into the plug 235 is inhibited, so that a highly reliable stack type FeRAM with stabilized contact resistance can be realized.

Modification Example 2

In this example, similarly to the second embodiment, a structure of a stack type FeRAM and a manufacturing method thereof will be disclosed, but this example is different in that a silicide film is formed on the ferroelectric capacitor structure 230.

FIG. 45A to FIG. 48 are schematic cross-sectional views showing a structure of an FeRAM according to modification example 2 of the second embodiment together with a manufacturing method thereof (main steps) in the order of steps.

First, similarly to the second embodiment, the respective steps of FIG. 38A to FIG. 38D are performed.

Figure 45A:
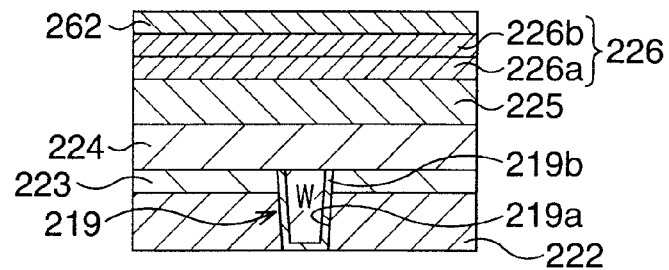
FIG. 45A to FIG. 45D are schematic cross-sectional views showing a structure of an FeRAM according to modification example 2 of the second embodiment together with a manufacturing method thereof (main steps) in the order of steps.

Subsequently, as shown in FIG. 45A, a silicide film 262 is formed on the upper electrode layer 226.

Particularly, the silicide film 262, for example a Ti silicide (TiSi) film is formed by deposition with a film thickness of approximately 50 nm on the Pt film 226b of the upper electrode layer 226. As the silicide film 262, at least one type selected from Ti silicide, Co silicide, Mo silicide, Nb silicide, Ta silicide, W silicide, and V silicide is used.

Here, when forming the silicide film 262, the silicide film is grown at a low temperature of 350° C. or lower by a sputtering method or a CVD method. A low temperature of this degree does not deteriorate the ferroelectric film 225. When the present invention is applied to a semiconductor memory having a general capacitor structure which is not the ferroelectric capacitor structure, it is not necessary to form the silicide film particularly at a low temperature, so that the silicide film may be formed by annealing at approximately 700° C. for example.

Figure 45B:
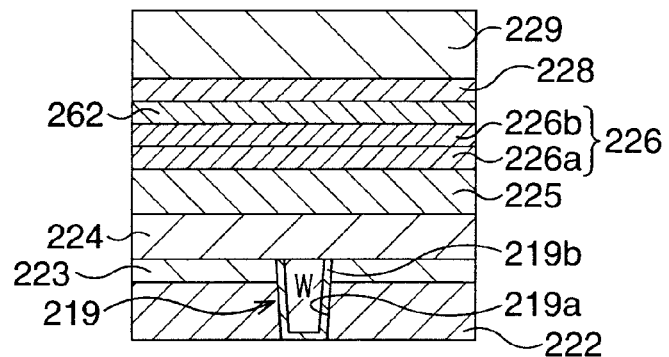

Subsequently, as shown in FIG. 45B, a TiN film 228 and a silicon oxide film 229 are formed.

Particularly, the TiN film 228 is formed by deposition with a film thickness of approximately 200 nm on the silicide film 262 by a sputtering method or the like. The silicon oxide film 229 is formed by deposition with a film thickness of approximately 1000 nm on the TiN film 228 by a CVD method using TEOS for example. Here, instead of the TEOS film, an HDP film may be formed. Note that it is also preferable to further form a silicon nitride film on the silicon oxide film 229.

Figure 45C:
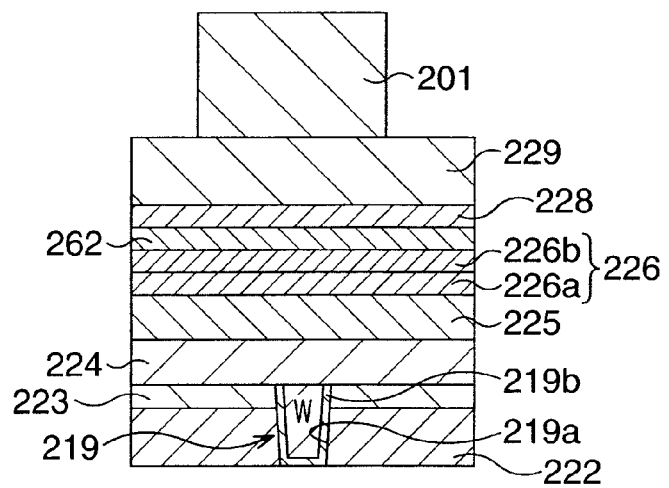

Subsequently, as shown in FIG. 45C, a resist mask 201 is formed.

Particularly, a resist is applied on the silicon oxide film 229, and this resist is processed in an electrode form by lithography, thereby forming the resist mask 201.

Figure 45D:
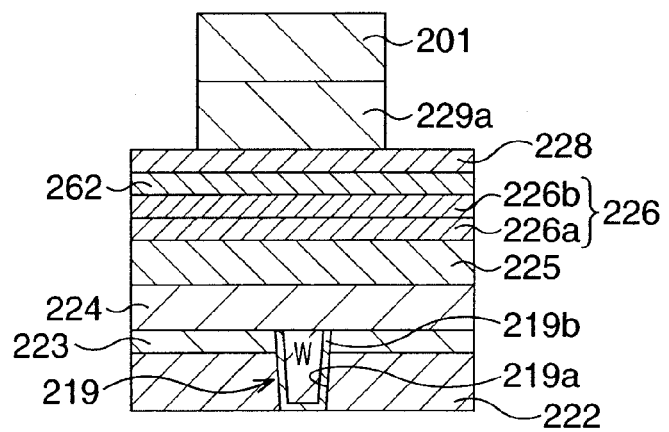

Subsequently, as shown in FIG. 45D, the silicon oxide film 229 is processed.

Particularly, with the resist mask 201 being a mask, the silicon oxide film 229 is dry-etched. At this time, the silicon oxide film 229 is patterned corresponding to the electrode form of the resist mask 201, thereby forming a hard mask 229a. Also, the resist mask 201 is etched and its thickness is reduced.

Figure 46A:
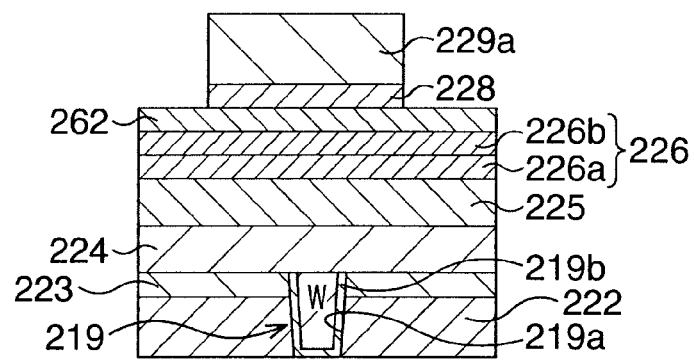
FIG. 46A to FIG. 46D are schematic cross-sectional views showing the structure of the FeRAM according to the modification example 2 of the second embodiment together with the manufacturing method thereof (main steps) in the order of steps, continuing from FIG. 45D.

Subsequently, as shown in FIG. 46A, the TiN film 228 is processed.

Particularly, with the resist mask 201 and the hard mask 229a being a mask, the TiN film 228 is dry etched. At this time, the TiN film 228 is patterned corresponding to the electrode form of the hard mask 229a. Also, the resist mask 201 itself is etched and becomes thin during the etching. Thereafter, the resist mask 201 is removed by ashing or the like. Note that here the silicide film 262 may also be patterned together with the TiN film 228 corresponding to the electrode form of the hard mask 229a.

Figure 46B:
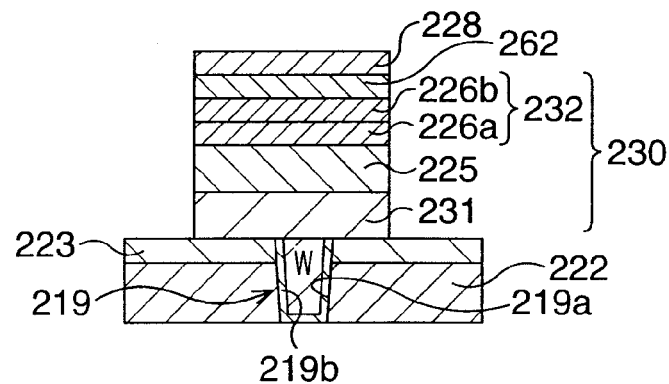

Subsequently, as shown in FIG. 46B, the silicide film 262, the upper electrode layer 226, the ferroelectric film 225, and the lower electrode layer 224 are processed.

Particularly, with the hard mask 229a and the TiN film 228 being a mask and the upper insulating film 223 being an etching stopper, the silicide film 262, the upper electrode layer 226, the ferroelectric film 225, and the lower electrode layer 224 are dry-etched. At this time, the silicide film 262, the upper electrode layer 226, the ferroelectric film 225, and the lower electrode layer 224 are patterned corresponding to the electrode form of the TiN film 228. Also, the hard mask 229a itself is etched and becomes thin during the etching.

Thereafter, the hard mask 229a is removed by dry etching (etching back) on its entire surface.

Figure 46C:
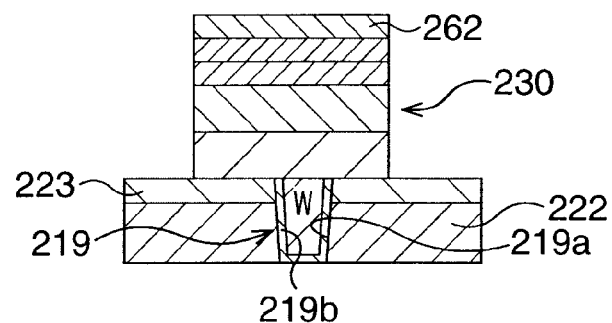

Subsequently, as shown in FIG. 46C, the ferroelectric capacitor structure 230 is completed.

Particularly, the TiN film 228 used as a mask is removed by wet etching. At this time, the ferroelectric capacitor structure 230 is completed, in which the ferroelectric film 225 and an upper electrode 232 are layered sequentially on a lower electrode 231, and the lower electrode 231 and the upper electrode 232 are capacitively coupled via the ferroelectric film 225. On an upper face of the ferroelectric capacitor structure 230, the silicide film 262 patterned in an electrode form remains. In this ferroelectric capacitor structure 230, the lower electrode 231 is connected to the plug 219, and the source/drain 218 and the lower electrode 231 are electrically connected via the plug 219.

Figure 46D:
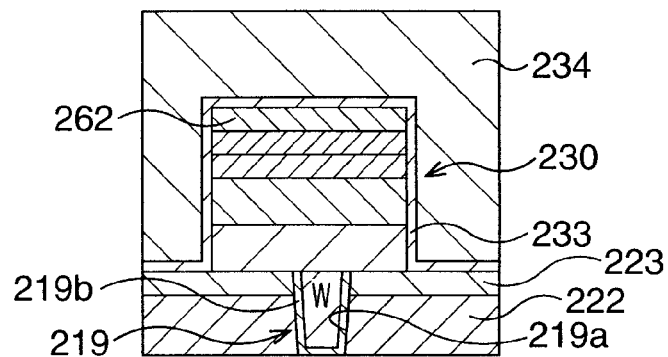

Subsequently, as shown in FIG. 46D, a protection film 233 and an interlayer insulating film 234 are formed.

Particularly, first, alumina ($Al_2O_3$) is used as a material and deposited by a sputtering method with a film thickness of approximately 20 nm to 50 nm so as to cover the entire face of the ferroelectric capacitor structure 230, thereby forming the protection film 233. Thereafter, the protection film 233 is annealed.

Next, the interlayer insulating film 234 is formed so as to cover the ferroelectric capacitor structure 230 via the protection film 233. Here, the interlayer insulating film 234 is formed such that a silicon oxide film is deposited with a film thickness of approximately 1500 nm to 2500 nm by a plasma CVD method using TEOS for example, and thereafter it is polished by CMP until the film thickness becomes approximately 1000 nm for example. After the CMP, for the purpose of dehydrating the interlayer insulating film 234, plasma annealing of $N_2O$ for example is performed.

Figure 47A:
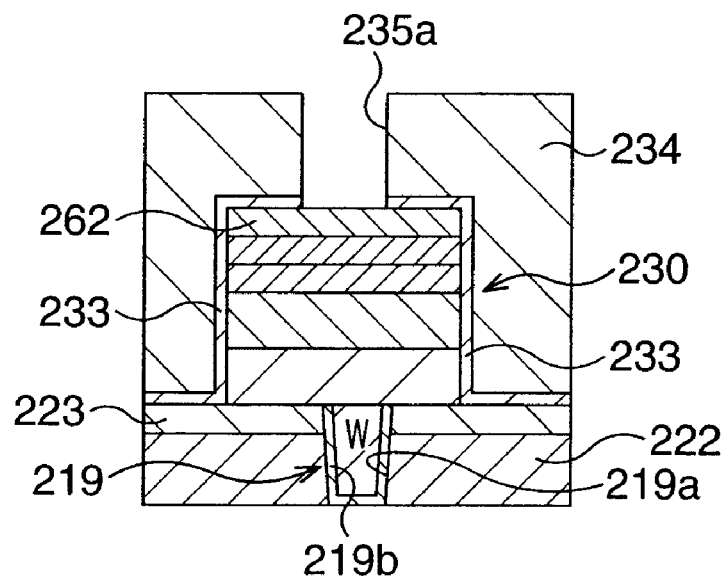
FIG. 47A and FIG. 47B are schematic cross-sectional views showing the structure of the FeRAM according to the modification example 2 of the second embodiment together with the manufacturing method thereof (main steps) in the order of steps, continuing from FIG. 46D.

Subsequently, as shown in FIG. 47A, a via hole 235a to the upper electrode 232 of the ferroelectric capacitor structure 230 is formed.

Particularly, the interlayer insulating film 234 and the protection film 233 are patterned by lithography and subsequent dry etching, thereby forming the via hole 235a which exposes part of a surface of the silicide film 262.

Figure 47B:
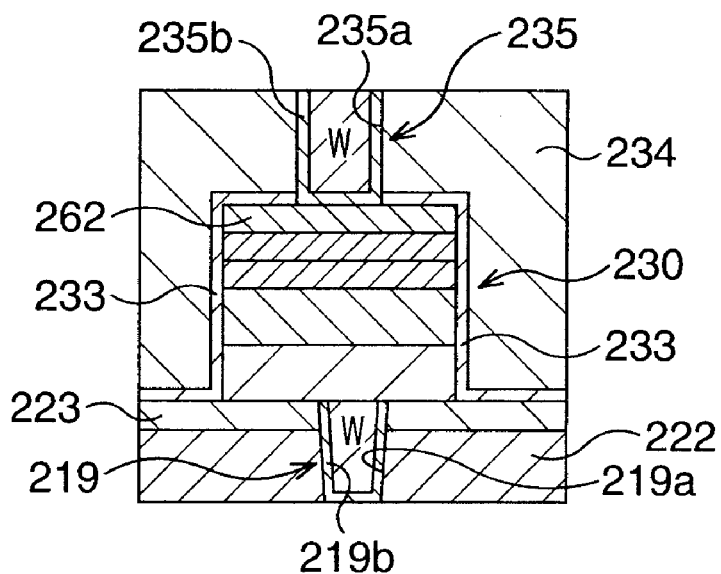

Subsequently, as shown in FIG. 47B, a plug 235 connected to the upper electrode 232 of the ferroelectric capacitor structure 230 is formed.

Particularly, first, a TiN film for example is deposited sequentially by a sputtering method with a film thickness of approximately 50 nm so as to cover a wall surface of the via hole 235a, thereby forming a base film (glue film) 235b. Then, a W film for example is formed by a CVD method so as to fill up the via hole 235a via the glue film 235b. The TiN film constituting the glue film 235b has a function of inhibiting permeation of hydrogen, and thus entrance of hydrogen into the plug 235 is inhibited. Here, for the glue film 235b which has a function of inhibiting permeation of hydrogen, at least one type selected from TiN, TiSiN, TaN, CrN, HfN, ZrN, TiAlN, TaAlN, CrAlN, and HfAlN is used.

Thereafter, with the interlayer insulating film 234 being a stopper, the W film and the glue film 235b are polished by CMP, thereby forming the plug 235 in which the via hole 235a is filled up with W via the glue film 235b. After the CMP, plasma annealing of $N_2O$ for example is performed.

In this example, the W filling up the via hole 235a is separated from the upper electrode 232 by the silicide film 262, so that entrance into the plug 235 of oxygen activated due to the $IrO_2$ film 226a constituting the upper electrode 232, oxygen activated due to the Pt film 226b, and the like is inhibited, thereby preventing oxidation of the plug 235.

Figure 48:
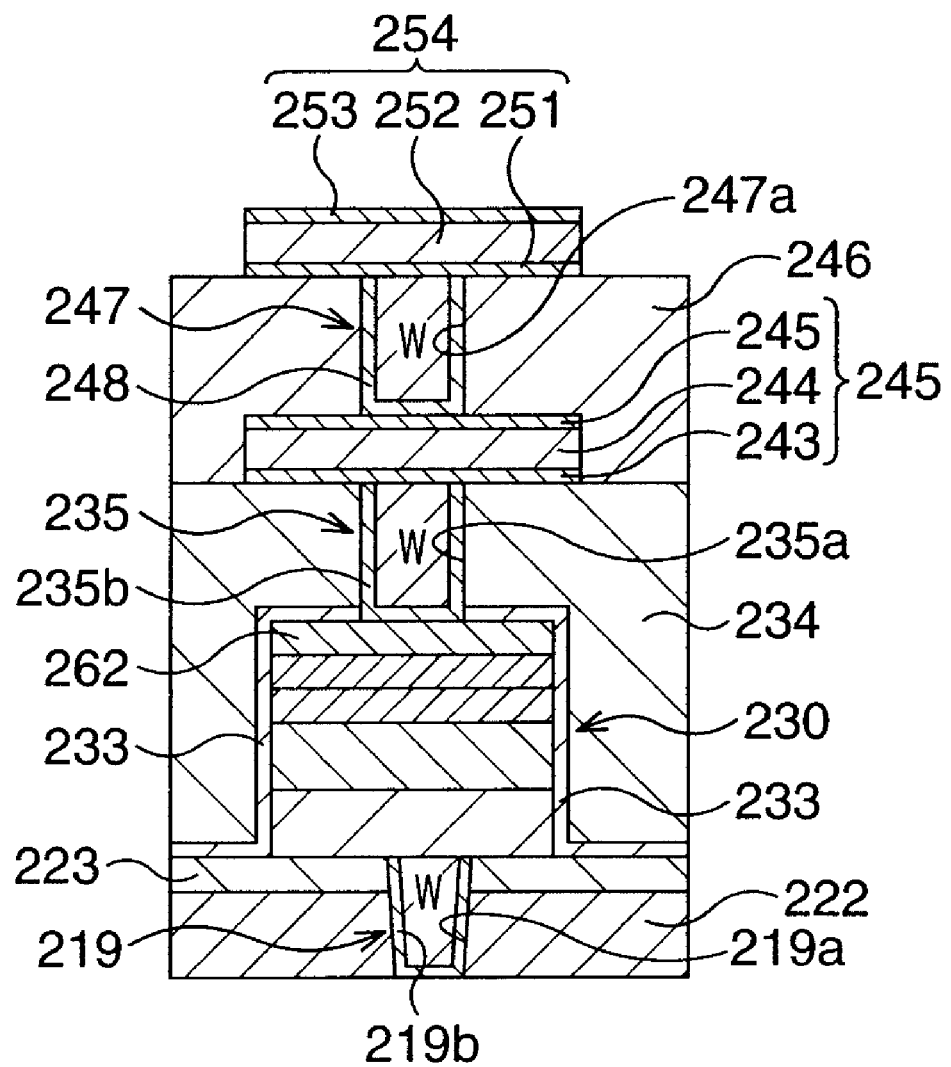
FIG. 48 is a schematic cross-sectional view showing the structure of the FeRAM according to the modification example 2 of the second embodiment together with the manufacturing method thereof (main steps) in the order of steps, continuing from FIG. 47B.

Then, similarly to the second embodiment, the respective steps of FIG. 42A and FIG. 42B are performed to obtain the structure shown in FIG. 48.

Thereafter, steps of forming an interlayer insulating film and a further upper layer wire, and so on are performed, thereby completing the stack type FeRAM according to this example.

As described above, according to this example, oxidation of the plug 235 connected to the ferroelectric capacitor structure 230 is inhibited, so that a highly reliable stack type FeRAM with stabilized contact resistance can be realized.

Modification Example 3

In this example, similarly to the second embodiment, a structure of a stack type FeRAM and a manufacturing method thereof will be disclosed, but this example is different in that a silicide film is formed on the ferroelectric capacitor structure 230.

FIG. 49A to FIG. 52B are schematic cross-sectional views showing a structure of an FeRAM according to modification example 3 of the second embodiment together with a manufacturing method thereof (main steps) in the order of steps.

First, similarly to the second embodiment, the respective steps of FIG. 38A to FIG. 38C are performed.

Figure 49A:
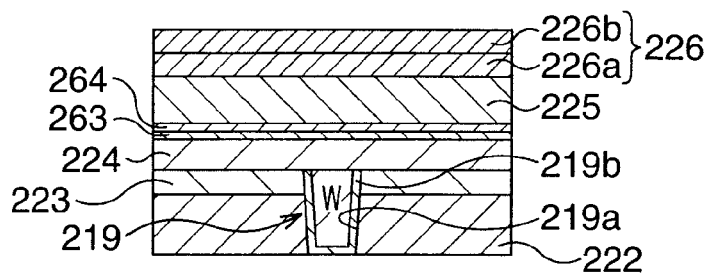
FIG. 49A to FIG. 49D are schematic cross-sectional views showing a structure of an FeRAM according to modification example 3 of the second embodiment together with a manufacturing method thereof (main steps) in the order of steps.

Subsequently, as shown in FIG. 49A, a lower electrode layer 224, a silicide film 263, a Ti film 264, a ferroelectric film 225, and an upper electrode layer 226 are formed sequentially.

Particularly, first, a Pt film is deposited with a film thickness of approximately 150 nm to 200 nm for example by a sputtering method, thereby forming the lower electrode layer 224.

Next, the silicide film 263, for example a Ti silicide (TiSi) film is formed by deposition with a film thickness of approximately 50 nm on the lower electrode layer 224 by a sputtering method or a CVD method. As the silicide film, at least one type selected from Ti silicide, Co silicide, Mo silicide, Nb silicide, Ta silicide, W silicide, and V silicide is used.

Next, a Ti film 264 is formed by deposition with a film thickness of approximately 20 nm on the silicide film 263 by a sputtering method or the like. Note that this Ti film 264 need not be formed.

Next, on the Ti film 264, the ferroelectric film 225 constituted of PZT for example, which is a ferroelectric, is deposited with a film thickness of approximately 100 nm to 300 nm by an RF sputtering method. Then, the ferroelectric film 225 is annealed to crystallize the ferroelectric film 225. Conditions of this annealing are such that it is performed for 60 seconds to 120 seconds at 550° C. to 650° C. for example while supplying $Ar/O_2$ gases at flow rates of 1.98 liter/minute of Ar and 0.025 liter/minute of $O_2$.

Next, the upper electrode layer 226 is formed by deposition on the ferroelectric film 225.

As the upper electrode layer 226, first, an $IrO_2$ film 226a for example which is a conductive oxide is formed with a film thickness of approximately 200 nm by a reactive sputtering method. Thereafter, the $IrO_2$ film 226a is annealed. Conditions of this annealing are such that it is performed for 10 seconds to 60 seconds at 650° C. to 850° C. for example while supplying $Ar/O_2$ gases at flow rates of 2.0 liter/minute of Ar and 0.02 liter/minute of $O_2$. Then, on the $IrO_2$ film 226a, a noble metal film, here a Pt film 226b, which functions as a cap film for the $IrO_2$ film 226a is formed with a film thickness of approximately 100 nm by a sputtering method. The $IrO_2$ film 226a and the Pt film 226b constitute the upper electrode layer 226. Note that for the upper electrode layer 226, instead of the IrO₂ film 226a, a conductive oxide of Ir, Ru, RuO₂, SrRuO₃ or the like or a layered structure of them may be adopted. Further, it is also possible to omit formation of the Pt film 226b.

Figure 49B:
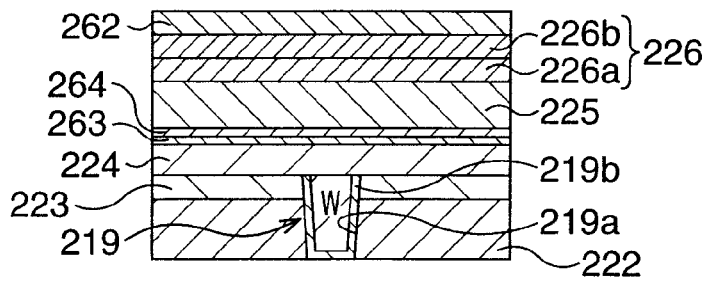

Subsequently, as shown in FIG. 49B, a silicide film 262 is formed on the upper electrode layer 226.

Particularly, the silicide film 262, for example a Ti silicide (TiSi) film is formed by deposition with a film thickness of approximately 50 nm on the Pt film 226b of the upper electrode layer 226. As the silicide film 262, at least one type selected from Ti silicide, Co silicide, Mo silicide, Nb silicide, Ta silicide, W silicide, and V silicide is used.

Here, when forming the silicide film 262, the silicide film is grown at a low temperature of 350° C. or lower by a sputtering method or a CVD method. A low temperature of this degree does not deteriorate the ferroelectric film 225. When the present invention is applied to a semiconductor memory having a general capacitor structure which is not the ferroelectric capacitor structure, it is not necessary to form the silicide film particularly at a low temperature, so that the silicide film may be formed by annealing at approximately 700° C. for example.

Figure 49C:
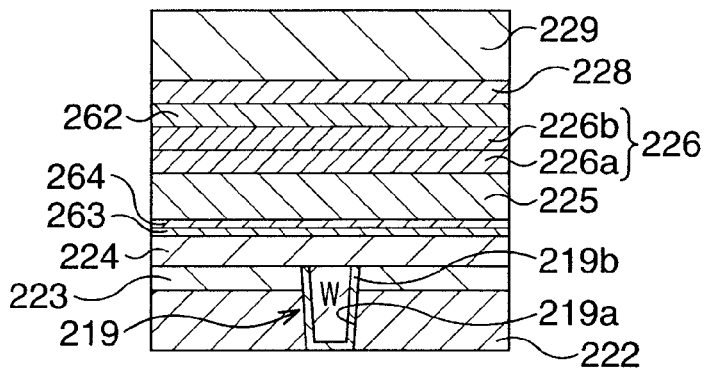

Subsequently, as shown in FIG. 49C, a TiN film 228 and a silicon oxide film 229 are formed.

Particularly, the TiN film 228 is formed by deposition with a film thickness of approximately 200 nm on the silicide film 262 by a sputtering method or the like. The silicon oxide film 229 is formed by deposition with a film thickness of approximately 1000 nm on the TiN film 228 by a CVD method using TEOS for example. Here, instead of the TEOS film, an HDP film may be formed. Note that it is also preferable to further form a silicon nitride film on the silicon oxide film 229.

Figure 49D:
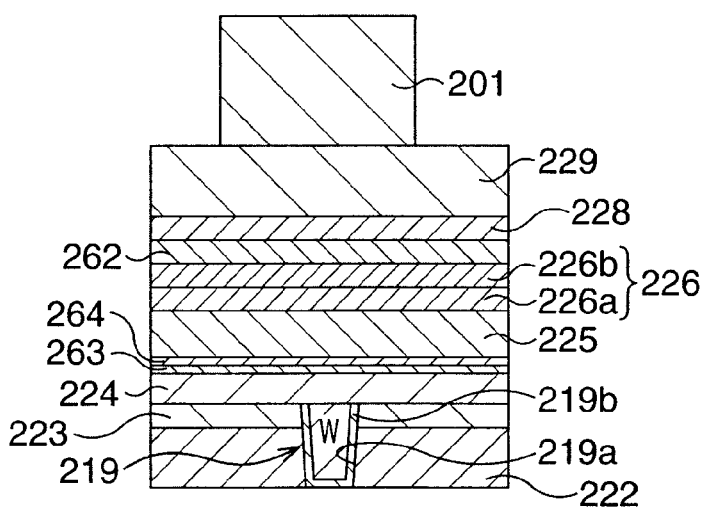

Subsequently, as shown in FIG. 49D, a resist mask 201 is formed.

Particularly, a resist is applied on the silicon oxide film 229, and this resist is processed in an electrode form by lithography, thereby forming the resist mask 201.

Figure 50A:
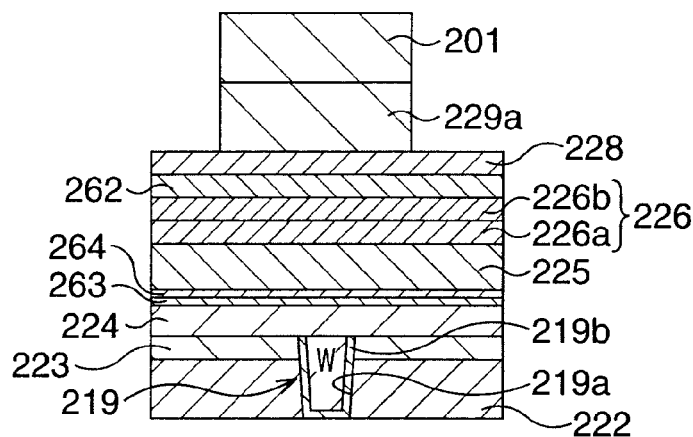
FIG. 50A to FIG. 50D are schematic cross-sectional views showing the structure of the FeRAM according to the modification example 3 of the second embodiment together with the manufacturing method thereof (main steps) in the order of steps, continuing from FIG. 49D.

Subsequently, as shown in FIG. 50A, the silicon oxide film 229 is processed.

Particularly, with the resist mask 201 being a mask, the silicon oxide film 229 is dry-etched. At this time, the silicon oxide film 229 is patterned corresponding to the electrode form of the resist mask 201, thereby forming a hard mask 229a. Also, the resist mask 201 is etched and its thickness is reduced.

Figure 50B:
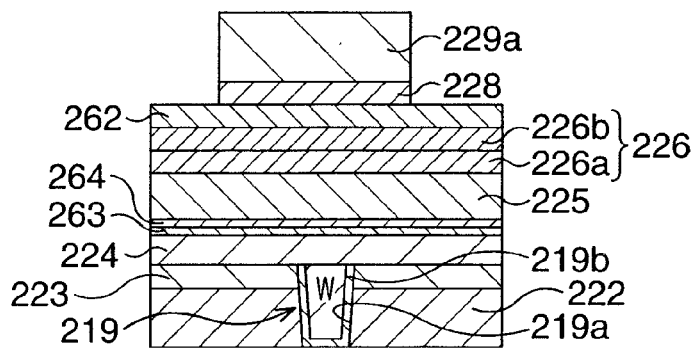

Subsequently, as shown in FIG. 50B, the TiN film 228 is processed.

Particularly, with the resist mask 201 and the hard mask 229a being a mask, the TiN film 228 is dry etched. At this time, the TiN film 228 is patterned corresponding to the electrode form of the hard mask 229a. Also, the resist mask 201 itself is etched and becomes thin during the etching. Thereafter, the resist mask 201 is removed by ashing or the like. Note that here a silicide film 227 may also be patterned together with the TiN film 228 corresponding to the electrode form of the hard mask 229a.

Figure 50C:
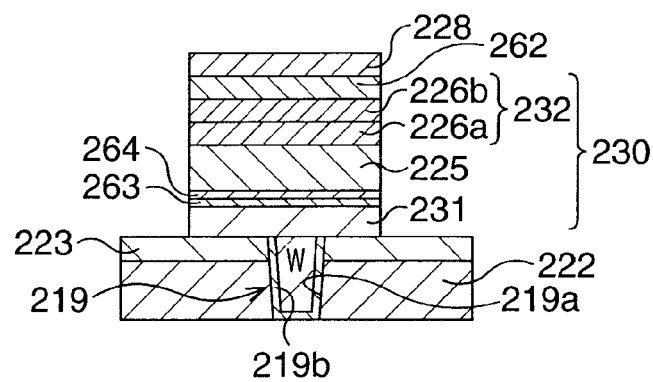

Subsequently, as shown in FIG. 50C, the silicide film 262, the upper electrode layer 226, the ferroelectric film 225, the Ti film 264, the silicide film 263, and the lower electrode layer 224 are processed.

Particularly, with the hard mask 229a and the TiN film 228 being a mask and the upper insulating film 223 being an etching stopper, the silicide film 262, the upper electrode layer 226, the ferroelectric film 225, the Ti film 264, the silicide film 263, and the lower electrode layer 224 are dry-etched. At this time, the silicide film 262, the upper electrode layer 226, the ferroelectric film 225, the Ti film 264, the silicide film 263, and the lower electrode layer 224 are patterned corresponding to the electrode form of the TiN film 228. Also, the hard mask 229a itself is etched and becomes thin during the etching. Thereafter, the hard mask 229a is removed by dry etching (etching back) on its entire surface.

Figure 50D:
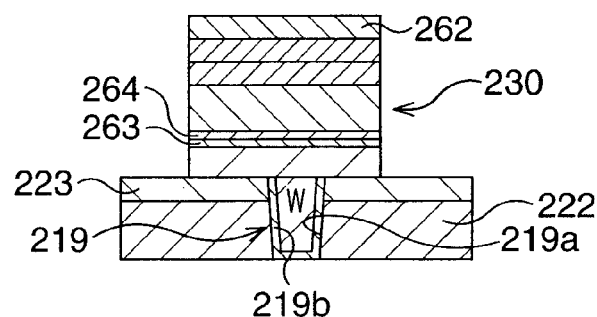

Subsequently, as shown in FIG. 50D, the ferroelectric capacitor structure 230 is completed.

Particularly, the TiN film 228 used as a mask is removed by wet etching. At this time, the ferroelectric capacitor structure 230 is completed, in which the ferroelectric film 225 and an upper electrode 232 are layered sequentially on a lower electrode 231 via the silicide film 263 and the Ti film 264, and the lower electrode 231 and the upper electrode 232 are capacitively coupled via the ferroelectric film 225. On an upper face of the ferroelectric capacitor structure 230, the silicide film 262 patterned in an electrode form remains. In this ferroelectric capacitor structure 230, the lower electrode 231 is connected to the plug 219, and the source/drain 218 and the lower electrode 231 are electrically connected via the plug 219.

Figure 51A:
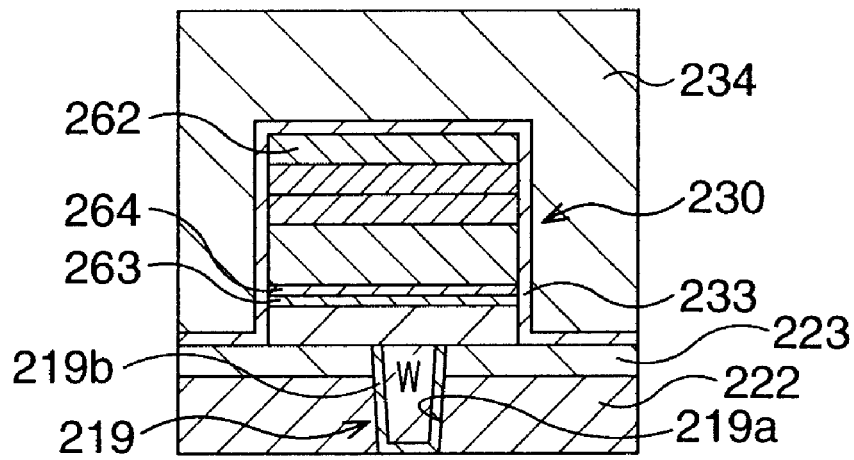
FIG. 51A and FIG. 51B are schematic cross-sectional views showing the structure of the FeRAM according to the modification example 3 of the second embodiment together with the manufacturing method thereof (main steps) in the order of steps, continuing from FIG. 50D.

Subsequently, as shown in FIG. 51A, a protection film 233 and an interlayer insulating film 234 are formed.

Particularly, first, alumina (Al₂O₃) is used as a material and deposited by a sputtering method with a film thickness of approximately 20 nm to 50 nm so as to cover the entire face of the ferroelectric capacitor structure 230, thereby forming the protection film 233. Thereafter, the protection film 233 is annealed.

Next, the interlayer insulating film 234 is formed so as to cover the ferroelectric capacitor structure 230 via the protection film 233. Here, the interlayer insulating film 234 is formed such that a silicon oxide film is deposited with a film thickness of approximately 1500 nm to 2500 nm by a plasma CVD method using TEOS for example, and thereafter it is polished by CMP until the film thickness becomes approximately 1000 nm for example. After the CMP, for the purpose of dehydrating the interlayer insulating film 234, plasma annealing of N₂O for example is performed.

Figure 51B:
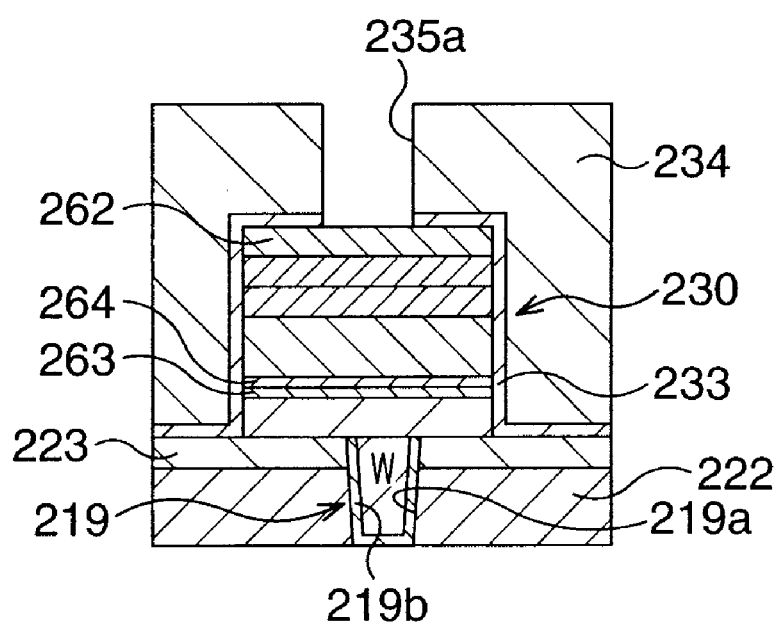

Subsequently, as shown in FIG. 51B, a via hole 235a to the upper electrode 232 of the ferroelectric capacitor structure 230 is formed.

Particularly, the interlayer insulating film 234 and the protection film 233 are patterned by lithography and subsequent dry etching, thereby forming the via hole 235a which exposes part of a surface of the silicide film 262.

Figure 52A:
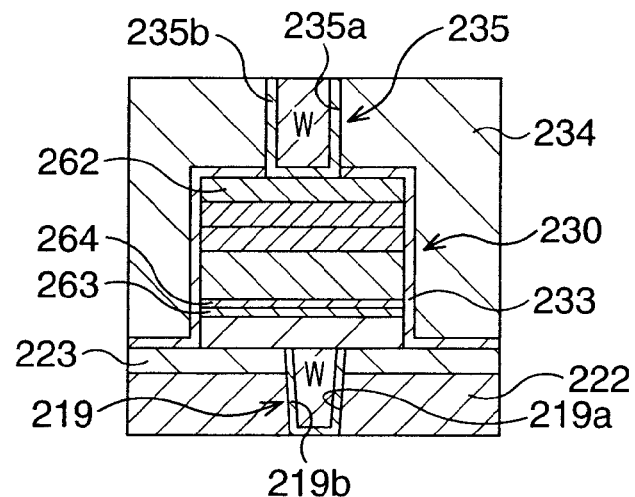
FIG. 52A and FIG. 52B are schematic cross-sectional views showing the structure of the FeRAM according to the modification example 3 of the second embodiment together with the manufacturing method thereof (main steps) in the order of steps, continuing from FIG. 51B.

Subsequently, as shown in FIG. 52A, a plug 235 connected to the upper electrode 232 of the ferroelectric capacitor structure 230 is formed.

Particularly, first, a TiN film for example is deposited sequentially by a sputtering method with a film thickness of approximately 50 nm so as to cover a wall surface of the via hole 235a, thereby forming a base film (glue film) 235b. Then, a W film for example is formed by a CVD method so as to fill up the via hole 235a via the glue film 235b. The TiN film constituting the glue film 235b has a function of inhibiting permeation of hydrogen, and thus entrance of hydrogen into the plug 235 is inhibited. Here, for the glue film 235b which has a function of inhibiting permeation of hydrogen, at least one type selected from TiN, TiSiN, TaN, CrN, HfN, ZrN, TiAlN, TaAlN, CrAlN, and HfAlN is used.

Thereafter, with the interlayer insulating film 234 being a stopper, the W film and the glue film 235b are polished by CMP, thereby forming the plug 235 in which the via hole 235a is filled up with W via the glue film 235b. After the CMP, plasma annealing of N₂O for example is performed.

In this example, the W filling up the via hole 235a is separated from the upper electrode 232 by the silicide film 262, and further separated from the lower electrode 231 by the silicide film 263. Therefore, entrance into the plug 235 of oxygen activated due to the IrO₂ film 226a constituting the upper electrode 232, oxygen activated due to the Pt film 226b, oxygen activated due to Pt constituting the lower electrode 231, and the like is inhibited, thereby preventing oxidation of the plug 235.

Figure 52B:
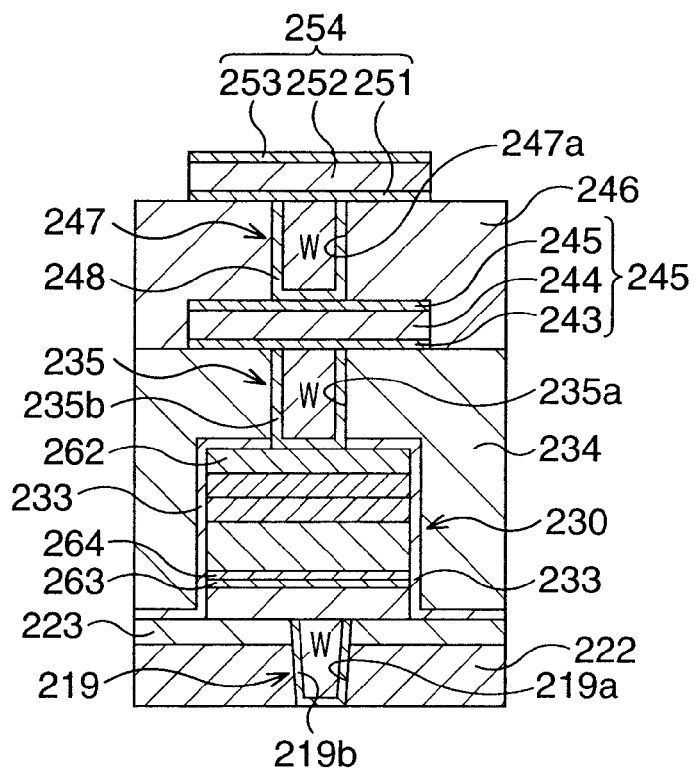

Then, similarly to the second embodiment, the respective steps of FIG. 42A and FIG. 42B are performed to obtain the structure shown in FIG. 52B.

Thereafter, steps of forming an interlayer insulating film and a further upper layer wire, and so on are performed, thereby completing the stack type FeRAM according to this example.

As described above, according to this example, oxidation of the plug 235 connected to the ferroelectric capacitor structure 230 is inhibited, so that a highly reliable stack type FeRAM with stabilized contact resistance can be realized.

Modification Example 4

In this example, similarly to the second embodiment, a structure of a stack type FeRAM and a manufacturing method thereof will be disclosed, but this example is different in that a silicide film is also formed as the glue film of the conductive plug connected to the ferroelectric capacitor structure 230.

Figure 53A:
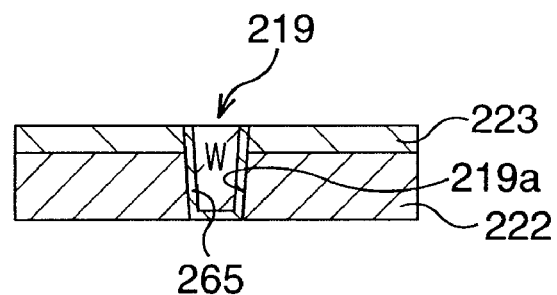
FIG. 53A and FIG. 53B are schematic cross-sectional views showing a structure of an FeRAM according to modification example 4 of the second embodiment together with a manufacturing method thereof (main steps) in the order of steps.
Figure 53B:
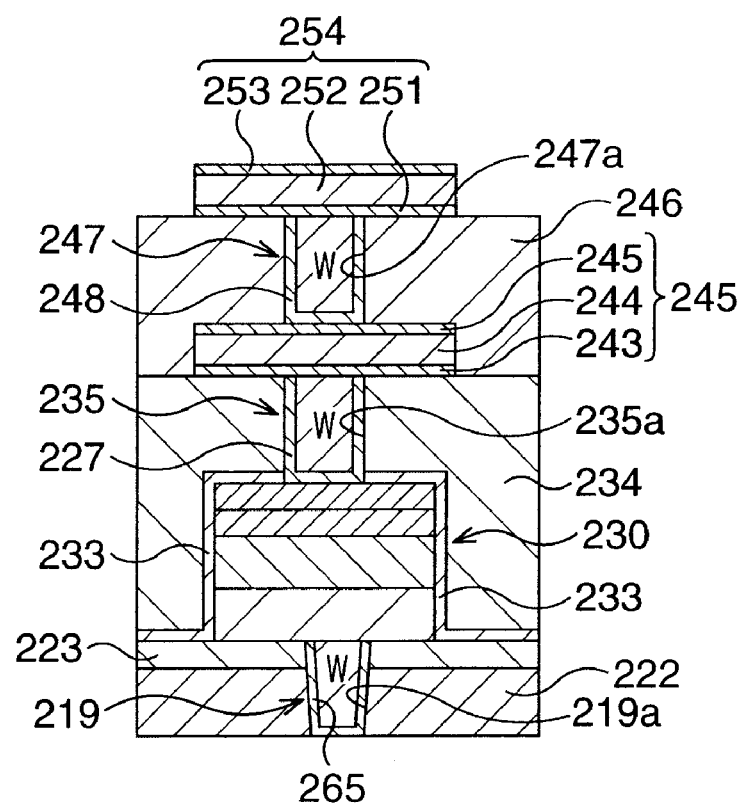

FIG. 53A and FIG. 53B are schematic cross-sectional views showing a structure of an FeRAM according to modification example 4 of the second embodiment together with a manufacturing method thereof (main steps) in the order of steps.

First, similarly to the second embodiment, the respective steps of FIG. 38A and FIG. 38B are performed.

Subsequently, as shown in FIG. 53A, a plug 219 connected to the source/drain region 218 of the transistor structure 220 is formed. Note that in FIG. 53A and respective subsequent drawings, for convenience of illustration, only the structure of the interlayer insulating film 222 and above is shown, and the silicon semiconductor substrate 210, the MOS transistor 220, and so on are omitted therefrom.

Particularly, first, with the source/drain region 218 being an etching stopper, the upper insulating film 223, the interlayer insulating film 222, and the protection film 221 are processed by lithography and subsequent dry etching until part of a surface of the source/drain region 218 exposes, thereby forming a via hole 219a with a diameter of approximately 0.3 for example.

Next, as a conductor impervious to oxygen, a silicide film is formed as a base film of the plug 219. Specifically, a silicide film, for example a Ti silicide (TiSi) film is deposited with a film thickness of approximately 50 nm so as to cover a wall surface of the via hole 219a, thereby forming a base film (glue film) 265. As the silicide film, at least one type selected from Ti silicide, Co silicide, Mo silicide, Nb silicide, Ta silicide, W silicide, and V silicide is used.

Then, a W film for example is formed by a CVD method so as to fill up the via hole 219a via the glue film 265. Thereafter, with the upper insulating film 223 being a stopper, the W film and the glue film 265 are polished by CMP, thereby forming the plug 219 in which the via hole 219a is filled up with W via the glue film 265. After the CMP, plasma annealing of N₂O for example is performed.

Then, similarly to the second embodiment, the respective steps of FIG. 38D to FIG. 42B are performed to obtain the structure shown in FIG. 53B.

Thereafter, steps of forming an interlayer insulating film and a further upper layer wire, and so on are performed, thereby completing the stack type FeRAM according to this example.

In this example, the W filling up the via hole 235a is separated from the upper electrode 232 by the glue film 227 constituted of the silicide film. Therefore, entrance into the plug 235 of oxygen activated due to the IrO₂ film 226a constituting the upper electrode 232, oxygen activated due to the Pt film 226b, oxygen activated due to Pt constituting the lower electrode 231, and the like is inhibited, thereby preventing oxidation of the plug 235. Similarly, the W filling up the via hole 219a is surrounded by the glue film 265 constituted of the silicide film, thereby preventing oxidation of the plug 219.

As described above, according to this example, oxidation of the plugs 235, 219 connected to the ferroelectric capacitor structure 230 on its top and bottom is inhibited, so that a highly reliable stack type FeRAM with stabilized contact resistance can be realized.

Modification Example 5

In this example, similarly to the second embodiment, a structure of a stack type FeRAM and a manufacturing method thereof will be disclosed, but this example is different in that a silicide film is also formed as the glue film of the conductive plug connected to the ferroelectric capacitor structure 230.

Figure 54A:
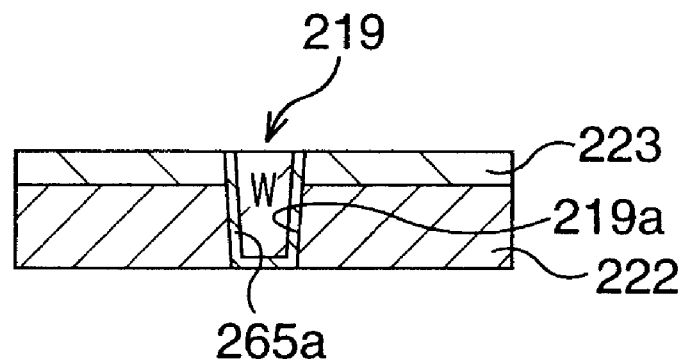
FIG. 54A and FIG. 54B are schematic cross-sectional views showing a structure of an FeRAM according to modification example 5 of the second embodiment together with a manufacturing method thereof (main steps) in the order of steps.
Figure 54B:
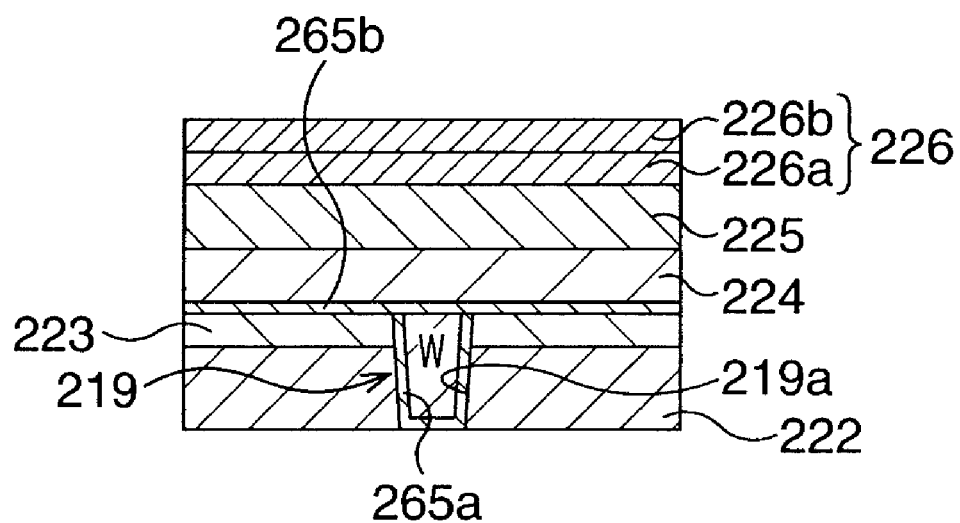
Figure 55:
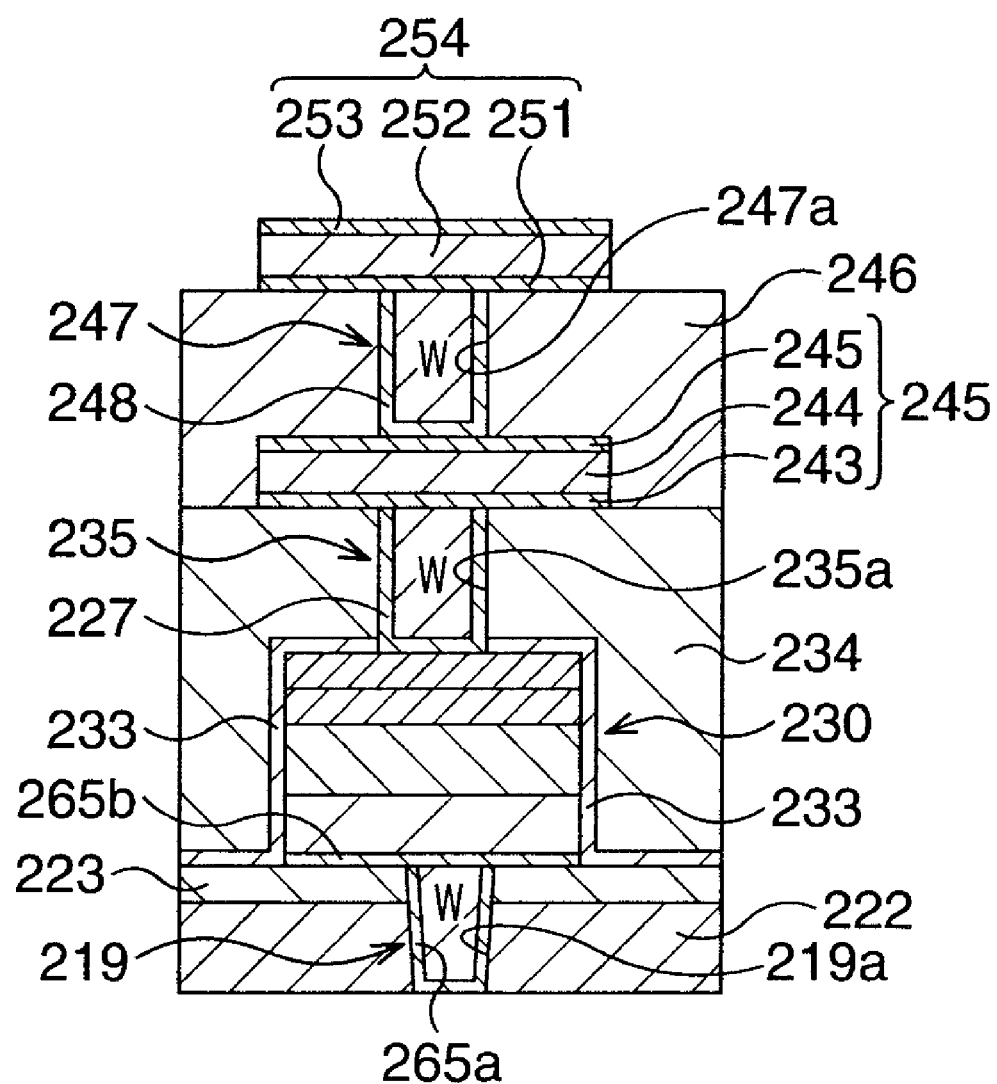
FIG. 55 is a schematic cross-sectional view showing the structure of the FeRAM according to the modification example 5 of the second embodiment together with the manufacturing method thereof (main steps) in the order of steps, continuing from FIG. 54B.

FIG. 54A to FIG. 55 are schematic cross-sectional views showing a structure of an FeRAM according to modification example 5 of the second embodiment together with the manufacturing method thereof (main steps) in the order of steps.

First, similarly to the second embodiment, the respective steps of FIG. 38A and FIG. 38B are performed.

Subsequently, as shown in FIG. 54A, a plug 219 connected to the source/drain region 218 of the transistor structure 220 is formed. Note that in FIG. 54A and respective subsequent drawings, for convenience of illustration, only the structure of the interlayer insulating film 222 and above is shown, and the silicon semiconductor substrate 210, the MOS transistor 220, and so on are omitted therefrom.

Particularly, first, with the source/drain region 218 being an etching stopper, the upper insulating film 223, the interlayer insulating film 222, and the protection film 221 are processed by lithography and subsequent dry etching until part of a surface of the source/drain region 218 exposes, thereby forming a via hole 219a with a diameter of approximately 0.3 for example.

Next, as a conductor impervious to oxygen, a silicide film is formed as a base film of the plug 219. Specifically, a silicide film, for example a Ti silicide (TiSi) film is deposited with a film thickness of approximately 50 nm so as to cover a wall surface of the via hole 219a, thereby forming a base film (glue film) 265a. As the silicide film, at least one type selected from Ti silicide, Co silicide, Mo silicide, Nb silicide, Ta silicide, W silicide, and V silicide is used.

Then, a W film for example is formed by a CVD method so as to fill up the via hole 219a via the glue film 265a. Thereafter, with the upper insulating film 223 being a stopper, the W film and the glue film 265a are polished by CMP, thereby forming the plug 219 in which the via hole 219a is filled up with W via the glue film 265a. After the CMP, plasma annealing of N₂O for example is performed.

Subsequently, as shown in FIG. 54B, a silicide film 365b, a lower electrode layer 224, a ferroelectric film 225 and an upper electrode layer 226 are formed sequentially.

Particularly, first, a silicide film 265b as a conductor impervious to oxygen is formed with a film thickness of approximately 50 nm so as to cover the plug 219. As the silicide film 265b, at least one type selected from Ti silicide, Co silicide, Mo silicide, Nb silicide, Ta silicide, W silicide, and V silicide is used.

Next, a Pt film is deposited with a film thickness of approximately 150 nm to 200 nm for example by a sputtering method, thereby forming the lower electrode layer 224.

Next, on the lower electrode layer 224, the ferroelectric film 225 constituted of PZT for example, which is a ferroelectric, is deposited with a film thickness of approximately 100 nm to 300 nm by an RF sputtering method. Then, the ferroelectric film 225 is annealed to crystallize the ferroelectric film 225. Conditions of this annealing are such that it is performed for 60 seconds to 120 seconds at 550° C. to 650° C. for example while supplying $Ar/O_2$ gases at flow rates of 1.98 liter/minute of Ar and 0.025 liter/minute of $O_2$.

Next, the upper electrode layer 226 is formed by deposition on the ferroelectric film 225.

As the upper electrode layer 226, first, an $IrO_2$ film 226a for example which is a conductive oxide is formed with a film thickness of approximately 50 nm by a reactive sputtering method. Thereafter, the $IrO_2$ film 226a is annealed. Conditions of this annealing are such that it is performed for 10 seconds to 60 seconds at 650° C. to 850° C. for example while supplying $Ar/O_2$ gases at flow rates of 2.0 liter/minute of Ar and 0.02 liter/minute of $O_2$. Then, on the $IrO_2$ film 226a, a noble metal film, here a Pt film 226b, which functions as a cap film for the $IrO_2$ film 226a is formed with a film thickness of approximately 100 nm by a sputtering method. The $IrO_2$ film 226a and the Pt film 226b constitute the upper electrode layer 226. Note that for the upper electrode layer 226, instead of the $IrO_2$ film 226a, a conductive oxide of Ir, Ru, $RuO_2$, $SrRuO_3$ or the like or a layered structure of them may be adopted. Further, it is also possible to omit formation of the Pt film 226b.

Then, similarly to the second embodiment, the respective steps of FIG. 39A to FIG. 42B are performed to obtain the structure shown in FIG. 55.

Thereafter, steps of forming an interlayer insulating film and a further upper layer wire, and so on are performed, thereby completing the stack type FeRAM according to this example.

In this example, the W filling up the via hole 235a is separated from the upper electrode 232 by the glue film 227 constituted of the silicide film. Therefore, entrance into the plug 235 of oxygen activated due to the $IrO_2$ film 226a constituting the upper electrode 232, oxygen activated due to the Pt film 226b, oxygen activated due to Pt constituting the lower electrode 231, and the like is inhibited, thereby preventing oxidation of the plug 235.

Furthermore, the W filling up the via hole 219a is covered from a bottom face to a side face by the glue film 265a which is the silicide film impervious to oxygen, and an upper face of the W filling up the via hole 219a is covered by the silicide film 265b. The W is in a state of being substantially completely isolated from the ferroelectric capacitor structure 230 existing at a lower layer thereof by the glue film 265a and the silicide film 265b. Therefore, oxidation of the plug 219 is prevented.

As described above, according to this example, oxidation of the plugs 235, 219 connected to the ferroelectric capacitor structure 230 on its top and bottom is inhibited, so that a highly reliable stack type FeRAM with stabilized contact resistance can be realized.

Modification Example 6

In this example, similarly to the second embodiment, a structure of a stack type FeRAM and a manufacturing method thereof will be disclosed, but this example is different in that a silicide film is applied to the glue films of the conductive plugs connecting the wires located at an upper layer of the ferroelectric capacitor structure 230.

FIG. 56A to FIG. 56E are schematic cross-sectional views showing a structure of an FeRAM according to modification example 6 of the second embodiment together with a manufacturing method thereof (main steps) in the order of steps.

First, similarly to the second embodiment, the respective steps of FIG. 38A to FIG. 42A are performed.

Figure 56A:
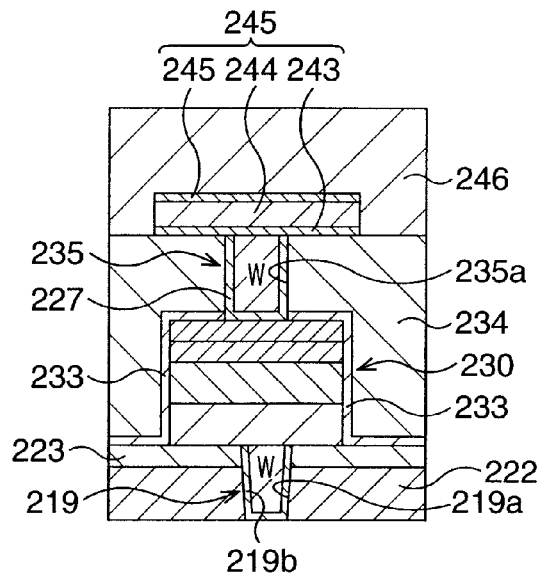
FIG. 56A to FIG. 56E are schematic cross-sectional views showing a structure of an FeRAM according to modification example 6 of the second embodiment together with a manufacturing method thereof (main steps) in the order of steps.

Subsequently, as shown in FIG. 56A, an interlayer insulating film 246 is formed so as to cover the first wire 245.

Particularly, a silicon oxide film is formed with a film thickness of approximately 700 nm so as to cover the first wire 245, and a plasma TEOS film is formed thereon so that a total film thickness thereof is approximately 1100 nm. Thereafter, the surface thereof is polished by CMP to make the film thickness approximately 750 nm, thereby forming the interlayer insulating film 246. After the CMP, plasma annealing of $N_2O$ for example is performed.

Figure 56B:
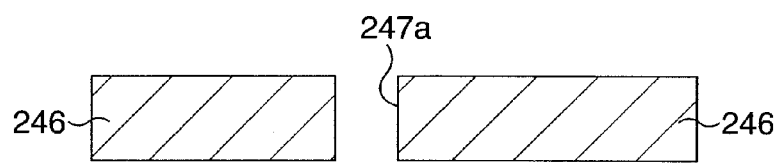

Subsequently, as shown in FIG. 56B, a via hole 247a which exposes a surface of the first wire 245 is formed. Note that in FIG. 56B and respective subsequent drawings, for convenience of illustration, only the structure of the interlayer insulating film 246 and above is shown, and the ferroelectric capacitor structure 230, the first wire 245, and so on are omitted therefrom.

Particularly, until part of a surface of the first wire 245 exposes, the interlayer insulating film 246 is processed by lithography and subsequent dry etching, thereby forming a via hole 247a with a diameter of approximately 0.25 μm for example.

Figure 56C:
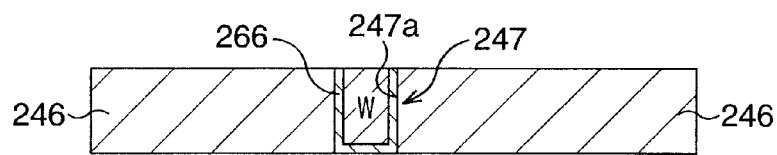

Subsequently, as shown in FIG. 56C, the plug 247 connected to the first wire 245 is formed.

Particularly, in order to inhibit oxidation of the plug 247 due to oxygen generated from the ferroelectric capacitor structure 230 (particularly, oxygen activated by the Pt film 226b), as a conductor impervious to oxygen a base film of the plug 247 is formed with a silicide film. Specifically, a silicide film, for example a Ti silicide (TiSi) film is formed with a film thickness of approximately 20 nm to 50 nm on the interlayer insulating film 246 so as to cover an inner wall surface of the via hole 247a, thereby forming a base film (glue film) 266. As the silicide film, at least one type selected from Ti silicide, Co silicide, Mo silicide, Nb silicide, Ta silicide, W silicide, and V silicide is used.

Here, when forming the silicide film, the silicide film is grown at a low temperature of 350° C. or lower by a sputtering method or a CVD method. A low temperature of this degree does not deteriorate the ferroelectric film 225 of the ferroelectric capacitor structure 230. When the present invention is applied to a semiconductor memory having a general capacitor structure which is not the ferroelectric capacitor structure, it is not necessary to form the silicide film particularly at a low temperature, so that the silicide film may be formed by annealing at approximately 700° C. for example.

Then, a W film for example is formed by a CVD method so as to fill up the via hole 247a via the glue film 266. Thereafter, with the interlayer insulating film 246 being a stopper, the W film and the glue film 266 are polished by CMP, thereby forming the plug 247 in which the via hole 247a is filled up with W via the glue film 266.

In this example, the W filling up the via hole 247a is covered from a bottom face to a side face by the glue film 266 which is the silicide film impervious to oxygen, and the W and the ferroelectric capacitor structure 230 existing at a lower layer thereof are separated by the glue film 266. Therefore, entrance into the plug 247 of oxygen activated due to the $IrO_2$ film 226a constituting the upper electrode 232, oxygen activated due to the Pt film 226b, and the like is inhibited, thereby preventing oxidation of the plug 247.

Note that in this example, the case of applying the silicide film to the glue film of the plug 235 connected to the ferroelectric capacitor structure 230, and also applying the silicide film to the glue film of the plug 247 connected to the first wire 245 is exemplified, but when attaching much weight to the achievement of preventing oxidation of the plug 247 in particular, the silicide film may be applied only to the glue film of the plug 247 connected to the first wire 245.

Figure 56D:
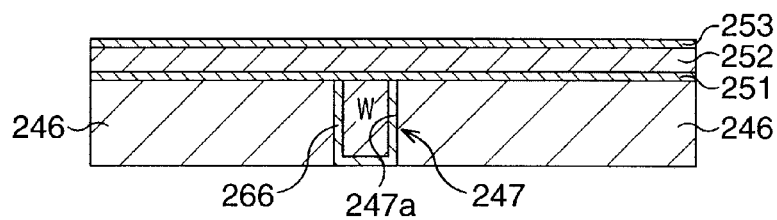

Subsequently, as shown in FIG. 56D, a barrier metal film 251, a wiring film 252 and a barrier metal film 253 are deposited on the entire surface by a sputtering method or the like.

Particularly, as the barrier metal film 251, a TiN film for example is formed with a film thickness of approximately 150 nm by a sputtering method. As the wiring film 252, an Al alloy film (here an Al—Cu film) for example is formed with a film thickness of approximately 350 nm. As the barrier metal film 253, a TiN film for example is formed with a film thickness of approximately 150 nm by a sputtering method. Here, the structure of the wiring film 252 is the same as that of a logic part other than the FeRAM of the same rules, so that there is no problem in processing of wires or reliability thereof.

Figure 56E:
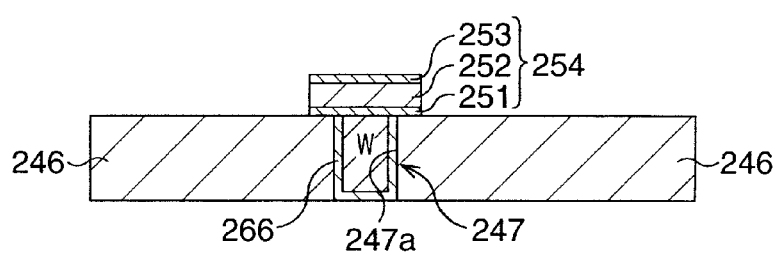

Subsequently, as shown in FIG. 56E, a second wire 254 connected to the plug 247 is formed.

Particularly, as a reflection preventing film, for example an SiON film or a reflection preventing film (not-shown) is formed, and thereafter the reflection preventing film, the barrier metal film 253, the wiring film 252 and the barrier metal film 251 are processed in a wiring form by lithography and subsequent dry etching, thereby pattern-forming the second wire 254.

Thereafter, steps of forming an interlayer insulating film and a further upper layer wire, and so on are performed, thereby completing the stack type FeRAM according to this example. Here, when forming further upper layer wires, a silicide film as described above is applied to a glue film of a plug (a plug constituted of W) connecting the upper layer wires, similarly to the plug 247.

As described above, according to this example, oxidation of the plug 235 connected to the upper electrode 232 of the ferroelectric capacitor structure 230 as well as the plug 247 connected to the first wire 245 is inhibited, so that a highly reliable stack type FeRAM with stabilized contact resistance can be realized.

Modification Example 7

In this example, similarly to the second embodiment, a structure of a stack type FeRAM and a manufacturing method thereof will be disclosed, but this example is different in that part of wires located at an upper layer of the ferroelectric capacitor structure 230 are formed by a so-called damascene method, and a silicide film is applied to the glue films of the wires and the conductive plugs.

FIG. 57A to FIG. 59B are schematic cross-sectional views showing a structure of an FeRAM according to modification example 7 of the second embodiment together with a manufacturing method thereof (main steps) in the order of steps.

First, similarly to the second embodiment, the respective steps of FIG. 38A to FIG. 42A are performed.

Figure 57A:
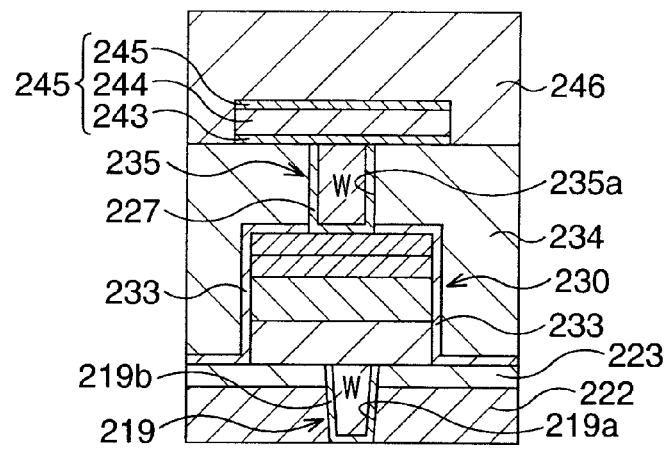
FIG. 57A to FIG. 57E are schematic cross-sectional views showing a structure of an FeRAM according to modification example 7 of the second embodiment together with a manufacturing method thereof (main steps) in the order of steps.

Subsequently, as shown in FIG. 57A, an interlayer insulating film 246 is formed so as to cover the first wire 245.

Particularly, a silicon oxide film is formed with a film thickness of approximately 700 nm so as to cover the first wire 245, and a plasma TEOS film is formed thereon so that a total film thickness thereof is approximately 1100 nm. Thereafter, the surface thereof is polished by CMP to make the film thickness approximately 750 nm, thereby forming the interlayer insulating film 246. After the CMP, plasma annealing of $N_2O$ for example is performed.

Figure 57B:
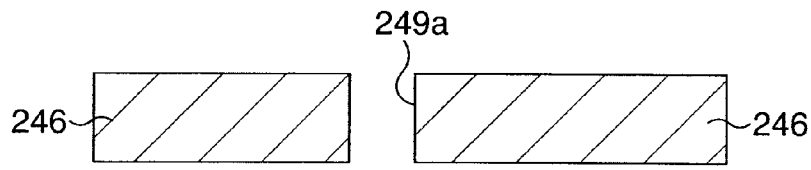

Subsequently, as shown in FIG. 57B, a via hole 249a which exposes a surface of the first wire 245 is formed. Note that in FIG. 57B and respective subsequent drawings, for convenience of illustration, only the structure of the interlayer insulating film 246 and above is shown, and the ferroelectric capacitor structure 230, the first wire 245, and so on are omitted therefrom.

Particularly, until part of a surface of the first wire 245 exposes, the interlayer insulating film 246 is processed by lithography and subsequent dry etching, thereby forming a via hole 249a with a diameter of approximately 0.25 μm for example.

Figure 57C:
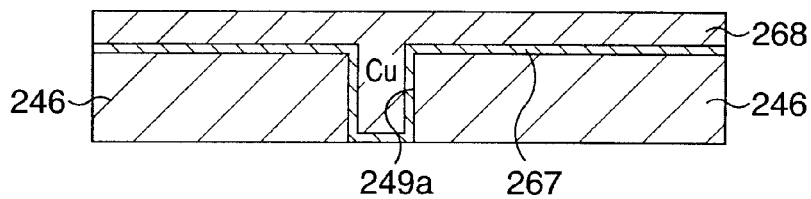

Subsequently, as shown in FIG. 57C, a base film 267 constituted of a silicide film is formed and Cu plating is performed.

Particularly, as a conductor impervious to oxygen, a base film is formed with a silicide film. Specifically, a silicide film, for example a Ti silicide (TiSi) film is formed with a film thickness of approximately 10 nm to 20 nm on the interlayer insulating film 246 so as to cover an inner wall surface of the via hole 249a, thereby forming the base film (glue film) 267. As the silicide film, at least one type selected from Ti silicide, Co silicide, Mo silicide, Nb silicide, Ta silicide, W silicide, and V silicide is used.

Here, when forming the silicide film, the silicide film is grown at a low temperature of 350° C. or lower by a sputtering method or a CVD method. A low temperature of this degree does not deteriorate the ferroelectric film 225 of the ferroelectric capacitor structure 230. When the present invention is applied to a semiconductor memory having a general capacitor structure which is not the ferroelectric capacitor structure, it is not necessary to form the silicide film particularly at a low temperature, so that the silicide film may be formed by annealing at approximately 700° C. for example.

Then, after a seed film (not-shown) of Cu is formed, a Cu (or an alloy thereof) film 268 is deposited on the glue film 267 by a plating method so as to fill up the via hole 249a via the glue film 267.

Figure 57D:
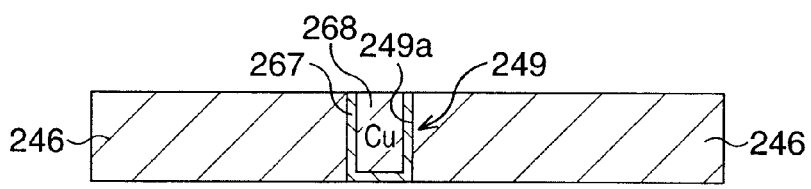

Subsequently, as shown in FIG. 57D, the plug 249 is formed.

Particularly, with the interlayer insulating film 246 being a stopper, the Cu film 268 and the glue film 267 are polished by CMP, thereby forming the plug 249 in which the via hole 249a is filled up with Cu via the glue film 267.

Figure 57E:
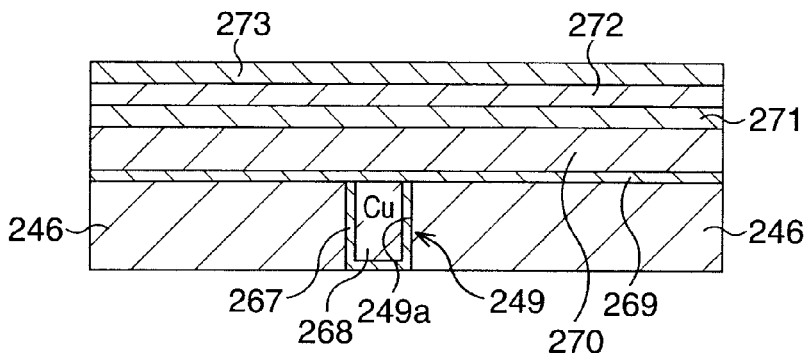

Subsequently, as shown in FIG. 57E, a silicon nitride film 269, an interlayer insulating film 270, an SOG film 271, an interlayer insulating film 272 and a silicon nitride film 273 are layered sequentially on the interlayer insulating film 246 so as to cover the plug 249.

Particularly, the silicon nitride film 269 is formed with a film thickness of approximately 50 nm to 100 nm by a CVD method for example. The interlayer insulating film 270 is formed with a film thickness of approximately 200 nm to 400 nm by a CVD method for example. The SOG film 271 is formed with a film thickness of approximately 100 nm to 200 nm by spin coating SOG. The interlayer insulating film 272 is formed with a film thickness of approximately 100 nm by a CVD method for example. The silicon nitride film 273 is formed with a film thickness of approximately 100 nm by a CVD method for example.

Subsequently, as shown in FIG. 58A, the silicon nitride film 273 is processed.

Particularly, the silicon nitride film 273 is patterned by lithography and dry etching, thereby forming an opening 273a in a wiring form in the silicon nitride film 273.

Subsequently, as shown in FIG. 58B, the interlayer insulating film 272 and the SOG film 271 are processed.

Particularly, the interlayer insulating film 272 and the SOG film 271 are patterned by lithography and dry etching, thereby forming openings 272a, 271a in a hole form at positions on the interlayer insulating film 272 and the SOG film 271 located above the plug 249 and matching with the opening 273a.

Subsequently, as shown in FIG. 58C, the interlayer insulating film 272 and the interlayer insulating film 270 are processed.

Particularly, using the silicon nitride film 273 as a hard mask, the interlayer insulating film 272 is patterned in a wiring form corresponding to the opening 273a by lithography and dry etching, thereby forming an opening 272b extending the opening 272a. At this time, simultaneously, the interlayer insulating film 272 and the SOG film 271 function as a mask, and the interlayer insulating film 270 is patterned in a hole form corresponding to the opening 271a, thereby forming an opening 270a.

Subsequently, as shown in FIG. 58D, a wiring trench 274 is completed.

Particularly, using the silicon nitride film 273 as a hard mask, the silicon nitride film 269 is patterned by lithography and dry etching until a surface of the plug 247 exposes. At this time, an opening 271b in a wiring form extending the opening 271a corresponding to the openings 273a, 273b, is formed in the SOG film 271, and an opening 269a in a hole form corresponding to the opening 270a is formed in the silicon nitride film 269. Here, also the silicon nitride film 273 becomes thin by the film thickness of the silicon nitride film 269 by etching. At this time, the openings 269a, 270a formed in the silicon nitride film 269 and the interlayer insulating film 270 and the openings 271b, 272b, 273a formed in the SOG film 271, the interlayer insulating film 272 and the silicon nitride film 273 become integral, thereby completing the wiring trench 274.

Figure 59A:
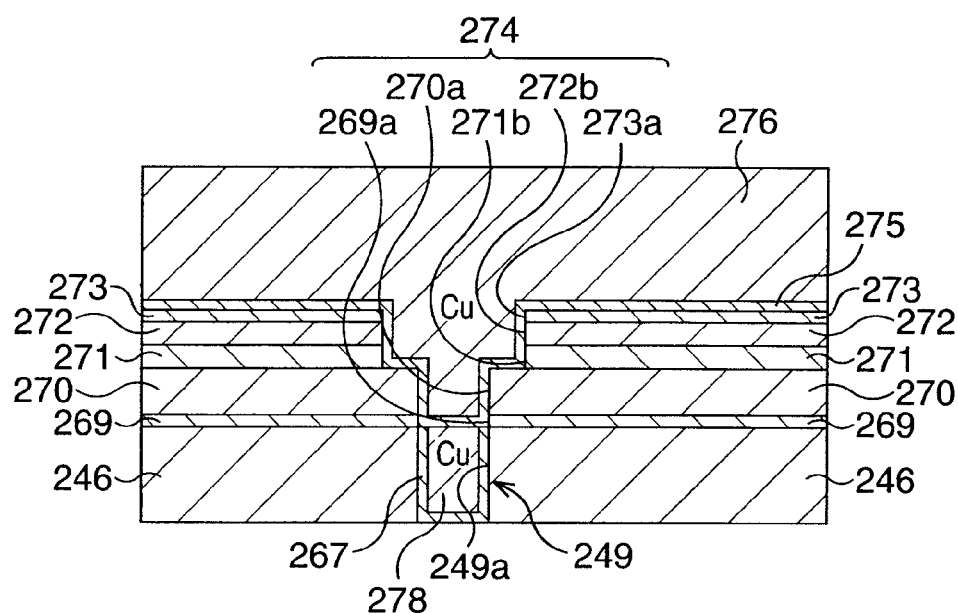
FIG. 59A and FIG. 59B are schematic cross-sectional views showing the structure of the FeRAM according to the modification example 7 of the second embodiment together with the manufacturing method thereof (main steps) in the order of steps, continuing from FIG. 58D.

Subsequently, as shown in FIG. 59A, a base film 275 constituted of a silicide film is formed and Cu plating is performed.

Particularly, as a conductor impervious to oxygen, a base film is formed with a silicide film. Specifically, a silicide film, for example a Ti silicide (TiSi) film is formed with a film thickness of approximately 10 nm to 20 nm on the silicon nitride film 274 so as to cover an inner wall surface of the wiring trench 274, thereby forming the base film (glue film) 275. As the silicide film, at least one type selected from Ti silicide, Co silicide, Mo silicide, Nb silicide, Ta silicide, W silicide, and V silicide is used.

Here, when forming the silicide film, the silicide film is grown at a low temperature of 350° C. or lower by a sputtering method or a CVD method. A low temperature of this degree does not deteriorate the ferroelectric film 225 of the ferroelectric capacitor structure 230. When the present invention is applied to a semiconductor memory having a general capacitor structure which is not the ferroelectric capacitor structure, it is not necessary to form the silicide film particularly at a low temperature, so that the silicide film may be formed by annealing at approximately 700° C. for example.

Then, after a seed film (not-shown, having a film thickness of approximately 130 nm) of Cu is formed, a Cu film 276 is deposited on the glue film 275 by a plating method so as to fill up the wiring trench 274 via the glue film 275.

Figure 59B:
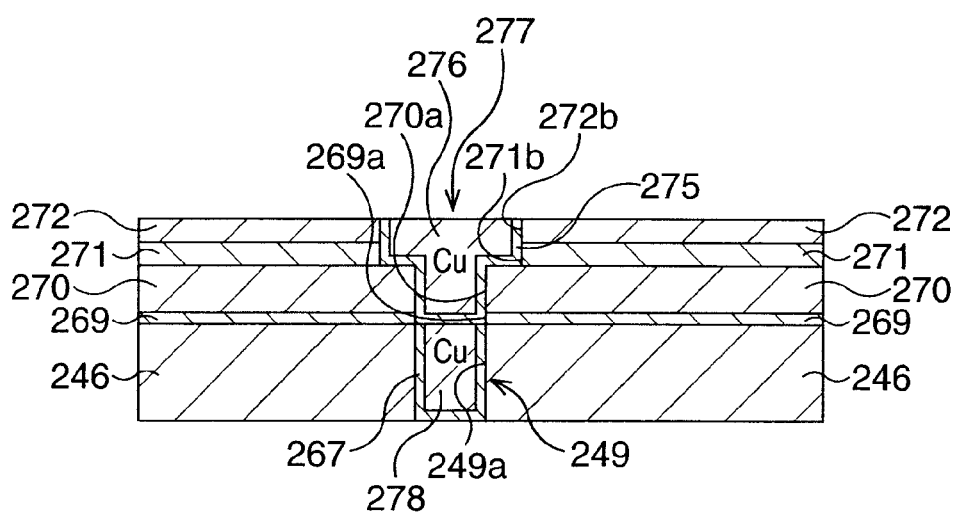

Subsequently, as shown in FIG. 59B, a wiring structure 277 is formed.

Particularly, with the interlayer insulating film 272 being a stopper, the Cu film 276, the glue film 275 and the silicon nitride film 273 are polished by CMP, and the wiring trench 274 is filled up with Cu (or an alloy thereof) via the glue film 275, thereby forming the wiring structure 277 electrically connected to the first wire 245 via the plug 249. Here, in the wiring structure 277, a part where spaces of the openings 269a, 270a are filled up with Cu via the glue film 275 corresponds to a conductive plug part and a part where spaces of the openings 271b, 272b are filled up with Cu via the glue film 275 corresponds to a wire part, and thus the conductive plug part and the wire part are formed integrally.

Thereafter, steps of forming an interlayer insulating film and a further upper layer wire by a damascene method, and so on are performed, thereby completing the stack type FeRAM according to this example. Here, when the further upper layer wire is formed, the silicide film as described above is applied to a glue film thereof, similarly to the wiring structure 277.

In this example, the Cu filling up the via hole 249a is covered from a bottom face to a side face by the glue film 267 which is the silicide film impervious to oxygen, and the Cu filling up the wiring trench 274 is covered from a bottom face to a side face by the glue film 275 which is the silicide film. These Cu are in a state of being isolated from the ferroelectric capacitor structure 230 existing at a lower layer thereof by the glue films 267, 275. Accordingly, entrance into the plug 249 and the wiring structure 277 of oxygen activated due to the $IrO_2$ film 226a constituting the upper electrode 232, oxygen activated due to the Pt film 226b, and the like is inhibited as much as possible, thereby preventing oxidation of the plug 249 and the wiring structure 277.

Note that in this example, the case of applying the silicide film to the glue film of the plug 235 connected to the ferroelectric capacitor structure 230, and also applying the silicide film to the glue films of the plug 249 connected to the first wire 245 and the wiring structure 277 is exemplified, but when attaching much weight to the achievement of preventing oxidation of the plug 247 and the wiring structure 277 in particular, the silicide film may be applied only to the glue films of the plug 247 and the wiring structure 277.

As described above, according to this example, oxidation of the plug 235 connected to the ferroelectric capacitor structure 230 as well as the plug 249 connected to the first wire 245 and the wiring structure 277 is inhibited, so that a highly reliable stack type FeRAM with stabilized contact resistance can be realized.

Modification Example 8

In this example, in the structure of the modification example 7, the glue films are formed as a layered structure of a silicide film and a conductive protection film which inhibits permeation of hydrogen.

FIG. 60A to FIG. 62B are schematic cross-sectional views showing a structure of an FeRAM according to modification example 8 of the second embodiment together with a manufacturing method thereof (main steps) in the order of steps.

First, similarly to the second embodiment, the respective steps of FIG. 38A to FIG. 42A are performed.

Figure 60A:
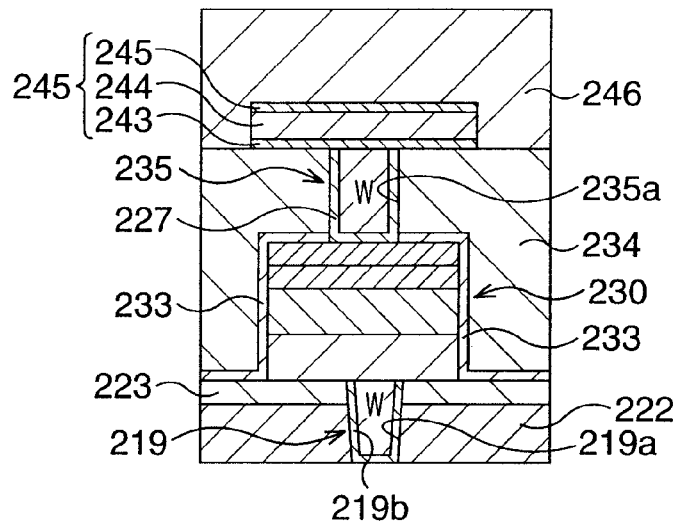
FIG. 60A to FIG. 60E are schematic cross-sectional views showing a structure of an FeRAM according to modification example 8 of the second embodiment together with a manufacturing method thereof (main steps) in the order of steps.

Subsequently, as shown in FIG. 60A, an interlayer insulating film 246 is formed so as to cover the first wire 245.

Particularly, a silicon oxide film is formed with a film thickness of approximately 700 nm so as to cover the first wire 245, and a plasma TEOS film is formed thereon so that a total film thickness thereof is approximately 1100 nm. Thereafter, the surface thereof is polished by CMP to make the film thickness approximately 750 nm, thereby forming the interlayer insulating film 246. After the CMP, plasma annealing of $N_2O$ for example is performed.

Figure 60B:
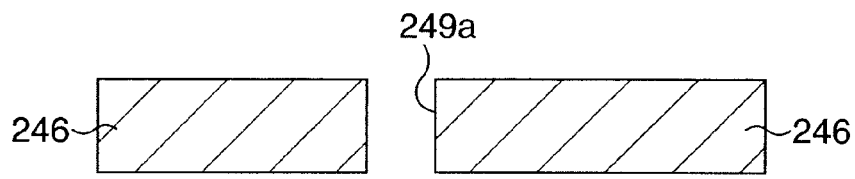

Subsequently, as shown in FIG. 60B, a via hole 49a which exposes a surface of the first wire 245 is formed. Note that in FIG. 60B and respective subsequent drawings, for convenience of illustration, only the structure of the interlayer insulating film 246 and above is shown, and the ferroelectric capacitor structure 230, the first wire 245, and so on are omitted therefrom.

Particularly, until part of a surface of the first wire 245 exposes, the interlayer insulating film 246 is processed by lithography and subsequent dry etching, thereby forming a via hole 249a with a diameter of approximately 0.25 μm for example.

Figure 60C:
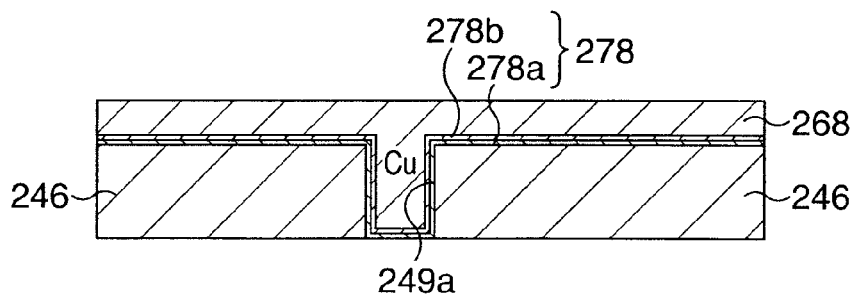

Subsequently, as shown in FIG. 60C, a base film 278 which is the layered structure of a silicide film and a conductive protection film which inhibits permeation of hydrogen is formed and Cu plating is performed.

Particularly, the silicide film which is a conductor impervious to oxygen and the conductive protection film which prevents entrance of hydrogen are layered to form the base film. Specifically, a silicide film 278a, for example a Ti silicide (TiSi) film (with a film thickness of approximately 20 nm) and a conductive protection film which inhibits permeation of hydrogen, for example a TiAlN film 278b (with a film thickness of approximately 50 nm) are deposited sequentially on the interlayer insulating film 246 so as to cover an inner wall surface of the via hole 249a, thereby forming the base film (glue film) 278 of layered structure. As the silicide film 278a, at least one type selected from Ti silicide, Co silicide, Mo silicide, Nb silicide, Ta silicide, W silicide, and V silicide is used. Further, as the conductive protection film which inhibits permeation of hydrogen, at least one type selected from TiN, TiSiN, TaN, CrN, HfN, ZrN, TiAlN, TaAlN, CrAlN, and HfAlN is used.

Here, when forming the silicide film 278a, the silicide film is grown at a low temperature of 350° C. or lower by a sputtering method or a CVD method. A low temperature of this degree does not deteriorate the ferroelectric film 225 of the ferroelectric capacitor structure 230. When the present invention is applied to a semiconductor memory having a general capacitor structure which is not the ferroelectric capacitor structure, it is not necessary to form the silicide film particularly at a low temperature, so that the silicide film may be formed by annealing at approximately 700° C. for example.

Then, after a seed film (not-shown) of Cu is formed, a Cu (or an alloy thereof) film 268 is deposited on the glue film 278 by a plating method so as to fill up the via hole 249a via the glue film 278.

Figure 60D:
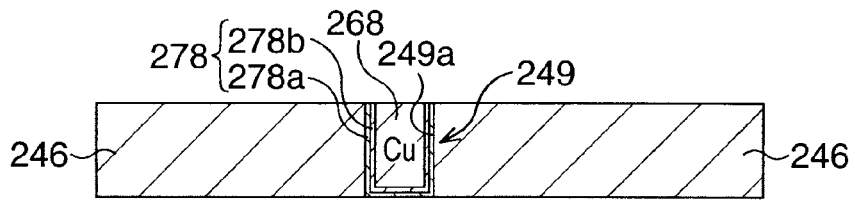

Subsequently, as shown in FIG. 60D, the plug 249 is formed.

Particularly, with the interlayer insulating film 246 being a stopper, the Cu film 268 and the glue film 278 are polished by CMP, thereby forming the plug 249 in which the via hole 249a is filled up with Cu via the glue film 278.

Figure 60E:
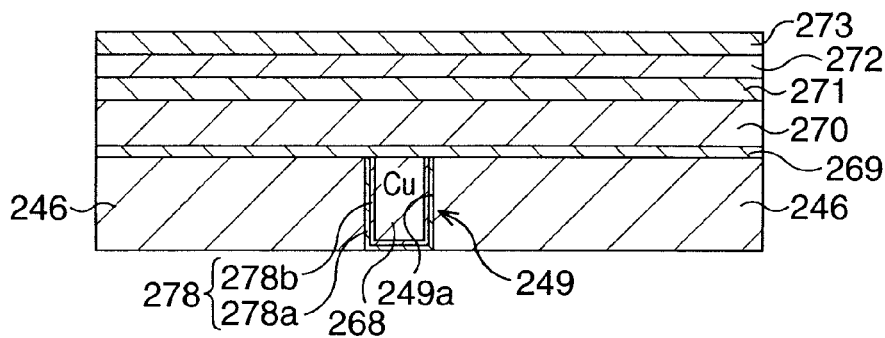

Subsequently, as shown in FIG. 60E, a silicon nitride film 269, an interlayer insulating film 270, an SOG film 271, an interlayer insulating film 272 and a silicon nitride film 273 are layered sequentially on the interlayer insulating film 246 so as to cover the plug 249.

Particularly, the silicon nitride film 269 is formed with a film thickness of approximately 50 nm to 100 nm by a CVD method for example. The interlayer insulating film 270 is formed with a film thickness of approximately 200 nm to 400 nm by a CVD method for example. The SOG film 271 is formed with a film thickness of approximately 100 nm to 200 nm by spin coating SOG. The interlayer insulating film 272 is formed with a film thickness of approximately 100 nm by a CVD method for example. The silicon nitride film 273 is formed with a film thickness of approximately 100 nm by a CVD method for example.

Figure 61A:
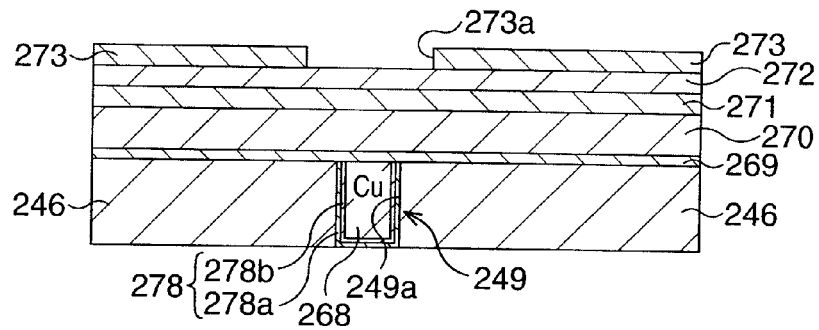
FIG. 61A to FIG. 61D are schematic cross-sectional views showing the structure of the FeRAM according to the modification example 8 of the second embodiment together with the manufacturing method thereof (main steps) in the order of steps, continuing from FIG. 60E.

Subsequently, as shown in FIG. 61A, the silicon nitride film 273 is processed.

Particularly, the silicon nitride film 273 is patterned by lithography and dry etching, thereby forming an opening 273a in a wiring form in the silicon nitride film 273.

Figure 61B:
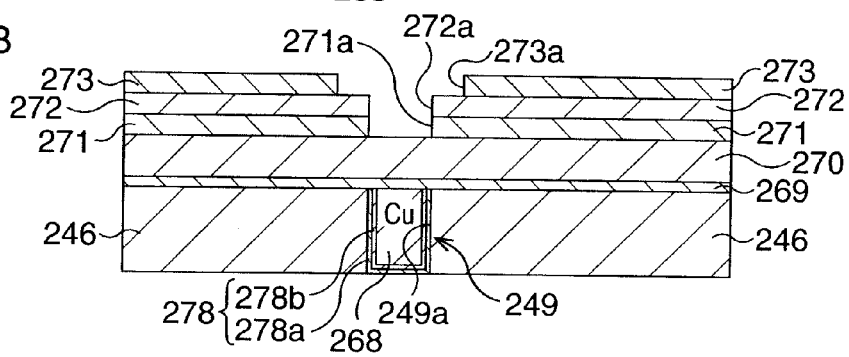

Subsequently, as shown in FIG. 61B, the interlayer insulating film 272 and the SOG film 271 are processed.

Particularly, the interlayer insulating film 272 and the SOG film 271 are patterned by lithography and dry etching, thereby forming openings 272a, 271a in a hole form at positions on the interlayer insulating film 272 and the SOG film 271 located above the plug 249 and matching with the opening 273a.

Figure 61C:
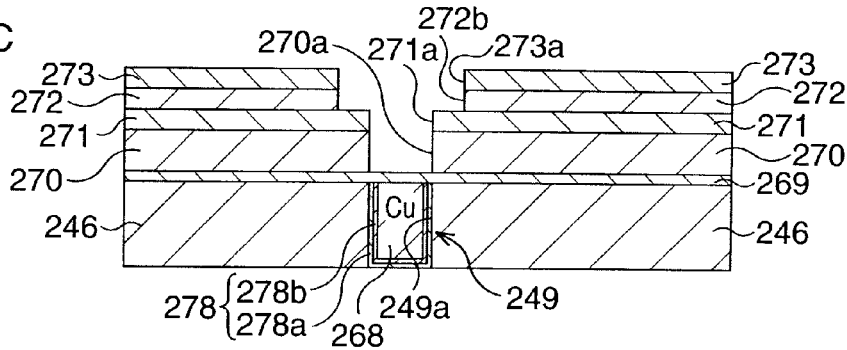

Subsequently, as shown in FIG. 61C, the interlayer insulating film 272 and the interlayer insulating film 270 are processed.

Particularly, using the silicon nitride film 273 as a hard mask, the interlayer insulating film 272 is patterned in a wiring form corresponding to the opening 273a by lithography and dry etching, thereby forming an opening 272b extending the opening 272a. At this time, simultaneously, the interlayer insulating film 272 and the SOG film 271 function as a mask, and the interlayer insulating film 270 is patterned in a hole form corresponding to the opening 271a, thereby forming an opening 270a.

Figure 61D:
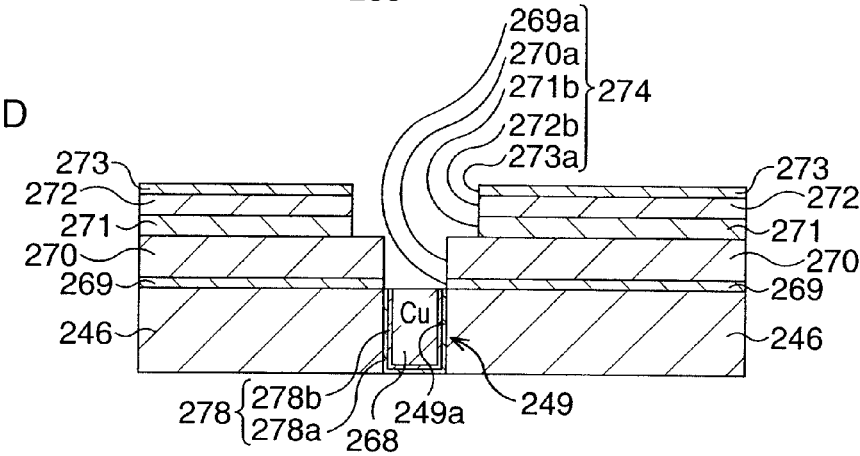

Subsequently, as shown in FIG. 61D, a wiring trench 274 is completed.

Particularly, using the silicon nitride film 273 as a hard mask, the silicon nitride film 269 is patterned by lithography and dry etching until a surface of the plug 247 exposes. At this time, an opening 271b in a wiring form extending the opening 271a corresponding to the openings 273a, 272b, is formed in the SOG film 271, and an opening 269a in a hole form corresponding to the opening 270a is formed in the silicon nitride film 269. Here, also the silicon nitride film 273 becomes thin by the film thickness of the silicon nitride film 269 by etching. At this time, the openings 269a, 270a formed in the silicon nitride film 269 and the interlayer insulating film 270 and the openings 271b, 272b, 273a formed in the SOG film 271, the interlayer insulating film 272 and the silicon nitride film 273 become integral, thereby completing the wiring trench 274.

Figure 62A:
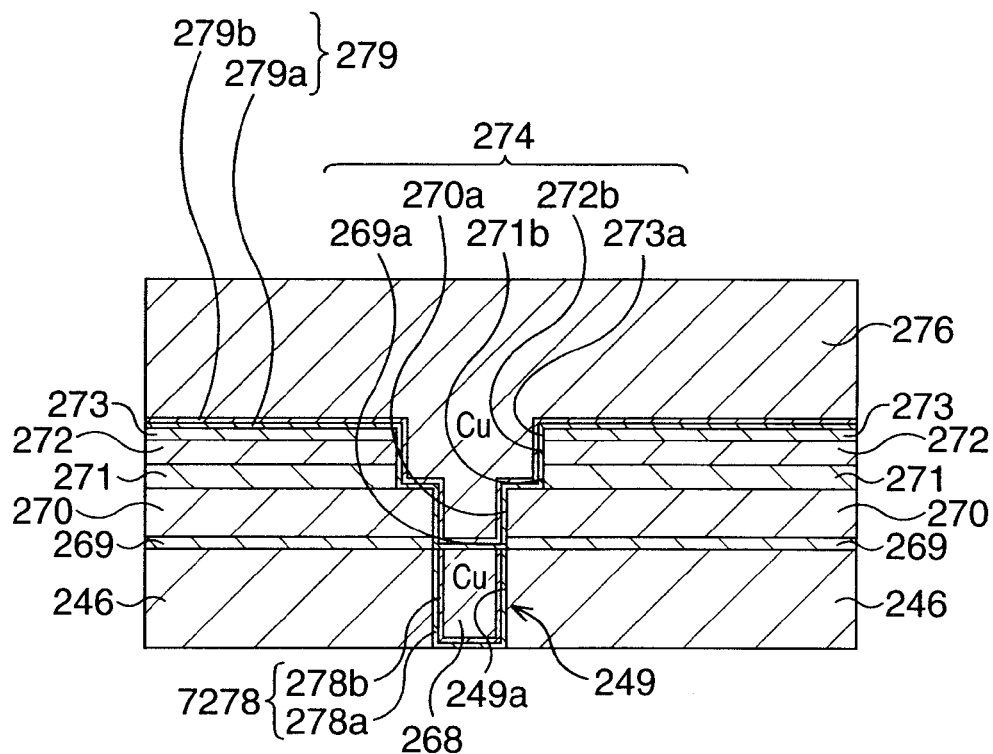
FIG. 62A and FIG. 62B are schematic cross-sectional views showing the structure of the FeRAM according to the modification example 8 of the second embodiment together with the manufacturing method thereof (main steps) in the order of steps, continuing from FIG. 61D.

Subsequently, as shown in FIG. 62A, a base film 279 is formed and Cu plating is performed.

Particularly, a silicide film which is a conductor impervious to oxygen and a conductive protection film which prevents entrance of hydrogen are layered to form the base film. Specifically, a silicide film 279a, for example a Ti silicide (TiSi) film (with a film thickness of approximately 20 nm) and a conductive protection film which inhibits permeation of hydrogen, for example a TiAlN film 279b (with a film thickness of approximately 50 nm) are deposited sequentially on the silicon nitride film 273 so as to cover an inner wall surface of the wiring trench 274, thereby forming the base film (glue film) 279 of layered structure. As the silicide film 279a, at least one type selected from Ti silicide, Co silicide, Mo silicide, Nb silicide, Ta silicide, W silicide, and V silicide is used. Further, as the conductive protection film which inhibits permeation of hydrogen, at least one type selected from TiN, TiSiN, TaN, CrN, HfN, ZrN, TiAlN, TaAlN, CrAlN, and HfAlN is used.

Here, when forming the silicide film 279a, the silicide film is grown at a low temperature of 350° C. or lower by a sputtering method or a CVD method. A low temperature of this degree does not deteriorate the ferroelectric film 225 of the ferroelectric capacitor structure 230. When the present invention is applied to a semiconductor memory having a general capacitor structure which is not the ferroelectric capacitor structure, it is not necessary to form the silicide film particularly at a low temperature, so that the silicide film may be formed by annealing at approximately 700° C. for example.

Then, after a seed film (not-shown, having a film thickness of approximately 130 nm) of Cu is formed, a Cu film 276 is deposited on the glue film 279 by a plating method so as to fill up the wiring trench 274 via the glue film 279.

Figure 62B:
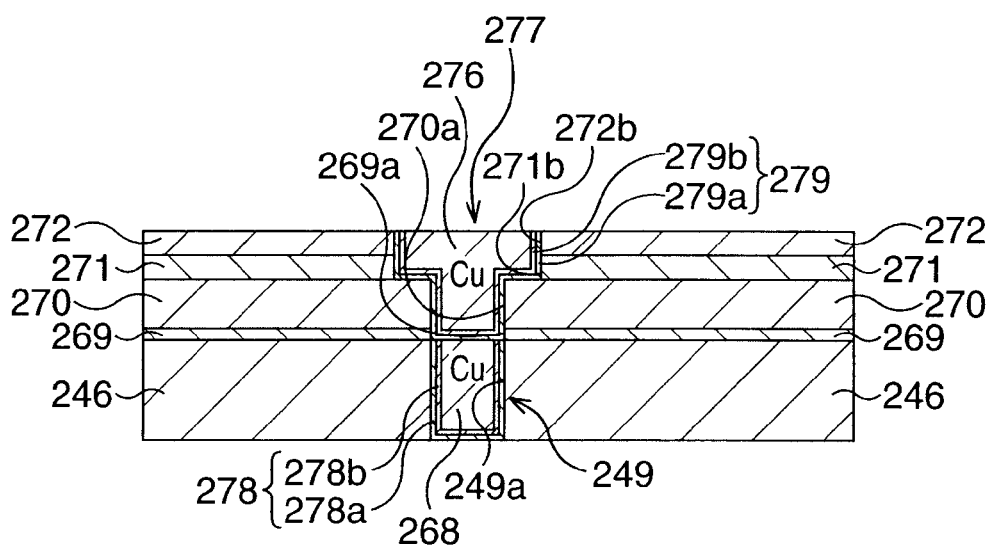

Subsequently, as shown in FIG. 62B, a wiring structure 277 is formed.

Particularly, with the interlayer insulating film 272 being a stopper, the Cu film 276, the glue film 279 and the silicon nitride film 273 are polished by CMP, and the wiring trench 274 is filled up with Cu (or an alloy thereof) via the glue film 279, thereby forming the wiring structure 277 electrically connected to the first wire 245 via the plug 249. Here, in the wiring structure 277, a part where spaces of the openings 269a, 270a are filled up with Cu via the glue film 279 corresponds to a conductive plug part and a part where spaces of the openings 271b, 272b, 273a are filled up with Cu via the glue film 279 corresponds to a wire part, and thus the conductive plug part and the wire part are formed integrally.

Thereafter, steps of forming an interlayer insulating film and a further upper layer wire by a damascene method, and so on are performed, thereby completing the stack type FeRAM according to this example. Here, when the further upper layer wire is formed, the layered films of the silicide film and the conductive protection film which inhibits permeation of hydrogen as described above are applied to a glue film thereof, similarly to the wiring structure 277.

In this example, the Cu filling up the via hole 249a is covered from a bottom face to a side face by the glue film 278 formed as the layered structure of the silicide film impervious to oxygen and the conductive protection film having a function of inhibiting permeation of hydrogen, and the Cu filling up the wiring trench 274 is covered from a bottom face to a side face by the glue film 279 formed as the layered structure of the silicide film and the conductive protection film having a function of inhibiting permeation of hydrogen. These Cu are in a state of being isolated from the ferroelectric capacitor structure 230 existing at a lower layer thereof by the glue films 278, 279. Accordingly, entrance into the plug 249 and the wiring structure 277 of oxygen activated due to the IrO$_2$ film 226a constituting the upper electrode 232, oxygen activated due to the Pt film 226b, and the like is inhibited as much as possible, thereby preventing oxidation of the plug 249 and the wiring structure 277 and also preventing entrance of hydrogen into the plug 249 and the wiring structure 277.

Note that in this example, the case of applying the silicide film to the glue film of the plug 235 connected to the ferroelectric capacitor structure 230, and also applying the layered films of the silicide film and the conductive protection film which inhibits permeation of hydrogen to the glue films of the plug 249 connected to the first wire 245 and the wiring structure 277 is exemplified, but when attaching much weight to the achievement of preventing oxidation of the plug 247 and the wiring structure 277 in particular, the silicide film may be applied only to the glue films of the plug 247 and the wiring structure 277.

Figure 63:
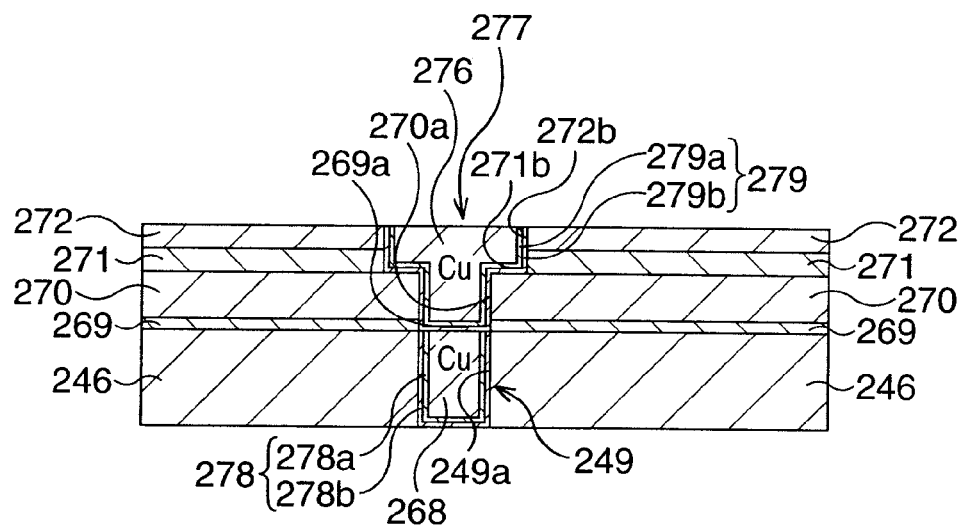
FIG. 63 is a schematic cross-sectional view showing a structure of an FeRAM according to another example of the modification example 8 of the second embodiment.

Further, in this example, the glue film 278 is formed as the layered structure of the silicide film 278a and the TiAlN film 278b and the glue film 279 is formed as the layered structure of the silicide film 279a and the TiAlN film 279b, but as shown in FIG. 63 (corresponding to FIG. 62B), the layered state of respective films may be inverted, thereby forming the glue film 278 as a layered structure of the TiAlN film 278b and the Ti silicide film 278a and the glue film 279 as a layered structure of the TiAlN film 279b and the Ti silicide film 279a.

Figure 64:
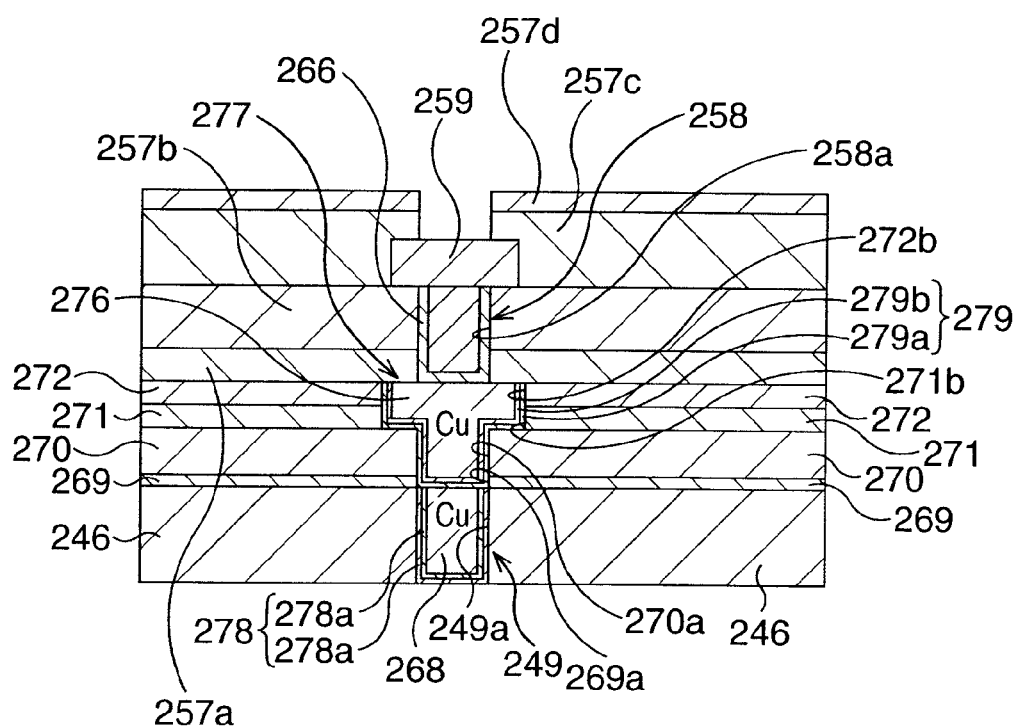
FIG. 64 is a schematic cross-sectional view showing a structure of an FeRAM according to another example of the modification example 8 of the second embodiment.

Further, as shown in FIG. 64, after forming the wiring structure 277 in which the wiring trench 274 is filled up with Cu via the glue film 279 as in this example, the modification example 6 may be applied. Specifically, W is filled via a glue film 266 in a via hole 258a formed in interlayer insulating films 257a, 257b, thereby forming a plug 258. In this plug 258, the W filling up the via hole 258a formed in the interlayer insulating films 257a, 257b is covered from a bottom face to a side face by the glue film 266 which is a silicide film impervious to oxygen. On the plug 258, a pad electrode 259 constituted of an Al alloy film (here an Al—Cu film) for example is formed, and interlayer insulating films 257c, 257d are formed so as to cover the pad electrode 259. In the interlayer insulating films 257c, 257d, an opening which exposes part of a surface of the pad electrode 259 is formed. As the interlayer insulating films 257a to 257c, a silicon oxide film such as NSG is used, and as the interlayer insulating film 257d, a silicon nitride film or the like, which is more rigid than the silicon oxide film, is used.

As described above, according to this example, oxidation of the plug 235 connected to the upper electrode 232 of the ferroelectric capacitor structure 230 as well as the plug 249 connected to the first wire 245 and the wiring structure 277 is inhibited, and moreover, entrance of hydrogen into at least the plug 249 connected to the first wire 245 and the wiring structure 277 is inhibited, so that a highly reliable stack type FeRAM with stabilized contact resistance can be realized.

Modification Example 9

In this example, similarly to the second embodiment, a structure of a stack type FeRAM and a manufacturing method thereof will be disclosed, but this example is different in that the conductor impervious to oxygen provided between the ferroelectric capacitor structure 230 and the conductive plug 235 is different.

Figure 65A:
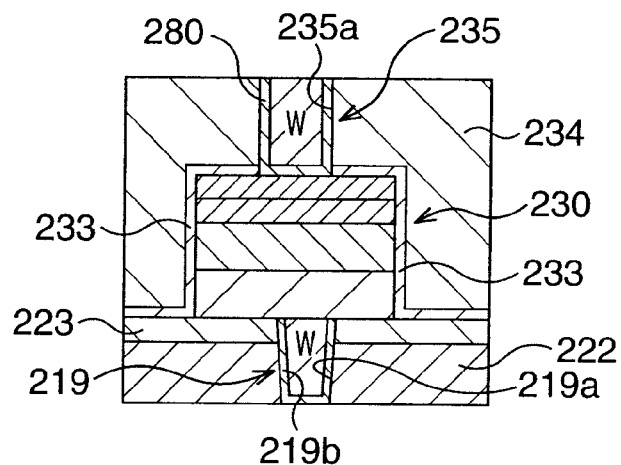
FIG. 65A and FIG. 65B are schematic cross-sectional views showing a structure of an FeRAM according to modification example 9 of the second embodiment together with a manufacturing method thereof (main steps) in the order of steps.
Figure 65B:
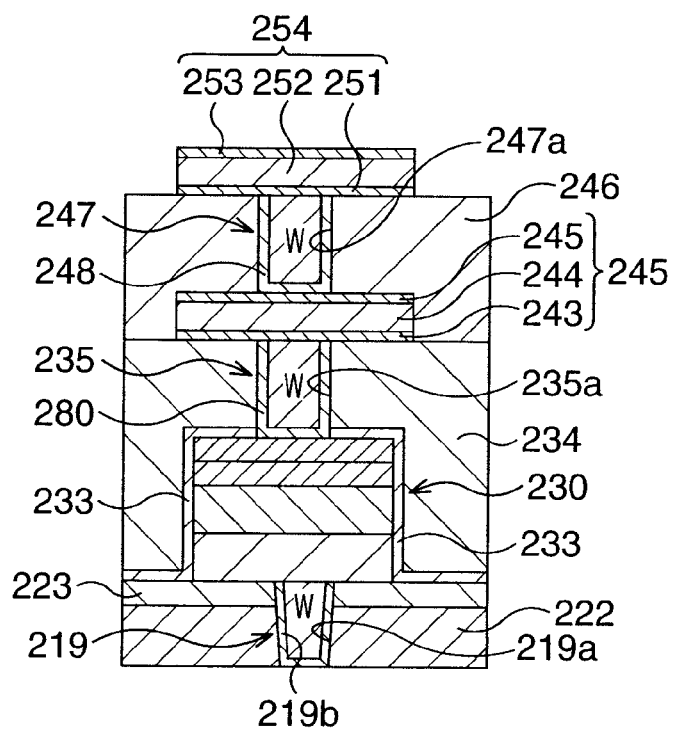

FIG. 65A and FIG. 65B are schematic cross-sectional views showing a structure of an FeRAM according to modification example 9 of the second embodiment together with a manufacturing method thereof (main steps) in the order of steps.

First, similarly to the second embodiment, the respective steps of FIG. 38A to FIG. 41A are performed.

Subsequently, as shown in FIG. 65A, a plug 235 connected to the upper electrode 232 of the ferroelectric capacitor structure 230 is formed.

In this example, in order to inhibit oxidation of the plug 235 due to oxygen generated from the upper electrode 232 (particularly, oxygen activated by the Pt film 226b), the base film of the plug 235 is formed with a metal film which is a conductor impervious to oxygen (capable of absorbing oxygen) and has conductivity even when oxidized. Specifically, a metal having conductivity even when oxidized, for example an Ir film is deposited with a film thickness of approximately 50 nm so as to cover a wall surface of the via hole 235a, thereby forming a base film (glue film) 280. As the metal having conductivity even when oxidized, one containing at least one type selected from Ag, Ni, Cu, Zn, In, Sn, Ir, Ru, Rh, Pd, and Os is used. When two or more types are selected, they may be used in an alloy state.

Then, a W film for example is formed by a CVD method so as to fill up the via hole 235a via the glue film 280. Thereafter, with the interlayer insulating film 234 being a stopper, the W film and the glue film 280 are polished by CMP, thereby forming the plug 235 in which the via hole 235a is filled up with W via the glue film 280. After the CMP, plasma annealing of $N_2O$ for example is performed.

In this example, the W filling up the via hole 235a is covered from a bottom face to a side face by the glue film 280 constituted of the Ir film which is a metal having conductivity even when oxidized, and the W and the upper electrode 232 are separated by the glue film 280. The glue film 280 absorbs oxygen, so to speak due to oxidation of itself, but it does not impair the electrical connection function of the plug 235 because it maintains conductivity even when oxidized. By this glue film 280, entrance into the plug 235 of oxygen activated due to the $IrO_2$ film 226a constituting the upper electrode 232, oxygen activated due to the Pt film 226b, and the like is inhibited, thereby preventing oxidation of the plug 235.

Then, the respective steps of FIG. 42A and FIG. 42B are performed to obtain the structure shown in FIG. 65B.

Thereafter, steps of forming an interlayer insulating film and a further upper layer wire, and so on are performed, thereby completing the stack type FeRAM according to this example.

As described above, according to this example, oxidation of the plug 235 connected to the ferroelectric capacitor structure 230 is inhibited, so that a highly reliable stack type FeRAM with stabilized contact resistance can be realized.

Modification Example 10

In this example, similarly to the second embodiment, a structure of a stack type FeRAM and a manufacturing method thereof will be disclosed, but this example is different in that a metal layer having conductivity even when oxidized is formed on the ferroelectric capacitor structure 230.

FIG. 66A to FIG. 69 are schematic cross-sectional views showing a structure of an FeRAM according to modification example 10 of the second embodiment together with a manufacturing method thereof (main steps) in the order of steps.

First, similarly to the second embodiment, the respective steps of FIG. 38A to FIG. 38D are performed.

Figure 66A:
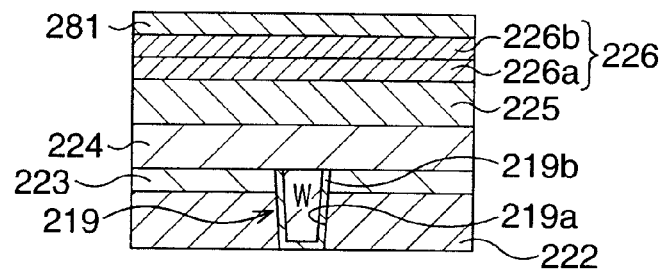
FIG. 66A to FIG. 66D are schematic cross-sectional views showing a structure of an FeRAM according to modification example 10 of the second embodiment together with a manufacturing method thereof (main steps) in the order of steps.

Subsequently, as shown in FIG. 66A, a conductive layer 281 constituted of a metal having conductivity even when oxidized is formed on the upper electrode layer 226.

Particularly, on the Pt film 226b, as a conductor impervious to oxygen, the conductive layer 281 constituted of a metal having conductivity even when oxidized, here Ir, is formed with a film thickness of approximately 200 nm. As the conductive layer 281, one containing at least one type selected from Ag, Ni, Cu, Zn, In, Sn, Ir, Ru, Rh, Pd, and Os is used. When two or more types are selected, they may be used in an alloy state.

Figure 66B:
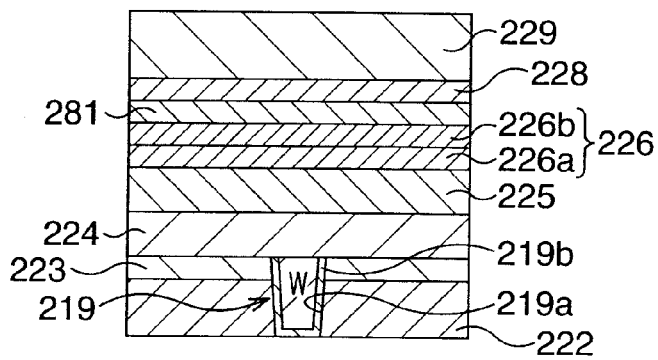

Subsequently, as shown in FIG. 66B, a TiN film 228 and a silicon oxide film 229 are formed.

Particularly, the TiN film 228 is formed by deposition with a film thickness of approximately 200 nm on the conductive layer 281 by a sputtering method or the like. The silicon oxide film 229 is formed by deposition with a film thickness of approximately 1000 nm on the TiN film 228 by a CVD method using TEOS for example. Here, instead of the TEOS film, an HDP film may be formed. Note that it is also preferable to further form a silicon nitride film on the silicon oxide film 229.

Figure 66C:
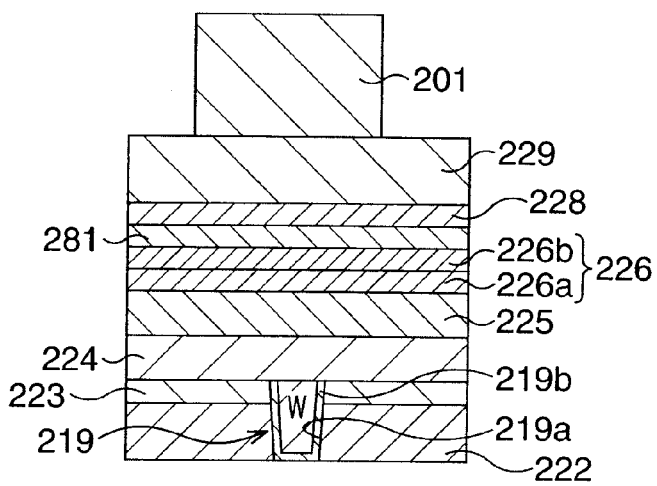

Subsequently, as shown in FIG. 66C, a resist mask 201 is formed.

Particularly, a resist is applied on the silicon oxide film 229, and this resist is processed in an electrode form by lithography, thereby forming the resist mask 201.

Figure 66D:
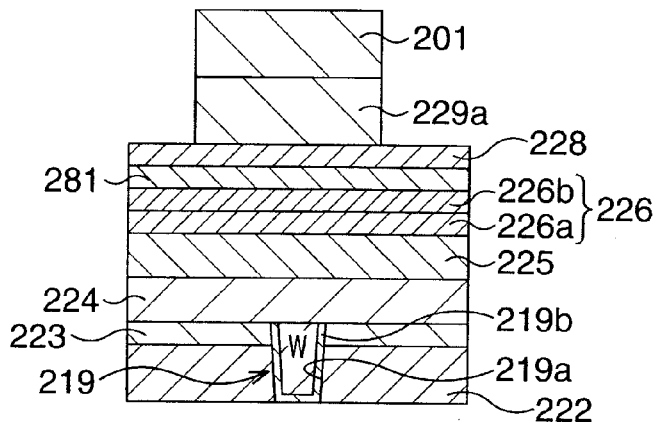

Subsequently, as shown in FIG. 66D, the silicon oxide film 229 is processed.

Particularly, with the resist mask 201 being a mask, the silicon oxide film 229 is dry-etched. At this time, the silicon oxide film 229 is patterned corresponding to the electrode form of the resist mask 201, thereby forming a hard mask 229a. Also, the resist mask 201 is etched and its thickness is reduced.

Figure 67A:
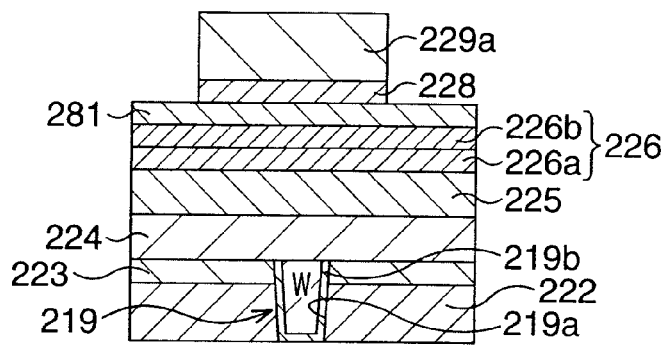
FIG. 67A to FIG. 67D are schematic cross-sectional views showing the structure of the FeRAM according to the modification example 10 of the second embodiment together with the manufacturing method thereof (main steps) in the order of steps, continuing from FIG. 66D.

Subsequently, as shown in FIG. 67A, the TiN film 228 is processed.

Particularly, with the resist mask 201 and the hard mask 229a being a mask, the TiN film 228 is dry etched. At this time, the TiN film 228 is patterned corresponding to the electrode form of the hard mask 229a. Also, the resist mask 201 itself is etched and becomes thin during the etching. Thereafter, the resist mask 201 is removed by ashing or the like. Note that here a silicide film 227 may also be patterned together with the TiN film 228 corresponding to the electrode form of the hard mask 229a.

Figure 67B:
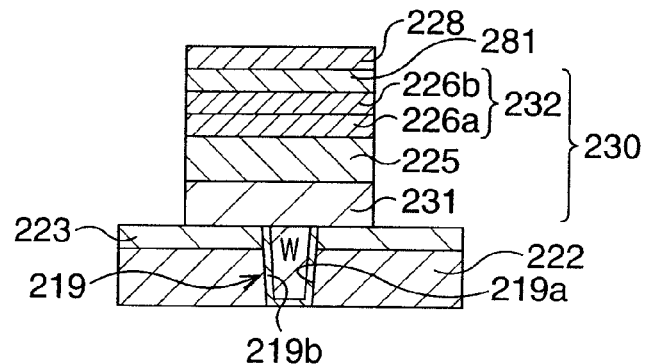

Subsequently, as shown in FIG. 67B, the conductive layer 281, the upper electrode layer 226, the ferroelectric film 225, and the lower electrode layer 224 are processed.

Particularly, with the hard mask 229a and the TiN film 228 being a mask and the upper insulating film 223 being an etching stopper, the conductive layer 281, the upper electrode layer 226, the ferroelectric film 225, and the lower electrode layer 224 are dry-etched. At this time, the conductive layer 281, the upper electrode layer 226, the ferroelectric film 225, and the lower electrode layer 224 are patterned corresponding to the electrode form of the TiN film 228. Also, the hard mask 229a itself is etched and becomes thin during the etching. Thereafter, the hard mask 229a is removed by dry etching (etching back) on its entire surface.

Figure 67C:
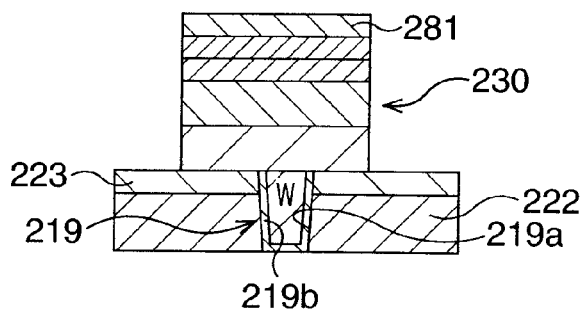

Subsequently, as shown in FIG. 67C, the ferroelectric capacitor structure 230 is completed.

Particularly, the TiN film 228 used as a mask is removed by wet etching. At this time, the ferroelectric capacitor structure 230 is completed, in which the ferroelectric film 225 and an upper electrode 232 are layered sequentially on a lower electrode 231, and the lower electrode 231 and the upper electrode 232 are capacitively coupled via the ferroelectric film 225. On an upper face of the ferroelectric capacitor structure 230, the conductive layer 281 patterned in the electrode form remains. In this ferroelectric capacitor structure 230, the lower electrode 231 is connected to the plug 219, and the source/drain 218 and the lower electrode 231 are electrically connected via the plug 219.

Figure 67D:
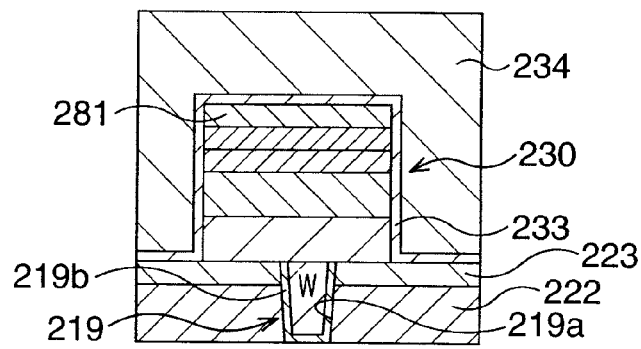

Subsequently, as shown in FIG. 67D, a protection film 233 and an interlayer insulating film 234 are formed.

Particularly, first, alumina ($Al_2O_3$) is used as a material and deposited by a sputtering method with a film thickness of approximately 20 nm to 50 nm so as to cover the entire face of the ferroelectric capacitor structure 230, thereby forming the protection film 233. Thereafter, the protection film 233 is annealed.

Next, the interlayer insulating film 234 is formed so as to cover the ferroelectric capacitor structure 230 via the protection film 233. Here, the interlayer insulating film 234 is formed such that a silicon oxide film is deposited with a film thickness of approximately 1500 nm to 2500 nm by a plasma CVD method using TEOS for example, and thereafter it is polished by CMP until the film thickness becomes approximately 1000 nm for example. After the CMP, for the purpose of dehydrating the interlayer insulating film 234, plasma annealing of $N_2O$ for example is performed.

Figure 68A:
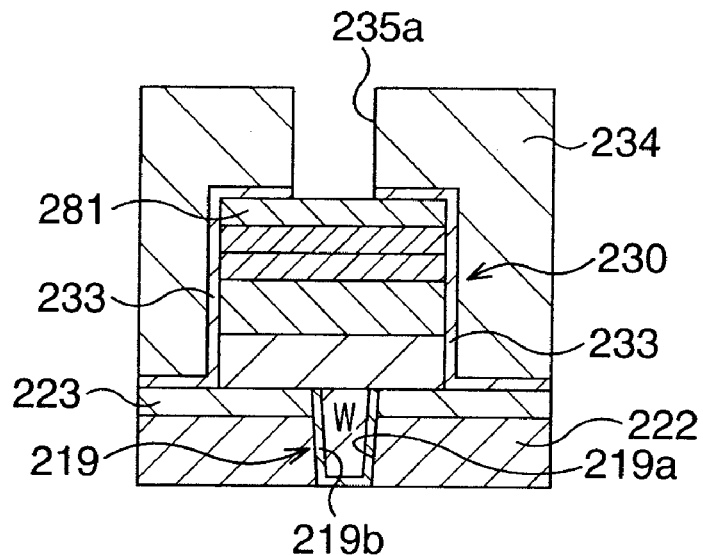
FIG. 68A and FIG. 68B are schematic cross-sectional views showing the structure of the FeRAM according to the modification example 10 of the second embodiment together with the manufacturing method thereof (main steps) in the order of steps, continuing from FIG. 67D.

Subsequently, as shown in FIG. 68A, a via hole 235a to the upper electrode 232 of the ferroelectric capacitor structure 230 is formed.

Particularly, the interlayer insulating film 234 and the protection film 233 are patterned by lithography and subsequent dry etching, thereby forming the via hole 235a which exposes part of a surface of the conductive layer 281.

Figure 68B:
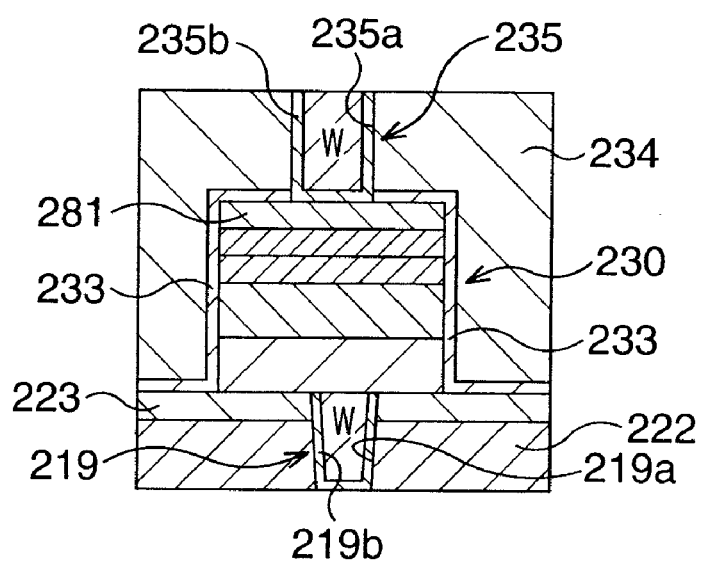

Subsequently, as shown in FIG. 68B, a plug 235 connected to the upper electrode 232 of the ferroelectric capacitor structure 230 is formed.

Particularly, first, a TiN film for example is deposited sequentially by a sputtering method with a film thickness of approximately 50 nm so as to cover a wall surface of the via hole 235a, thereby forming a base film (glue film) 235b. Then, a W film for example is formed by a CVD method so as to fill up the via hole 235a via the glue film 235b. The TiN film constituting the glue film 235b has a function of inhibiting permeation of hydrogen, and thus entrance of hydrogen into the plug 235 is inhibited. Here, for the glue film 235b which has a function of inhibiting permeation of hydrogen, at least one type selected from TiN, TiSiN, TaN, CrN, HfN, ZrN, TiAlN, TaAlN, CrAlN, and HfAlN is used.

Thereafter, with the interlayer insulating film 234 being a stopper, the W film and the glue film 235b are polished by CMP, thereby forming the plug 235 in which the via hole 235a is filled up with W via the glue film 235b. After the CMP, plasma annealing of $N_2O$ for example is performed.

In this example, the W filling up the via hole 235a and the upper electrode 232 are separated by the conductive layer 281. The conductive layer 281 absorbs oxygen, so to speak due to oxidation of itself, but it does not impair the electrical connection function of the plug 235 because it maintains conductivity even when oxidized. By this conductive layer 281, entrance into the plug 235 of oxygen activated due to the $IrO_2$ film 226a constituting the upper electrode 232, oxygen activated due to the Pt film 226b, and the like is inhibited, thereby preventing oxidation of the plug 235.

Figure 69:
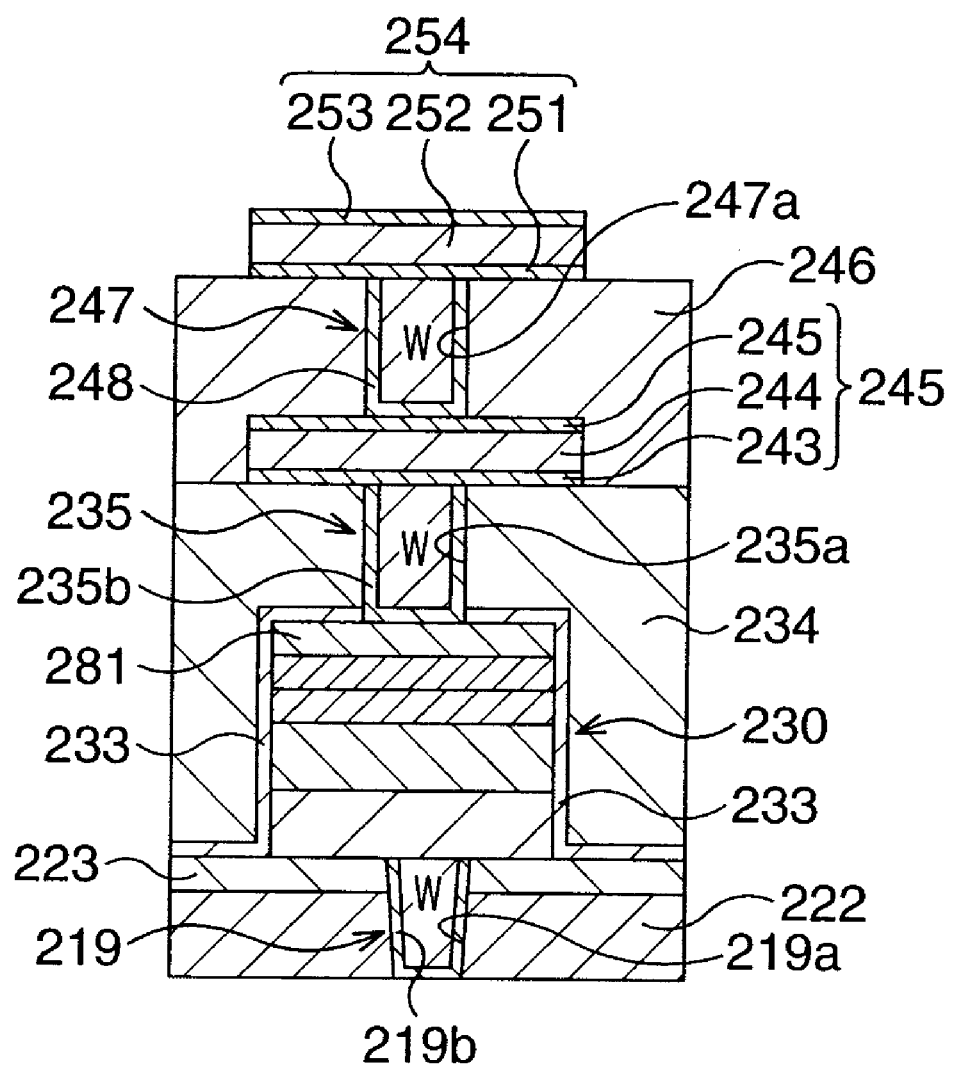
FIG. 69 is a schematic cross-sectional view showing the structure of the FeRAM according to the modification example 10 of the second embodiment together with the manufacturing method thereof (main steps) in the order of steps, continuing from FIG. 68B.

Then, similarly to the second embodiment, the respective steps of FIG. 42A and FIG. 42B are performed to obtain the structure shown in FIG. 69.

Thereafter, steps of forming an interlayer insulating film and a further upper layer wire, and so on are performed, thereby completing the stack type FeRAM according to this example.

As described above, according to this example, oxidation of the plug 235 connected to the ferroelectric capacitor structure 230 is inhibited, so that a highly reliable stack type FeRAM with stabilized contact resistance can be realized.

Modification Example 11

In this example, similarly to the second embodiment, a structure of a stack type FeRAM and a manufacturing method thereof will be disclosed, but this example is different in that a metal layer having conductivity even when oxidized is formed on the ferroelectric capacitor structure 230.

FIG. 70A to FIG. 73B are schematic cross-sectional views showing a structure of an FeRAM according to modification example 11 of the second embodiment together with a manufacturing method thereof (main steps) in the order of steps.

First, similarly to the second embodiment, the respective steps of FIG. 38A to FIG. 38C are performed.

Figure 70A:
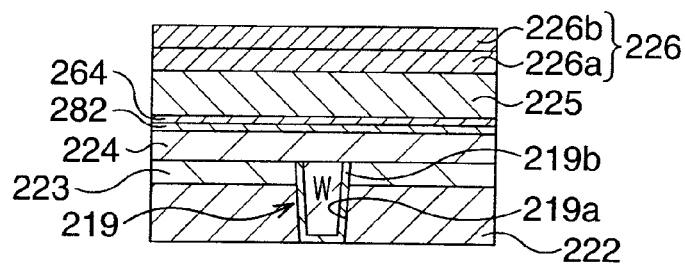
FIG. 70A to FIG. 70D are schematic cross-sectional views showing a structure of an FeRAM according to modification example 11 of the second embodiment together with a manufacturing method thereof (main steps) in the order of steps.

Subsequently, as shown in FIG. 70A, a lower electrode layer 224, a conductive layer 282 constituted of a metal having conductivity even when oxidized, a Ti film 264, a ferroelectric film 225, and an upper electrode layer 226 are formed sequentially.

Particularly, first, a Pt film is deposited with a film thickness of approximately 150 nm to 200 nm for example by a sputtering method, thereby forming the lower electrode layer 224.

Next, on the lower electrode layer 224, as a conductor impervious to oxygen, the conductive layer 282 constituted of a metal having conductivity even when oxidized, here Ir, is formed with a film thickness of approximately 200 nm. As the conductive layer 282, one containing at least one type selected from Ag, Ni, Cu, Zn, In, Sn, Ir, Ru, Rh, Pd, and Os is used. When two or more types are selected, they may be used in an alloy state.

Next, a Ti film 264 is formed by deposition with a film thickness of approximately 20 nm on the conductive layer 282 by a sputtering method or the like. Note that this Ti film 264 need not be formed.

Next, on the Ti film 264, the ferroelectric film 225 constituted of PZT for example, which is a ferroelectric, is deposited with a film thickness of approximately 100 nm to 300 nm by an RF sputtering method. Then, the ferroelectric film 225 is annealed to crystallize the ferroelectric film 225. Conditions of this annealing are such that it is performed for 60 seconds to 120 seconds at 550° C. to 650° C. for example while supplying $Ar/O_2$ gases at flow rates of 1.98 liter/minute of Ar and 0.025 liter/minute of $O_2$.

Next, the upper electrode layer 226 is formed by deposition on the ferroelectric film 225.

As the upper electrode layer 226, first, an $IrO_2$ film 226a for example which is a conductive oxide is formed with a film thickness of approximately 200 nm by a reactive sputtering method. Thereafter, the $IrO_2$ film 226a is annealed. Conditions of this annealing are such that it is performed for 10 seconds to 60 seconds at 650° C. to 850° C. for example while supplying $Ar/O_2$ gases at flow rates of 2.0 liter/minute of Ar and 0.02 liter/minute of $O_2$. Then, on the $IrO_2$ film 226a, a noble metal film, here a Pt film 226b, which functions as a cap film for the $IrO_2$ film 226a is formed with a film thickness of approximately 100 nm by a sputtering method. The $IrO_2$ film 226a and the Pt film 226b constitute the upper electrode layer 226. Note that for the upper electrode layer 226, instead of the $IrO_2$ film 226a, a conductive oxide of Ir, Ru, $RuO_2$, $SrRuO_3$ or the like or a layered structure of them may be adopted. Further, it is also possible to omit formation of the Pt film 226b.

Figure 70B:
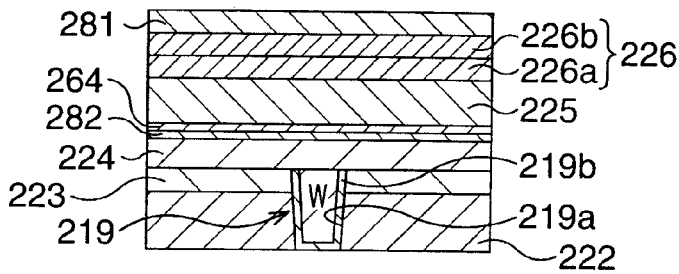

Subsequently, as shown in FIG. 70B, a conductive layer 281 constituted of a metal having conductivity even when oxidized is formed on the upper electrode layer 226.

Particularly, on the Pt film 226b of the upper electrode layer 226, as a conductor impervious to oxygen, the conductive layer 281 constituted of a metal having conductivity even when oxidized, here Ir, is formed with a film thickness of approximately 200 nm. As the conductive layer 281, one containing at least one type selected from Ag, Ni, Cu, Zn, In, Sn, Ir, Ru, Rh, Pd, and Os is used. When two or more types are selected, they may be used in an alloy state.

Figure 70C:
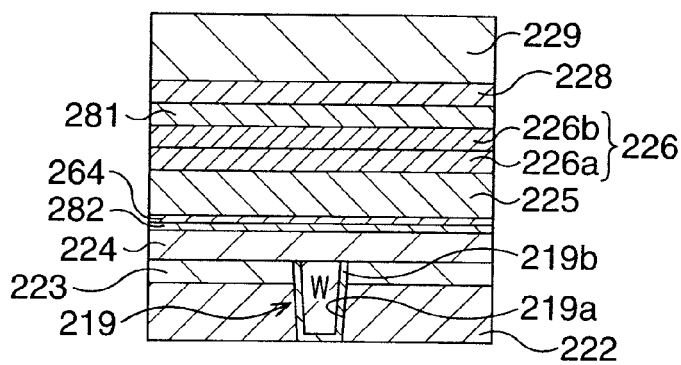

Subsequently, as shown in FIG. 70C, a TiN film 228 and a silicon oxide film 229 are formed.

Particularly, the TiN film 228 is formed by deposition with a film thickness of approximately 200 nm on the conductive layer 281 by a sputtering method or the like. The silicon oxide film 229 is formed by deposition with a film thickness of approximately 1000 nm on the TiN film 228 by a CVD method using TEOS for example. Here, instead of the TEOS film, an HDP film may be formed. Note that it is also preferable to further form a silicon nitride film on the silicon oxide film 229.

Figure 70D:
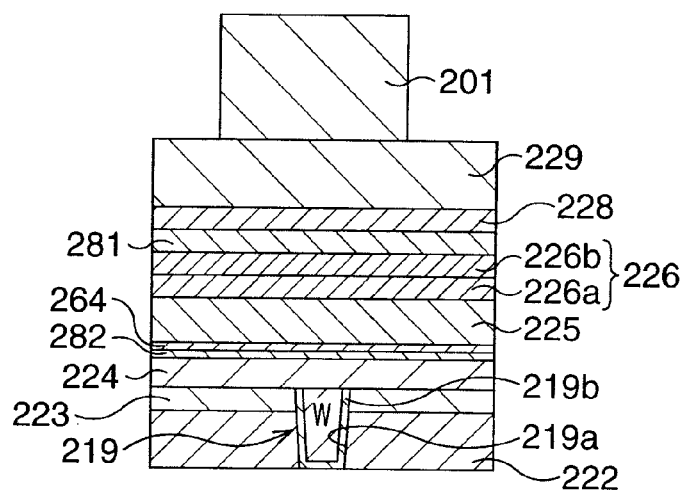

Subsequently, as shown in FIG. 70D, a resist mask 201 is formed.

Particularly, a resist is applied on the silicon oxide film 229, and this resist is processed in an electrode form by lithography, thereby forming the resist mask 201.

Figure 71A:
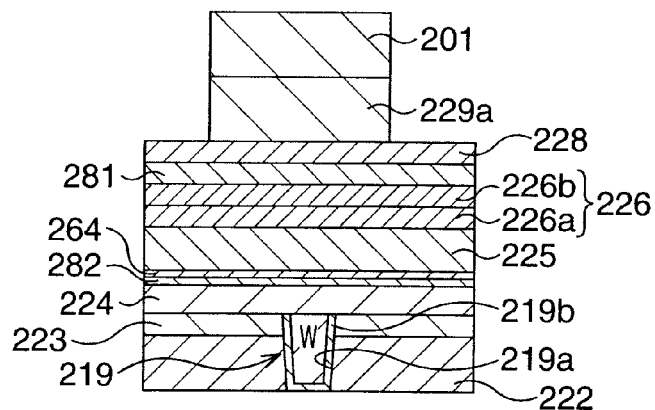
FIG. 71A to FIG. 71D are schematic cross-sectional views showing the structure of the FeRAM according to the modification example 11 of the second embodiment together with the manufacturing method thereof (main steps) in the order of steps, continuing from FIG. 70D.

Subsequently, as shown in FIG. 71A, the silicon oxide film 229 is processed.

Particularly, with the resist mask 201 being a mask, the silicon oxide film 229 is dry-etched. At this time, the silicon oxide film 229 is patterned corresponding to the electrode form of the resist mask 201, thereby forming a hard mask 229a. Also, the resist mask 201 is etched and its thickness is reduced.

Figure 71B:
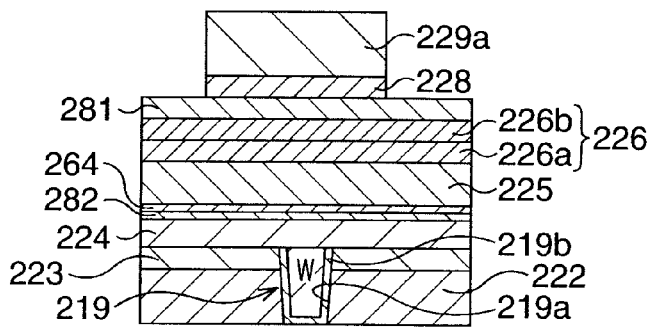

Subsequently, as shown in FIG. 71B, the TiN film 228 is processed.

Particularly, with the resist mask 201 and the hard mask 229a being a mask, the TiN film 228 is dry etched. At this time, the TiN film 228 is patterned corresponding to the electrode form of the hard mask 229a. Also, the resist mask 201 itself is etched and becomes thin during the etching. Thereafter, the resist mask 201 is removed by ashing or the like. Note that here a silicide film 227 may also be patterned together with the TiN film 228 corresponding to the electrode form of the hard mask 229a.

Figure 71C:
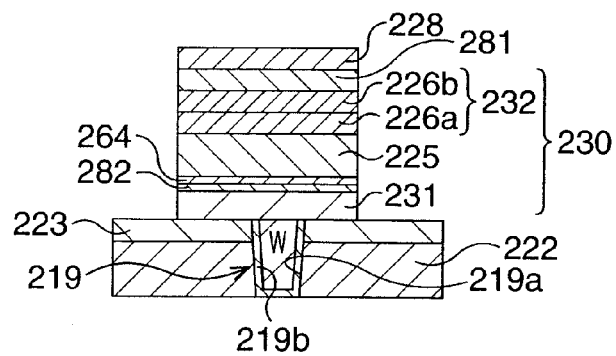

Next, as shown in FIG. 71C, the conductive layer 281, the upper electrode layer 226, the ferroelectric film 225, the Ti film 264, the conductive layer 282, and the lower electrode layer 224 are processed.

Particularly, with the hard mask 229a and the TiN film 228 being a mask and the upper insulating film 223 being an etching stopper, the conductive layer 281, the upper electrode layer 226, the ferroelectric film 225, the Ti film 264, the conductive layer 282, and the lower electrode layer 224 are dry-etched. At this time, the conductive layer 281, the upper electrode layer 226, the ferroelectric film 225, the Ti film 264, the conductive layer 282, and the lower electrode layer 224 are patterned corresponding to the electrode form of the TiN film 228. Also, the hard mask 229a itself is etched and becomes thin during the etching. Thereafter, the hard mask 229a is removed by dry etching (etching back) on its entire surface.

Figure 71D:
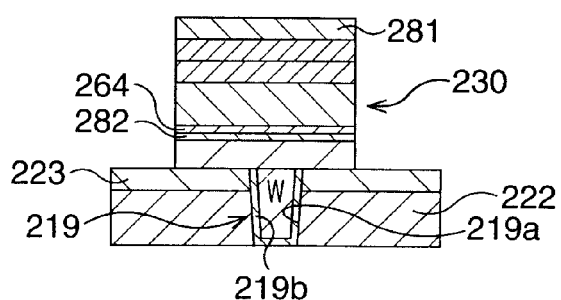

Subsequently, as shown in FIG. 71D, the ferroelectric capacitor structure 230 is completed.

Particularly, the TiN film 228 used as a mask is removed by wet etching. At this time, the ferroelectric capacitor structure 230 is completed, in which the ferroelectric film 225 and an upper electrode 232 are layered sequentially on a lower electrode 231 via the conductive layer 282 and the Ti film 264, and the lower electrode 231 and the upper electrode 232 are capacitively coupled via the ferroelectric film 225. On an upper face of the ferroelectric capacitor structure 230, the conductive layer 281 patterned in the electrode form remains. In this ferroelectric capacitor structure 230, the lower electrode 231 is connected to the plug 219, and the source/drain 218 and the lower electrode 231 are electrically connected via the plug 219.

Figure 72A:
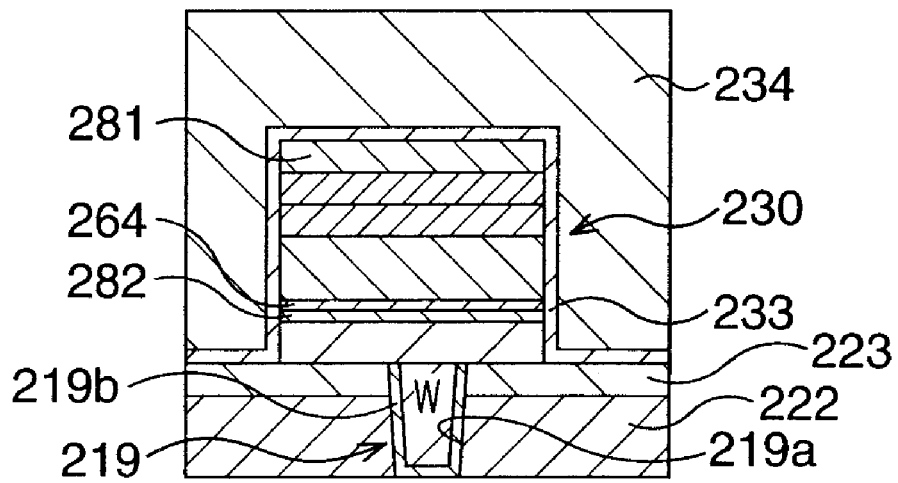
FIG. 72A and FIG. 72B are schematic cross-sectional views showing the structure of the FeRAM according to the modification example 11 of the second embodiment together with the manufacturing method thereof (main steps) in the order of steps, continuing from FIG. 71D.

Subsequently, as shown in FIG. 72A, a protection film 233 and an interlayer insulating film 234 are formed.

Particularly, first, alumina ($Al_2O_3$) is used as a material and deposited by a sputtering method with film thickness of approximately 20 nm to 50 nm so as to cover the entire face of the ferroelectric capacitor structure 230, thereby forming the protection film 233. Thereafter, the protection film 233 is annealed.

Next, the interlayer insulating film 234 is formed so as to cover the ferroelectric capacitor structure 230 via the protection film 233. Here, the interlayer insulating film 234 is formed such that a silicon oxide film is deposited with a film thickness of approximately 1500 nm to 2500 nm by a plasma CVD method using TEOS for example, and thereafter it is polished by CMP until the film thickness becomes approximately 1000 nm for example. After the CMP, for the purpose of dehydrating the interlayer insulating film 234, plasma annealing of $N_2O$ for example is performed.

Figure 72B:
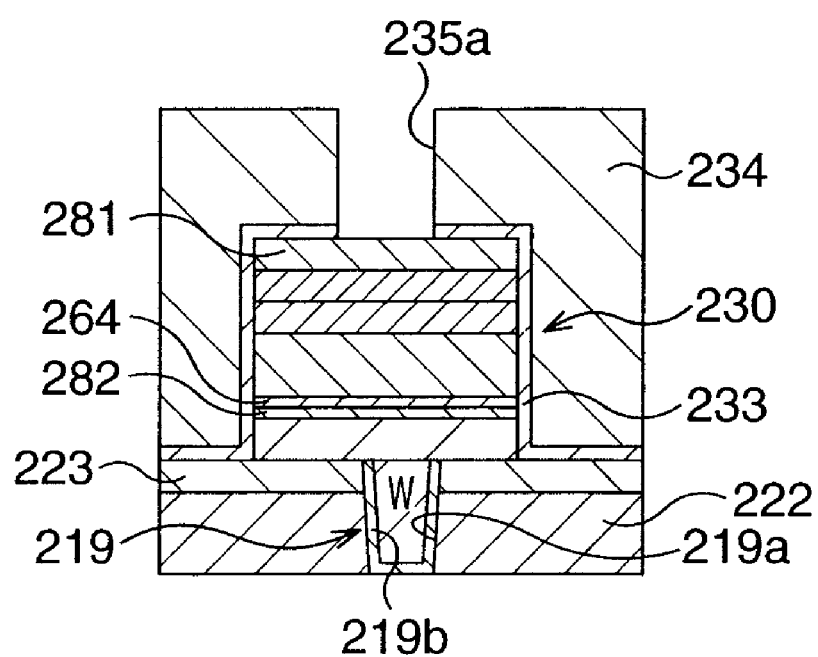

Subsequently, as shown in FIG. 72B, a via hole 235a to the upper electrode 232 of the ferroelectric capacitor structure 230 is formed.

Particularly, the interlayer insulating film 234 and the protection film 233 are patterned by lithography and subsequent dry etching, thereby forming the via hole 235a which exposes part of a surface of the conductive layer 281.

Figure 73A:
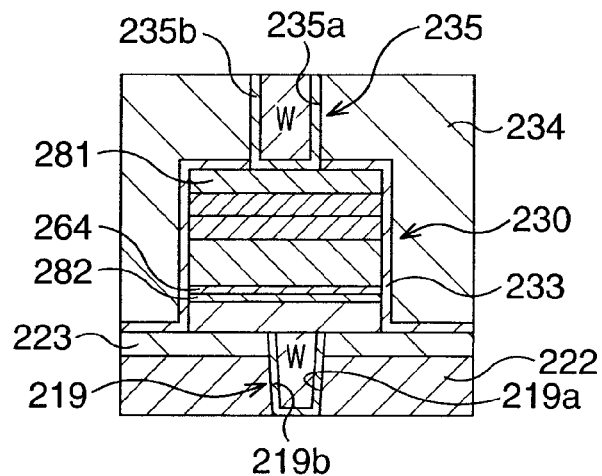
FIG. 73A and FIG. 73B are schematic cross-sectional views showing the structure of the FeRAM according to the modification example 11 of the second embodiment together with the manufacturing method thereof (main steps) in the order of steps, continuing from FIG. 72B.

Subsequently, as shown in FIG. 73A, a plug 235 connected to the upper electrode 232 of the ferroelectric capacitor structure 230 is formed.

Particularly, first, a TiN film for example is deposited sequentially by a sputtering method with a film thickness of approximately 50 nm so as to cover a wall surface of the via hole 235a, thereby forming a base film (glue film) 235b. Then, a W film for example is formed by a CVD method so as to fill up the via hole 235a via a glue film 235b. The TiN film constituting the glue film 235b has a function of inhibiting permeation of hydrogen, and thus entrance of hydrogen into the plug 235 is inhibited. Here, for the glue film 235b which has a function of inhibiting permeation of hydrogen, at least one type selected from TiN, TiSiN, TaN, CrN, HfN, ZrN, TiAlN, TaAlN, CrAlN, and HfAlN is used.

Thereafter, with the interlayer insulating film 234 being a stopper, the W film and the glue film 235b are polished by CMP, thereby forming the plug 235 in which the via hole 235a is filled up with W via the glue film 235b. After the CMP, plasma annealing of $N_2O$ for example is performed.

In this example, the W filling up the via hole 235a is separated from the upper electrode 232 by the conductive layer 281, and further separated from the lower electrode 231 by the conductive layer 282. The conductive layers 281, 282 absorb oxygen, so to speak due to oxidation of themselves, but they do not impair the electrical connection function of the plug 235 because they maintain conductivity even when oxidized. By these conductive layers 281, 282, entrance into the plug 235 of oxygen activated due to the $IrO_2$ film 226a constituting the upper electrode 232, oxygen activated due to the Pt film 226b, oxygen activated due to the Pt constituting the lower electrode 231, and the like is inhibited, thereby preventing oxidation of the plug 235.

Figure 73B:
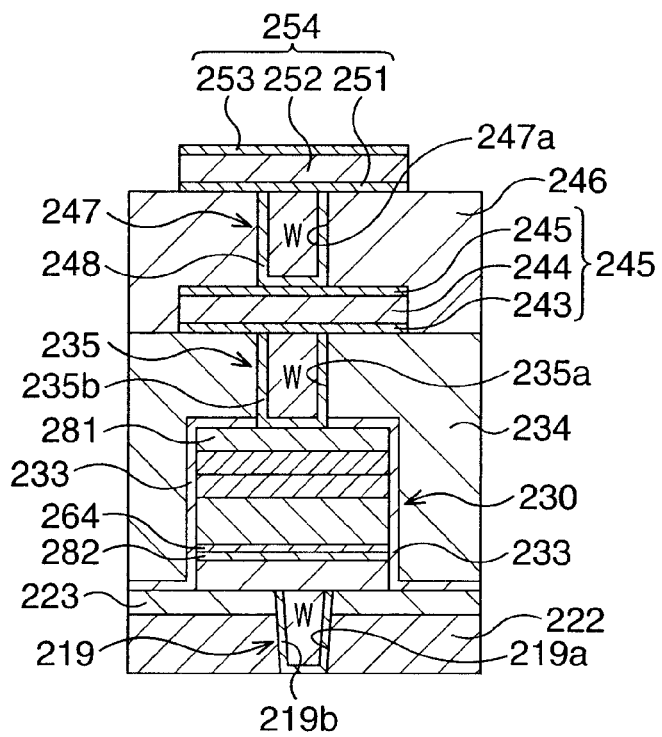

Then, similarly to the second embodiment, the respective steps of FIG. 42A and FIG. 42B are performed to obtain the structure shown in FIG. 73B.

Thereafter, steps of forming an interlayer insulating film and a further upper layer wire, and so on are performed, thereby completing the stack type FeRAM according to this example.

As described above, according to this example, oxidation of the plug 235 connected to the ferroelectric capacitor structure 230 is inhibited, so that a highly reliable stack type FeRAM with stabilized contact resistance can be realized.

Modification Example 12

In this example, similarly to the second embodiment, a structure of a stack type FeRAM and a manufacturing method thereof will be disclosed, but this example is different in that the conductor impervious to oxygen provided between the ferroelectric capacitor structure 230 and the conductive plug 235 is different.

FIG. 74A to FIG. 77B are schematic cross-sectional views showing a structure of an FeRAM according to modification example 12 of the second embodiment together with a manufacturing method thereof (main steps) in the order of steps.

First, similarly to the second embodiment, the respective steps of FIG. 38A and FIG. 38B are performed.

Figure 74A:
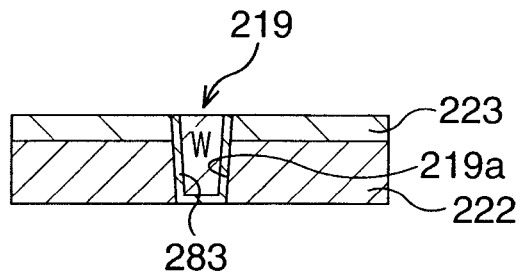
FIG. 74A to FIG. 74D are schematic cross-sectional views showing a structure of an FeRAM according to modification example 12 of the second embodiment together with a manufacturing method thereof (main steps) in the order of steps.

Subsequently, as shown in FIG. 74A, a plug 219 connected to the source/drain region 218 of the transistor structure 220 is formed. Note that in FIG. 74A and respective subsequent drawings, for convenience of illustration, only the structure of the interlayer insulating film 222 and above is shown, and the silicon semiconductor substrate 210, the MOS transistor 220, and so on are omitted therefrom.

Particularly, first, with the source/drain region 218 being an etching stopper, the upper insulating film 223, the interlayer insulating film 222, and the protection film 221 are processed by lithography and subsequent dry etching until part of a surface of the source/drain region 218 exposes, thereby forming a via hole 219a with a diameter of approximately 0.3 for example.

Next, the base film of the plug 219 is formed with a metal film which is a conductor impervious to oxygen (capable of absorbing oxygen) and has conductivity even when oxidized. Specifically, a metal having conductivity even when oxidized, for example an Ir film is deposited with a film thickness of approximately 50 nm so as to cover a wall surface of the via hole 235a, thereby forming a base film (glue film) 283. As the metal having conductivity even when oxidized, one containing at least one type selected from Ag, Ni, Cu, Zn, In, Sn, Ir, Ru, Rh, Pd, and Os is used. When two or more types are selected, they may be used in an alloy state.

Then, a W film for example is formed by a CVD method so as to fill up the via hole 219a via the glue film 283. Thereafter, with the upper insulating film 223 being a stopper, the W film and the glue film 283 are polished by CMP, thereby forming the plug 219 in which the via hole 219a is filled up with W via the glue film 283. After the CMP, plasma annealing of $N_2O$ for example is performed.

Figure 74B:
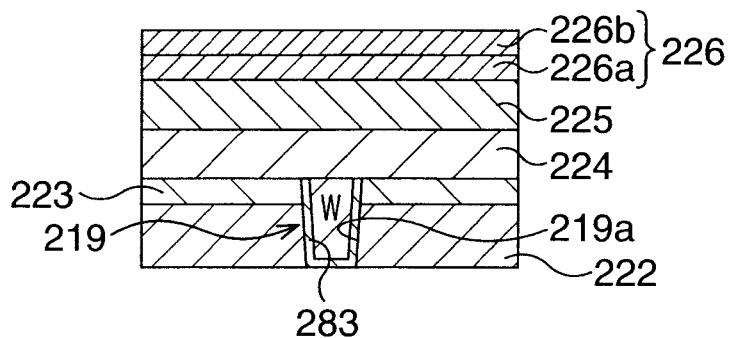

Subsequently, as shown in FIG. 74B, a lower electrode layer 224, a ferroelectric film 225 and an upper electrode layer 226 are formed sequentially.

Particularly, first, a Pt film is deposited with a film thickness of approximately 150 nm to 200 nm for example by a sputtering method, thereby forming the lower electrode layer 224.

Next, on the lower electrode layer 224, the ferroelectric film 225 constituted of PZT for example, which is a ferroelectric, is deposited with a film thickness of approximately 100 nm to 300 nm by an RF sputtering method. Then, the ferroelectric film 225 is annealed to crystallize the ferroelectric film 225. Conditions of this annealing are such that it is performed for 60 seconds to 120 seconds at 550° C. to 650° C. for example while supplying $Ar/O_2$ gases at flow rates of 1.98 liter/minute of Ar and 0.025 liter/minute of $O_2$.

Next, the upper electrode layer 226 is formed by deposition on the ferroelectric film 225.

As the upper electrode layer 226, first, an $IrO_2$ film 226a for example which is a conductive oxide is formed with a film thickness of approximately 200 nm by a reactive sputtering method. Thereafter, the $IrO_2$ film 226a is annealed. Conditions of this annealing are such that it is performed for 10 seconds to 60 seconds at 650° C. to 850° C. for example while supplying $Ar/O_2$ gases at flow rates of 2.0 liter/minute of Ar and 0.02 liter/minute of $O_2$. Then, on the $IrO_2$ film 226a, a noble metal film, here a Pt film 226b, which functions as a cap film for the $IrO_2$ film 226a is formed with a film thickness of approximately 100 nm by a sputtering method. The $IrO_2$ film 226a and the Pt film 226b constitute the upper electrode layer 226. Note that for the upper electrode layer 226, instead of the $IrO_2$ film 226a, a conductive oxide of Ir, Ru, $RuO_2$, $SrRuO_3$ or the like or a layered structure of them may be adopted. Further, it is also possible to omit formation of the Pt film 226b.

Figure 74C:
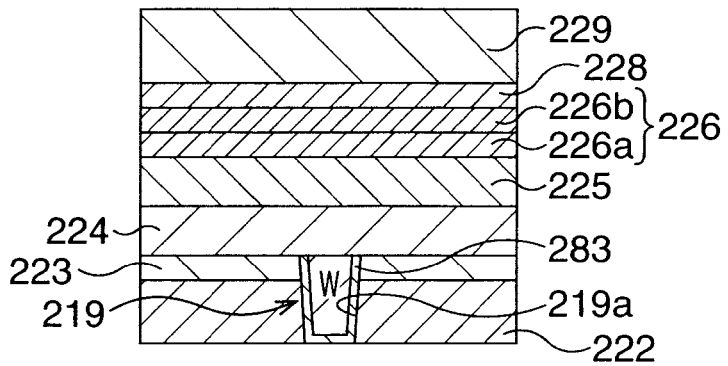

Subsequently, as shown in FIG. 74C, a TiN film 228 and a silicon oxide film 229 are formed.

Particularly, the TiN film 228 is formed by deposition with a film thickness of approximately 200 nm on the upper electrode layer 226 by a sputtering method or the like. The silicon oxide film 229 is formed by deposition with a film thickness of approximately 1000 nm on the TiN film 228 by a CVD method using TEOS for example. Here, instead of the TEOS film, an HDP film may be formed. Note that it is also preferable to further form a silicon nitride film on the silicon oxide film 229.

Figure 74D:
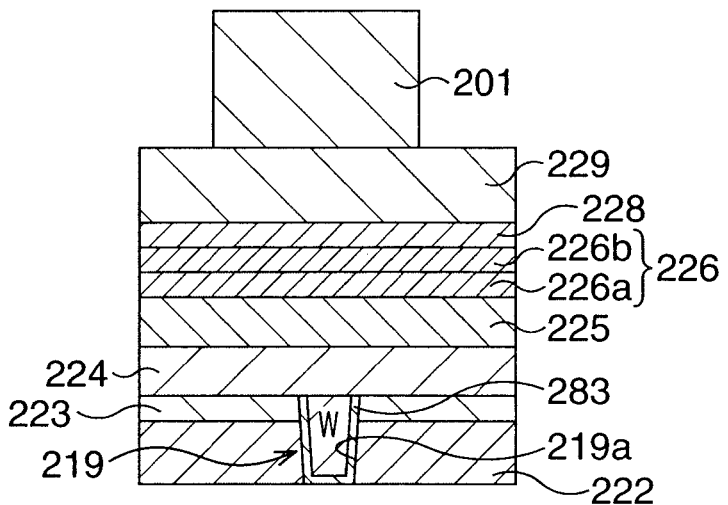

Subsequently, as shown in FIG. 74D, a resist mask 201 is formed.

Particularly, a resist is applied on the silicon oxide film 229, and this resist is processed in an electrode form by lithography, thereby forming the resist mask 201.

Figure 75A:
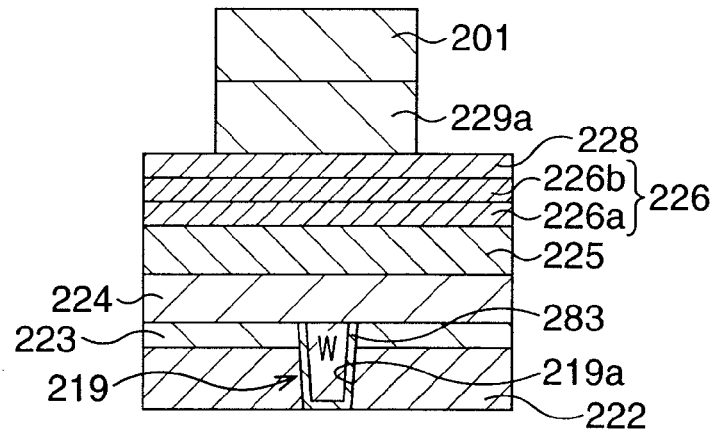
FIG. 75A to FIG. 75D are schematic cross-sectional views showing the structure of the FeRAM according to the modification example 12 of the second embodiment together with the manufacturing method thereof (main steps) in the order of steps, continuing from FIG. 74D.

Subsequently, as shown in FIG. 75A, the silicon oxide film 229 is processed.

Particularly, with the resist mask 201 being a mask, the silicon oxide film 229 is dry-etched. At this time, the silicon oxide film 229 is patterned corresponding to the electrode form of the resist mask 201, thereby forming a hard mask 229a. Also, the resist mask 201 is etched and its thickness is reduced.

Figure 75B:
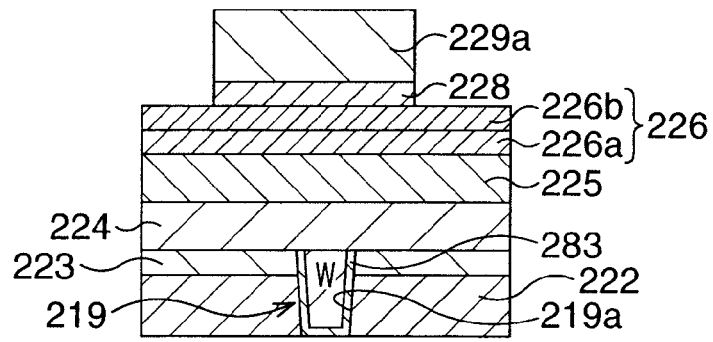

Subsequently, as shown in FIG. 75B, the TiN film 228 is processed.

Particularly, with the resist mask 201 and the hard mask 229a being a mask, the TiN film 228 is dry etched. At this time, the TiN film 228 is patterned corresponding to the electrode form of the hard mask 229a. Also, the resist mask 201 itself is etched and becomes thin during the etching. Thereafter, the resist mask 201 is removed by ashing or the like. Note that here a silicide film 227 may also be patterned together with the TiN film 228 corresponding to the electrode form of the hard mask 229a.

Figure 75C:
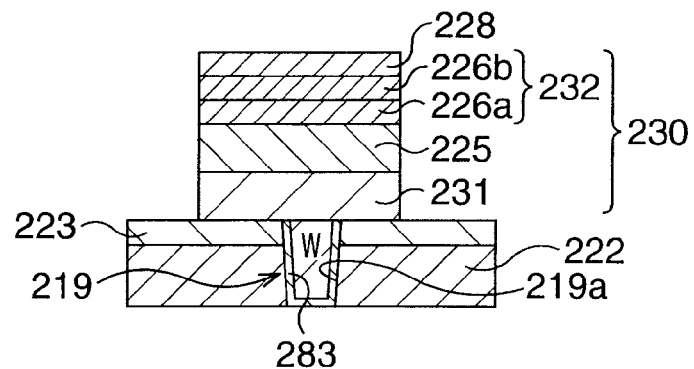

Subsequently, as shown in FIG. 75C, the upper electrode layer 226, the ferroelectric film 225, and the lower electrode layer 224 are processed.

Particularly, with the hard mask 229a and the TiN film 228 being a mask and the upper insulating film 223 being an etching stopper, the upper electrode layer 226, the ferroelectric film 225, and the lower electrode layer 224 are dry-etched. At this time, the upper electrode layer 226, the ferroelectric film 225, and the lower electrode layer 224 are patterned corresponding to the electrode form of the TiN film 228. Also, the hard mask 229a itself is etched and becomes thin during the etching. Thereafter, the hard mask 229a is removed by dry etching (etching back) on its entire surface.

Figure 75D:
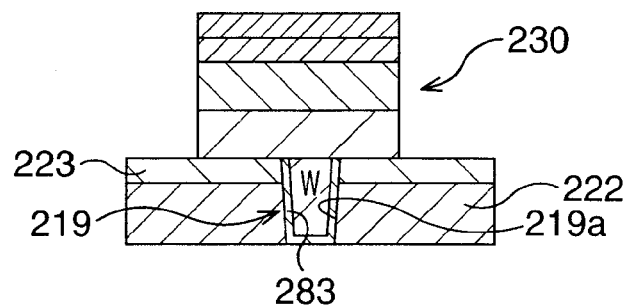

Subsequently, as shown in FIG. 75D, the ferroelectric capacitor structure 230 is completed.

Particularly, the TiN film 228 used as a mask is removed by wet etching. At this time, the ferroelectric capacitor structure 230 is completed, in which the ferroelectric film 225 and an upper electrode 232 are layered sequentially on a lower electrode 231, and the lower electrode 231 and the upper electrode 232 are capacitively coupled via the ferroelectric film 225. In this ferroelectric capacitor structure 230, the lower electrode 231 is connected to the plug 219, and the source/drain 218 and the lower electrode 231 are electrically connected via the plug 219.

Figure 76A:
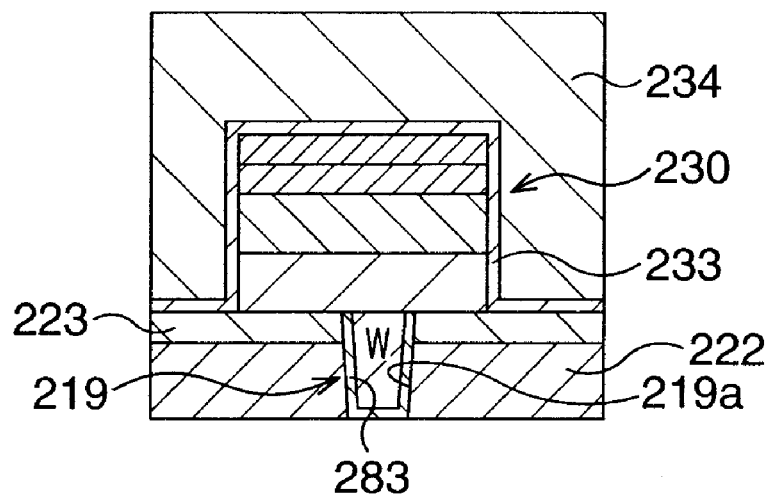
FIG. 76A and FIG. 76B are schematic cross-sectional views showing the structure of the FeRAM according to the modification example 12 of the second embodiment together with the manufacturing method thereof (main steps) in the order of steps, continuing from FIG. 75D.

Subsequently, as shown in FIG. 76A, a protection film 233 and an interlayer insulating film 234 are formed.

Particularly, first, alumina ($Al_2O_3$) is used as a material and deposited by a sputtering method with a film thickness of approximately 20 nm to 50 nm so as to cover the entire face of the ferroelectric capacitor structure 230, thereby forming the protection film 233. Thereafter, the protection film 233 is annealed.

Next, the interlayer insulating film 234 is formed so as to cover the ferroelectric capacitor structure 230 via the protection film 233. Here, the interlayer insulating film 234 is formed such that a silicon oxide film is deposited with a film thickness of approximately 1500 nm to 2500 nm by a plasma CVD method using TEOS for example, and thereafter it is polished by CMP until the film thickness becomes approximately 1000 nm for example. After the CMP, for the purpose of dehydrating the interlayer insulating film 234, plasma annealing of $N_2O$ for example is performed.

Figure 76B:
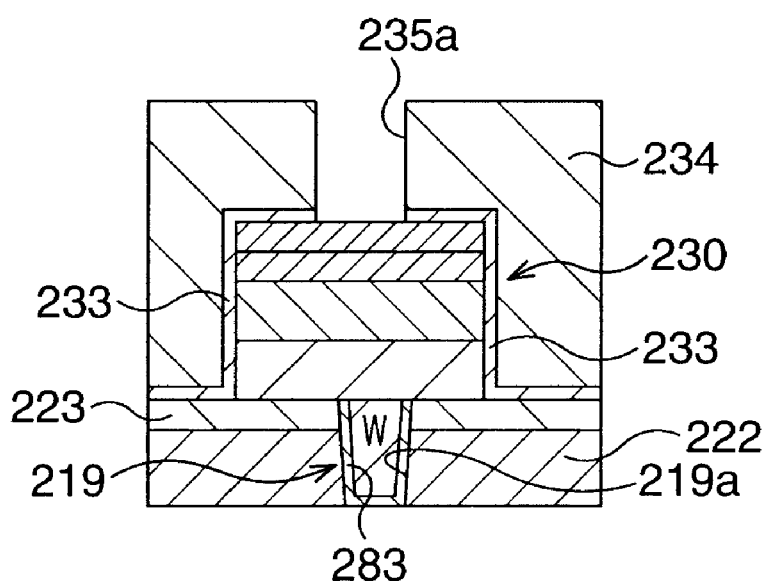

Subsequently, as shown in FIG. 76B, a via hole 235a to the upper electrode 232 of the ferroelectric capacitor structure 230 is formed.

Particularly, the interlayer insulating film 234 and the protection film 233 are patterned by lithography and subsequent dry etching, thereby forming the via hole 235a which exposes part of a surface of the upper electrode 232.

Figure 77A:
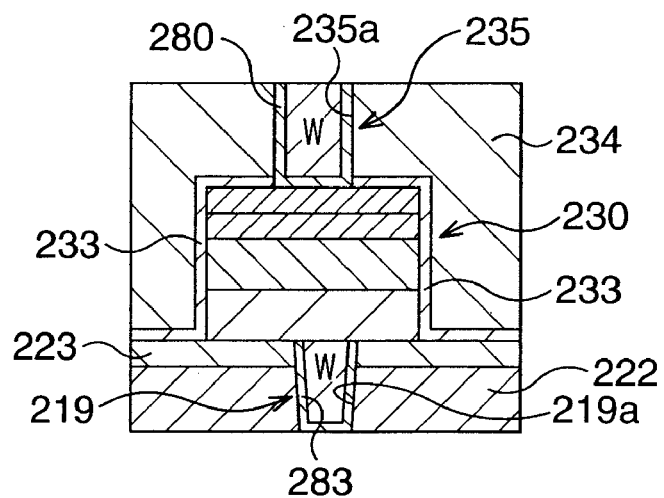
FIG. 77A and FIG. 77B are schematic cross-sectional views showing the structure of the FeRAM according to the modification example 12 of the second embodiment together with the manufacturing method thereof (main steps) in the order of steps, continuing from FIG. 76B.

Subsequently, as shown in FIG. 77A, a plug 235 connected to the upper electrode 232 of the ferroelectric capacitor structure 230 is formed.

In this example, in order to inhibit oxidation of the plug 235 due to oxygen generated from the upper electrode 232 (particularly, oxygen activated by the Pt film 226b), the base film of the plug 235 is formed with a metal film which is a conductor impervious to oxygen (capable of absorbing oxygen) and has conductivity even when oxidized. Specifically, a metal having conductivity even when oxidized, for example an Ir film is deposited with a film thickness of approximately 50 nm so as to cover a wall surface of the via hole 235a, thereby forming a base film (glue film) 280. As the metal having conductivity even when oxidized, one containing at least one type selected from Ag, Ni, Cu, Zn, In, Sn, Ir, Ru, Rh, Pd, and Os is used. When two or more types are selected, they may be used in an alloy state.

Then, a W film for example is formed by a CVD method so as to fill up the via hole 235a via the glue film 280. Thereafter, with the interlayer insulating film 234 being a stopper, the W film and the glue film 280 are polished by CMP, thereby forming the plug 235 in which the via hole 235a is filled up with W via the glue film 280. After the CMP, plasma annealing of $N_2O$ for example is performed.

In this example, the W filling up the via hole 235a is covered from a bottom face to a side face by the glue film 280 constituted of the Ir film which is a metal having conductivity even when oxidized, and the W and the upper electrode 232 are separated by the glue film 280. The glue film 280 absorbs oxygen, so to speak due to oxidation of itself, but it does not impair the electrical connection function of the plug 235 because it maintains conductivity even when oxidized. By this glue film 280, entrance into the plug 235 of oxygen activated due to the $IrO_2$ film 226a constituting the upper electrode 232, oxygen activated due to the Pt film 226b, and the like is inhibited, thereby preventing oxidation of the plug 235.

Figure 77B:
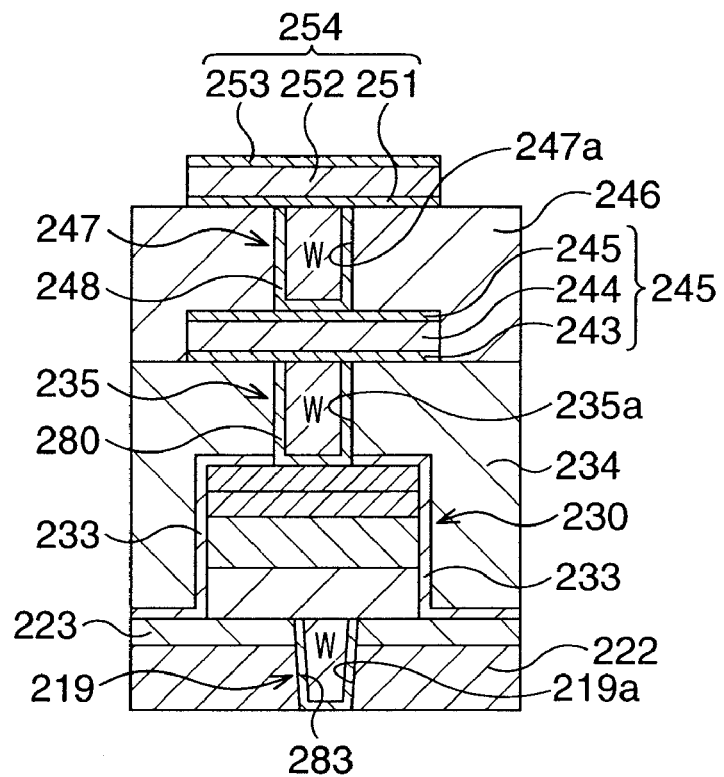

Then, the respective steps of FIG. 42A and FIG. 42B are performed to obtain the structure shown in FIG. 77B.

Thereafter, steps of forming an interlayer insulating film and a further upper layer wire, and so on are performed, thereby completing the stack type FeRAM according to this example.

In this example, the W filling up the via hole 235a is separated from the upper electrode 232 by the glue film 280 constituted of the conductive layer having conductivity even when oxidized. The glue film 280 absorbs oxygen, so to speak due to oxidation of itself, but it does not impair the electrical connection function of the plug 235 because it maintains conductivity even when oxidized. By this glue film 280, entrance into the plug 235 of oxygen activated due to the $IrO_2$ film 226a constituting the upper electrode 232, oxygen activated due to the Pt film 226b, oxygen activated due to Pt constituting the lower electrode 231, and the like is inhibited, thereby preventing oxidation of the plug 235. Similarly, the W filling up the via hole 219a is surrounded by the glue film 283 constituted of the conductive layer having conductivity even when oxidized, thereby preventing oxidation of the plug 219.

As described above, according to this example, oxidation of the plugs 235, 219 connected to the ferroelectric capacitor structure 230 on its top and bottom is inhibited, so that a highly reliable stack type FeRAM with stabilized contact resistance can be realized.

Modification Example 13

In this example, similarly to the second embodiment, a structure of a stack type FeRAM and a manufacturing method thereof will be disclosed, but this example is different in that the conductor impervious to oxygen provided between the ferroelectric capacitor structure 230 and the conductive plug 235 is different.

FIG. 78A to FIG. 81B are schematic cross-sectional views showing a structure of an FeRAM according to modification example 13 of the second embodiment together with a manufacturing method thereof (main steps) in the order of steps.

First, similarly to the second embodiment, the respective steps of FIG. 38A and FIG. 38B are performed.

Figure 78A:
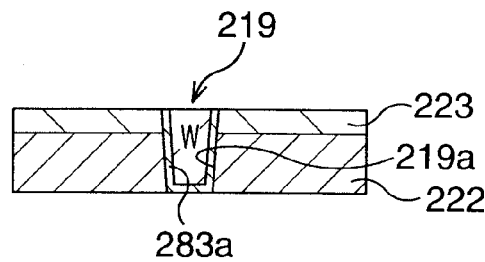
FIG. 78A to FIG. 78D are schematic cross-sectional views showing a structure of an FeRAM according to modification example 13 of the second embodiment together with a manufacturing method thereof (main steps) in the order of steps.

Subsequently, as shown in FIG. 78A, a plug 219 connected to the source/drain region 218 of the transistor structure 220 is formed. Note that in FIG. 78A and respective subsequent drawings, for convenience of illustration, only the structure of the interlayer insulating film 222 and above is shown, and the silicon semiconductor substrate 210, the MOS transistor 220, and so on are omitted therefrom.

Particularly, first, with the source/drain region 218 being an etching stopper, the upper insulating film 223, the interlayer insulating film 222, and the protection film 221 are processed by lithography and subsequent dry etching until part of a surface of the source/drain region 218 exposes, thereby forming a via hole 219a with a diameter of approximately 0.3 μm for example.

Next, the base film of the plug 219 is formed with a metal film which is a conductor impervious to oxygen (capable of absorbing oxygen) and has conductivity even when oxidized. Specifically, a metal having conductivity even when oxidized, for example an Ir film is deposited with a film thickness of approximately 50 nm so as to cover a wall surface of the via hole 235a, thereby forming a base film (glue film) 283a. As the metal having conductivity even when oxidized, one containing at least one type selected from Ag, Ni, Cu, Zn, In, Sn, Ir, Ru, Rh, Pd, and Os is used. When two or more types are selected, they may be used in an alloy state.

Then, a W film for example is formed by a CVD method so as to fill up the via hole 219a via the glue film 283a. Thereafter, with the upper insulating film 223 being a stopper, the W film and the glue film 283a are polished by CMP, thereby forming the plug 219 in which the via hole 219a is filled up with W via the glue film 283a. After the CMP, plasma annealing of $N_2O$ for example is performed.

Figure 78B:
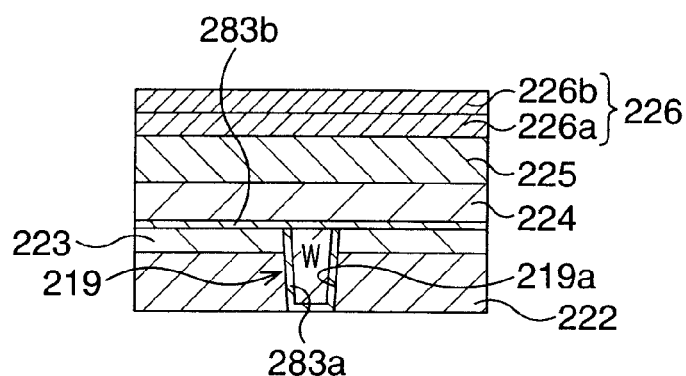

Subsequently, as shown in FIG. 78B, a conductive layer 283b having conductivity even when oxidized, a lower electrode layer 224, a ferroelectric film 225 and an upper electrode layer 226 are formed sequentially.

Particularly, first, as a conductor impervious to oxygen, a metal having conductivity even when oxidized, for example an Ir film is deposited with a film thickness of approximately 200 nm so as to cover the plug 219, thereby forming the conductive layer 283b. As the metal having conductivity even when oxidized, one containing at least one type selected from Ag, Ni, Cu, Zn, In, Sn, Ir, Ru, Rh, Pd, and Os is used. When two or more types are selected, they may be used in an alloy state.

Next, a Pt film is deposited with a film thickness of approximately 150 nm to 200 nm for example by a sputtering method, thereby forming the lower electrode layer 224.

Next, on the lower electrode layer 224, the ferroelectric film 225 constituted of PZT for example, which is a ferroelectric, is deposited with a film thickness of approximately 100 nm to 300 nm by an RF sputtering method. Then, the ferroelectric film 225 is annealed to crystallize the ferroelectric film 225. Conditions of this annealing are such that it is performed for 60 seconds to 120 seconds at 550° C. to 650° C. for example while supplying $Ar/O_2$ gases at flow rates of 1.98 liter/minute of Ar and 0.025 liter/minute of $O_2$.

Next, the upper electrode layer 226 is formed by deposition, on the ferroelectric film 225.

As the upper electrode layer 226, first, an $IrO_2$ film 226a for example which is a conductive oxide is formed with a film thickness of approximately 200 nm by a reactive sputtering method. Thereafter, the $IrO_2$ film 226a is annealed. Conditions of this annealing are such that it is performed for 10 seconds to 60 seconds at 650° C. to 850° C. for example while supplying $Ar/O_2$ gases at flow rates of 2.0 liter/minute of Ar and 0.02 liter/minute of $O_2$. Then, on the $IrO_2$ film 226a, a noble metal film, here a Pt film 226b, which functions as a cap film for the $IrO_2$ film 226a is formed with a film thickness of approximately 100 nm by a sputtering method. The $IrO_2$ film 226a and the Pt film 226b constitute the upper electrode layer 226. Note that for the upper electrode layer 226, instead of the $IrO_2$ film 226a, a conductive oxide of Ir, Ru, $RuO_2$, $SrRuO_3$ or the like or a layered structure of them may be adopted. Further, it is also possible to omit formation of the Pt film 226b.

Figure 78C:
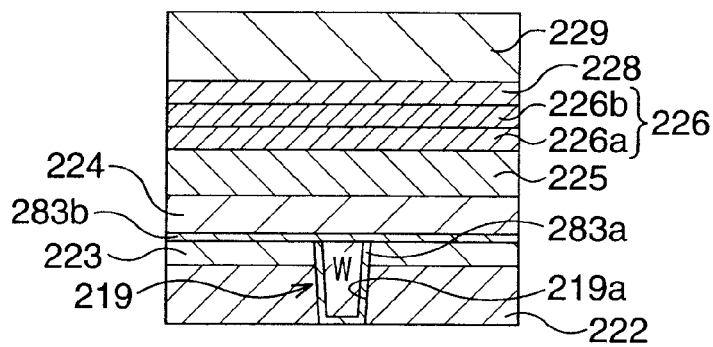

Subsequently, as shown in FIG. 78C, a TiN film 228 and a silicon oxide film 229 are formed.

Particularly, the TiN film 228 is formed by deposition with a film thickness of approximately 200 nm on the upper electrode layer 226 by a sputtering method or the like. The silicon oxide film 229 is formed by deposition with a film thickness of approximately 1000 nm on the TiN film 228 by a CVD method using TEOS for example. Here, instead of the TEOS film, an HDP film may be formed. Note that it is also preferable to further form a silicon nitride film on the silicon oxide film 229.

Figure 78D:
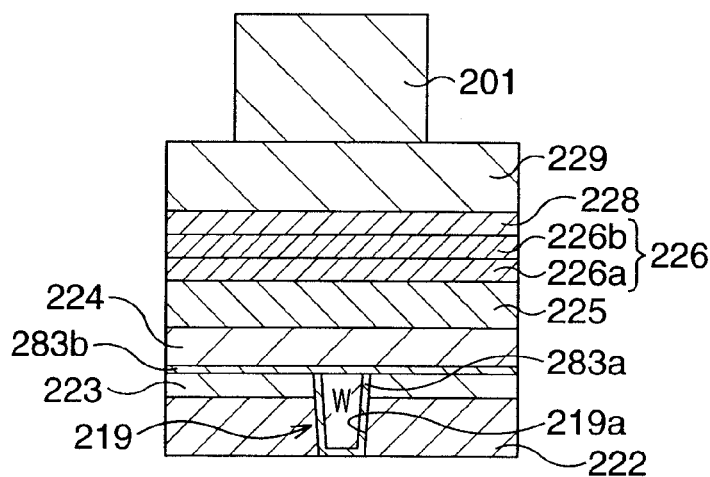

Subsequently, as shown in FIG. 78D, a resist mask 201 is formed.

Particularly, a resist is applied on the silicon oxide film 229, and this resist is processed in an electrode form by lithography, thereby forming the resist mask 201.

Figure 79A:
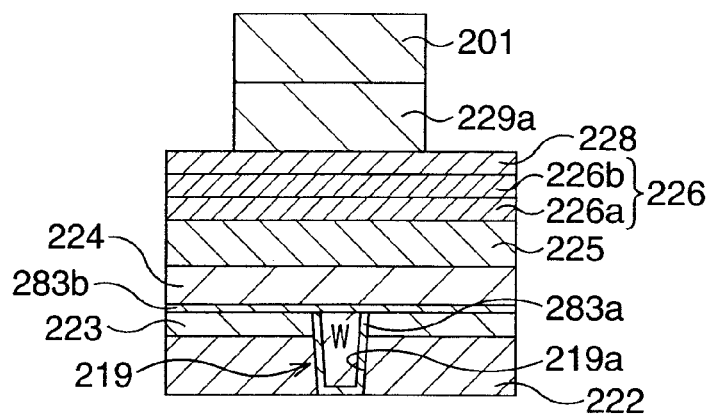
FIG. 79A to FIG. 79D are schematic cross-sectional views showing the structure of the FeRAM according to the modification example 13 of the second embodiment together with the manufacturing method thereof (main steps) in the order of steps, continuing from FIG. 78D.

Subsequently, as shown in FIG. 79A, the silicon oxide film 229 is processed.

Particularly, with the resist mask 201 being a mask, the silicon oxide film 229 is dry-etched. At this time, the silicon oxide film 229 is patterned corresponding to the electrode form of the resist mask 201, thereby forming a hard mask 229a. Also, the resist mask 201 is etched and its thickness is reduced.

Figure 79B:
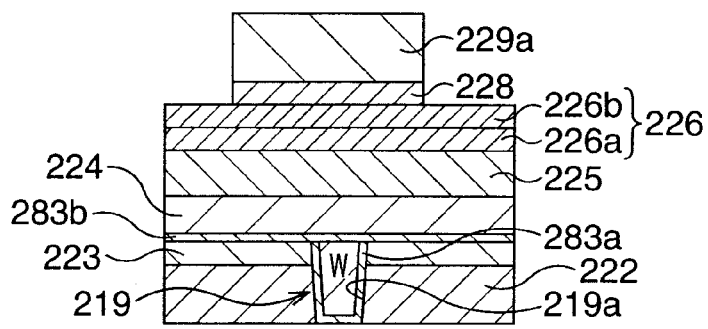

Subsequently, as shown in FIG. 79B, the TiN film 228 is processed.

Particularly, with the resist mask 201 and the hard mask 229a being a mask, the TiN film 228 is dry etched. At this time, the TiN film 228 is patterned corresponding to the electrode form of the hard mask 229a. Also, the resist mask 201 itself is etched and becomes thin during the etching. Thereafter, the resist mask 201 is removed by ashing or the like. Note that here a silicide film 227 may also be patterned together with the TiN film 228 corresponding to the electrode form of the hard mask 229a.

Figure 79C:
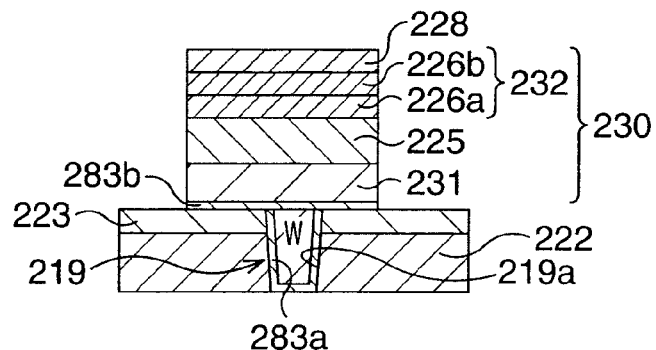

Subsequently, as shown in FIG. 79C, the upper electrode layer 226, the ferroelectric film 225, the lower electrode layer 224 and the conductive layer 283b are processed.

Particularly, with the hard mask 229a and the TiN film 228 being a mask and the upper insulating film 223 being an etching stopper, the upper electrode layer 226, the ferroelectric film 225, the lower electrode layer 224 and the conductive layer 283b are dry-etched. At this time, the upper electrode layer 226, the ferroelectric film 225, the lower electrode layer 224 and the conductive layer 283b are patterned corresponding to the electrode form of the TiN film 228. Also, the hard mask 229a itself is etched and becomes thin during the etching. Thereafter, the hard mask 229a is removed by dry etching (etching back) on its entire surface.

Figure 79D:
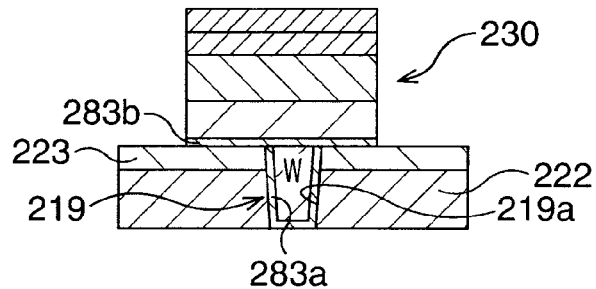

Subsequently, as shown in FIG. 79D, the ferroelectric capacitor structure 230 is completed.

Particularly, the TiN film 228 used as a mask is removed by wet etching. At this time, the ferroelectric capacitor structure 230 is completed, in which the ferroelectric film 225 and an upper electrode 232 are layered sequentially on a lower electrode 231, and the lower electrode 231 and the upper electrode 232 are capacitively coupled via the ferroelectric film 225. In this ferroelectric capacitor structure 230, the lower electrode 231 is connected to the plug 219 via the conductive layer 283b, and the source/drain 218 and the lower electrode 231 are electrically connected via the plug 219.

Figure 80A:
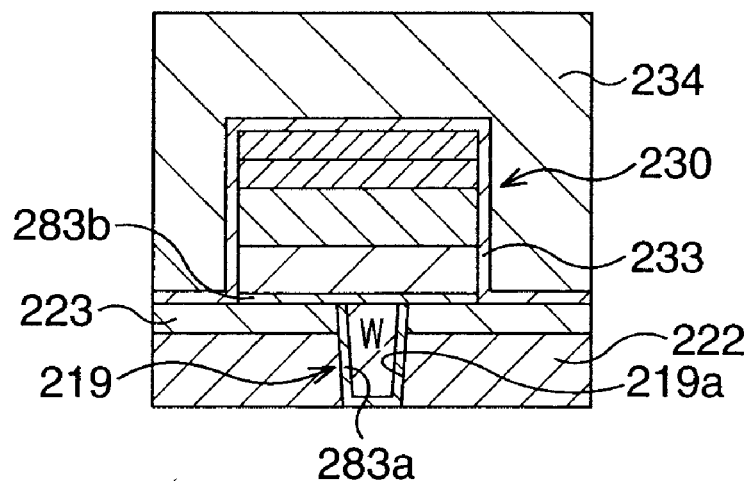
FIG. 80A and FIG. 80B are schematic cross-sectional views showing the structure of the FeRAM according to the modification example 13 of the second embodiment together with the manufacturing method thereof (main steps) in the order of steps, continuing from FIG. 79D.

Subsequently, as shown in FIG. 80A, a protection film 233 and an interlayer insulating film 234 are formed.

Particularly, first, alumina ($Al_2O_3$) is used as a material and deposited by a sputtering method with a film thickness of approximately 20 nm to 50 nm so as to cover the entire face of the ferroelectric capacitor structure 230, thereby forming the protection film 233. Thereafter, the protection film 233 is annealed.

Next, the interlayer insulating film 234 is formed so as to cover the ferroelectric capacitor structure 230 via the protection film 233. Here, the interlayer insulating film 234 is formed such that a silicon oxide film is deposited with a film thickness of approximately 1500 nm to 2500 nm by a plasma CVD method using TEOS for example, and thereafter it is polished by CMP until the film thickness becomes approximately 1000 nm for example. After the CMP, for the purpose of dehydrating the interlayer insulating film 234, plasma annealing of $N_2O$ for example is performed.

Figure 80B:
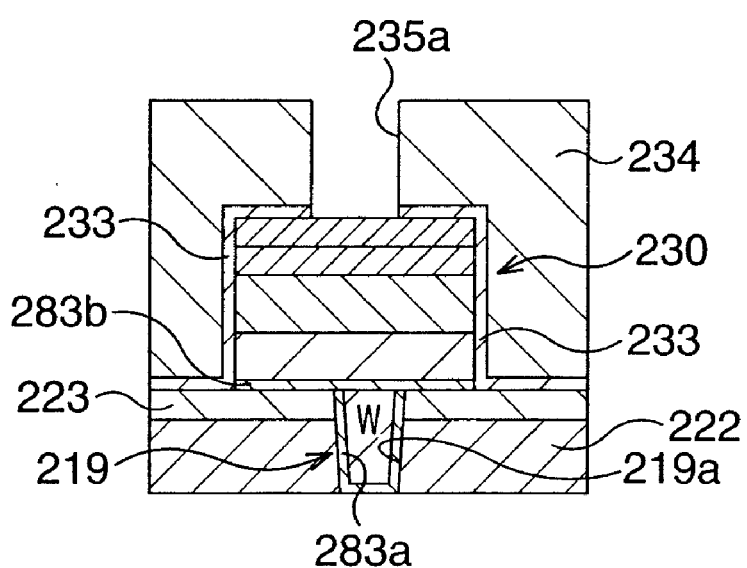

Subsequently, as shown in FIG. 80B, a via hole 235a to the upper electrode 232 of the ferroelectric capacitor structure 230 is formed.

Particularly, the interlayer insulating film 234 and the protection film 233 are patterned by lithography and subsequent dry etching, thereby forming the via hole 235a which exposes part of a surface of the upper electrode 232.

Figure 81A:
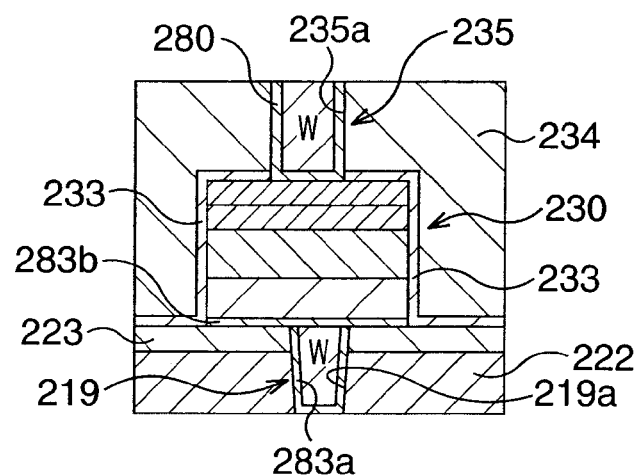
FIG. 81A and FIG. 81B are schematic cross-sectional views showing the structure of the FeRAM according to the modification example 13 of the second embodiment together with the manufacturing method thereof (main steps) in the order of steps, continuing from FIG. 80B.

Subsequently, as shown in FIG. 81A, a plug 235 connected to the upper electrode 232 of the ferroelectric capacitor structure 230 is formed.

In this example, in order to inhibit oxidation of the plug 235 due to oxygen generated from the upper electrode 232 (particularly, oxygen activated by the Pt film 226b), the base film of the plug 235 is formed with a metal film which is a conductor impervious to oxygen (capable of absorbing oxygen) and has conductivity even when oxidized. Specifically, a metal having conductivity even when oxidized, for example an Ir film is deposited with a film thickness of approximately 50 nm so as to cover a wall surface of the via hole 235a, thereby forming a base film (glue film) 280. As the metal having conductivity even when oxidized, one containing at least one type selected from Ag, Ni, Cu, Zn, In, S Ir, Ru, Rh, Pd, and Os is used. When two or more types are selected, they may be used in an alloy state.

Then, a W film for example is formed by a CVD method so as to fill up the via hole 235a via the glue film 280. Thereafter, with the interlayer insulating film 234 being a stopper, the W film and the glue film 280 are polished by CMP, thereby forming the plug 235 in which the via hole 235a is filled up with W via the glue film 280. After the CMP, plasma annealing of $N_2O$ for example is performed.

Figure 81B:
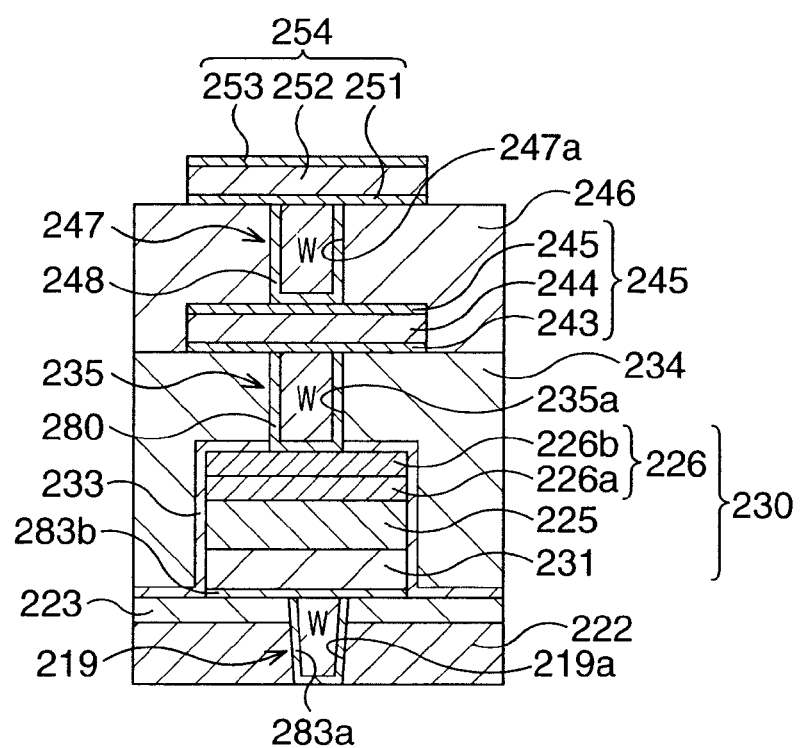

Then, similarly to the second embodiment, the respective steps of FIG. 42A and FIG. 42B are performed to obtain the structure shown in FIG. 81B.

Thereafter, steps of forming an interlayer insulating film and a further upper layer wire, and so on are performed, thereby completing the stack type FeRAM according to this example.

In this example, the W filling up the via hole 235a is separated from the upper electrode 232 by the glue film 280 constituted of the conductive layer having conductivity even when oxidized. The glue film 280 absorbs oxygen, so to speak due to oxidation of itself, but it does not impair the electrical connection function of the plug 235 because it maintains conductivity even when oxidized. By this glue film 280, entrance into the plug 235 of oxygen activated due to the $IrO_2$ film 226a constituting the upper electrode 232, oxygen activated due to the Pt film 226b, oxygen activated due to Pt constituting the lower electrode 231, and the like is inhibited, thereby preventing oxidation of the plug 235.

Furthermore, the W filling up the via hole 219a is covered from a bottom face to a side face by the glue film 283a constituted of the conductive layer having conductivity even when oxidized, and an upper face of the W filling up the via hole 219a is covered by the conductive layer 283b having conductivity even when oxidized. The W is in a state of being substantially completely isolated from the ferroelectric capacitor structure 230 existing at a lower layer thereof by the glue film 283a and the conductive layer 283b. Therefore, oxidation of the plug 219 is prevented.

As described above, according to this example, oxidation of the plugs 235, 219 connected to the ferroelectric capacitor structure 230 on its top and bottom is inhibited, so that a highly reliable stack type FeRAM with stabilized contact resistance can be realized.

Modification Example 14

In this example, similarly to the second embodiment, a structure of a stack type FeRAM and a manufacturing method thereof will be disclosed, but this example is different in that a silicide film is formed on the ferroelectric capacitor structure 230, and a conductive layer having conductivity even when oxidized is formed under the ferroelectric capacitor structure 230.

FIG. 82A to FIG. 83C are schematic cross-sectional views showing a structure of an FeRAM according to modification example 14 of the second embodiment together with a manufacturing method thereof (main steps) in the order of steps.

First, similarly to the second embodiment, the respective steps of FIG. 38A and FIG. 38B are performed. In this example, in the step of FIG. 38B, only the protection film 221 and the interlayer insulating film 222 are formed, and the upper insulating film 223 is not formed.

Figure 82A:
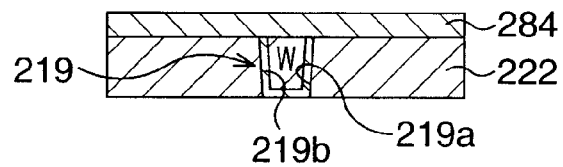
FIG. 82A to FIG. 82E are schematic cross-sectional views showing a structure of an FeRAM according to modification example 14 of the second embodiment together with a manufacturing method thereof (main steps) in the order of steps.

Subsequently, as shown in FIG. 82A, a conductive layer 284 having conductivity even when oxidized is formed. Note that in FIG. 82A and respective subsequent drawings, for convenience of illustration, only the structure of the interlayer insulating film 222 and above is shown, and the silicon semiconductor substrate 210, the MOS transistor 220, and so on are omitted therefrom.

Particularly, on the interlayer insulating film 222, a metal film having conductivity even when oxidized, for example an Ir film is formed with a film thickness of approximately 200 nm so as to cover the plug 219 by a sputtering method or the like, thereby forming the conductive layer 284. As the metal having conductivity even when oxidized, one containing at least one type selected from Ag, Ni, Cu, Zn, In, Sn, Ir, Ru, Rh, Pd, and Os is used. When two or more types are selected, they may be used in an alloy state.

Figure 82B:
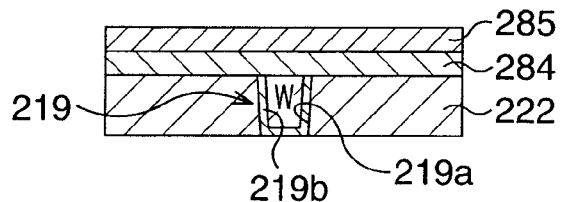

Subsequently, as shown in FIG. 82B, a TiN film 285 is formed.

Particularly, the TiN film 285 is formed by deposition with a film thickness of approximately 200 nm on the conductive layer 284 by a sputtering method or the like.

Figure 82C:
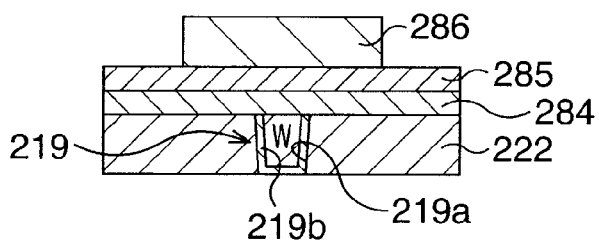

Subsequently, as shown in FIG. 82C, a resist mask 286 is formed.

Particularly, a resist is applied on the TiN film 285, and this resist is processed by lithography to form the resist mask 286 in an electrode form at a position matching with an upper side of the plug 219.

Figure 82D:
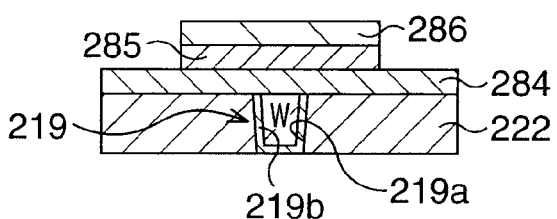

Subsequently, as shown in FIG. 82D, the TiN film 285 is processed.

Particularly, with the resist mask 286 being a mask, the TiN film 285 is patterned in an electrode form by dry etching. At this time, the resist mask 286 is also etched and its film thickness is reduced. Thereafter, the resist mask 286 is removed by ashing or the like.

Figure 82E:
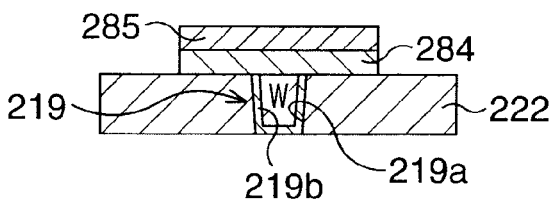

Subsequently, as shown in FIG. 82E, the conductive layer 284 is processed.

Particularly, with the TiN film 285 being a mask, the conductive layer 284 is patterned in an electrode form by dry etching.

Figure 83A:
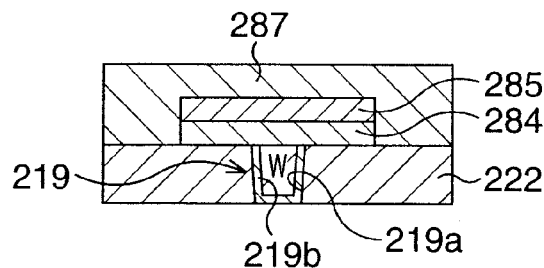
FIG. 83A to FIG. 83C are schematic cross-sectional views showing the structure of the FeRAM according to the modification example 14 of the second embodiment together with the manufacturing method thereof (main steps) in the order of steps, continuing from FIG. 82E.

Subsequently, as shown in FIG. 83A, a silicon nitride film 287 is formed.

Particularly, the silicon nitride film 287 is formed by deposition so as to cover the processed conductive layer 284 and TiN film 285 by a CVD method or the like.

Figure 83B:
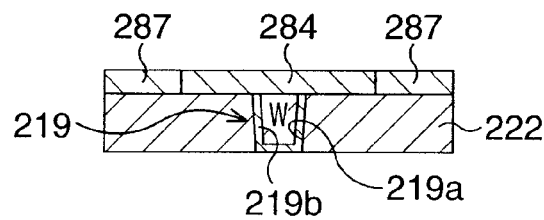

Subsequently, as shown in FIG. 83B, the silicon nitride film 287 and the TiN film 285 are planarized.

Particularly, with the conductive layer 284 being a stopper, the silicon nitride film 287 and the TiN film 285 are polished by a CMP method. At this time, the TiN film 285 is removed, and thus the silicon nitride film 287 is planarized in a state that the conductive layer 284 is exposed.

Figure 83C:
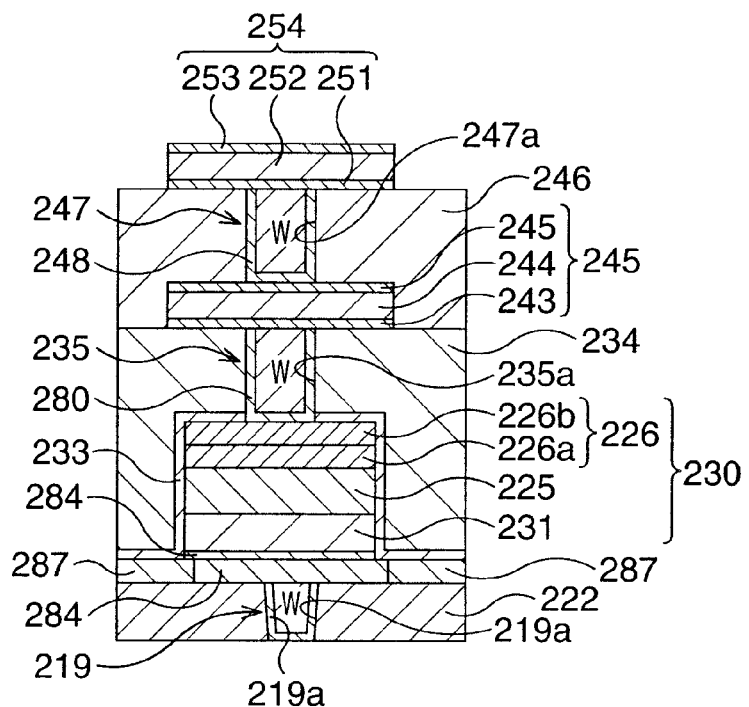

Then, similarly to the second embodiment, the respective steps of FIG. 38D to FIG. 42B are performed to obtain the structure shown in FIG. 83C.

Thereafter, steps of forming an interlayer insulating film and a further upper layer wire, and so on are performed, thereby completing the stack type FeRAM according to this example.

In this example, the W filling up the via hole 235a is separated from the upper electrode 232 by the glue film 227 constituted of the silicide film, so that entrance into the plug 235 of oxygen activated due to the $IrO_2$ film 226a constituting the upper electrode 232, oxygen activated due to the Pt film 226b, and the like is inhibited, thereby preventing oxidation of the plug 235.

Furthermore, the W filling up the via hole 219a is separated from the upper electrode 232 by the conductive layer 284 having conductivity even when oxidized. The conductive layer 284 absorbs oxygen, so to speak due to oxidation of itself, but it does not impair the electrical connection function of the plug 219 because it maintains conductivity even when oxidized. By this conductive layer 284, oxidation of the plug 219 is prevented.

As described above, according to this example, oxidation of the plugs 235, 219 connected to the ferroelectric capacitor structure 230 on its top and bottom is inhibited, so that a highly reliable stack type FeRAM with stabilized contact resistance can be realized.

Modification Example 15

In this example, similarly to the second embodiment, a structure of a stack type FeRAM and a manufacturing method thereof will be disclosed, but this example is different in that a silicide film is formed on the ferroelectric capacitor structure 230, and a silicide film and a conductive layer having conductivity even when oxidized are formed under the ferroelectric capacitor structure 230.

Figure 84A:
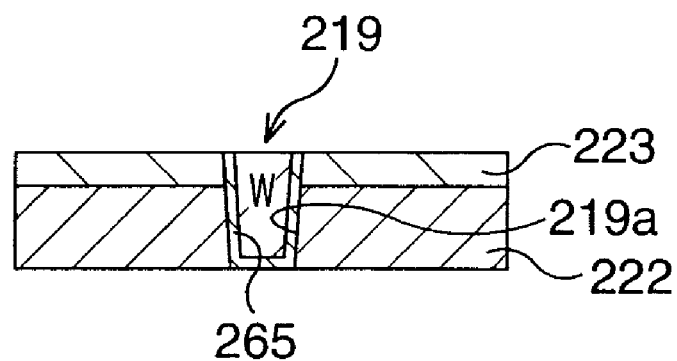
FIG. 84A and FIG. 84B are schematic cross-sectional views showing a structure of an FeRAM according to modification example 15 of the second embodiment together with a manufacturing method thereof (main steps) in the order of steps.
Figure 84B:
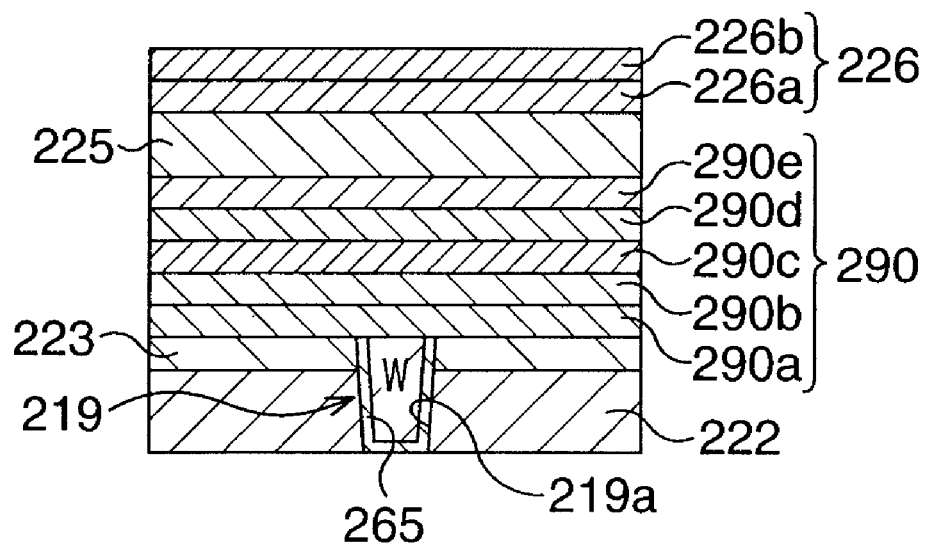
Figure 85:
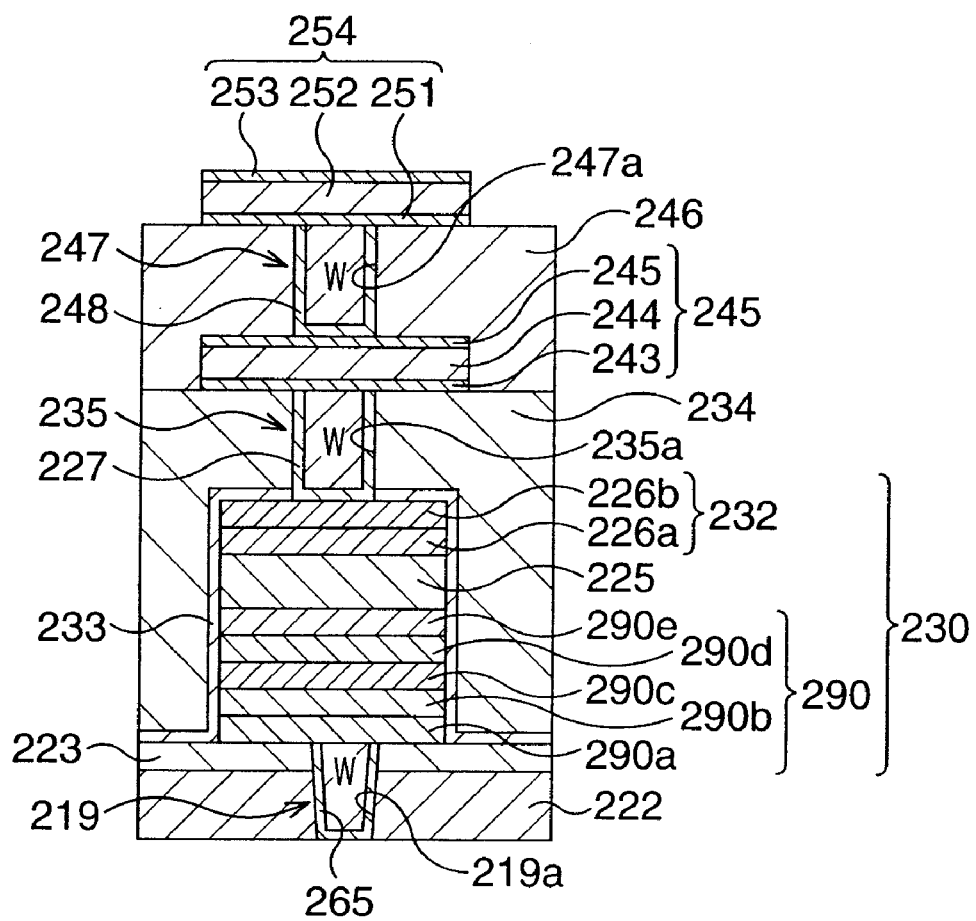
FIG. 85 is a schematic cross-sectional view showing the structure of the FeRAM according to the modification example 15 of the second embodiment together with the manufacturing method thereof (main steps) in the order of steps, continuing from FIG. 84B.

FIG. 84A to FIG. 85 are schematic cross-sectional views showing a structure of an FeRAM according to modification example 15 of the second embodiment together with a manufacturing method thereof (main steps) in the order of steps.

First, similarly to the second embodiment, the respective steps of FIG. 38A and FIG. 38B are performed.

Subsequently, as shown in FIG. 84A, a plug 219 connected to the source/drain region 218 of the transistor structure 220 is formed. Note that in FIG. 84A and respective subsequent drawings, for convenience of illustration, only the structure of the interlayer insulating film 222 and above is shown, and the silicon semiconductor substrate 210, the MOS transistor 220, and so on are omitted therefrom.

Particularly, first, with the source/drain region 218 being an etching stopper, the upper insulating film 223, the interlayer insulating film 222, and the protection film 221 are processed by lithography and subsequent dry etching until part of a surface of the source/drain region 218 exposes, thereby forming a via hole 219a with a diameter of approximately 0.3 μm for example.

Next, as a conductor impervious to oxygen, a silicide film as a base film of the plug 219, for example a Ti silicide (TiSi) film is formed by deposition with a film thickness of approximately 50 nm, thereby forming a base film (glue film) 265. As the silicide film, at least one type selected from Ti silicide, Co silicide, Mo silicide, Nb silicide, Ta silicide, W silicide, and V silicide is used.

Then, a W film for example is formed by a CVD method so as to fill up the via hole 219a via the glue film 265. Thereafter, with the upper insulating film 223a being a stopper, the W film and the glue film 265 are polished by CMP, thereby forming the plug 219 in which the via hole 219a is filled up with W via the glue film 265. After the CMP, plasma annealing of $N_2O$ for example is performed.

Subsequently, as shown in FIG. 84B, a lower electrode layer 290 constituted of layered films impervious to oxygen, a ferroelectric film 225 and an upper electrode layer 226 are formed sequentially.

Particularly, first, as the lower electrode layer 290 impervious to oxygen, a silicide film 290a (with a film thickness of approximately 50 nm), a conductive layer 290b (with a film thickness of approximately 100 nm) which is a metal having conductivity even when oxidized, for example an Ir film, a Pt film 290c (with a film thickness of approximately 100 nm) which is a noble metal, a silicide film 290d (with a film thickness of approximately 50 nm), and a Ti film 290e (with a film thickness of approximately 20 nm) are formed sequentially so as to cover the plug 219.

Here as the silicide films 290a, 290d, at least one type selected from Ti silicide, Co silicide, Mo silicide, Nb silicide, Ta silicide, W silicide, and V silicide is used.

Also, as the conductive layer 290b having conductivity even when oxidized, one containing at least one type selected from Ag, Ni, Cu, Zn, In, Sn, Ir, Ru, Rh, Pd, and Os is used. When two or more types are selected, they may be used in an alloy state.

Also, instead of the Pt film 290c, a metal film of other noble metal film or the like may be formed. Furthermore, the Ti film 290e need not be formed.

Next, on the lower electrode layer 290, the ferroelectric film 225 constituted of PZT for example, which is a ferroelectric, is deposited with a film thickness of approximately 100 nm to 300 nm by an RF sputtering method. Then, the ferroelectric film 225 is annealed to crystallize the ferroelectric film 225. Conditions of this annealing are such that it is performed for 60 seconds to 120 seconds at 550° C. to 650° C. for example while supplying $Ar/O_2$ gases at flow rates of 1.98 liter/minute of Ar and 0.025 liter/minute of $O_2$.

Next, the upper electrode layer 226 is formed by deposition on the ferroelectric film 225.

As the upper electrode layer 226, first, an $IrO_2$ film 226a for example which is a conductive oxide is formed with a film thickness of approximately 200 nm by a reactive sputtering method. Thereafter, the $IrO_2$ film 226a is annealed. Conditions of this annealing are such that it is performed for 10 seconds to 60 seconds at 650° C. to 850° C. for example while supplying $Ar/O_2$ gases at flow rates of 2.0 liter/minute of Ar and 0.02 liter/minute of $O_2$. Then, on the $IrO_2$ film 226a, a noble metal film, here a Pt film 226b, which functions as a cap film for the $IrO_2$ film 226a is formed with a film thickness of approximately 100 nm by a sputtering method. The $IrO_2$ film 226a and the Pt film 226b constitute the upper electrode layer 226. Note that for the upper electrode layer 226, instead of the $IrO_2$ film 226a, a conductive oxide of Ir, Ru, $RuO_2$, $SrRuO_3$ or the like or a layered structure of them may be adopted. Further, it is also possible to omit formation of the Pt film 226b.

Then, similarly to the second embodiment, the respective steps of FIG. 39A to FIG. 42B are performed to obtain the structure shown in FIG. 85. Here, the lower electrode formed by processing the lower electrode layer 290 is referred to as 291.

Thereafter, steps of forming an interlayer insulating film and a further upper layer wire, and so on are performed, thereby completing the stack type FeRAM according to this example.

In this example, the W filling up the via hole 235a is separated from the upper electrode 232 by the glue film 227 constituted of the silicide film. Therefore, entrance into the plug 235 of oxygen activated due to the $IrO_2$ film 226a constituting the upper electrode 232, oxygen activated due to the Pt film 226b, oxygen activated due to Pt constituting the lower electrode 231, and the like is inhibited, thereby preventing oxidation of the plug 235. Similarly, the W filling up the via hole 219a is surrounded by the glue film 265 constituted of the silicide film, thereby preventing oxidation of the plug 219.

Furthermore, the W filling up the via hole 219a is covered from a bottom face to a side face by the glue film 265, and an upper face of the W filling up the via hole 219a is covered by the lower electrode 291 constituted by appropriately layering including the silicide films 290a, 290d, and the conductive layer 290b having conductivity even when oxidized. The W is in a state of being substantially completely isolated from the ferroelectric capacitor structure 230 existing at a lower layer thereof by the glue film 265 and the lower electrode 291. Therefore, oxidation of the plug 219 is prevented.

As described above, according to this example, oxidation of the plugs 235, 219 connected to the ferroelectric capacitor structure 230 on its top and bottom is inhibited, so that a highly reliable stack type FeRAM with stabilized contact resistance can be realized.

Modification Example 16

In this example, similarly to the second embodiment, a structure of a stack type FeRAM and a manufacturing method thereof will be disclosed, but this example is different in that a conductive layer having conductivity even when oxidized is applied to the glue films of the conductive plugs connecting the wires located at an upper layer of the ferroelectric capacitor structure 230.

FIG. 86A to FIG. 86E are schematic cross-sectional views showing a structure of an FeRAM according to modification example 16 of the second embodiment together with a manufacturing method thereof (main steps) in the order of steps.

First, similarly to the second embodiment, the respective steps of FIG. 38A to FIG. 42A are performed.

Figure 86A:
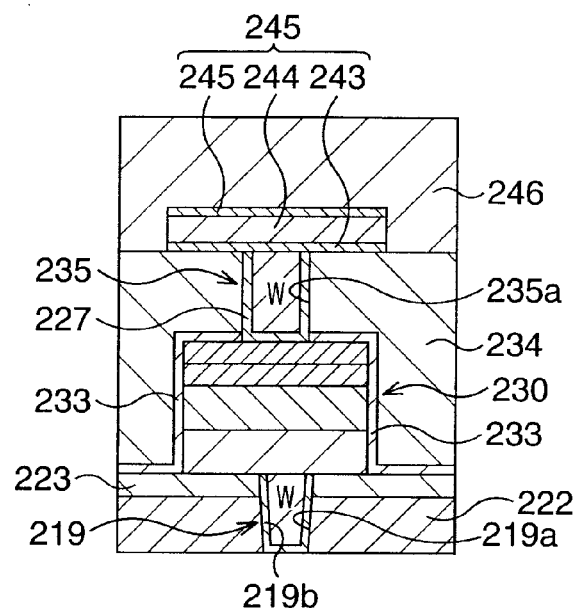
FIG. 86A to FIG. 86E are schematic cross-sectional views showing a structure of an FeRAM according to modification example 16 of the second embodiment together with a manufacturing method thereof (main steps) in the order of steps.

Subsequently, as shown in FIG. 86A, an interlayer insulating film 246 is formed so as to cover the first wire 245.

Particularly, a silicon oxide film is formed with a film thickness of approximately 700 nm so as to cover the first wire 245, and a plasma TEOS film is formed thereon so that a total film thickness thereof is approximately 1100 nm. Thereafter, the surface thereof is polished by CMP to make the film thickness approximately 750 nm, thereby forming the interlayer insulating film 246. After the CMP, plasma annealing of $N_2O$ for example is performed.

Figure 86B:
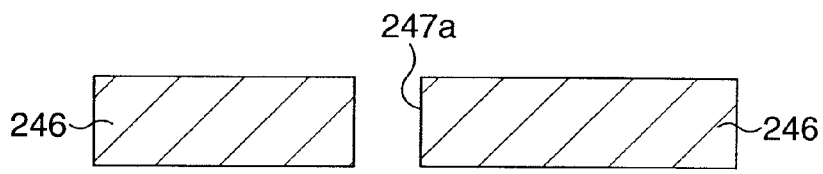

Subsequently, as shown in FIG. 86B, a via hole 247a which exposes a surface of the first wire 245 is formed. Note that in FIG. 86B and respective subsequent drawings, for convenience of illustration, only the structure of the interlayer insulating film 246 and above is shown, and the ferroelectric capacitor structure 230, the first wire 245, and so on are omitted therefrom.

Particularly, until part of a surface of the first wire 245 exposes, the interlayer insulating film 246 is processed by lithography and subsequent dry etching, thereby forming a via hole 247a with a diameter of approximately 0.25 μm for example.

Figure 86C:
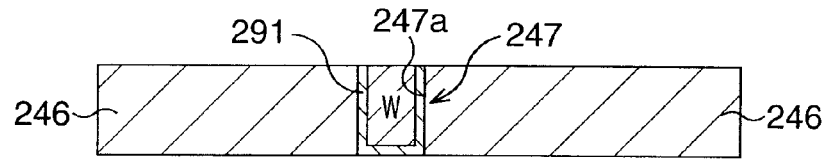

Subsequently, as shown in FIG. 86C, the plug 247 connected to the first wire 245 is formed.

Particularly, in order to inhibit oxidation of the plug 247 due to oxygen generated from the ferroelectric capacitor structure 230 (particularly, oxygen activated by the Pt film 226b), the base film of the plug 247 is formed with a metal film which is a conductor impervious to oxygen (capable of absorbing oxygen) and has conductivity even when oxidized. Specifically, a metal having conductivity even when oxidized, for example an Ir film is deposited with a film thickness of approximately 50 nm so as to cover a wall surface of the via hole 247a, thereby forming a base film (glue film) 291. As the metal having conductivity even when oxidized, one containing at least one type selected from Ag, Ni, Cu, Zn, In, Sn, Ir, Ru, Rh, Pd, and Os is used. When two or more types are selected, they may be used in an alloy state.

Then, a W film for example is formed by a CVD method so as to fill up the via hole 247a via the glue film 291. Thereafter, with the interlayer insulating film 246 being a stopper, the W film and the glue film 291 are polished by CMP, thereby forming the plug 247 in which the via hole 247a is filled up with W via the glue film 291.

In this example, the W filling up the via hole 247a is covered from a bottom face to a side face by the glue film 291 constituted of the Ir film which is a metal having conductivity even when oxidized, and the W and the upper electrode 232 are separated by the glue film 291. The glue film 291 absorbs oxygen, so to speak due to oxidation of itself, but it does not impair the electrical connection function of the plug 247 because it maintains conductivity even when oxidized. By this glue film 291, entrance into the plug 247 of oxygen activated due to the $IrO_2$ film 226a constituting the upper electrode 232, oxygen activated due to the Pt film 226b, and the like is inhibited, thereby preventing oxidation of the plug 247.

Note that in this example, the case of applying the silicide film to the glue film of the plug 235 connected to the ferroelectric capacitor structure 230, and applying the metal film having conductivity even when oxidized to the glue film of the plug 247 connected to the first wire 245 is exemplified, but it is also preferable to apply the metal film having conductivity to the glue film of the plug 235 connected to the ferroelectric capacitor structure 230. Also, when attaching much weight to the achievement of preventing oxidation of the plug 247 in particular, the metal film having conductivity even when oxidized may be applied only to the glue film of the plug 247 connected to the first wire 245.

Figure 86D:
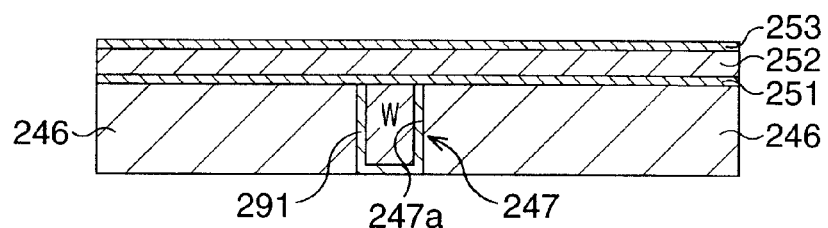

Subsequently, as shown in FIG. 86D, a barrier metal film 251, a wiring film 252 and a barrier metal film 253 are deposited on the entire surface by a sputtering method or the like.

Particularly, as the barrier metal film 251, a TiN film for example is formed with a film thickness of approximately 150 nm by a sputtering method. As the wiring film 252, an Al alloy film (here an Al—Cu film) for example is formed with a film thickness of approximately 350 nm. As the barrier metal film 253, a TiN film for example is formed with a film thickness of approximately 150 nm by a sputtering method. Here, the structure of the wiring film 252 is the same as that of a logic part other than the FeRAM of the same rules, so that there is no problem in processing of wires or reliability thereof.

Figure 86E:
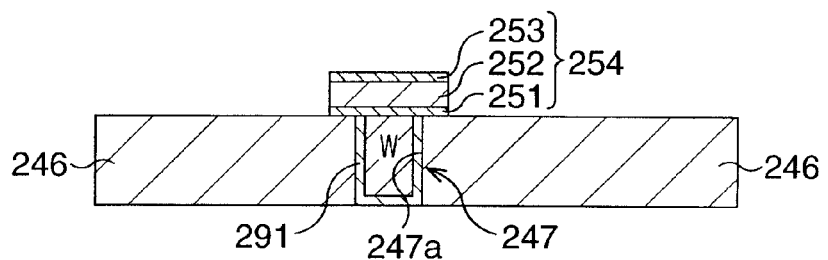

Subsequently, as shown in FIG. 86E, a second wire 254 connected to the plug 247 is formed.

Particularly, as a reflection preventing film, for example an SiON film or a reflection preventing film (not-shown) is formed, and thereafter the reflection preventing film, the barrier metal film 253, the wiring film 252 and the barrier metal film 251 are processed in a wiring form by lithography and subsequent dry etching, thereby pattern-forming the second wire 254.

Thereafter, steps of forming an interlayer insulating film and a further upper layer wire, and so on are performed, thereby completing the stack type FeRAM according to this example. Here, when forming further upper layer wires, a silicide film as described above is applied to a glue film of a plug (a plug constituted of W) connecting the upper layer wires, similarly to the plug 247.

As described above, according to this example, oxidation of the plug 235 connected to the upper electrode 232 of the ferroelectric capacitor structure 230 as well as the plug 247 connected to the first wire 245 is inhibited, so that a highly reliable stack type FeRAM with stabilized contact resistance can be realized.

Modification Example 17

In this example, similarly to the second embodiment, a structure of a stack type FeRAM and a manufacturing method thereof will be disclosed, but this example is different in that part of wires located at an upper layer of the ferroelectric capacitor structure 230 are formed by a so-called damascene method, and a conductive layer having conductivity even when oxidized is applied to the glue films of the wires and the conductive plugs.

FIG. 87A to FIG. 89B are schematic cross-sectional views showing a structure of an FeRAM according to modification example 17 of the second embodiment together with a manufacturing method thereof (main steps) in the order of steps.

First, similarly to the second embodiment, the respective steps of FIG. 38A to FIG. 42A are performed.

Figure 87A:
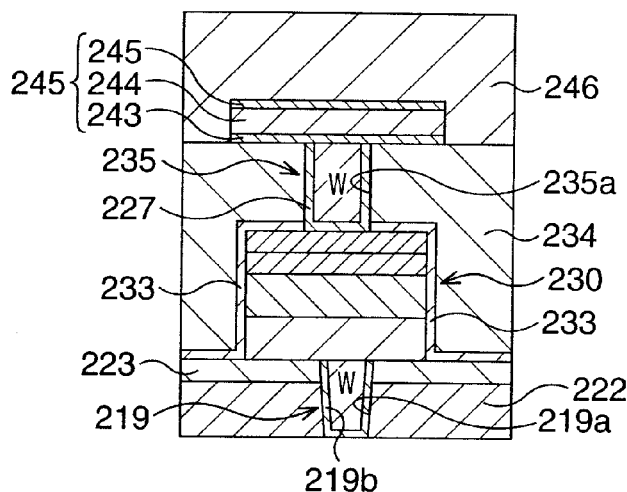
FIG. 87A to FIG. 87E are schematic cross-sectional views showing a structure of an FeRAM according to modification example 17 of the second embodiment together with a manufacturing method thereof (main steps) in the order of steps.

Subsequently, as shown in FIG. 87A, an interlayer insulating film 246 is formed so as to cover the first wire 245.

Particularly, a silicon oxide film is formed with a film thickness of approximately 700 nm so as to cover the first wire 245, and a plasma TEOS film is formed thereon so that a total film thickness thereof is approximately 1100 nm. Thereafter, the surface thereof is polished by CMP to make the film thickness approximately 750 nm, thereby forming the interlayer insulating film 246. After the CMP, plasma annealing of $N_2O$ for example is performed.

Figure 87B:
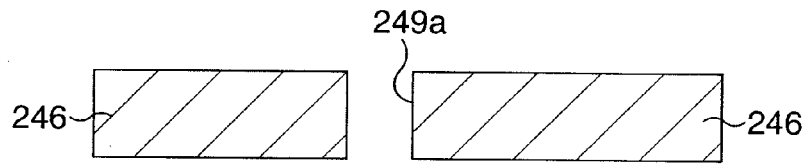

Subsequently, as shown in FIG. 87B, a via hole 249a which exposes a surface of the first wire 245 is formed. Note that in FIG. 87B and respective subsequent drawings, for convenience of illustration, only the structure of the interlayer insulating film 246 and above is shown, and the ferroelectric capacitor structure 230, the first wire 245, and so on are omitted therefrom.

Particularly, until part of a surface of the first wire 245 exposes, the interlayer insulating film 246 is processed by lithography and subsequent dry etching, thereby forming a via hole 249a with a diameter of approximately 0.25 μm for example.

Figure 87C:
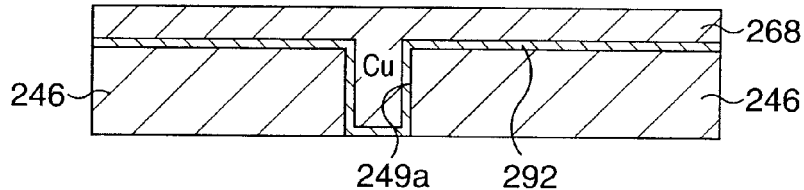

Subsequently, as shown in FIG. 87C, a base film 292 constituted of a conductive layer having conductivity even when oxidized is formed and Cu plating is performed.

Particularly, the base film is formed with a metal film which is a conductor impervious to oxygen (capable of absorbing oxygen) and has conductivity even when oxidized. Specifically, a metal having conductivity even when oxidized, for example an Ir film is deposited with a film thickness of approximately 50 nm so as to cover a wall surface of the via hole 249a, thereby forming a base film (glue film) 292. As the metal having conductivity even when oxidized, one containing at least one type selected from Ag, Ni, Cu, Zn, In, Sn, Ir, Ru, Rh, Pd, and Os is used. When two or more types are selected, they may be used in an alloy state.

Then, after a seed film (not-shown) of Cu is formed, a Cu (or an alloy thereof) film 268 is deposited on the glue film 292 by a plating method so as to fill up the via hole 249a via the glue film 292.

Figure 87D:
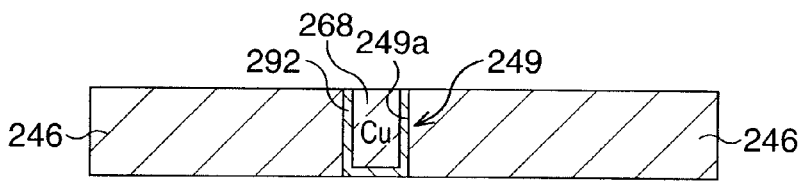

Subsequently, as shown in FIG. 87D, the plug 249 is formed.

Particularly, with the interlayer insulating film 246 being a stopper, the Cu film 268 and the glue film 292 are polished by CMP, thereby forming the plug 249 in which the via hole 249a is filled up with Cu via the glue film 292.

Figure 87E:
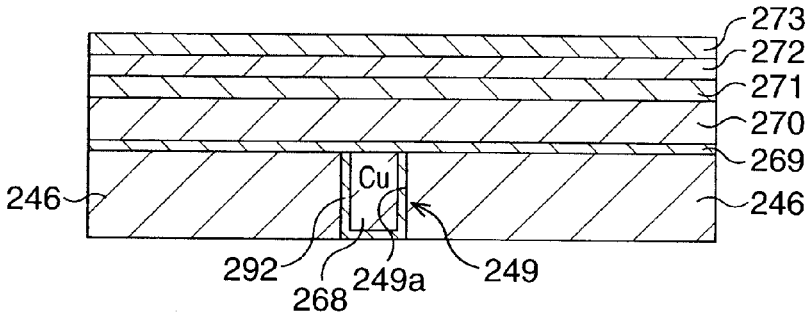

Subsequently, as shown in FIG. 87E, a silicon nitride film 269, an interlayer insulating film 270, an SOG film 271, an interlayer insulating film 272 and a silicon nitride film 273 are layered sequentially on the interlayer insulating film 246 so as to cover the plug 249.

Particularly, the silicon nitride film 269 is formed with a film thickness of approximately 50 nm to 100 nm by a CVD method for example. The interlayer insulating film 270 is formed with a film thickness of approximately 200 nm to 400 nm by a CVD method for example. The SOG film 271 is formed with a film thickness of approximately 100 nm to 200 nm by spin coating SOG. The interlayer insulating film 272 is formed with a film thickness of approximately 100 nm by a CVD method for example. The silicon nitride film 273 is formed with a film thickness of approximately 100 nm by a CVD method for example.

Figure 88A:
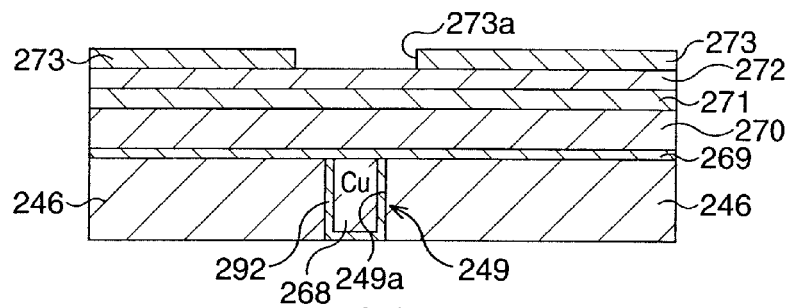
FIG. 88A to FIG. 88D are schematic cross-sectional views showing the structure of the FeRAM according to the modification example 17 of the second embodiment together with the manufacturing method thereof (main steps) in the order of steps, continuing from FIG. 87E.

Subsequently, as shown in FIG. 88A, the silicon nitride film 273 is processed.

Particularly, the silicon nitride film 273 is patterned by lithography and dry etching, thereby forming an opening 273a in a wiring form in the silicon nitride film 273.

Figure 88B:
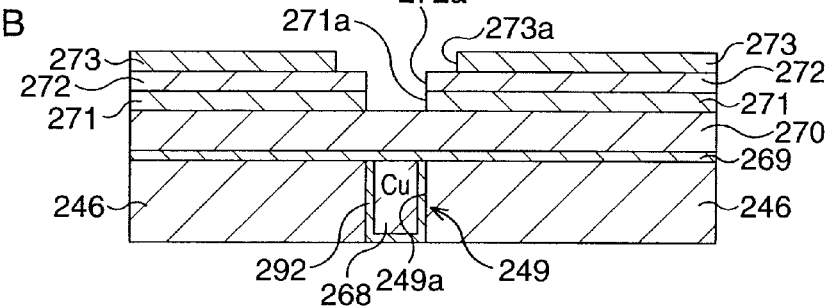

Subsequently, as shown in FIG. 88B, the interlayer insulating film 272 and the SOG film 271 are processed.

Particularly, the interlayer insulating film 272 and the SOG film 271 are patterned by lithography and dry etching, thereby forming openings 272a, 271a in a hole form at positions on the interlayer insulating film 272 and the SOG film 271 located above the plug 249 and matching with the opening 273a.

Figure 88C:
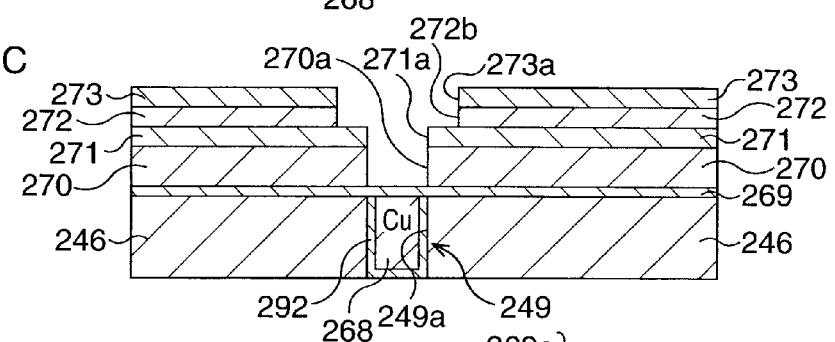

Subsequently, as shown in FIG. 88C, the interlayer insulating film 272 and the interlayer insulating film 270 are processed.

Particularly, using the silicon nitride film 273 as a hard mask, the interlayer insulating film 272 is patterned in a wiring form corresponding to the opening 273a by lithography and dry etching, thereby forming an opening 272b extending the opening 272a. At this time, simultaneously, the interlayer insulating film 272 and the SOG film 271 function as a mask, and the interlayer insulating film 270 is patterned in a hole form corresponding to the opening 271a, thereby forming an opening 270a.

Figure 88D:
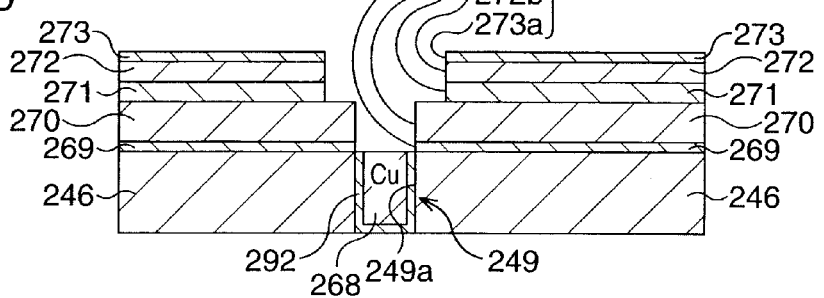

Subsequently, as shown in FIG. 88D, a wiring trench 274 is completed.

Particularly, using the silicon nitride film 273 as a hard mask, the silicon nitride film 269 is patterned by lithography and dry etching until a surface of the plug 247 exposes. At this time, an opening 271b in a wiring form extending the opening 271a corresponding to the openings 273a, 272b, is formed in the SOG film 271, and an opening 269a in a hole form corresponding to the opening 270a is formed in the silicon nitride film 269. Here, also the silicon nitride film 273 becomes thin by the film thickness of the silicon nitride film 269 by etching. At this time, the openings 269a, 270a formed in the silicon nitride film 269 and the interlayer insulating film 270 and the openings 271b, 272b, 273a formed in the SOG film 271, the interlayer insulating film 272 and the silicon nitride film 273 become integral, thereby completing the wiring trench 274.

Figure 89A:
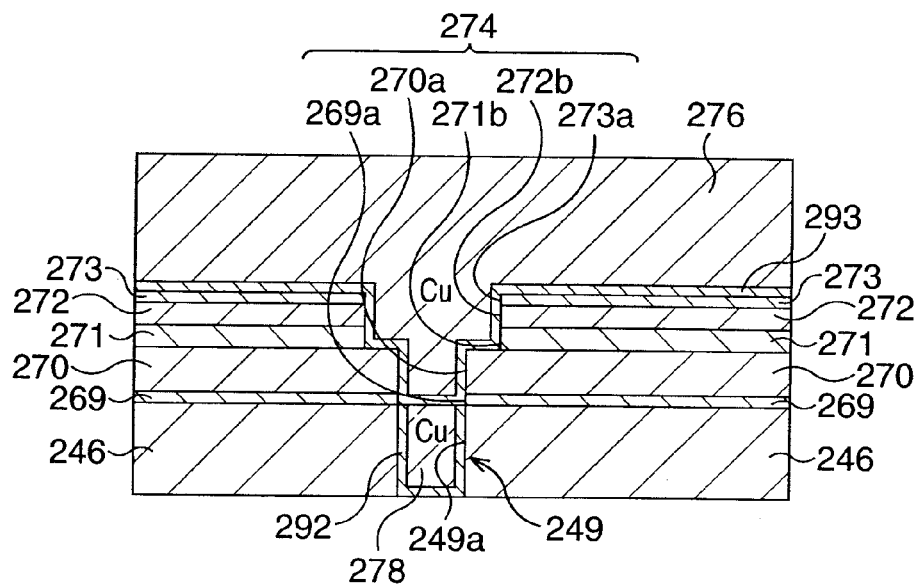
FIG. 89A and FIG. 89B are schematic cross-sectional views showing the structure of the FeRAM according to the modification example 17 of the second embodiment together with the manufacturing method thereof (main steps) in the order of steps, continuing from FIG. 88D.

Subsequently, as shown in FIG. 89A, a base film 293 constituted of a conductive layer having conductivity even when oxidized is formed and Cu plating is performed.

Particularly, the base film is formed with a metal film which is a conductor impervious to oxygen (capable of absorbing oxygen) and has conductivity even when oxidized. Specifically, a metal having conductivity even when oxidized, for example an Ir film is deposited with a film thickness of approximately 10 nm to 20 nm so as to cover respective wall surfaces of the wiring trench 274, thereby forming a base film (glue film) 293. As the metal having conductivity even when oxidized, one containing at least one type selected from Ag, Ni, Cu, Zn, In, Sn, Ir, Ru, Rh, Pd, and Os is used. When two or more types are selected, they may be used in an alloy state.

Then, after a seed film (not-shown, having a film thickness of approximately 130 nm) of Cu is formed, a Cu film 276 is deposited on the glue film 293 by a plating method so as to fill up the wiring trench 274 via the glue film 293.

Figure 89B:
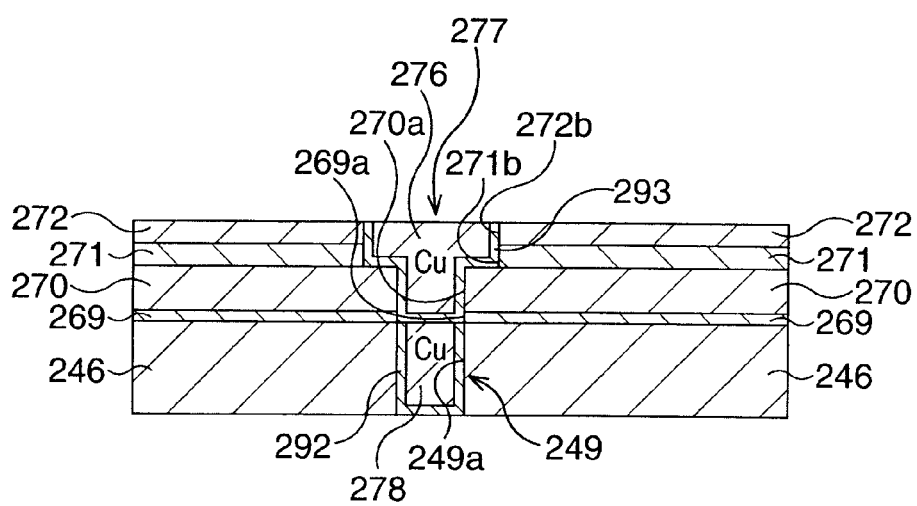

Subsequently, as shown in FIG. 89B, a wiring structure 277 is formed.

Particularly, with the interlayer insulating film 272 being a stopper, the Cu film 276, the glue film 293 and the silicon nitride film 273 are polished by CMP, and the wiring trench 274 is filled up with Cu (or an alloy thereof) via the glue film 293, thereby forming the wiring structure 277 electrically connected to the first wire 245 via the plug 249. Here, in the wiring structure 277, a part where spaces of the openings 269a, 270a are filled up with Cu via the glue film 293 corresponds to a conductive plug part and a part where spaces of the openings 271b, 272b are filled up with Cu via the glue film 293 corresponds to a wire part, and thus the conductive plug part and the wire part are formed integrally.

Thereafter, steps of forming an interlayer insulating film and a further upper layer wire by a damascene method, and so on are performed, thereby completing the stack type FeRAM according to this example. Here, when the further upper layer wire is formed, the silicide film as described above is applied to a glue film thereof, similarly to the wiring structure 277.

In this example, the Cu filling up the via hole 249a is covered from a bottom face to a side face by the glue film 292 which is the conductive layer having conductivity even when oxidized, and the Cu filling up the wiring trench 274 is covered from a bottom face to a side face by the glue film 293 which is the conductive layer having conductivity even when oxidized. These Cu are in a state of being isolated from the ferroelectric capacitor structure 230 existing at a lower layer thereof by the glue films 292, 293. Accordingly, entrance into the plug 249 and the wiring structure 277 of oxygen activated due to the $IrO_2$ film 226a constituting the upper electrode 232, oxygen activated due to the Pt film 226b, and the like is inhibited as much as possible, thereby preventing oxidation of the plug 249 and the wiring structure 277.

Note that in this example, the case of applying the silicide film to the glue film of the plug 235 connected to the ferroelectric capacitor structure 230, and also applying the conductive layer having conductivity even when oxidized to the glue films of the plug 249 connected to the first wire 245 and the wiring structure 277 is exemplified, but when attaching much weight to the achievement of preventing oxidation of the plug 247 and the wiring structure 277 in particular, the conductive layer having conductivity even when oxidized may be applied only to the glue films of the plug 247 and the wiring structure 277.

As described above, according to this example, oxidation of the plug 235 connected to the ferroelectric capacitor structure 230 as well as the plug 249 connected to the first wire 245 and the wiring structure 277 is inhibited, so that a highly reliable stack type FeRAM with stabilized contact resistance can be realized.

Modification Example 18

In this example, in the structure of the modification example 17, the glue films are formed as a layered structure of a silicide film and a conductive protection film which inhibits permeation of hydrogen.

FIG. 90A to FIG. 92B are schematic cross-sectional views showing a structure of an FeRAM according to modification example 18 of the second embodiment together with a manufacturing method thereof (main steps) in the order of steps.

First, similarly to the second embodiment, the respective steps of FIG. 38A to FIG. 42A are performed.

Figure 90A:
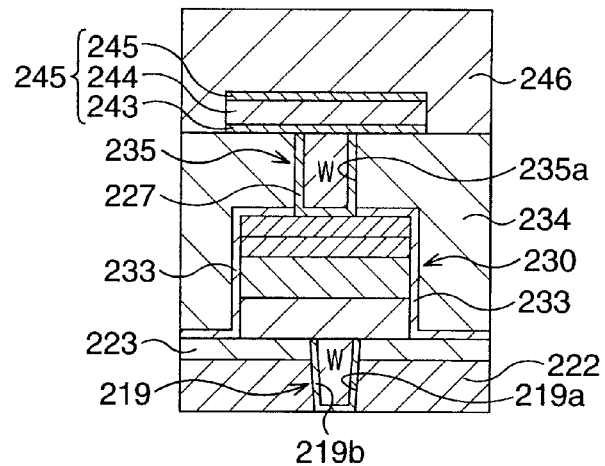
FIG. 90A to FIG. 90E are schematic cross-sectional views showing a structure of an FeRAM according to modification example 18 of the second embodiment together with a manufacturing method thereof (main steps) in the order of steps.

Subsequently, as shown in FIG. 90A, an interlayer insulating film 246 is formed so as to cover the first wire 245.

Particularly, a silicon oxide film is formed with a film thickness of approximately 700 nm so as to cover the first wire 245, and a plasma TEOS film is formed thereon so that a total film thickness thereof is approximately 1100 nm. Thereafter, the surface thereof is polished by CMP to make the film thickness approximately 750 nm, thereby forming the interlayer insulating film 246. After the CMP, plasma annealing of $N_2O$ for example is performed.

Figure 90B:
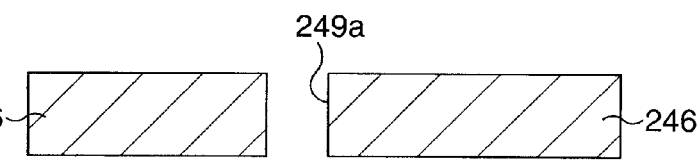

Subsequently, as shown in FIG. 90B, a via hole 249a which exposes a surface of the first wire 245 is formed. Note that in FIG. 90B and respective subsequent drawings, for convenience of illustration, only the structure of the interlayer insulating film 246 and above is shown, and the ferroelectric capacitor structure 230, the first wire 245, and so on are omitted therefrom.

Particularly, until part of a surface of the first wire 245 exposes, the interlayer insulating film 246 is processed by lithography and subsequent dry etching, thereby forming a via hole 249a with a diameter of approximately 0.25 µm for example.

Figure 90C:
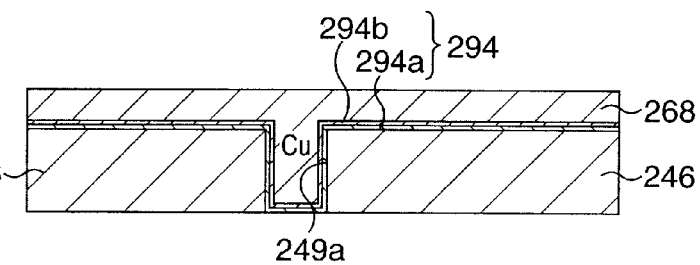

Subsequently, as shown in FIG. 90C, a base film 294 which is the layered structure of a conductive layer having conductivity even when oxidized and a conductive protection film which inhibits permeation of hydrogen is formed and Cu plating is performed.

Particularly, the conductive layer which is a conductor impervious to oxygen and has conductivity even when oxidized and a conductive protection film which prevents entrance of hydrogen are layered to form the base film. Specifically, a conductive layer 294a, for example an Ir film (with a film thickness of approximately 20 nm) and a conductive protection film which inhibits permeation of hydrogen, for example a TiAlN film 294b (with a film thickness of approximately 50 nm) are deposited sequentially on the interlayer insulating film 246 so as to cover an inner wall surface of the via hole 249a, thereby forming the base film (glue film) 294 of layered structure. As the conductive layer 294a, one containing at least one type selected from Ag, Ni, Cu, Zn, In, Sn, Ir, Ru, Rh, Pd, and Os is used. When two or more types are selected, they may be used in an alloy state. Further, as the conductive protection film which inhibits permeation of hydrogen, at least one type selected from TiN, TiSiN, TaN, CrN, HfN, ZrN, TiAlN, TaAlN, CrAlN, and HfAlN is used.

Then, after a seed film (not-shown) of Cu is formed, a Cu (or an alloy thereof) film 268 is deposited on the glue film 294 by a plating method so as to fill up the via hole 249a via the glue film 294.

Figure 90D:
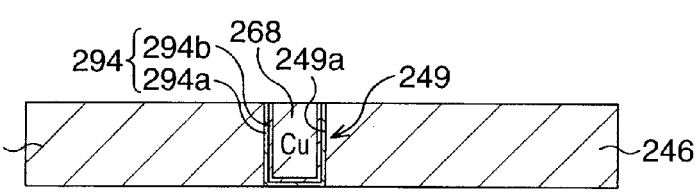

Subsequently, as shown in FIG. 90D, the plug 249 is formed.

Particularly, with the interlayer insulating film 246 being a stopper, the Cu film 268 and the glue film 294 are polished by CMP, thereby forming the plug 249 in which the via hole 249a is filled up with Cu via the glue film 294.

Figure 90E:
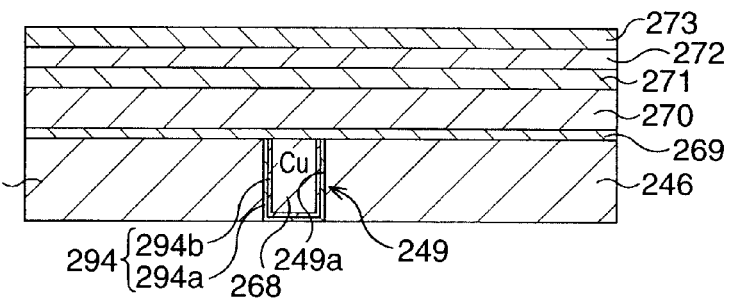

Subsequently, as shown in FIG. 90E, a silicon nitride film 269, an interlayer insulating film 270, an SOG film 271, an interlayer insulating film 272 and a silicon nitride film 273 are layered sequentially on the interlayer insulating film 246 so as to cover the plug 249.

Particularly, the silicon nitride film 269 is formed with a film thickness of approximately 50 nm to 100 nm by a CVD method for example. The interlayer insulating film 270 is formed with a film thickness of approximately 200 nm to 400 nm by a CVD method for example. The SOG film 271 is formed with a film thickness of approximately 100 nm to 200 nm by spin coating SOG. The interlayer insulating film 272 is formed with a film thickness of approximately 100 nm by a CVD method for example. The silicon nitride film 273 is formed with a film thickness of approximately 100 nm by a CVD method for example.

Subsequently, as shown in FIG. 91A, the silicon nitride film 273 is processed.

Particularly, the silicon nitride film 273 is patterned by lithography and dry etching, thereby forming an opening 273a in a wiring form in the silicon nitride film 273.

Subsequently, as shown in FIG. 91B, the interlayer insulating film 272 and the SOG film 271 are processed.

Particularly, the interlayer insulating film 272 and the SOG film 271 are patterned by lithography and dry etching, thereby forming openings 272a, 271a in a hole form at positions on the interlayer insulating film 272 and the SOG film 271 located above the plug 249 and matching with the opening 273a.

Subsequently, as shown in FIG. 91C, the interlayer insulating film 272 and the interlayer insulating film 270 are processed.

Particularly, using the silicon nitride film 273 as a hard mask, the interlayer insulating film 272 is patterned in a wiring form corresponding to the opening 273a by lithography and dry etching, thereby forming an opening 272b extending the opening 272a. At this time, simultaneously, the interlayer insulating film 272 and the SOG film 271 function as a mask, and the interlayer insulating film 270 is patterned in a hole form corresponding to the opening 271a, thereby forming an opening 270a.

Subsequently, as shown in FIG. 91D, a wiring trench 274 is completed.

Particularly, using the silicon nitride film 273 as a hard mask, the silicon nitride film 269 is patterned by lithography and dry etching until a surface of the plug 247 exposes. At this time, an opening 271b in a wiring form extending the opening 271a corresponding to the openings 273a, 272b, is formed in the SOG film 271, and an opening 269a in a hole form corresponding to the opening 270a is formed in the silicon nitride film 269. Here, also the silicon nitride film 273 becomes thin by the film thickness of the silicon nitride film 269 by etching. At this time, the openings 269a, 270a formed in the silicon nitride film 269 and the interlayer insulating film 270 and the openings 271b, 272b, 273a formed in the SOG film 271, the interlayer insulating film 272 and the silicon nitride film 273 become integral, thereby completing the wiring trench 274.

Figure 92A:
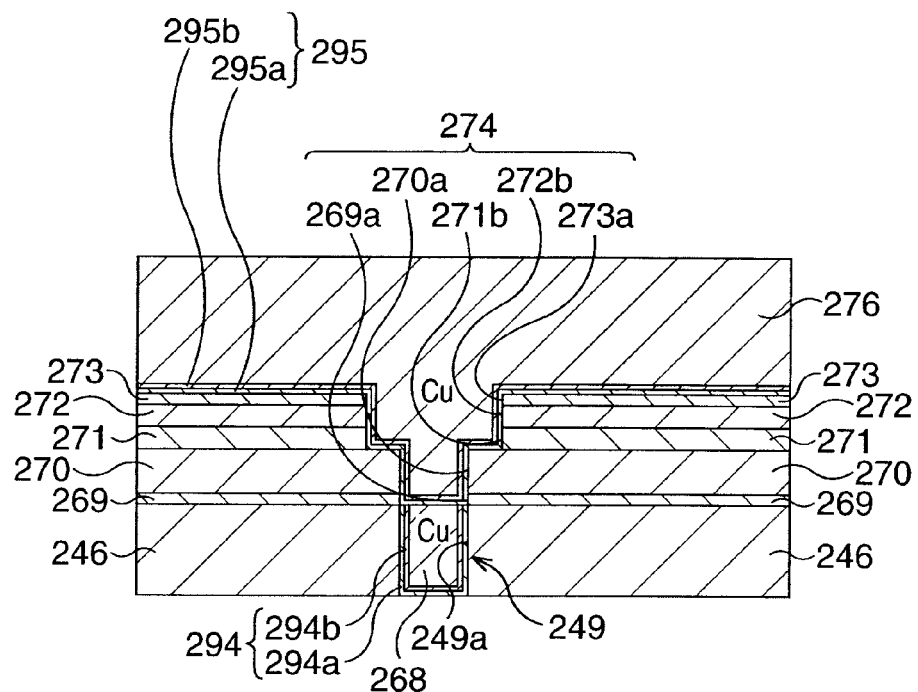
FIG. 92A and FIG. 92B are schematic cross-sectional views showing the structure of the FeRAM according to the modification example 18 of the second embodiment together with the manufacturing method thereof (main steps) in the order of steps, continuing from FIG. 91D.

Subsequently, as shown in FIG. 92A, a base film 295 is formed and Cu plating is performed.

Particularly, a conductive layer which is a conductor impervious to oxygen and has conductivity even when oxidized and a conductive protection film which prevents entrance of hydrogen are layered to form the base film. Specifically, a conductive layer 295a, for example an Ir film (with a film thickness of approximately 20 nm) and a conductive protection film which inhibits permeation of hydrogen, for example a TiAlN film 295b (with a film thickness of approximately 50 nm) are deposited sequentially on the silicon nitride film 273 so as to cover an inner wall surface of the wiring trench 274, thereby forming the base film (glue film) 295 of layered structure. As the conductive layer 295a, one containing at least one type selected from Ag, Ni, Cu, Zn, In, Sn, Ir, Ru, Rh, Pd, and Os is used. When two or more types are selected, they may be used in an alloy state. Further, as the conductive protection film which inhibits permeation of hydrogen, at least one type selected from TiN, TiSiN, TaN, CrN, HfN, ZrN, TiAlN, TaAlN, CrAlN, and HfAlN is used.

Then, after a seed film (not-shown, having a film thickness of approximately 130 nm) of Cu is formed, a Cu film 276 is deposited on the glue film 295 by a plating method so as to fill up the wiring trench 274 via the glue film 295.

Figure 92B:
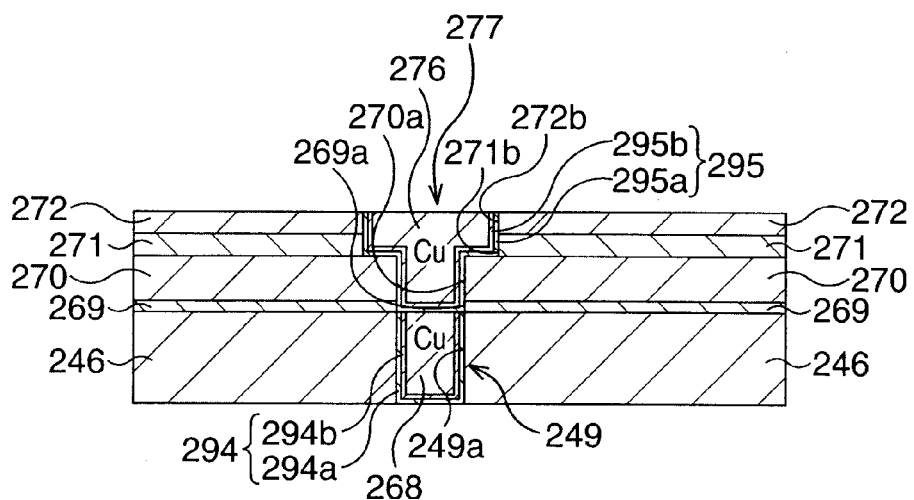

Subsequently, as shown in FIG. 92B, a wiring structure 277 is formed.

Particularly, with the interlayer insulating film 272 being a stopper, the Cu film 276, the glue film 295 and the silicon nitride film 273 are polished by CMP, and the wiring trench 274 is filled up with Cu (or an alloy thereof) via the glue film 295, thereby forming the wiring structure 277 electrically connected to the first wire 245 via the plug 249. Here, in the wiring structure 277, a part where spaces of the openings 269a, 270a are filled up with Cu via the glue film 295 corresponds to a conductive plug part and a part where spaces of the openings 271b, 272b are filled up with Cu via the glue film 295 corresponds to a wire part, and thus the conductive plug part and the wire part are formed integrally.

Thereafter, steps of forming an interlayer insulating film and a further upper layer wire by a damascene method, and so on are performed, thereby completing the stack type FeRAM according to this example. Here, when the further upper layer wire is formed, the layered films of the silicide film and the conductive protection film which inhibits permeation of hydrogen as described above are applied to a glue film thereof, similarly to the wiring structure 277.

In this example, the Cu filling up the via hole 249a is covered from a bottom face to a side face by the glue film 294 which is formed as the layered structure of the conductive layer having conductivity even when oxidized and the conductive protection film having a function of inhibiting permeation of hydrogen, and the Cu filling up the wiring trench 274 is covered from a bottom face to a side face by the glue film 295 which is formed as the layered structure of the conductive layer having conductivity even when oxidized and the conductive protection film having a function of inhibiting permeation of hydrogen. These Cu are in a state of being isolated from the ferroelectric capacitor structure 230 existing at a lower layer thereof by the glue films 294, 295. Accordingly, entrance into the plug 249 and the wiring structure 277 of oxygen activated due to the IrO$_2$ film 226a constituting the upper electrode 232, oxygen activated due to the Pt film 226b, and the like is inhibited as much as possible, thereby preventing oxidation of the plug 249 and the wiring structure 277 and also preventing entrance of hydrogen into the plug 249 and the wiring structure 277.

Note that in this example, the case of applying the silicide film to the glue film of the plug 235 connected to the ferroelectric capacitor structure 230, and also applying the layered structure of the conductive layer having conductivity even when oxidized and the conductive protection film having a function of inhibiting permeation of hydrogen to the glue films of the plug 249 connected to the first wire 245 and the wiring structure 277 is exemplified, but when attaching much weight to the achievement of preventing oxidation of the plug 247 and the wiring structure 277 in particular, the layered structure of the conductive layer having conductivity even when oxidized and the conductive protection film having a function of inhibiting permeation of hydrogen may be applied only to the glue films of the plug 247 and the wiring structure 277.

Figure 93:
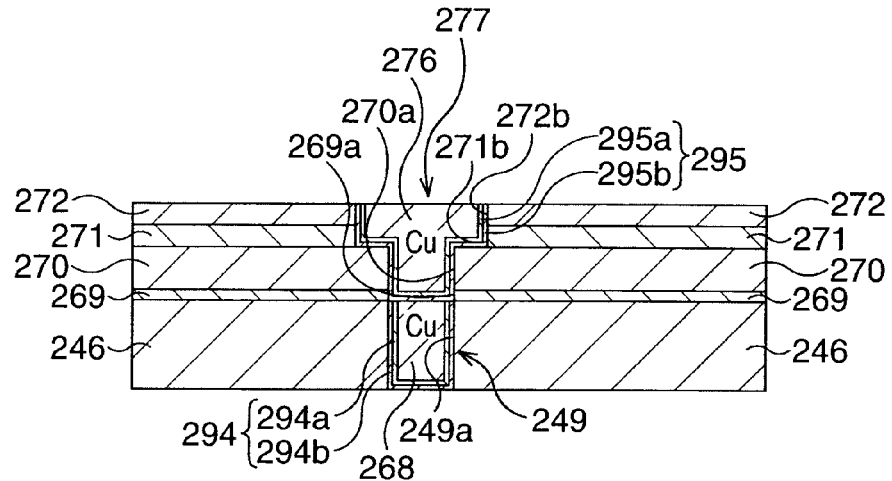
FIG. 93 is a schematic cross-sectional view showing a structure of an FeRAM according to another example of the modification example 18 of the second embodiment.

Further, in this example, the glue film 294 is formed as the layered structure of the conductive layer 294a and the TiAlN film 294b and the glue film 295 is formed as the layered structure of the conductive layer 295a and the TiAlN film 295b, but as shown in FIG. 93 (corresponding to FIG. 92B), the layered state of respective films may be inverted, thereby forming the glue film 294 as a layered structure of the TiAlN film 294b and the conductive layer 294a and the glue film 295 as a layered structure of the TiAlN film 295b and the conductive layer 295a.

Figure 94:
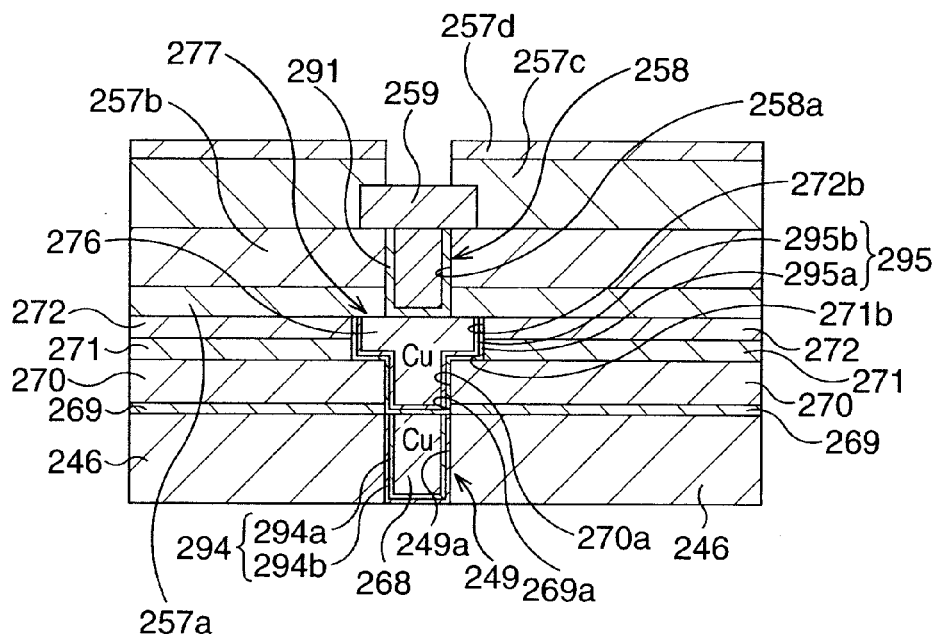
FIG. 94 is a schematic cross-sectional view showing a structure of an FeRAM according to another example of the modification example 18 of the second embodiment.

Further, as shown in FIG. 94, after forming the wiring structure 277 in which the wiring trench 274 is filled up with Cu via the glue film 295 as in this example, the modification example 16 may be applied. Specifically, W is filled via a glue film 291 in a via hole 258a formed in interlayer insulating films 257a, 257b, thereby forming a plug 258. In this plug 258, the W filling up the via hole 258a formed in the interlayer insulating films 257a, 257b is covered from a bottom face to a side face by the glue film 291 which is a metal having conductivity even when oxidized, for example an Ir film. On the plug 258, a pad electrode 259 constituted of an Al alloy film (here an Al—Cu film) for example is formed, and interlayer insulating films 257c, 257d are formed so as to cover the pad electrode 259. In the interlayer insulating films 257c, 257d, an opening which exposes part of a surface of the pad electrode 259 is formed. As the interlayer insulating films 257a to 257c, a silicon oxide film such as NSG is used, and as the interlayer insulating film 257d, a silicon nitride film or the like, which is more rigid than the silicon oxide film, is used.

As described above, according to this example, oxidation of the plug 235 connected to the upper electrode 232 of the ferroelectric capacitor structure 230 as well as the plug 249 connected to the first wire 245 and the wiring structure 277 is inhibited, and moreover, entrance of hydrogen into at least the plug 249 connected to the first wire 245 and the wiring structure 277 is inhibited, so that a highly reliable stack type FeRAM with stabilized contact resistance can be realized.

Modification Example 19

In this example, similarly to the second embodiment, a structure of a stack type FeRAM and a manufacturing method thereof will be disclosed, but this example is different in that the conductor impervious to oxygen provided between the ferroelectric capacitor structure 230 and the conductive plug 235 is different.

FIG. 95A to FIG. 98 are schematic cross-sectional views showing a structure of an FeRAM according to modification example 19 of the second embodiment together with a manufacturing method thereof (main steps) in the order of steps.

First, similarly to the second embodiment, the respective steps of FIG. 38A to FIG. 38C are performed.

Figure 95A:
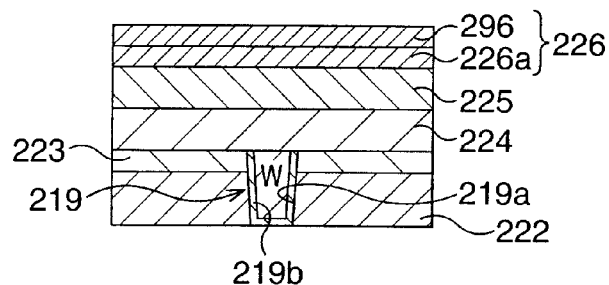
FIG. 95A to FIG. 95D are schematic cross-sectional views showing a structure of an FeRAM according to modification example 19 of the second embodiment together with a manufacturing method thereof (main steps) in the order of steps.

Subsequently, as shown in FIG. 95A, a lower electrode layer 224, a ferroelectric film 225 and an upper electrode layer 226 are formed sequentially.

Particularly, first, a Pt film is deposited with a film thickness of approximately 150 nm to 200 nm for example by a sputtering method, thereby forming the lower electrode layer 224.

Next, on the lower electrode layer 224, the ferroelectric film 225 constituted of PZT for example, which is a ferroelectric, is deposited with a film thickness of approximately 100 nm to 300 nm by an RF sputtering method. Then, the ferroelectric film 225 is annealed to crystallize the ferroelectric film 225. Conditions of this annealing are such that it is performed for 60 seconds to 120 seconds at 550° C. to 650° C. for example while supplying Ar/O$_2$ gases at flow rates of 1.98 liter/minute of Ar and 0.025 liter/minute of O$_2$.

Next, the upper electrode layer 226 is formed by deposition on the ferroelectric, film 225.

First, an IrO$_2$ film 226a for example which is a conductive oxide is formed with a film thickness of approximately 200 nm by a reactive sputtering method. Thereafter, the IrO$_2$ film 226a is annealed. Conditions of this annealing are such that it is performed for 10 seconds to 60 seconds at 650° C. to 850° C. for example while supplying Ar/O$_2$ gases at flow rates of 2.0 liter/minute of Ar and 0.02 liter/minute of O$_2$.

Next, a Pt film 296 which functions as a cap film for the IrO$_2$ film 226a is formed on the IrO$_2$ film 226a.

Pt is a noble metal which has catalytic activity, and in this example, a Pt film 296 including a catalyst poisoning material which inhibits the catalytic activity of Pt is formed. As the catalyst poisoning material, a material containing at least one type selected from CO, chlorine compound, sulfur compound, phosphorous compound, and silicon compound is used.

Specifically, the following techniques (4) to (6) are proposed. In this embodiment, at least one of the techniques (4) to (6) (for example the technique (4)) is selected and performed.

(4) By a PVD (Physical Vapor Deposition) method, a growing gas to which a catalyst poisoning material, for example CO is added is used to form the Pt film 296 with a film thickness of approximately 100 nm.

(5) By a PVD method, a Pt target to which a catalyst poisoning material, for example CO is added is used to form the Pt film 296 with a film thickness of approximately 100 nm.

(6) After forming a Pt film with a film thickness of approximately 100 nm by a PVD method, the Pt film is contacted with a gas to which a catalyst poisoning material, for example CO is added so that the catalyst poisoning material is included in the Pt film, thereby forming the Pt film 296.

By forming the Pt film 296 as described above, the upper electrode layer 226 is formed with the IrO$_2$ film 226a and the Pt film 296.

Figure 95B:
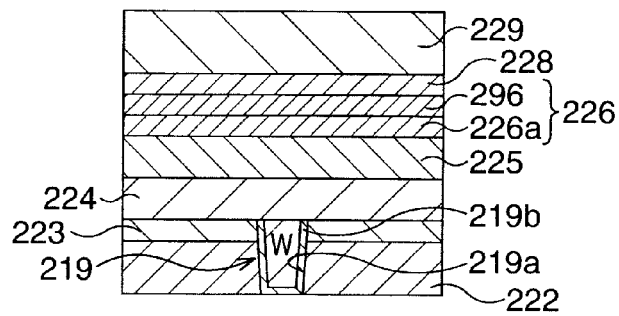

Subsequently, as shown in FIG. 95B, a TiN film 228 and a silicon oxide film 229 are formed.

Particularly, the TiN film 228 is formed by deposition with a film thickness of approximately 200 nm on the Pt film 296 by a sputtering method or the like. The silicon oxide film 229 is formed by deposition with a film thickness of approximately 1000 nm on the TiN film 228 by a CVD method using TEOS for example. Here, instead of the TEOS film, an HDP film may be formed. Note that it is also preferable to further form a silicon nitride film on the silicon oxide film 229.

Figure 95C:
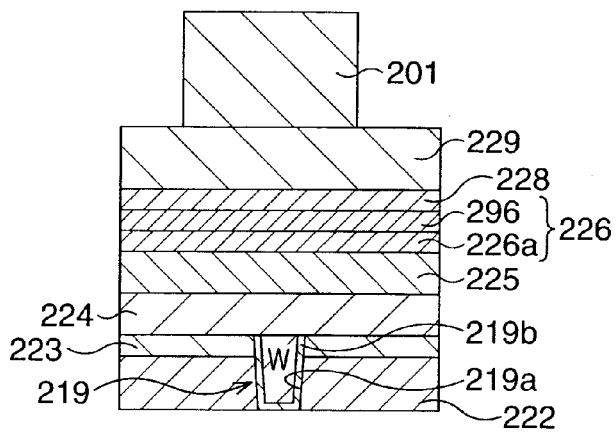

Subsequently, as shown in FIG. 95C, a resist mask 201 is formed.

Particularly, a resist is applied on the silicon oxide film 229, and this resist is processed in an electrode form by lithography, thereby forming the resist mask 201.

Figure 95D:
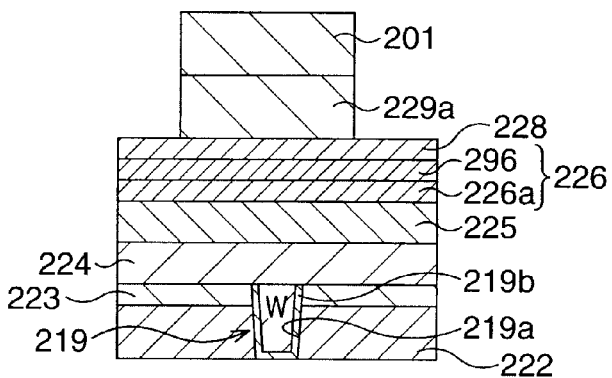

Subsequently, as shown in FIG. 95D, the silicon oxide film 229 is processed.

Particularly, with the resist mask 201 being a mask, the silicon oxide film 229 is dry-etched. At this time, the silicon oxide film 229 is patterned corresponding to the electrode form of the resist mask 201, thereby forming a hard mask 229a. Also, the resist mask 201 is etched and its thickness is reduced.

Figure 96A:
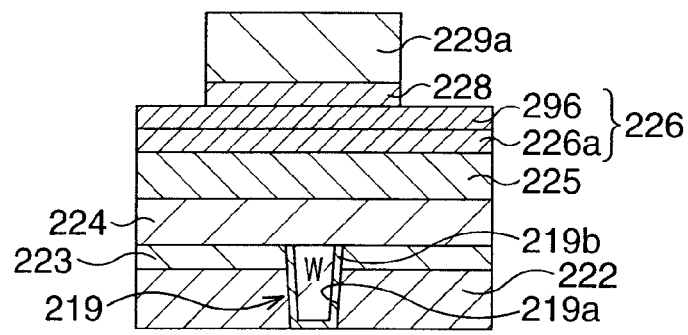
FIG. 96A to FIG. 96D are schematic cross-sectional views showing the structure of the FeRAM according to the modification example 19 of the second embodiment together with the manufacturing method thereof (main steps) in the order of steps, continuing from FIG. 95D.

Subsequently, as shown in FIG. 96A, the TiN film 228 is processed.

Particularly, with the resist mask 201 and the hard mask 229a being a mask, the TiN film 228 is dry etched. At this time, the TiN film 228 is patterned corresponding to the electrode form of the hard mask 229a. Also, the resist mask 201 itself is etched and becomes thin during the etching. Thereafter, the resist mask 201 is removed by ashing or the like.

Figure 96B:
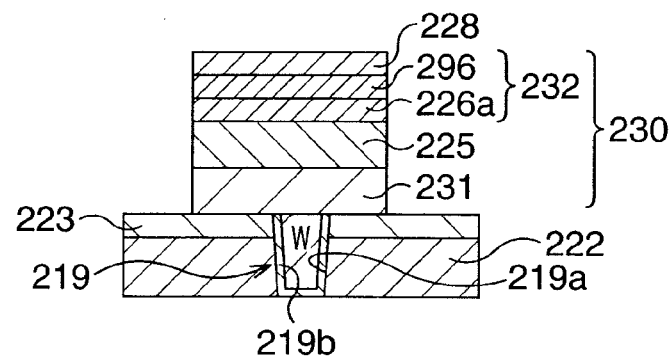

Subsequently, as shown in FIG. 96B, the upper electrode layer 226, the ferroelectric film 225, and the lower electrode layer 224 are processed.

Particularly, with the hard mask 229a and the TiN film 228 being a mask and the upper insulating film 223 being an etching stopper, the upper electrode layer 226, the ferroelectric film 225, and the lower electrode layer 224 are dry-etched. At this time, the upper electrode layer 226, the ferroelectric film 225, and the lower electrode layer 224 are patterned corresponding to the electrode form of the TiN film 228. Also, the hard mask 229a itself is etched and becomes thin during the etching. Thereafter, the hard mask 229a is removed by dry etching (etching back) on its entire surface.

Figure 96C:
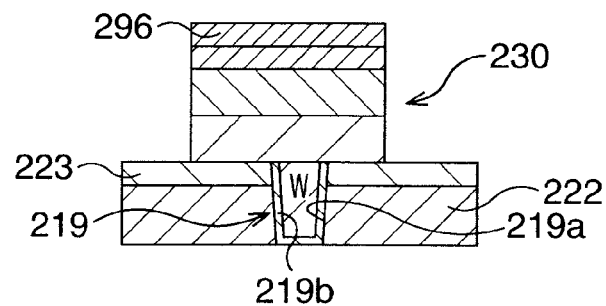

Subsequently, as shown in FIG. 96C, the ferroelectric capacitor structure 230 is completed.

Particularly, the TiN film 228 used as a mask is removed by wet etching. At this time, the ferroelectric capacitor structure 230 is completed, in which the ferroelectric film 225 and an upper electrode 232 are layered sequentially on a lower electrode 231, and the lower electrode 231 and the upper electrode 232 are capacitively coupled via the ferroelectric film 225. In this ferroelectric capacitor structure 230, the lower electrode 231 is connected to the plug 219, and the source/drain 218 and the lower electrode 231 are electrically connected via the plug 219.

Here, when forming the Pt film 296 including the catalyst poisoning material, instead of performing one of the techniques (4) to (6), a technique (7) as follows may be carried out.

In the technique (7), after the Pt film is patterned as in FIG. 96C (after the upper electrode 232 is pattern formed), in a state that the Pt film is exposed, the Pt film is contacted with a gas to which a catalyst poisoning material, for example CO, is added so that the catalyst poisoning material is included in the Pt film, thereby forming the Pt film 296. By performing this technique (7), a larger effect of inhibiting the catalytic activity of Pt can be obtained rather than performing the technique (6).

Figure 96D:
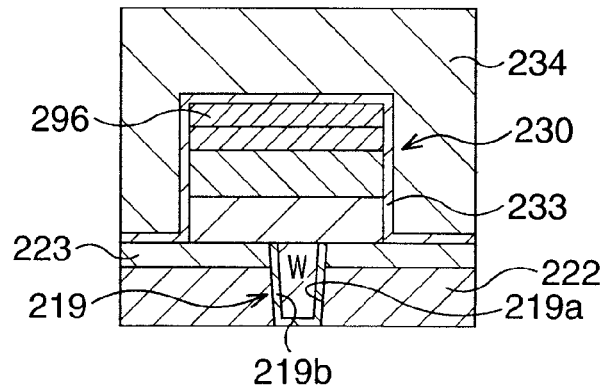

Subsequently, as shown in FIG. 96D, a protection film 233 and an interlayer insulating film 234 are formed.

Particularly, first, alumina ($Al_2O_3$) is used as a material and deposited by a sputtering method with a film thickness of approximately 20 nm to 50 nm so as to cover the entire face of the ferroelectric capacitor structure 230, thereby forming the protection film 233. Thereafter, the protection film 233 is annealed.

Next, the interlayer insulating film 234 is formed so as to cover the ferroelectric capacitor structure 230 via the protection film 233. Here, the interlayer insulating film 234 is formed such that a silicon oxide film is deposited with a film thickness of approximately 1500 nm to 2500 nm by a plasma CVD method using TEOS for example, and thereafter it is polished by CMP until the film thickness becomes approximately 1000 nm for example. After the CMP, for the purpose of dehydrating the interlayer insulating film 234, plasma annealing of $N_2O$ for example is performed.

Figure 97A:
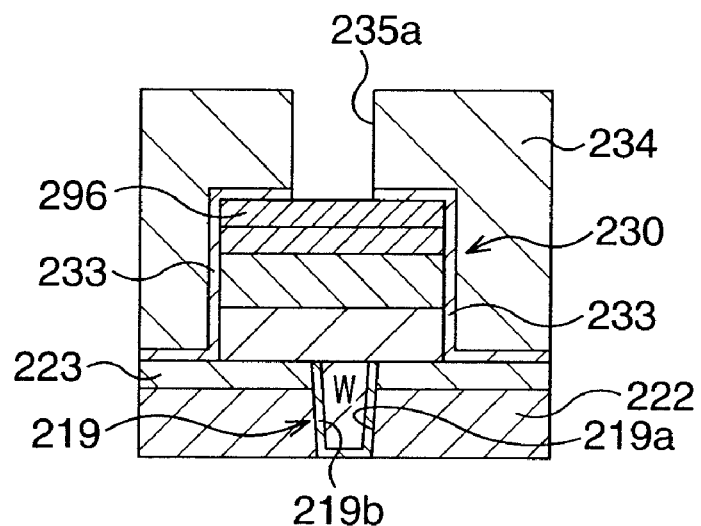
FIG. 97A and FIG. 97B are schematic cross-sectional views showing the structure of the FeRAM according to the modification example 19 of the second embodiment together with the manufacturing method thereof (main steps) in the order of steps, continuing from FIG. 96D.

Subsequently, as shown in FIG. 97A, a via hole 235a to the upper electrode 232 of the ferroelectric capacitor structure 230 is formed.

Particularly, the interlayer insulating film 234 and the protection film 233 are patterned by lithography and subsequent dry etching, thereby forming the via hole 235a which exposes part of a surface of the silicide film 262.

Figure 97B:
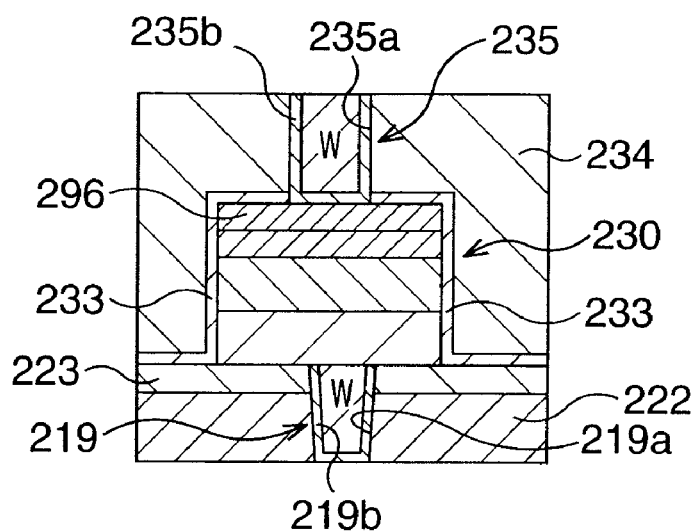

Subsequently, as shown in FIG. 97B, a plug 235 connected to the upper electrode 232 of the ferroelectric capacitor structure 230 is formed.

Particularly, first, a TiN film for example is deposited sequentially by a sputtering method with a film thickness of approximately 50 nm so as to cover a wall surface of the via hole 235a, thereby forming a base film (glue film) 235b. Then, a W film for example is formed by a CVD method so as to fill up the via hole 235a via a glue film 235b. The TiN film constituting the glue film 235b has a function of inhibiting permeation of hydrogen, and thus entrance of hydrogen into the plug 235 is inhibited. Here, for the glue film 235b which has a function of inhibiting permeation of hydrogen, at least one type selected from TiN, TiSiN, TaN, CrN, HfN, ZrN, TiAlN, TaAlN, CrAlN, and HfAlN is used.

Thereafter, with the interlayer insulating film 234 being a stopper, the W film and the glue film 235b are polished by CMP, thereby forming the plug 235 in which the via hole 235a is filled up with W via the glue film 235b. After the CMP, plasma annealing of $N_2O$ for example is performed.

In this example, the Pt film 296 is formed including the catalyst poisoning material inside, and the W filling up the via hole 235a and the $IrO_2$ film 226a are separated by the Pt film 296. In the Pt film 296, catalytic activity of oxygen in Pt is inhibited, so that the Pt film 296 can exhibit an oxidation preventing function, which is an original function thereof, without being disturbed by its own catalytic activity. By this Pt film 296, entrance of oxygen activated due to the $IrO_2$ film 226a into the plug 235 is inhibited, and also activation of oxygen in the Pt film 296 is inhibited, thereby preventing oxidation of the plug 235.

Figure 98:
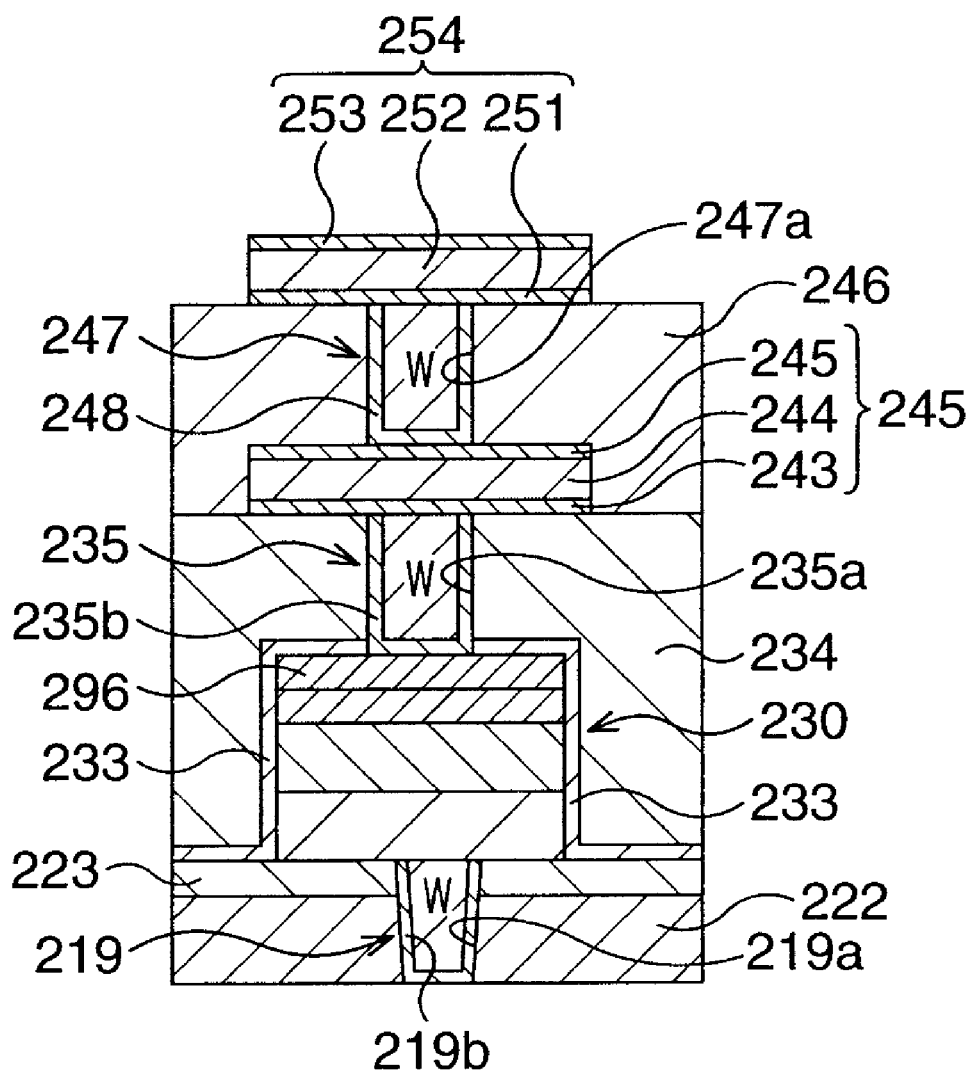
FIG. 98 is a schematic cross-sectional view showing the structure of the FeRAM according to the modification example 19 of the second embodiment together with the manufacturing method thereof (main steps) in the order of steps, continuing from FIG. 97B.

Then, similarly to the second embodiment, the respective steps of FIG. 42A and FIG. 42B are performed to obtain the structure shown in FIG. 98.

Thereafter, steps of forming an interlayer insulating film and a further upper layer wire, and so on are performed, thereby completing the stack type FeRAM according to this example.

As described above, according to this example, oxidation of the plug 235 connected to the ferroelectric capacitor structure 230 is inhibited, so that a highly reliable stack type FeRAM with stabilized contact resistance can be realized.

Note that this example can be applied to the second embodiment and the modification examples 1 to 18. Specifically, in such cases, in each of the second embodiment and the modification examples 1 to 18, the Pt film 226b, which is a component of the upper electrode film 226, is formed as a structure including the catalyst poisoning material inside. By this structure, a highly reliable stack type FeRAM with more securely stabilized contact resistance can be realized.

According to the present invention, oxidation of a conductive plug is inhibited, so that a highly reliable semiconductor device having stabilized contact resistance can be realized.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A method of manufacturing a semiconductor device, comprising:

forming a conductive structure above a semiconductor substrate;

forming an insulating film which covers the conductive structure;

forming in the insulating film openings which expose part of a surface of the conductive structure;

forming base films each constituted of a silicide material at a temperature of 350° C. or lower by one of a sputtering method and a CVD method so as to cover inner wall surfaces of the openings respectively;

forming conductive plugs by filling up the openings with a conductive material via the base films, wherein the conductive structure has a noble metal layer in an upper layer part thereof, and wherein, to the noble metal layer, a material which contains at least one type selected from carbon monoxide chlorine compound, sulfur compound, phosphorous compound, and silicon compound is added.

2. The method of manufacturing a semiconductor device according to claim 1, wherein the silicide material contains at least one type selected from titanium silicide, cobalt silicide, molybdenum silicide, niobium silicide, tantalum silicide, tungsten silicide, and vanadium silicide.

3. The method of manufacturing a semiconductor device according to claim 2, further comprising forming a capacitor structure constituted by sandwiching a ferroelectric film between a lower electrode and an upper electrode, and wherein the conductive structure is a wire.

4. The method of manufacturing a semiconductor device according to claim 1, further comprising forming a conductive protection film which which inhibits permeation of hydrogen contains at lease one type selected from titanium nitride, titanium silicon nitride, tantalum nitride, chromium nitride hafnium nitride, zirconium nitride, titanium aluminum nitride, tantalum aluminum nitride, chromium aluminum nitride, and hafnium aluminum nitride above the base films or below the base films.

5. The method of manufacturing a semiconductor device according to claim 1, wherein, when the noble metal layer is formed by a chemical vapor deposition method, the noble metal layer is formed using a growing gas to which the catalyst poisoning material is added.

6. The method of manufacturing a semiconductor device according to claim 1, further comprising contacting, after the noble metal layer is formed, the noble metal layer with a gas including the catalyst poisoning material.

7. The method of manufacturing a semiconductor device according to claim 1, wherein the conductive structure is a capacitor structure constituted by sandwiching a ferroelectric film between a lower electrode and an upper electrode.

8. The method of manufacturing a semiconductor device according to claim 7, wherein the ferroelectric film is constituted of a ferroelectric material having a ferroelectric property.

* * * * *